(12) United States Patent
Lee et al.

(10) Patent No.: US 8,193,636 B2
(45) Date of Patent: Jun. 5, 2012

(54) CHIP ASSEMBLY WITH INTERCONNECTION BY METAL BUMP

(75) Inventors: Jin-Yuan Lee, Hsin-Chu (TW); Hsin-Jung Lo, Taipei (TW)

(73) Assignee: Megica Corporation, Hsinchu (TW)

( * ) Notice: Subject to any disclaimer, the term of this patent is extended or adjusted under 35 U.S.C. 154(b) by 605 days.

(21) Appl. No.: 12/045,029

(22) Filed: Mar. 10, 2008

(65) Prior Publication Data

US 2008/0284014 A1 Nov. 20, 2008

Related U.S. Application Data

(60) Provisional application No. 60/894,459, filed on Mar. 13, 2007, provisional application No. 60/911,514, filed on Apr. 12, 2007.

(51) Int. Cl.
H01L 23/48 (2006.01)

(52) U.S. Cl. . 257/736; 257/758; 257/750; 257/E23.011; 257/690; 257/691; 257/737

(58) Field of Classification Search ............... 257/690, 257/691, 737, 758, 750, E23.011, 736
See application file for complete search history.

(56) References Cited

U.S. PATENT DOCUMENTS

| | | |
|---|---|---|
| 4,051,508 A | 9/1977 | Sato |
| 4,622,576 A | 11/1986 | Buynoski |
| 4,685,998 A | 8/1987 | Quinn |
| 4,733,289 A | 3/1988 | Tsurumaru |
| 4,789,647 A | 12/1988 | Peters |
| 5,083,187 A | 1/1992 | Lamson |
| 5,172,212 A | 12/1992 | Baba |
| 5,226,232 A | 7/1993 | Boyd |
| 5,310,699 A | 5/1994 | Chikawa |
| 5,384,488 A | 1/1995 | Golshan |
| 5,417,800 A | 5/1995 | Takeshita |
| 5,430,329 A | 7/1995 | Harada |

(Continued)

FOREIGN PATENT DOCUMENTS

EP 1536469 6/2005

(Continued)

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

(Continued)

*Primary Examiner* — Marcos D. Plzarro
*Assistant Examiner* — Eva Yan Montalvo
(74) *Attorney, Agent, or Firm* — McDermott Will & Emery LLP

(57) ABSTRACT

A chip assembly includes a semiconductor chip, a bump and an external circuit. The semiconductor chip includes a semiconductor substrate, a transistor in and on the semiconductor substrate, multiple dielectric layers over the semiconductor substrate, a metallization structure over the semiconductor substrate, wherein the metallization structure is connected to the transistor, and a passivation layer over the metallization structure, over the dielectric layers and over the transistor. The bump is connected to the metallization structure through an opening in the passivation layer, wherein the bump includes an adhesion/barrier layer and a gold layer over the adhesion/barrier layer. The external circuit can be connected to the bump using a tape carrier package (TCP), a chip-on-film (COF) package or a chip-on-glass (COG) assembly.

17 Claims, 116 Drawing Sheets

U.S. PATENT DOCUMENTS

| | | | |
|---|---|---|---|
| 5,468,984 A | 11/1995 | Efland |
| 5,532,512 A | 7/1996 | Fillion |
| 5,534,465 A | 7/1996 | Frye |
| 5,631,499 A | 5/1997 | Hosomi |
| 5,659,201 A | 8/1997 | Wollesen |
| 5,665,989 A | 9/1997 | Dangelo |
| 5,691,248 A | 11/1997 | Cronin |
| 5,783,868 A | 7/1998 | Galloway |
| 5,785,236 A | 7/1998 | Cheung |
| 5,792,594 A | 8/1998 | Brown |
| 5,834,844 A | 11/1998 | Akagawa |
| 5,854,513 A | 12/1998 | Kim |
| 5,883,435 A | 3/1999 | Geffken |
| 5,892,273 A | 4/1999 | Iwasaki |
| 5,952,726 A | 9/1999 | Liang |
| 5,969,424 A | 10/1999 | Matsuki |
| 5,994,766 A | 11/1999 | Shenoy |
| 6,011,314 A | 1/2000 | Leibovitz |
| 6,013,571 A | 1/2000 | Morrell |
| 6,022,792 A | 2/2000 | Ishii |
| 6,066,877 A | 5/2000 | Williams |
| 6,077,726 A | 6/2000 | Mistry |
| 6,144,100 A | 11/2000 | Shen |
| 6,177,731 B1 | 1/2001 | Ishida |
| 6,184,143 B1 | 2/2001 | Ohashi |
| 6,187,680 B1 | 2/2001 | Costrini |
| 6,229,221 B1 | 5/2001 | Kloen |
| 6,229,711 B1 | 5/2001 | Yoneda |
| 6,235,648 B1 | 5/2001 | Mizuhara |
| 6,236,101 B1 | 5/2001 | Erdeljac |
| 6,255,737 B1 | 7/2001 | Hashimoto |
| 6,288,447 B1 | 9/2001 | Amishiro |
| 6,300,234 B1 | 10/2001 | Flynn |
| 6,303,423 B1 | 10/2001 | Lin |
| 6,359,328 B1 | 3/2002 | Dubin |
| 6,362,087 B1 | 3/2002 | Wang |
| 6,376,353 B1 | 4/2002 | Zhou |
| 6,383,916 B1 | 5/2002 | Lin |
| 6,384,486 B2 | 5/2002 | Zuniga |
| 6,410,435 B1 | 6/2002 | Ryan |
| 6,426,281 B1 | 7/2002 | Lin |
| 6,429,120 B1 | 8/2002 | Ahn |
| 6,441,467 B2 | 8/2002 | Toyosawa |
| 6,451,681 B1 | 9/2002 | Greer |
| 6,472,745 B1 | 10/2002 | Iizuka |
| 6,479,900 B1 | 11/2002 | Shinogi |
| 6,495,442 B1 | 12/2002 | Lin |
| 6,515,369 B1 | 2/2003 | Lin |
| 6,544,880 B1 | 4/2003 | Akram |
| 6,545,355 B2 | 4/2003 | Yanagida |
| 6,559,548 B1 | 5/2003 | Matsunaga |
| 6,593,222 B2 | 7/2003 | Smoak |
| 6,605,528 B1 | 8/2003 | Lin |
| 6,614,091 B1 | 9/2003 | Downey |
| 6,639,299 B2 | 10/2003 | Aoki |
| 6,646,347 B2 | 11/2003 | Mercado |
| 6,649,509 B1 | 11/2003 | Lin |
| 6,653,563 B2 | 11/2003 | Bohr |
| 6,680,544 B2 | 1/2004 | Lu |
| 6,683,380 B2 | 1/2004 | Efland |
| 6,707,124 B2 | 3/2004 | Wachtler |
| 6,707,159 B1 | 3/2004 | Kumamoto |
| 6,713,875 B2 | 3/2004 | Farrar |
| 6,720,243 B2 | 4/2004 | Weng |
| 6,756,295 B2 | 6/2004 | Lin |
| 6,756,664 B2 | 6/2004 | Yang |
| 6,759,275 B1 | 7/2004 | Lee |
| 6,762,115 B2 | 7/2004 | Lin |
| 6,762,122 B2 | 7/2004 | Mis |
| 6,780,748 B2 | 8/2004 | Yamaguchi |
| 6,791,178 B2 | 9/2004 | Yamaguchi |
| 6,798,050 B1 | 9/2004 | Homma |
| 6,800,555 B2 | 10/2004 | Test |
| 6,802,945 B2 | 10/2004 | Liu |
| 6,806,578 B2 | 10/2004 | Howell |
| 6,844,631 B2 | 1/2005 | Yong |
| 6,853,076 B2 | 2/2005 | Datta |
| 6,861,740 B2 | 3/2005 | Hsu |
| 6,864,562 B1 | 3/2005 | Toyosawa |
| 6,878,633 B2 | 4/2005 | Raskin |
| 6,940,169 B2 | 9/2005 | Jin |
| 6,943,440 B2 | 9/2005 | Kim |
| 6,963,136 B2 | 11/2005 | Shinozaki |
| 6,963,138 B2 | 11/2005 | Low |
| 6,979,647 B2 | 12/2005 | Bojkov |
| 7,045,899 B2 | 5/2006 | Yamane |
| 7,115,985 B2 | 10/2006 | Antol |
| 7,220,657 B2 | 5/2007 | Ihara |
| 7,230,340 B2 | 6/2007 | Lin |
| 7,239,028 B2 | 7/2007 | Anzai |
| 7,271,489 B2 | 9/2007 | Lin |
| 7,372,161 B2 | 5/2008 | Lin |
| 7,381,642 B2 | 6/2008 | Lin |
| 7,416,971 B2 | 8/2008 | Lin |
| 7,420,276 B2 | 9/2008 | Lin |
| 7,423,346 B2 | 9/2008 | Lin |
| 7,465,654 B2 | 12/2008 | Chou |
| 7,470,997 B2 | 12/2008 | Lin |
| 7,473,999 B2 | 1/2009 | Lin |
| 7,521,805 B2 | 4/2009 | Lin |
| 7,719,116 B2 | 5/2010 | Wakabayashi |
| 7,723,849 B2 | 5/2010 | Ohmori |
| 2001/0035452 A1 | 11/2001 | Test |
| 2001/0040290 A1 | 11/2001 | Sakurai |
| 2001/0045651 A1 | 11/2001 | Saito |
| 2001/0051426 A1 | 12/2001 | Pozder |
| 2002/0000665 A1 | 1/2002 | Barr |
| 2002/0000671 A1 | 1/2002 | Zuniga |
| 2002/0043723 A1 | 4/2002 | Shimizu |
| 2002/0127846 A1 | 9/2002 | Burrell |
| 2002/0158334 A1 | 10/2002 | Vu |
| 2003/0006062 A1 | 1/2003 | Stone |
| 2003/0025202 A1 | 2/2003 | Mikagi |
| 2003/0030146 A1 | 2/2003 | Tamaru |
| 2003/0134496 A1 | 7/2003 | Lee |
| 2003/0216039 A1 | 11/2003 | Wang |
| 2003/0218246 A1 | 11/2003 | Abe |
| 2003/0222295 A1 | 12/2003 | Lin |
| 2003/0224613 A1 | 12/2003 | Ramanathan |
| 2004/0007779 A1 | 1/2004 | Arbuthnot |
| 2004/0023450 A1 | 2/2004 | Katagiri |
| 2004/0070086 A1 | 4/2004 | Lee |
| 2004/0169255 A1 | 9/2004 | Kiyotoshi |
| 2005/0017361 A1 | 1/2005 | Lin |
| 2005/0037609 A1 | 2/2005 | Nakatani |
| 2005/0277283 A1 | 12/2005 | Lin |
| 2006/0012041 A1 | 1/2006 | Chou |
| 2006/0019490 A1 | 1/2006 | Chou |
| 2006/0060961 A1 | 3/2006 | Lin |
| 2006/0091536 A1 | 5/2006 | Huang |
| 2006/0091540 A1 | 5/2006 | Chou |
| 2006/0125094 A1 | 6/2006 | Lin |
| 2006/0267198 A1 | 11/2006 | Lin |
| 2007/0026631 A1* | 2/2007 | Lin et al. ............... 438/424 |
| 2007/0026660 A1 | 2/2007 | Yamasaki |
| 2007/0205520 A1 | 9/2007 | Chou |
| 2007/0275503 A1 | 11/2007 | Lin |
| 2008/0042280 A1 | 2/2008 | Lin |
| 2008/0284037 A1 | 11/2008 | Andry |

FOREIGN PATENT DOCUMENTS

| | | |
|---|---|---|
| TW | 453146 | 9/2001 |
| TW | 552631 | 9/2003 |
| TW | 592007 | 6/2004 |
| TW | I227542 | 2/2005 |
| TW | I249822 | 2/2006 |
| TW | I250598 | 3/2006 |
| TW | I284385 | 7/2007 |

OTHER PUBLICATIONS

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

* cited by examiner

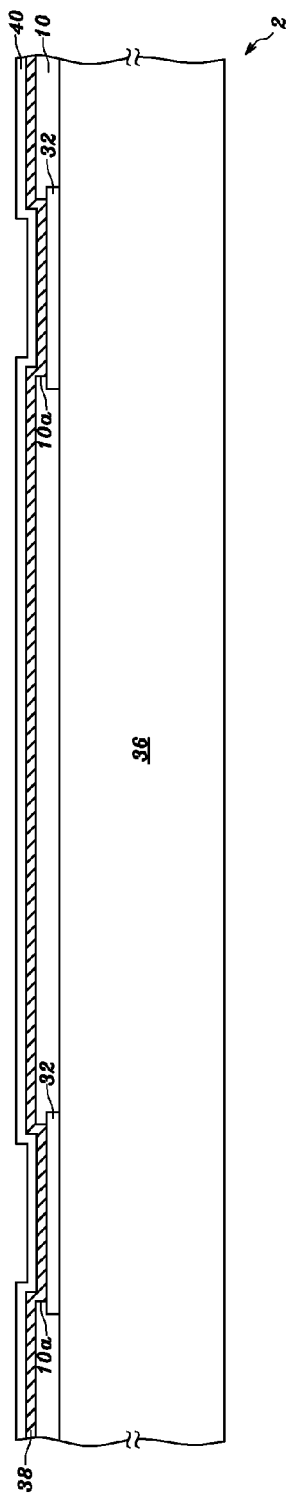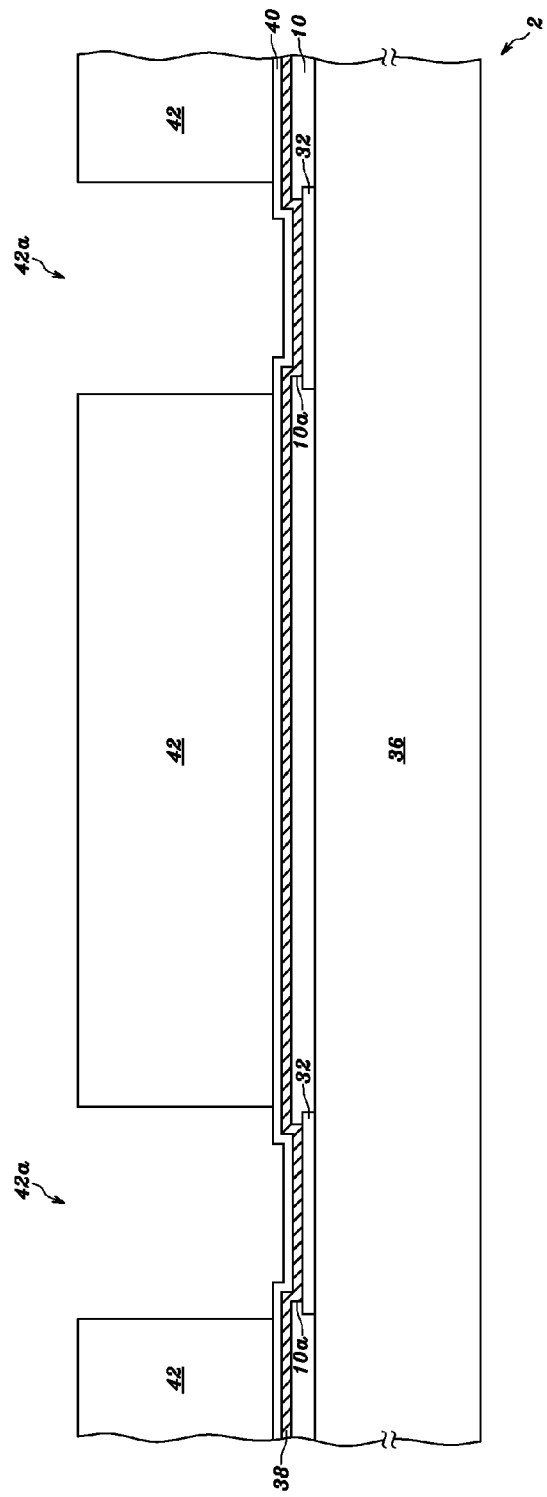
Fig. 2A
Fig. 2B

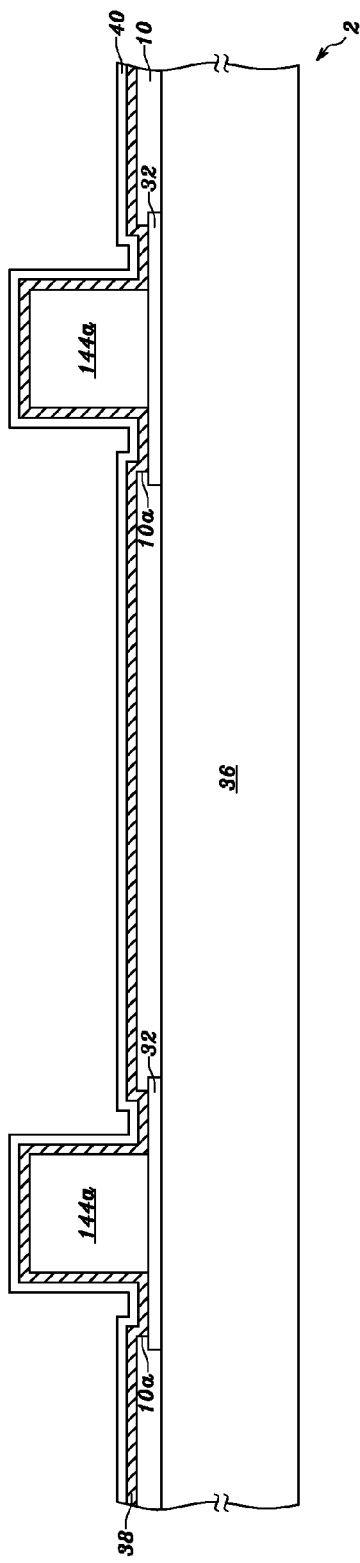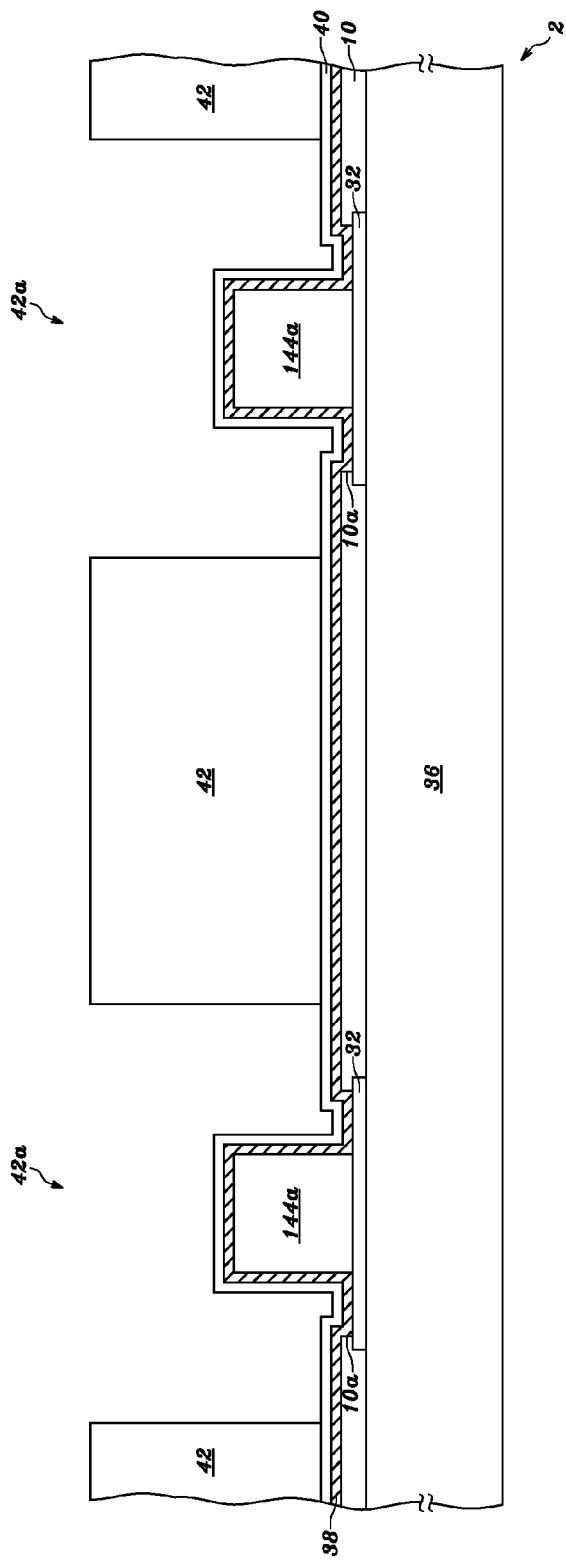

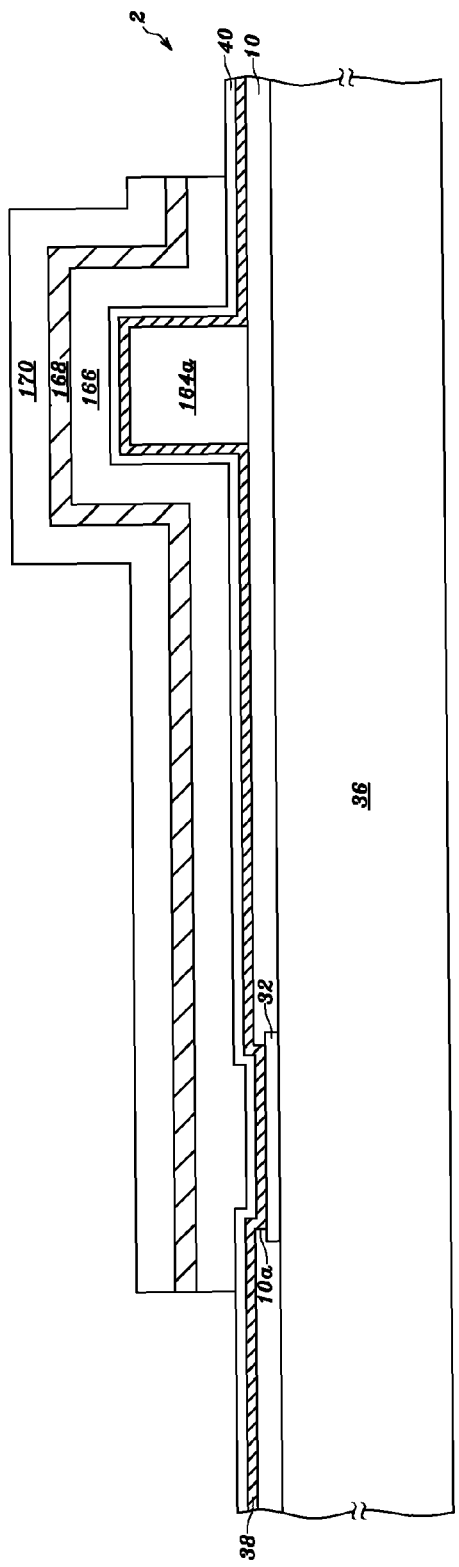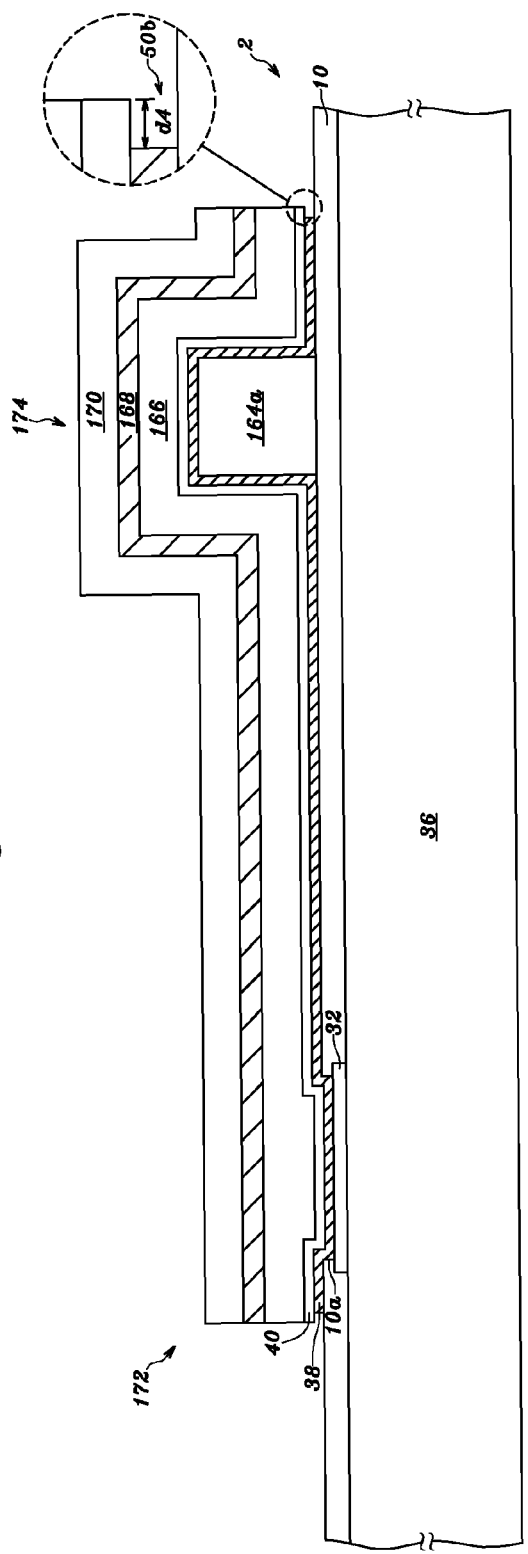

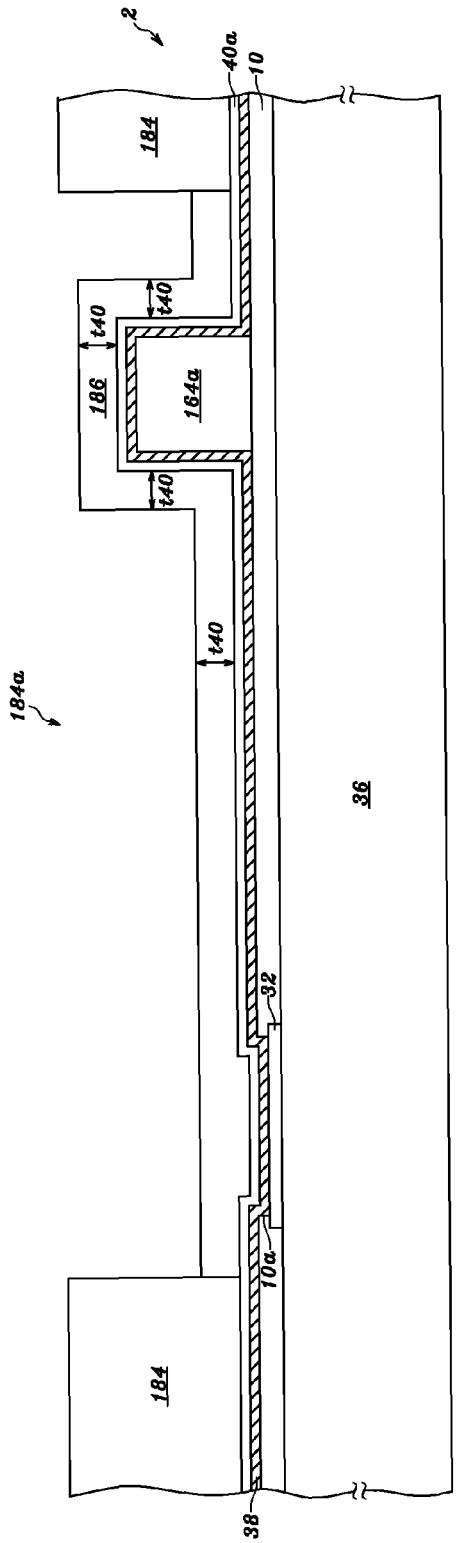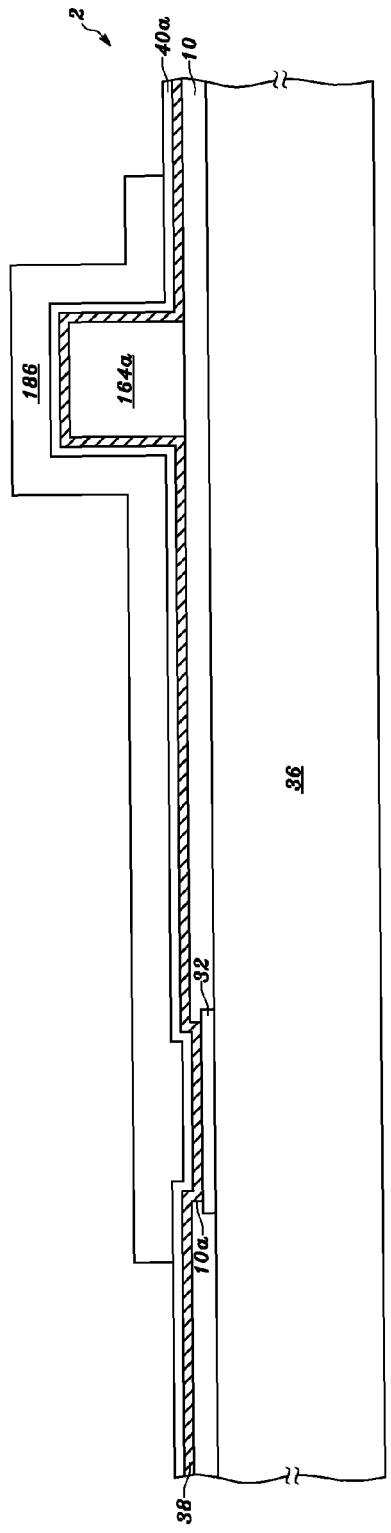

CHIP ASSEMBLY WITH INTERCONNECTION BY METAL BUMP

This application claims priority to U.S. provisional application No. 60/894,459 filed on Mar. 13, 2007, and to U.S. provisional application No. 60/911,514 filed on Apr. 12, 2007, which are herein incorporated by reference in their entirety.

BACKGROUND OF THE INVENTION

1. Field of the Invention

The invention relates to a chip assembly with a bump connected to an external circuit, and, more specifically, to a chip assembly with a bump connected to an external circuit using a tape carrier package (TCP), a chip-on-film (COF) package or a chip-on-glass (COG) assembly.

2. Brief Description of the Related Art

Gold bump technology has been widely used in microelectronics and micro systems, such as in the connection between a flat panel display and a driver chip. A driver chip can be connected to a flat panel display with a COG (chip on glass) process, which is mainly implemented with an electroplating technology for gold bumps. However, the conventional gold bump is expensive and disadvantageous to an electric property to a chip package.

SUMMARY OF THE INVENTION

It is the objective of the invention to provide a chip assembly with a bump for enhancing an electric property of the chip assembly and reducing the manufacture cost of the bump.

In order to reach the above objective, the present invention provides a chip package comprising a semiconductor chip, a metal bump, a flexible circuit film, a tin-alloy layer and a polymer material. The semiconductor chip comprises a semiconductor substrate comprising silicon, a transistor in or over the semiconductor substrate, a first dielectric layer over the semiconductor substrate, a metallization structure over the first dielectric layer, wherein the metallization structure comprises a first metal layer and a second metal layer over the first metal layer, and wherein the metallization structure is connected to the transistor, a second dielectric layer between the first and second metal layers, a passivation layer over the metallization structure, over the first and second dielectric layers and over the transistor, and a pad over the semiconductor substrate, wherein the pad is connected to the metallization structure. The metal bump is on the pad, wherein the metal bump comprises an adhesion/barrier layer on the pad and a copper layer with a thickness of between 5 and 30 micrometers on the adhesion/barrier layer. The flexible circuit film comprises a first polymer layer, a second polymer layer and a copper trace comprising a portion between the first and second polymer layers. The tin-alloy layer is between the copper layer and the copper trace, wherein the tin-alloy layer comprises gold. The polymer material encloses the metal bump.

In order to reach the above objective, the present invention provides a chip-on-glass (COG) assembly comprising a semiconductor chip, a metal bump, a glass substrate, a conductive trace and an anisotropic conductive film. The semiconductor chip comprises a semiconductor substrate comprising silicon, a transistor in or over the semiconductor substrate, a first dielectric layer over the semiconductor substrate, a metallization structure over the first dielectric layer, wherein the metallization structure comprises a first metal layer and a second metal layer over the first metal layer, and wherein the metallization structure is connected to the transistor, a second dielectric layer between the first and second metal layers, a passivation layer over the metallization structure, over the first and second dielectric layers and over the transistor, and a pad over the semiconductor substrate, wherein the pad is connected to the metallization structure. The metal bump is on the pad, wherein the metal bump comprises an adhesion/barrier layer on the pad, a copper layer having a thickness of between 5 and 30 micrometers on the adhesion/barrier layer and a gold layer having a thickness of between 1 and 10 micrometers over the copper layer. The conductive trace is between the gold layer and the glass substrate. The anisotropic conductive film encloses the metal bump and between the glass substrate and the semiconductor chip, wherein the anisotropic conductive film comprises multiple conductive particles between the gold layer and the conductive trace.

In order to reach the above objective, the present invention provides a chip-on-glass (COG) assembly comprising a semiconductor chip, a metal bump, a glass substrate, a conductive trace and a non-conductive film (NCF). The semiconductor chip comprises a semiconductor substrate comprising silicon, a transistor in or over the semiconductor substrate, a first dielectric layer over the semiconductor substrate, a metallization structure over the first dielectric layer, wherein the metallization structure comprises a first metal layer and a second metal layer over the first metal layer, and wherein the metallization structure is connected to the transistor, a second dielectric layer between the first and second metal layers, a passivation layer over the metallization structure, over the first and second dielectric layers and over the transistor, and a pad over the semiconductor substrate, wherein the pad is connected to the metallization structure. The metal bump is on the pad, wherein the metal bump comprises an adhesion/barrier layer on the pad, a copper layer having a thickness of between 5 and 30 micrometers on the adhesion/barrier layer and a gold layer having a thickness of between 1 and 10 micrometers over the copper layer. The conductive trace is between the gold layer and the glass substrate, wherein the gold layer contacts with the conductive trace. The non-conductive film (NCF) encloses the metal bump and is between the glass substrate and the semiconductor chip.

To enable the objectives, technical contents, characteristics and accomplishments of the present invention, the embodiments of the present invention are to be described in detail in cooperation with the attached drawings below.

BRIEF DESCRIPTION OF THE DRAWINGS

FIGS. 2A through 2E and FIGS. 2G through 2P are cross-sectional views showing a process for fabricating multiple metal bumps on a wafer and packaging a chip singulated from the wafer according to one embodiment of the present invention.

FIGS. 12A through 12G and FIGS. 12I through 12N are cross-sectional views showing a process for fabricating multiple bumps on a wafer and packaging a chip singulated from the wafer according to one embodiment of the present invention.

FIGS. 16A through 16G and FIGS. 16I through 16O are cross-sectional views showing a process for fabricating one or more polymer bumps on a wafer, fabricating multiple metal traces on one or more polymer bumps and on the wafer, and packaging a chip singulated from the wafer according to one embodiment of the present invention.

FIGS. 18A through 18E and FIGS. 18G through 18M are cross-sectional views showing a process for fabricating one or more polymer bumps on a wafer, fabricating multiple metal traces on one or more polymer bumps and on the wafer, and packaging a chip singulated from the wafer according to one embodiment of the present invention.

DETAILED DESCRIPTION OF THE INVENTION

Figure 1A:
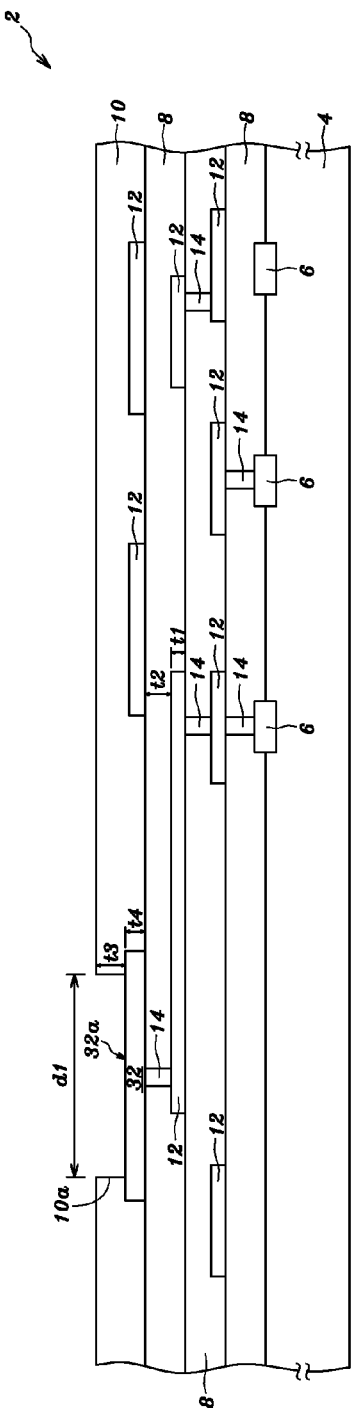
FIGS. 1A and 1B are cross-sectional views schematically showing a wafer according to the present invention.
Figure 1B:
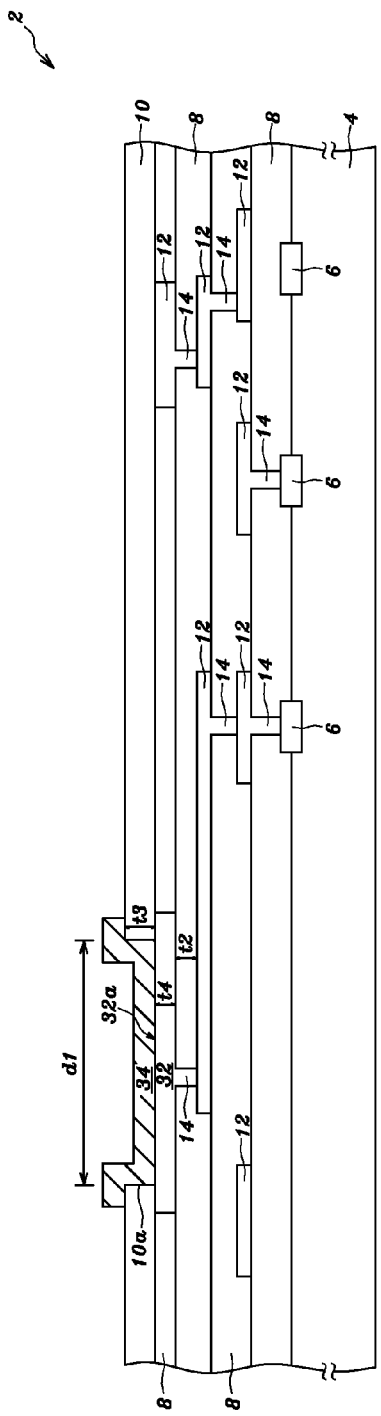

Referring to FIGS. 1A and 1B, a semiconductor wafer 2 includes a semiconductor substrate 4, multiple semiconductor devices 6, a metallization structure, multiple dielectric layers 8 and a passivation layer 10. The semiconductor substrate 4 may be a silicon substrate, a GaAs substrate or a SiGe substrate.

Referring to FIGS. 1A and 1B, the semiconductor devices 6 are formed in or over the semiconductor substrate 4. The semiconductor device 6 may be a memory device, a logic device, a passive device, such as resistor, capacitor, inductor or filter, or an active device, such as p-channel MOS device, n-channel MOS device, CMOS (Complementary Metal Oxide Semiconductor), BJT (Bipolar Junction Transistor) or BiCMOS (Bipolar CMOS) device.

Referring to FIGS. 1A and 1B, the metallization structure, circuit structure, is formed over the semiconductor substrate 4, connected to the semiconductor devices 6. The metallization structure comprises multiple patterned metal layers 12 having a thickness t1 of less than 3 micrometers (such as between 0.2 and 2 μm) and multiple metal plugs 14. For example, the patterned metal layers 12 and the metal plugs 14 are principally made of copper, wherein each of the patterned metal layers 12 has a copper-containing layer having a thickness of less than 3 micrometers (such as between 0.2 and 2 μm). Alternatively, the patterned metal layers 12 are principally made of aluminum or aluminum-alloy, and the metal plugs 14 are principally made of tungsten, wherein each of the patterned metal layers 12 has an aluminum-containing layer having a thickness of less than 3 micrometers (such as between 0.2 and 2 μm).

Figure 1C:
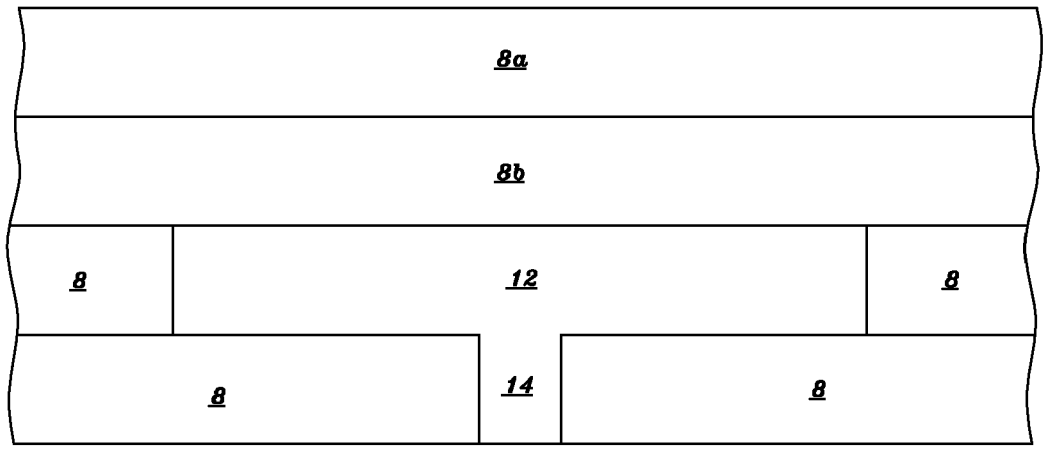
FIGS. 1C through 1L are cross-sectional views showing a process of forming a metallization structure over a semiconductor substrate.
Figure 1D:
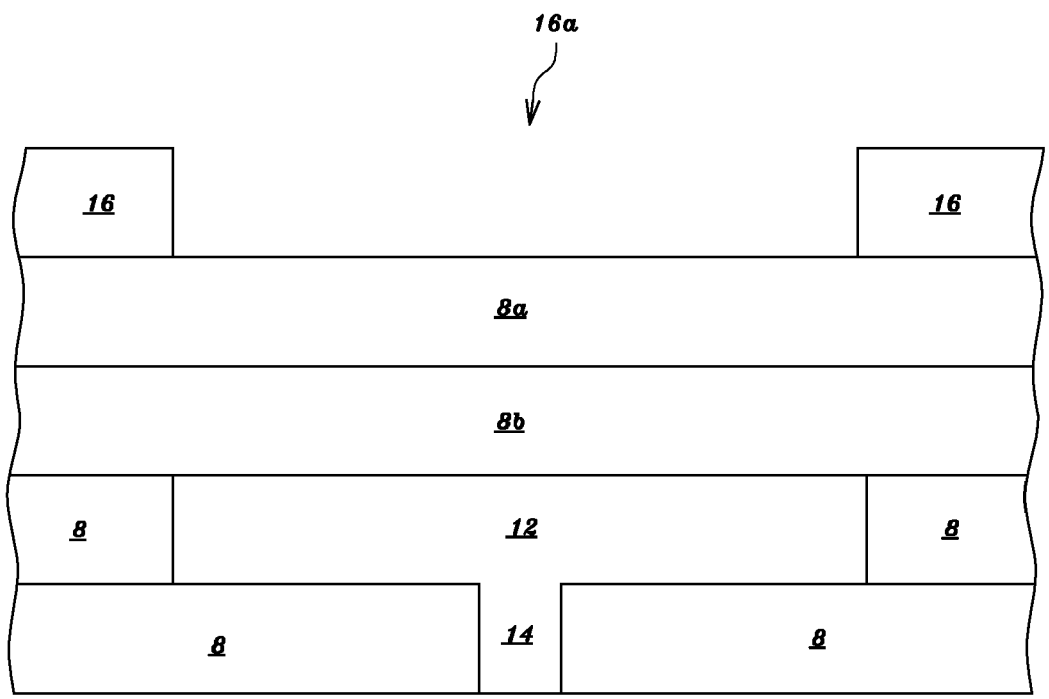
Figure 1E:
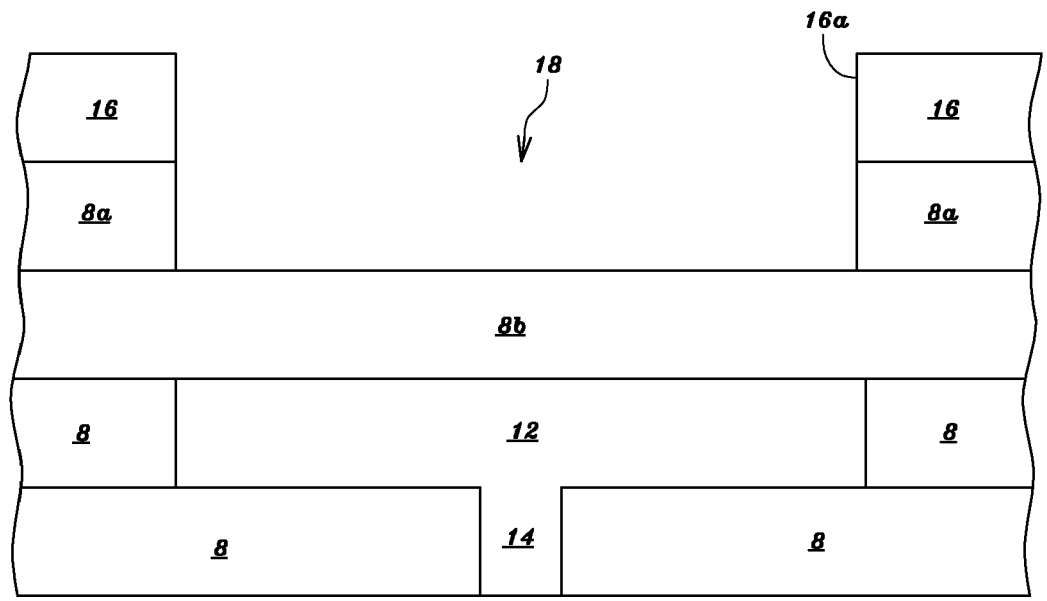
Figure 1F:
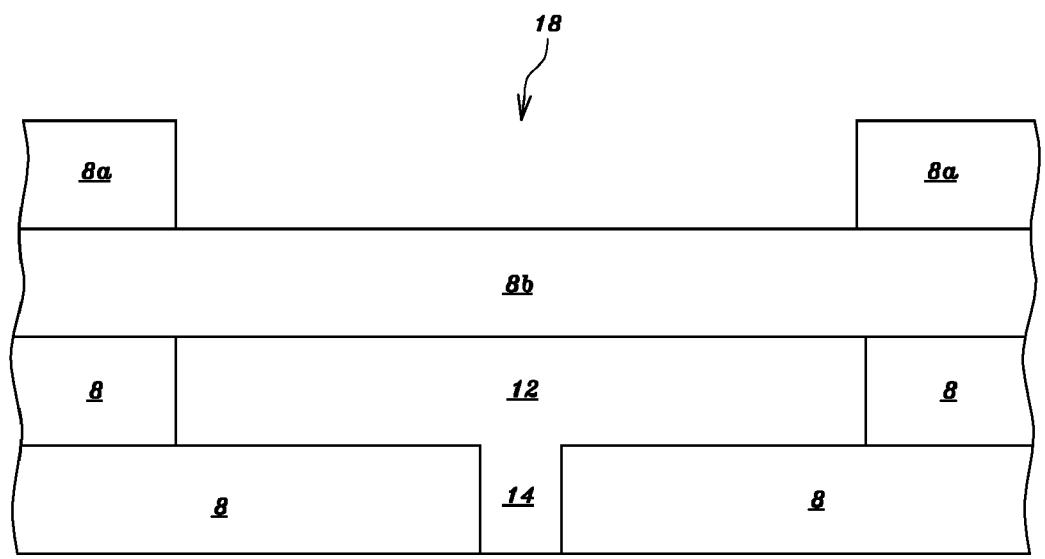
Figure 1G:
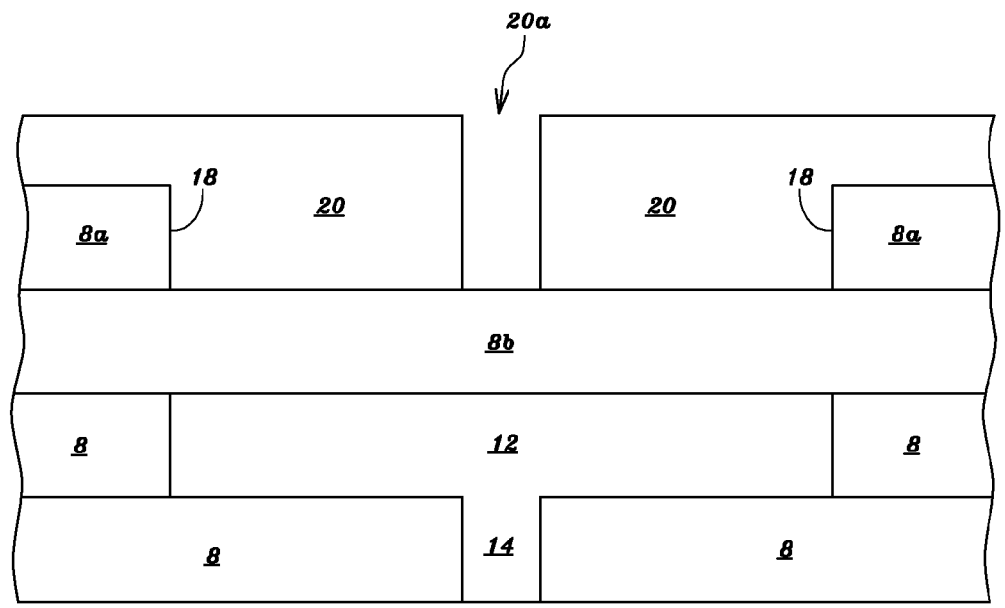
Figure 1H:
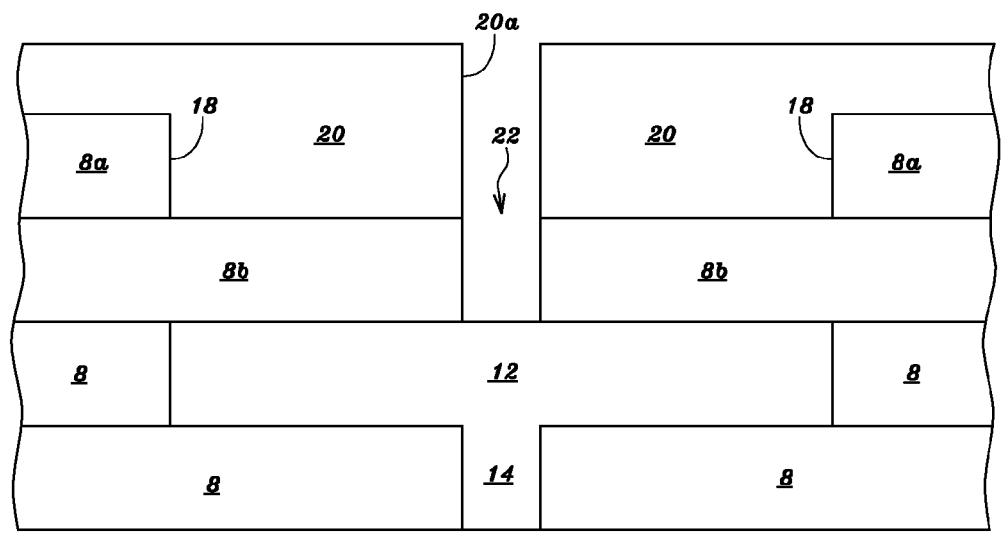
Figure 1I:
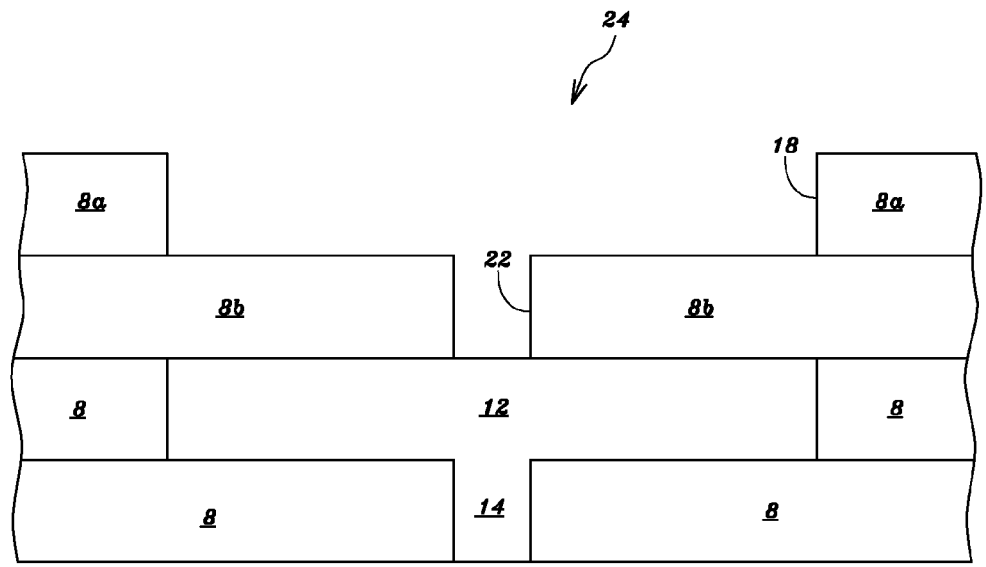
Figure 1J:
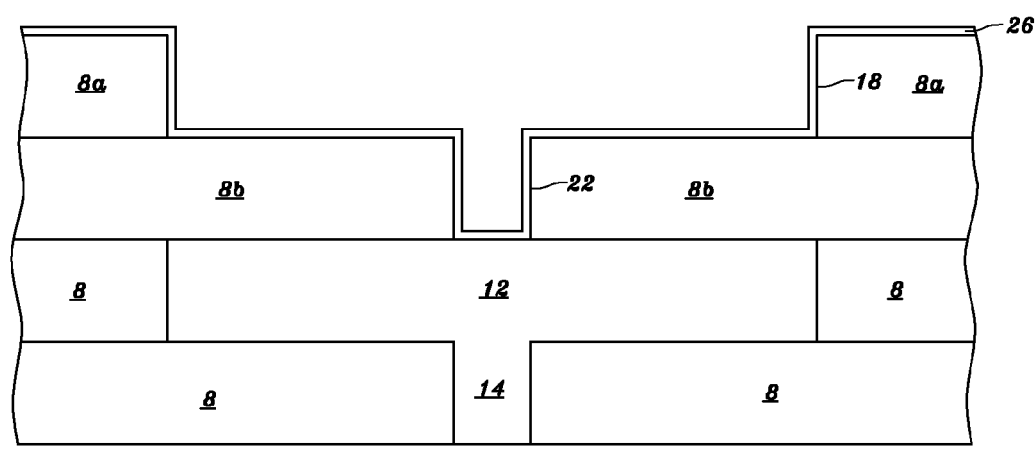
Figure 1K:
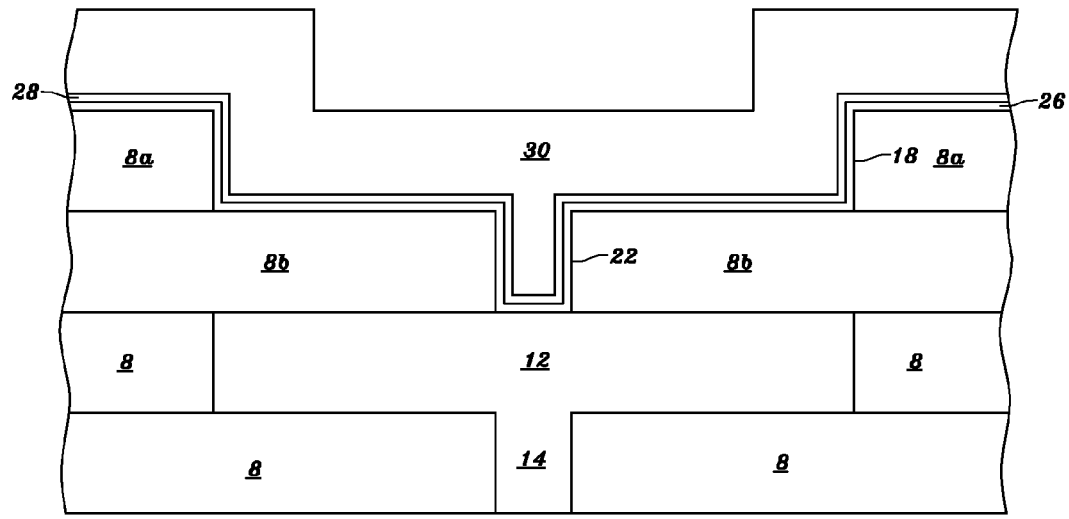
Figure 1L:
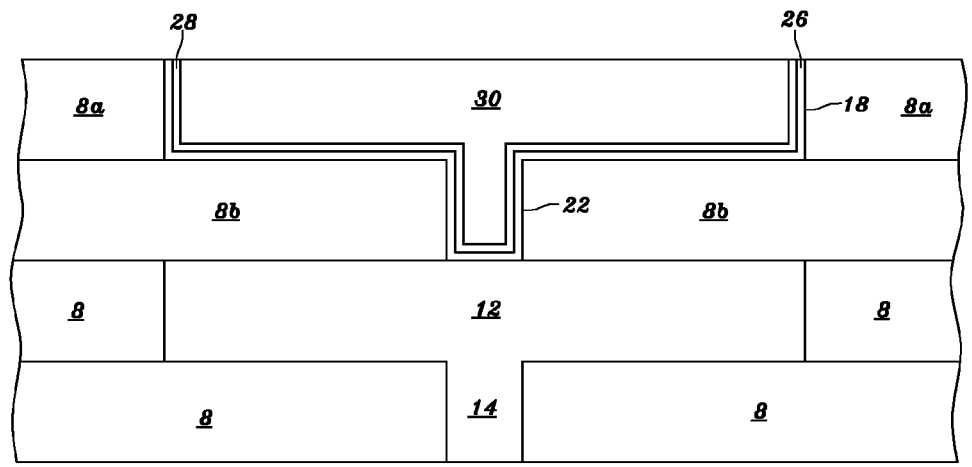

The metallization structure may be formed by a damascene process. In the following, a damascene process for forming one pattern metal layer 12 and one metal plug 14 are illustrated. The damascene process can be referred to as forming multiple pattern metal layers 12 and multiple metal plugs 14 in the metallization structure. Referring to FIG. 1C, multiple dielectric layers 8 in FIGS. 1A and 1B include two dielectric layers 8a and 8b. The dielectric layer 8a is formed on the dielectric layer 8b by a chemical vapor deposition (CVD) process or a spin-on coating process, wherein each of the dielectric layers 8a and 8b may be composed of a low-K oxide layer with a thickness of between 0.3 and 2 μm, and preferably of between 0.5 and 1 μm, and an oxynitride layer on the low-K oxide layer, of a low-K polymer layer with a thickness of between 0.3 and 2 μm, and preferably of between 0.5 and 1 μm, and an oxynitride layer on the low-K polymer layer, of a low-K oxide layer with a thickness of between 0.3 and 2 μm, and preferably of between 0.5 and 1 μm, and a nitride layer on the low-K oxide layer, of a low-K polymer layer with a thickness of between 0.3 and 2 μm, and preferably of between 0.5 and 1 μm, and a nitride layer on the low-K polymer layer, or of a low-K dielectric layer with a thickness of between 0.3 and 2 μm, and preferably of between 0.5 and 1 μm, and a nitride-containing layer on the low-K dielectric layer. Next, referring to FIG. 1D, a photoresist layer 16 is formed on the dielectric layer 8a, an opening 16a in the photoresist layer 16 exposing the dielectric layer 8a. Next, referring to FIG. 1E, the dielectric layer 8a under the opening 16a is removed by a dry etching method to form a trench 18 in the dielectric layer 8a exposing the dielectric layer 8b. Next, referring to FIG. 1F, after forming the trench 18 in the dielectric layer 8a, the photoresist layer 16 is removed. Next, referring to FIG. 1G, a photoresist layer 20 is formed on the dielectric layer 8a and on the dielectric layer 8b exposed by the trench 18, an opening 20a in the photoresist layer 20 exposing the dielectric layer 8b exposed by the trench 18. Next, referring to FIG. 1H, the dielectric layer 8b under the opening 20a is removed by a dry etching method to form a via 22 in the dielectric layer 8b exposing the patterned metal layer 12 of the metallization structure. Next, referring to FIG. 1I, after forming the via 22 in the dielectric layer 8b, the photoresist layer 20 is removed. Thereby, an opening 24 including the trench 18 and the via 22 is formed in the dielectric layers 8a and 8b. Next, referring to FIG. 1J, an adhesion/barrier layer 26 having a thickness of between 20 and 200 angstroms is formed on the patterned metal layer 12 of the metallization structure exposed by the opening 24, on the sidewalls of the opening 24 and on the top surface of the dielectric layer 8a. The adhesion/barrier layer 38 can be formed by a sputtering process or a chemical vapor deposition (CVD) process. The material of the adhesion/barrier layer 26 may include titanium, titanium nitride, a titanium-tungsten alloy, tantalum, tantalum nitride, or a composite of the abovementioned materials. For example, the adhesion/barrier layer 26 may be formed by sputtering a tantalum layer on the metallization structure exposed by the opening 24, on the sidewalls of the opening 24 and on the top surface of the dielectric layer 8a. Alternatively, the adhesion/barrier layer 26 may be formed by sputtering a tantalum-nitride layer on the metallization structure exposed by the opening 24, on the sidewalls of the opening 24 and on the top surface of the dielectric layer 8a. Alternatively, the adhesion/barrier layer 26 may be formed by forming a tantalum-nitride layer on the metallization structure exposed by the opening 24, on the sidewalls of the opening 24 and on the top surface of the dielectric layer 8a by a chemical vapor deposition (CVD) process. Next, referring to FIG. 1K, a seed layer 28, made of copper, having a thickness of between 50 and 500 angstroms is formed on the adhesion/barrier layer 26 using a sputtering process or a chemical vapor deposition (CVD) process, and then a copper layer 30 having a thickness of between 0.5 and 5 μm, and preferably of between 1 and 2 μm, is electroplated on the seed layer 28. Next, referring to FIG. 1L, the copper layer 30, the seed layer 28 and the adhesion/barrier layer 26 outside the opening 24 in the dielectric layers 8a and 8b are removed using a chemical mechanical polishing (CMP) process until the top surface of the dielectric layer 8a is exposed to an ambient. Thereby, the patterned metal layer 12 is composed of the adhesion/barrier layer 26, the seed layer 28 and the copper layer 30 formed in the trench 18, and the metal plug 14 is composed of the adhesion/barrier layer 26, the seed layer 28 and the copper layer 30 formed in the via 22. The patterned metal layer 12 can be connected to the semiconductor device 6 through the metal plug 14 inside the dielectric layer 8, and the neighboring patterned metal layers 12 are interconnected through the metal plugs 14 inside the dielectric layer 8.

Referring to FIG. 1A, alternatively, the patterned metal layer 12 may be formed by a process including sputtering an adhesion/barrier layer with a thickness of between 500 and 1500 angstroms on an insulating layer, such as silicon oxide, next sputtering an aluminum-alloy layer, containing more than 90 wt. % of aluminum and less than 10 wt. % of copper, having a thickness between 0.2 and 2 micrometers on the adhesion/barrier layer, next sputtering an anti-reflection layer, such as a titanium-nitride layer, with a thickness of between 200 and 600 angstroms on the aluminum-alloy layer, next forming a photoresist layer on the anti-reflection layer, next patterning the photoresist layer using a photolithography process, next etching the adhesion/barrier layer, the aluminum-alloy layer and the anti-reflection layer not under the patterned photoresist layer using the patterned photoresist layer as an etching mask, and then removing the patterned photoresist layer. The material of the adhesion/barrier layer may include titanium, titanium nitride, a titanium-tungsten alloy, tantalum, tantalum nitride, or a composite of the abovementioned materials.

Referring to FIGS. 1A and 1B, the dielectric layers 8 are located over the semiconductor substrate 4 and interposed respectively between the neighboring patterned metal layers 12, and the neighboring patterned metal layers 12 are interconnected through the metal plugs 14 inside the dielectric layer 8. The dielectric layers 8 are commonly formed by a chemical vapor deposition (CVD) process. The material of the dielectric layers 8 may include silicon oxide, silicon oxynitride, TEOS (Tetraethoxysilane), a compound containing silicon, carbon, oxygen and hydrogen (such as $Si_wC_xO_yH_z$), silicon nitride (such as $Si_3N_4$), FSG (Fluorinated Silicate Class), Black Diamond, SiLK, a porous silicon oxide, a porous compound containing nitrogen, oxygen and silicon, SOG (Spin-On Glass), BPSG (borophosphosilicate glass), a polyarylene ether, PBO (Polybenzoxazole), or a material having a low dielectric constant (K) of between 1.5 and 3, for example. The dielectric layer 8 between the neighboring patterned metal layers 12 has a thickness t2 of less than 3 micrometers, such as between 0.3 and 3 μm or between 0.3 and 2.5 μm.

Referring to FIGS. 1A and 1B, the passivation layer 10 is formed over the semiconductor devices 6, over the metallization structure (including the metal layers 12 and the metal plugs 14) and over the dielectric layers 8. The passivation layer 10 can protect the semiconductor devices 6 and the metallization structure from being damaged by moisture and foreign ion contamination. In other words, mobile ions (such as sodium ion), transition metals (such as gold, silver and copper) and impurities can be prevented from penetrating through the passivation layer 10 to the semiconductor devices 6, such as transistors, polysilicon resistor elements and polysilicon-polysilicon capacitor elements, and to the metallization structure.

The passivation layer 10 is commonly made of silicon oxide (such as $SiO_2$), silicon oxynitride, silicon nitride (such as $Si_3N_4$) or PSG (phosphosilicate glass). The passivation layer 10 on a pad 32 of the metallization structure and on the topmost metal layer 12 of the metallization structure commonly has a thickness t3 of more than 0.3 μm, such as between 0.3 and 2 μm or between 0.3 and 1.5 μm. In a preferred case, the silicon nitride layer in the passivation layer 10 has a thickness of more than 0.3 μm. Ten methods for depositing the passivation layer 10 are described as below.

In a first method, the passivation layer 10 is formed by depositing a silicon oxide layer with a thickness of between 0.2 and 1.2 μm using a CVD method and then depositing a silicon nitride layer with a thickness of 0.2 and 1.2 μm on the silicon oxide layer using a CVD method.

In a second method, the passivation layer 10 is formed by depositing a silicon oxide layer with a thickness of between 0.2 and 1.2 μm using a CVD method, next depositing a silicon oxynitride layer with a thickness of between 0.05 and 0.15 μm on the silicon oxide layer using a Plasma Enhanced CVD (PECVD) method, and then depositing a silicon nitride layer with a thickness of between 0.2 and 1.2 μm on the silicon oxynitride layer using a CVD method.

In a third method, the passivation layer 10 is formed by depositing a silicon oxynitride layer with a thickness of between 0.05 and 0.15 μm using a CVD method, next depositing a silicon oxide layer with a thickness of between 0.2 and 1.2 μm on the silicon oxynitride layer using a CVD method, and then depositing a silicon nitride layer with a thickness of between 0.2 and 1.2 μm on the silicon oxide layer using a CVD method.

In a fourth method, the passivation layer 10 is formed by depositing a first silicon oxide layer with a thickness of between 0.2 and 0.5 μm using a CVD method, next depositing a second silicon oxide layer with a thickness of between 0.5 and 1 μm on the first silicon oxide layer using a spin-coating method, next depositing a third silicon oxide layer with a thickness of between 0.2 and 0.5 μm on the second silicon oxide layer using a CVD method, and then depositing a silicon nitride layer with a thickness of 0.2 and 1.2 μm on the third silicon oxide using a CVD method.

In a fifth method, the passivation layer 10 is formed by depositing a silicon oxide layer with a thickness of between 0.5 and 2 μm using a High Density Plasma CVD (HDP-CVD) method and then depositing a silicon nitride layer with a thickness of 0.2 and 1.2 μm on the silicon oxide layer using a CVD method.

In a sixth method, the passivation layer 10 is formed by depositing an Undoped Silicate Glass (USG) layer with a thickness of between 0.2 and 3 μm, next depositing an insulating layer of TEOS, PSG or BPSG (borophosphosilicate glass) with a thickness of between 0.5 and 3 μm on the USG layer, and then depositing a silicon nitride layer with a thickness of 0.2 and 1.2 μm on the insulating layer using a CVD method.

In a seventh method, the passivation layer 10 is formed by optionally depositing a first silicon oxynitride layer with a thickness of between 0.05 and 0.15 μm using a CVD method, next depositing a silicon oxide layer with a thickness of between 0.2 and 1.2 μm on the first silicon oxynitride layer using a CVD method, next optionally depositing a second silicon oxynitride layer with a thickness of between 0.05 and 0.15 μm on the silicon oxide layer using a CVD method, next depositing a silicon nitride layer with a thickness of between 0.2 and 1.2 μm on the second silicon oxynitride layer or on the silicon oxide using a CVD method, next optionally depositing a third silicon oxynitride layer with a thickness of between 0.05 and 0.15 μm on the silicon nitride layer using a CVD method, and then depositing a silicon oxide layer with a thickness of between 0.2 and 1.2 μm on the third silicon oxynitride layer or on the silicon nitride layer using a CVD method.

In a eighth method, the passivation layer 10 is formed by depositing a first silicon oxide layer with a thickness of between 0.2 and 1.2 μm using a CVD method, next depositing a second silicon oxide layer with a thickness of between 0.5 and 1 μm on the first silicon oxide layer using a spin-coating method, next depositing a third silicon oxide layer with a thickness of between 0.2 and 1.2 μm on the second silicon oxide layer using a CVD method, next depositing a silicon nitride layer with a thickness of between 0.2 and 1.2 μm on the third silicon oxide layer using a CVD method, and then depositing a fourth silicon oxide layer with a thickness of between 0.2 and 1.2 μm on the silicon nitride layer using a CVD method.

In a ninth method, the passivation layer 10 is formed by depositing a first silicon oxide layer with a thickness of between 0.5 and 2 μm using a HDP-CVD method, next depositing a silicon nitride layer with a thickness of between 0.2 and 1.2 μm on the first silicon oxide layer using a CVD method, and then depositing a second silicon oxide layer with a thickness of between 0.5 and 2 μm on the silicon nitride using a HDP-CVD method.

In a tenth method, the passivation layer 10 is formed by depositing a first silicon nitride layer with a thickness of between 0.2 and 1.2 μm using a CVD method, next depositing a silicon oxide layer with a thickness of between 0.2 and 1.2 μm on the first silicon nitride layer using a CVD method, and then depositing a second silicon nitride layer with a thickness of between 0.2 and 1.2 μm on the silicon oxide layer using a CVD method.

An opening 10a in the passivation layer 10 exposes a contact point 33 of a pad 32 of the metallization structure used to input or output signals or to be connected to a power source or a ground reference. In practical, a plurality of the openings 10a can be formed in the passivation layer 10, exposing a plurality of the pads 32, respectively. The pad 32 may have a thickness t4 of between 0.5 and 3 μm, and the pad 32 is connected to the semiconductor device 6 through the metal layers 12 and the metal plugs 14. For example, the pad 32 may be composed of a sputtered aluminum layer or a sputtered aluminum-copper-alloy layer with a thickness of between 0.5 and 3 μm. Alternatively, the pad 32 may include an electroplated copper layer with a thickness of between 0.5 and 3 μm, and a barrier layer, such as tantalum or tantalum nitride, on a bottom surface and side walls of the electroplated copper layer.

Therefore, the pad 32 can be an aluminum pad, principally made of sputtered aluminum with a thickness of between 0.5 and 3 μm. Alternatively, the pad 32 can be a copper pad, principally made of electroplated copper with a thickness of between 0.5 and 3 μm.

The opening 10a may have a transverse dimension d1, from a top view, of between 0.5 and 20 μm or between 20 and 200 μm. The shape of the opening 10a from a top view may be a circle, and the diameter of the circle-shaped opening 10a may be between 0.5 and 20 μm or between 20 and 200 μm. Alternatively, the shape of the opening 10a from a top view may be a square, and the width of the square-shaped opening 10a may be between 0.5 and 20 μm or between 20 and 200 μm. Alternatively, the shape of the opening 10a from a top view may be a polygon, such as hexagon or octagon, and the polygon-shaped opening 10a may have a width of between 0.5 and 20 μm or between 20 and 200 μm. Alternatively, the shape of the opening 10a from a top view may be a rectangle, and the rectangle-shaped opening 10a may have a shorter width of between 0.5 and 20 μm or between 20 and 200 μm. Further, there may be some of the semiconductor devices 6 under the pad 32 exposed by the opening 10a. Alternatively, there may be no active devices under the pad 32 exposed by the opening 10a.

Referring to FIG. 1B, a metal cap 34, acting as a pad, having a thickness of between 0.4 and 5 μm, and preferably of between 0.4 and 2 μm, can be optionally formed on the contact point 33 of the pad 32 exposed by the opening 10a in the passivation layer 10 to prevent the pad 32 from being oxidized or contaminated. In practical, a plurality of the metal caps 34 can be formed on a plurality of the pads 32, respectively. The material of the metal cap 34 may include aluminum, an aluminum-copper alloy, an Al—Si—Cu alloy or gold. For example, when the pad 32 is a copper pad, the metal cap 34 including aluminum is used to protect the copper pad 32 from being oxidized. The metal cap 34 may comprise a barrier layer having a thickness of between 0.01 and 0.5 μm on the pad 32. The barrier layer may be made of titanium, titanium nitride, titanium-tungsten alloy, tantalum, tantalum nitride, chromium or nickel.

For example, the metal cap 34 may include a tantalum-containing layer, such as tantalum layer or tantalum-nitride layer, having a thickness of between 0.01 and 0.5 μm on the pad 32, principally made of electroplated copper, exposed by the opening 10a, and an aluminum-containing layer, such as aluminum layer or aluminum-copper-alloy layer, having a thickness of between 0.4 and 3 μm on the tantalum-containing layer. Alternatively, the metal cap 34 may include a titanium-containing layer, such as titanium layer or titanium-tungsten-alloy layer, having a thickness of between 0.01 and 0.7 μm, and preferably of between 0.03 and 0.35 μm, on the pad 32, principally made of electroplated copper, exposed by the opening 10a, a sputtered gold layer having a thickness of between 0.03 and 1 μm, and preferably of between 0.05 and 0.2 μm, on the titanium-containing layer, and an electroplated gold layer having a thickness of between 1 and 5 μm on the sputtered gold layer. Alternatively, the metal cap 34 may be a gold layer having a thickness of between 0.4 and 5 μm on the pad 32, principally made of electroplated copper, exposed by the opening 10a. Alternatively, the metal cap 34 may include a nickel layer having a thickness of between 0.3 and 2 μm on the pad 32, principally made of electroplated copper, exposed by the opening 10a, and a gold layer having a thickness of between 0.4 and 3 μm on the nickel layer.

The semiconductor substrate 4, the metallization structure, the dielectric layer 8, the passivation layer 10 and the pad 32 are described in the above paragraphs. Below, the integrated circuit (IC) scheme 36 under the passivation layer 10 may be any one of the structures shown in FIGS. 1A and 1B under the passivation layer 10; the IC scheme 36 represents the combination of the semiconductor substrate 4, the semiconductor devices 6, the metallization structure (including the metal layers 12 and the metal plugs 14) and the dielectric layers 8 in FIG. 1A and FIG. 1B.

Embodiment 1

Referring to FIG. 2A, an adhesion/barrier layer 38 having a thickness of between 0.02 and 0.5 μm, and preferably of between 0.25 and 0.35 μm, can be formed on the passivation layer 10 and on the pads 32, such as aluminum pads or copper pads, exposed by the openings 10a. The adhesion/barrier layer 38 can be formed by a physical vapor deposition (PVD) process, such as a sputtering process or an evaporation process, or a chemical vapor deposition (CVD) process. The material of the adhesion/barrier layer 38 may include titanium, a titanium-tungsten alloy, titanium nitride, chromium, tantalum, tantalum nitride or a composite of the abovementioned materials. In a case, the adhesion/barrier layer 38 can be formed by sputtering a titanium-tungsten-alloy layer with a thickness of between 0.02 and 0.5 μm, and preferably of between 0.25 and 0.35 μm, on the passivation layer 10 and on the pads 32, such as aluminum pads or copper pads, exposed by the openings 10a. In another case, the adhesion/barrier layer 38 can be formed by sputtering a titanium layer with a thickness of between 0.02 and 0.5 μm, and preferably of between 0.25 and 0.35 μm, on the passivation layer 10 and on the pads 32, such as aluminum pads or copper pads, exposed by the openings 10a. In another case, the adhesion/barrier layer 38 can be formed by sputtering a tantalum-nitride layer with a thickness of between 0.02 and 0.5 μm, and preferably of between 0.25 and 0.35 μm, on the passivation layer 10 and on the pads 32, such as aluminum pads or copper pads, exposed by the openings 10a. In another case, the adhesion/barrier layer 38 can be formed by sputtering a tantalum layer with a thickness of between 0.02 and 0.5 μm, and preferably of between 0.25 and 0.35 μm, on the passivation layer 10 and on the pads 32, such as aluminum pads or copper pads, exposed by the openings 10a. In another case, the adhesion/barrier layer 38 can be formed by sputtering a titanium layer on the passivation layer 10 and on the pads 32, such as aluminum pads or copper pads, exposed by the openings 10a, and then sputtering a titanium-tungsten-alloy layer on the titanium layer. The adhesion/barrier layer 38 is used to prevent the occurrence of interdiffusion between metal layers and to provide good adhesion between the metal layers.

Next, a seed layer 40, made of copper, having a thickness of between 0.03 and 1 μm, and preferably of between 0.05 and 0.2 μm, can be formed on the adhesion/barrier layer 38. The seed layer 40 can be formed by a physical vapor deposition (PVD) process, such as a sputtering process or an evaporation process, or a chemical vapor deposition (CVD) process. The seed layer 40 is beneficial to electroplating a metal layer thereon.

For example, when the adhesion/barrier layer 38 is formed by sputtering a titanium layer with a thickness of between 0.02 and 0.5 μm, and preferably of between 0.25 and 0.35 μm, the seed layer 40 can be formed by sputtering a copper layer with a thickness of between 0.03 and 1 μm, and preferably of between 0.05 and 0.2 μm, on the titanium layer. When the adhesion/barrier layer 38 is formed by sputtering a titanium-tungsten-alloy layer with a thickness of between 0.02 and 0.5 μm, and preferably of between 0.25 and 0.35 μm, the seed layer 40 can be formed by sputtering a copper layer with a thickness of between 0.03 and 1 μm, and preferably of between 0.05 and 0.2 μm, on the titanium-tungsten-alloy layer. When the adhesion/barrier layer 38 is formed by sputtering a tantalum layer with a thickness of between 0.02 and 0.5 µm, and preferably of between 0.25 and 0.35 µm, the seed layer 40 can be formed by sputtering a copper layer with a thickness of between 0.03 and 1 µm, and preferably of between 0.05 and 0.2 µm, on the tantalum layer. When the adhesion/barrier layer 38 is formed by sputtering a tantalum-nitride layer with a thickness of between 0.02 and 0.5 µm, and preferably of between 0.25 and 0.35 µm, the seed layer 40 can be formed by sputtering a copper layer with a thickness of between 0.03 and 1 µm, and preferably of between 0.05 and 0.2 µm, on the tantalum-nitride layer. When the adhesion/barrier layer 38 is formed by sputtering a titanium layer and then sputtering a titanium-tungsten-alloy layer on the titanium layer, the seed layer 40 can be formed by sputtering a copper layer with a thickness of between 0.03 and 1 µm, and preferably of between 0.05 and 0.2 µm, on the titanium-tungsten-alloy layer.

Referring to FIG. 2B, a photoresist layer 42, such as positive-type photoresist layer, having a thickness of between 10 and 40 micrometers, and preferably of between 15 and 25 micrometers, is spin-on coated on the seed layer 40. Next, the photoresist layer 42 is patterned with the processes of exposure and development to form openings 42a in the photoresist layer 42 exposing the seed layer 40. A 1× stepper or 1× contact aligner can be used to expose the photoresist layer 42 during the process of exposure.

For example, the photoresist layer 42 can be formed by spin-on coating a positive-type photosensitive polymer layer having a thickness of between 10 and 40 µm, and preferably of between 15 and 25 µm, on the seed layer 40, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 40 with an $O_2$ plasma or a plasma containing fluorine of below 200 PPM and oxygen, such that the photoresist layer 42 can be patterned with the openings 42a in the photoresist layer 42 exposing the seed layer 40.

Figure 2C:
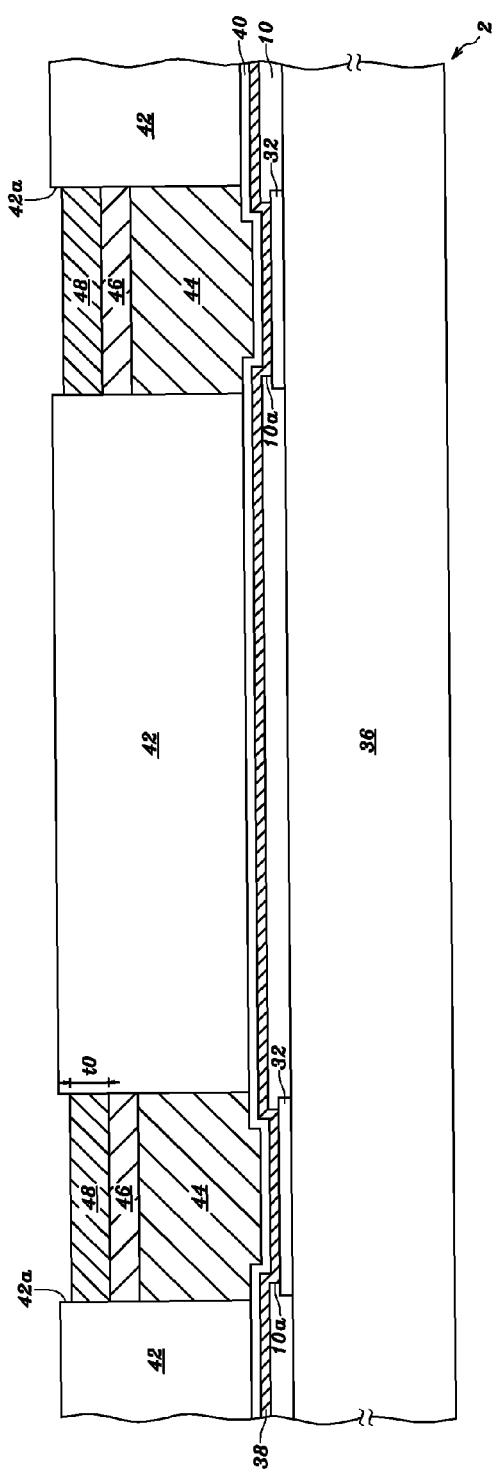

Referring to FIG. 2C, a copper layer 44 having a thickness of between 5 and 30 micrometers, and preferably of between 10 and 20 micrometers, is electroplated on the seed layer 40 exposed by the openings 42a. Next, a nickel layer 46 having a thickness of between 0.1 and 5 micrometers, and preferably of between 0.2 and 2 micrometers, can be electroplated on the electroplated copper layer 44 in the openings 42a. Next, a gold layer 48 having a thickness t0 of between 1 and 10 micrometers, and preferably of between 3 and 6 micrometers, can be electroplated on the nickel layer 46 in the openings 42a with a non-cyanide electroplating solution, such as a solution containing gold sodium sulfite ($Na_3Au(SO_3)_2$) or a solution containing gold ammonium sulfite (($NH_4)_3[Au(SO_3)_2]$), or with an electroplating solution containing cyanide. The nickel layer 46 can be replaced by a cobalt layer having a thickness of between 0.1 and 5 µm, and preferably of between 0.2 and 2 µm. The gold layer 48 can be replaced by a silver layer having a thickness of between 1 and 10 µm, and preferably of between 3 and 6 µm.

Figure 2D:
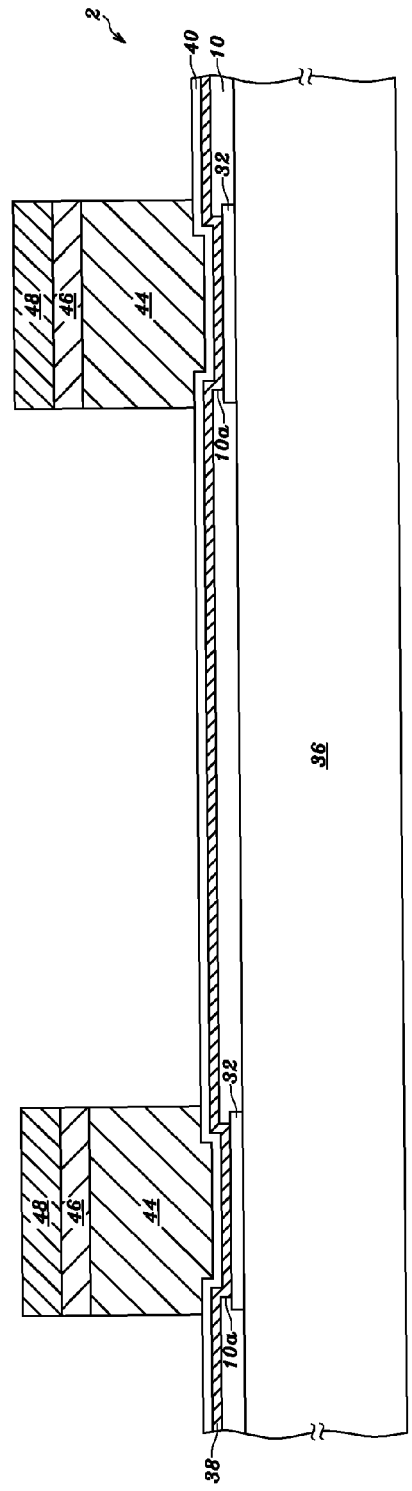

Referring to FIG. 2D, after the gold layer 48 is formed, most of the photoresist layer 42 can be removed using an organic solution with amide. However, some residuals from the photoresist layer 42 could remain on the gold layer 48 and on the seed layer 40. Thereafter, the residuals can be removed from the gold layer 48 and from the seed layer 40 with a plasma, such as $O_2$ plasma or plasma containing fluorine of below 200 PPM and oxygen.

Figure 2E:
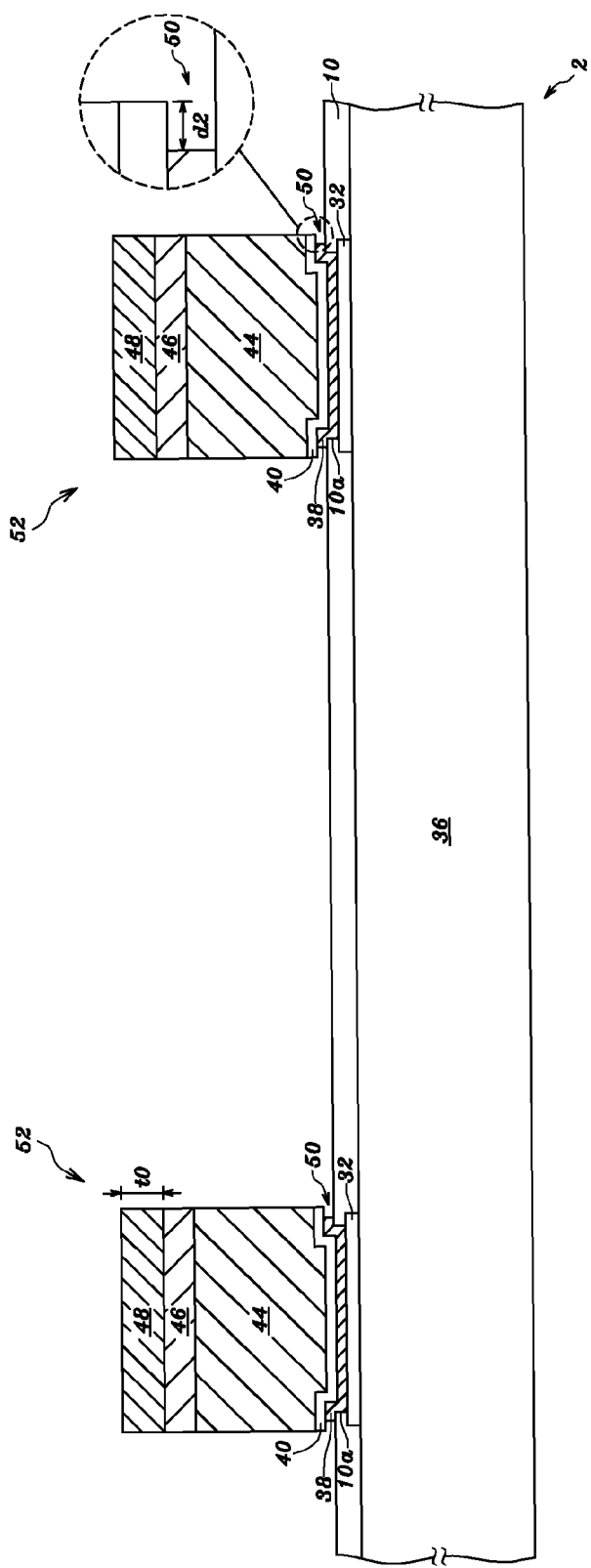

Referring to FIG. 2E, the seed layer 40 and the adhesion/barrier layer 38 not under the electroplated copper layer 44 are subsequently removed with a wet etching method or a dry etching method, such as an Ar sputtering etching process. As to the wet etching method, the seed layer 40, made of copper, can be etched with a solution containing $NH_4OH$ or with a solution containing $H_2SO_4$. When the adhesion/barrier layer 38 is a titanium-tungsten-alloy layer, it can be etched with a solution containing hydrogen peroxide or with a solution containing $NH_4OH$ and hydrogen peroxide; when the adhesion/barrier layer 38 is a titanium layer, it can be etched with a solution containing hydrogen fluoride or with a solution containing $NH_4OH$ and hydrogen peroxide.

Multiple undercuts 50 are formed under the seed layer 40 and under the electroplated copper layer 44 when the adhesion/barrier layer 38 not under the electroplated copper layer 44 is removed using a wet etching method. The adhesion/barrier layer 38 under the electroplated copper layer 44 has a first sidewall recessed from a second sidewall of the seed layer 40, wherein a distance d2 between the first sidewall and the second sidewall is between 0.3 and 2 micrometers.

Thereby, in the present invention, multiple metal bumps 52 can be formed, respectively, on the pads 32, such as aluminum pads or copper pads, exposed by the openings 10a. The metal bumps 52 can be formed of the adhesion/barrier layer 38 on the pads 32, a copper layer (including the seed layer 40 and the electroplated copper layer 44), having a thickness of between 5 and 30 micrometers, and preferably of between 10 and 20 micrometers, on the adhesion/barrier layer 38, the nickel layer 46 on the copper layer and the gold layer 48 on the nickel layer 46.

Figure 2F:
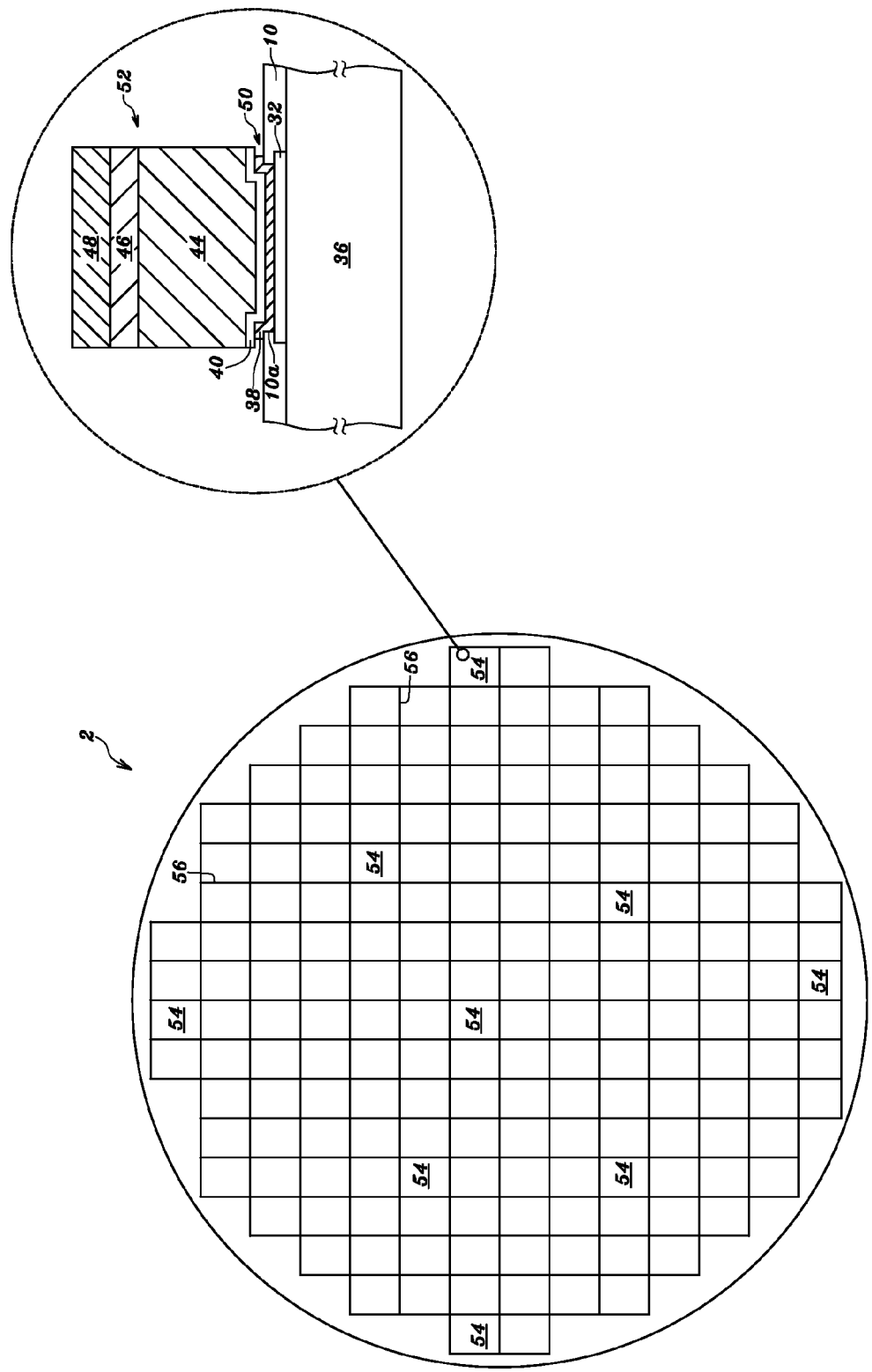
FIG. 2F is a top view showing a semiconductor wafer with multiple metal bumps.

After the metal bumps 52 are formed, the semiconductor wafer 2 can be cut into multiple chips 54. The detail can be referred as to FIG. 2F. Referring to FIG. 2F, the semiconductor wafer 2 includes multiple semiconductor chips 54 with scribe lines 56 between neighboring two of the semiconductor chips 54. The metal bumps 52 are on the pads 32, of each semiconductor chips 54, exposed by the openings 10a. In a wafer dicing process, the semiconductor wafer 2 can be cut along the scribe lines 56 to separate the semiconductor chips 54.

TCP (Tape Carrier Package)—Gold to Tin Connection

Figure 2G:
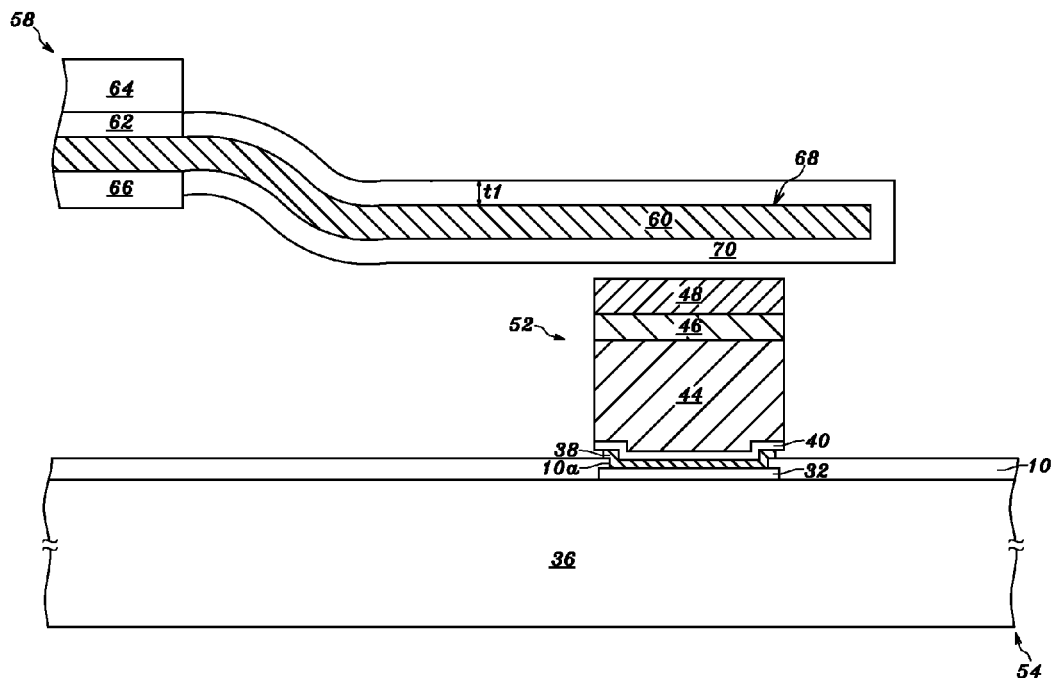

Referring to FIG. 2G, a flexible circuit film 58 includes multiple copper traces 60 (only one of them is shown), an adhesive layer 62 on a top surface of the copper traces 60, a polymer layer 64 on the adhesion layer 62 and a polymer layer 66 on a bottom surface of the copper traces 60. Each of the copper traces 60 has an inner lead 68, uncoved by the adhesion layer 62 and the polymer layers 64 and 66, to be joined with the metal bump 52 preformed on the semiconductor chip 54, and an outer lead (not shown), uncoved by the adhesion layer 62 and the polymer layers 64 and 66, to be connected to an external circuit, such as another semiconductor chip, printed circuit board containing a core with glass fiber and multiple circuit layers over and under the core, glass substrate, flexible film containing a polymer layer, such as polyimide, having a thickness of between 30 and 200 µm and a circuit layer on the polymer layer, or ceramic substrate. The inner leads 68 are connected to the outer leads, respectively. The flexible circuit film 58 further includes a tin-containing layer 70, such as pure tin, a tin-silver alloy, a tin-silver-copper alloy or a tin-lead alloy, enclosing the inner leads 68 of the copper traces 60.

The copper traces 60 have a thickness of between 3 and 30 micrometers, and preferably of between 5 and 20 micrometers. The polymer layer 64 having a thickness of between 10 and 100 micrometers, and preferably of between 15 and 75 micrometers, can be polyimide, polyester, polybenzoxazole or epoxy. The polymer layer 66 having a thickness of between 1 and 20 micrometers, and preferably of between 5 and 10 micrometers, can be polyimide, polyester, polybenzoxazole or epoxy. The tin-containing layer 70 has a thickness t1 of between 0.2 and 1 μm, of between 0.4 and 1 μm or of between 0.3 and 0.6 μm.

Figure 2H:
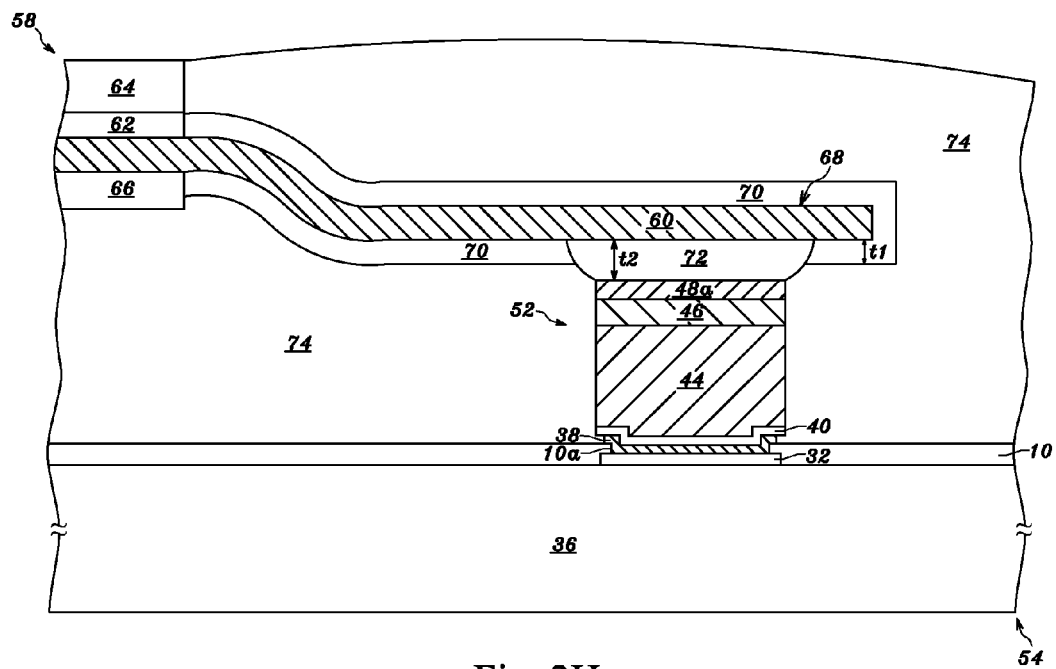

Referring to FIG. 2H, when the flexible circuit film 58 is bonded with the metal bumps 52 (only one of them is shown), the tin-containing layer 70 on a bottom surface of the inner leads 68 (only one of them is shown) can be thermally pressed on the gold layer 48 of the metal bumps 52 at a temperature of between 490 and 540° C., and preferably of between 500 and 520° C., for a time of between 1 and 10 seconds, and preferably of between 3 and 6 seconds. Thereby, a tin-alloy layer 72 containing gold can be formed between the remaining gold layer 48a of the metal bumps 52 and the copper traces 60 of the flexible circuit film 58, wherein the remaining gold layer 48a has a thickness of between 0.2 and 6 micrometers, and preferably of between 1.5 and 4 micrometers. The tin-alloy layer 72 has a thickness t2 of between 0.5 and 10 micrometers, of between 1 and 5 micrometers or of between 1.5 and 3 micrometers. When the tin-containing layer 70 before bonded with the gold layer 48 is pure tin, the tin-alloy layer 72 is tin-gold alloy having a thickness t2 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 70 before bonded with the gold layer 48 is tin-silver alloy, the tin-alloy layer 72 is tin-silver-gold alloy having a thickness t2 of between 0.5 and 10 micrometers, of between 1 and 5 micrometers or of between 1.5 and 3 micrometers. When the tin-containing layer 70 before bonded with the gold layer 48 is tin-silver-copper alloy, the tin-alloy layer 72 is tin-silver-gold-copper alloy having a thickness t2 of between 0.5 and 10 micrometers, of between 1 and 5 micrometers or of between 1.5 and 3 micrometers.

After the metal bumps 52 are connected to the tin-containing layer 70 on the bottom surface of the inner leads 68 using a thermal pressing process, a polymer material 74, such as epoxy, polybenzoxazole or polyimide, can be formed between the semiconductor chip 54 and the tin-containing layer 70 on the bottom surface of the inner leads 68, and enclosing the metal bumps 52. Next, the polymer material 74 is cured at a temperature of between 150 and 250° C.

In the FIGS. 2G and 2H, the copper traces 60 can be replaced by multiple gold traces having a thickness of between 3 and 30 μm, and preferably of between 5 and 20 μm. Alternatively, the copper traces 60 can be replaced by multiple silver traces having a thickness of between 3 and 30 μm, and preferably of between 5 and 20 μm.

TCP (Tape Carrier Package)—Gold to Gold Connection

Figure 2I:
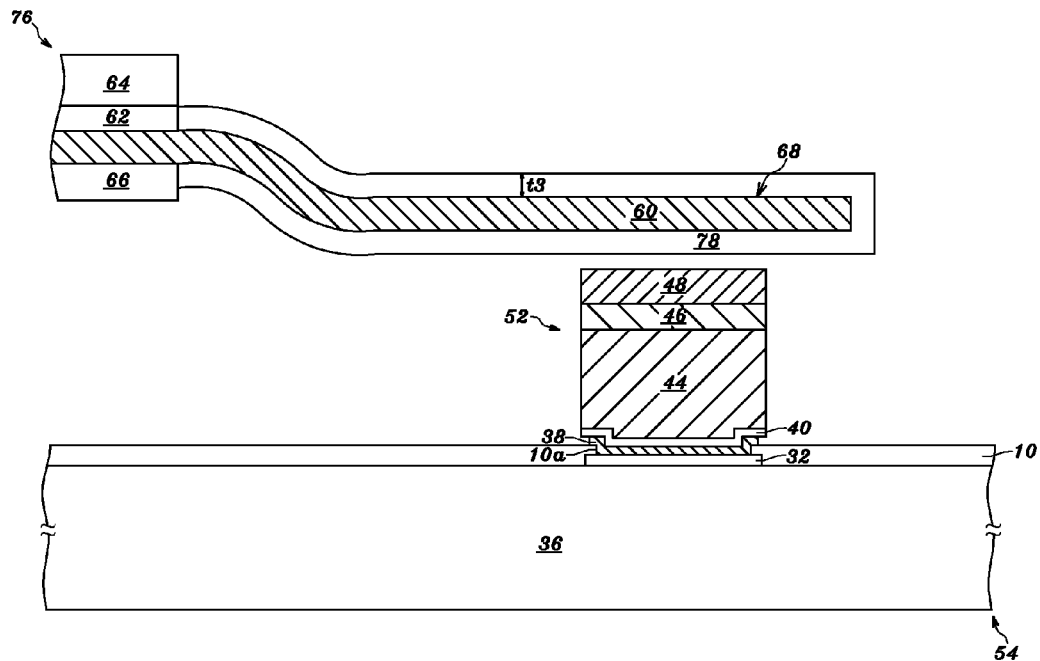

Referring to FIG. 2I, a flexible circuit film 76 includes multiple copper traces 60 (only one of them is shown), an adhesive layer 62 on a top surface of the copper traces 60, a polymer layer 64 on the adhesion layer 62 and a polymer layer 66 on a bottom surface of the copper traces 60. Each of the copper traces 60 has an inner lead 68, uncoved by the adhesion layer 62 and the polymer layers 64 and 66, to be joined with the metal bump 52 preformed on the semiconductor chip 54, and an outer lead (not shown), uncoved by the adhesion layer 62 and the polymer layers 64 and 66, to be connected to an external circuit, such as another semiconductor chip, printed circuit board containing a core with glass fiber and multiple circuit layers over and under the core, glass substrate, flexible film containing a polymer layer, such as polyimide, having a thickness of between 30 and 200 μm and a circuit layer on the polymer layer, or ceramic substrate. The inner leads 68 are connected to the outer leads, respectively. The flexible circuit film 76 further includes a gold layer 78 enclosing the inner leads 68 of the copper traces 60. The specification of the copper traces 60 and the polymer layers 64 and 66 shown in FIGS. 2I-2J can be referred to as the specification of the copper traces 60 and the polymer layers 64 and 66 illustrated in FIG. 2G The gold layer 78 has a thickness t3 of between 0.2 and 1 μm, of between 0.4 and 1 μm or of between 0.3 and 0.6 μm.

Figure 2J:
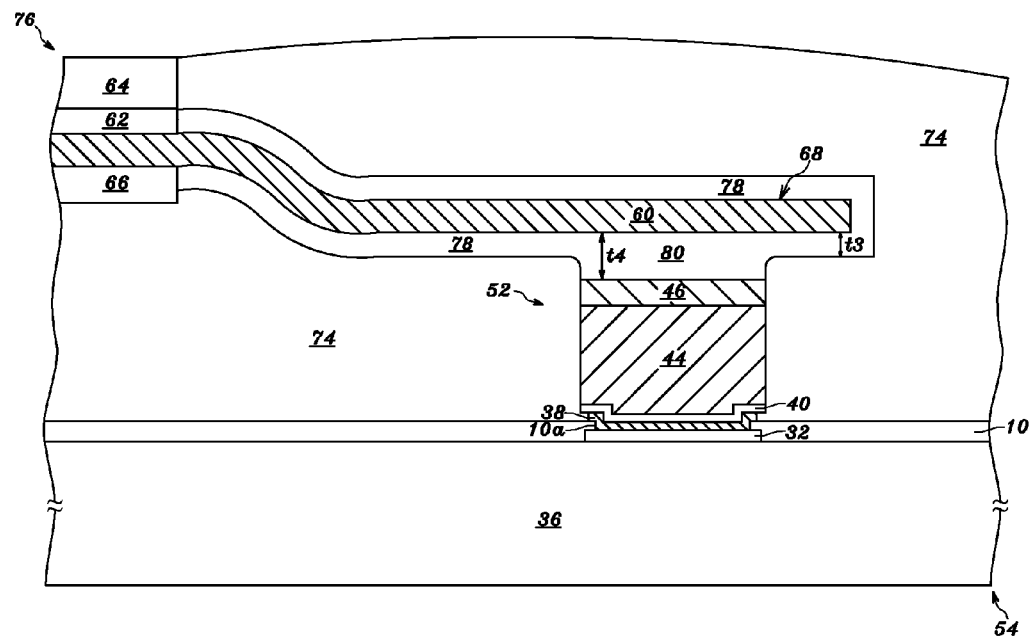

Referring to FIG. 2J, when the flexible circuit film 76 is bonded with the metal bumps 52 (only one of them is shown), the gold layer 78 on a bottom surface of the inner leads 68 (only one of them is shown) can be thermally pressed on the gold layer 48 of the metal bumps 52 at a temperature of between 490 and 540° C., and preferably of between 500 and 520° C., for a time of between 1 and 10 seconds, and preferably of between 3 and 6 seconds. Thereby, a gold layer 80 formed by the joint of the gold layer 78 and the gold layer 48 can be between the nickel layer 46 of the metal bumps 52 and the copper traces 60 of the flexible circuit film 76, wherein the gold layer 80 has a thickness t4 of between 1 and 10 micrometers, and preferably of between 3 and 6 micrometers.

After the metal bumps 52 are connected to the copper traces 60 using a thermal pressing process, a polymer material 74, such as epoxy or polyimide, can be formed between the semiconductor chip 54 and the gold layer 78 on the bottom surface of the inner leads 68, and enclosing the metal bumps 52. Next, the polymer material 74 is cured at a temperature of between 150 and 250° C.

COF (Chip on Film) Package—Gold to Tin Connection

Figure 2K:
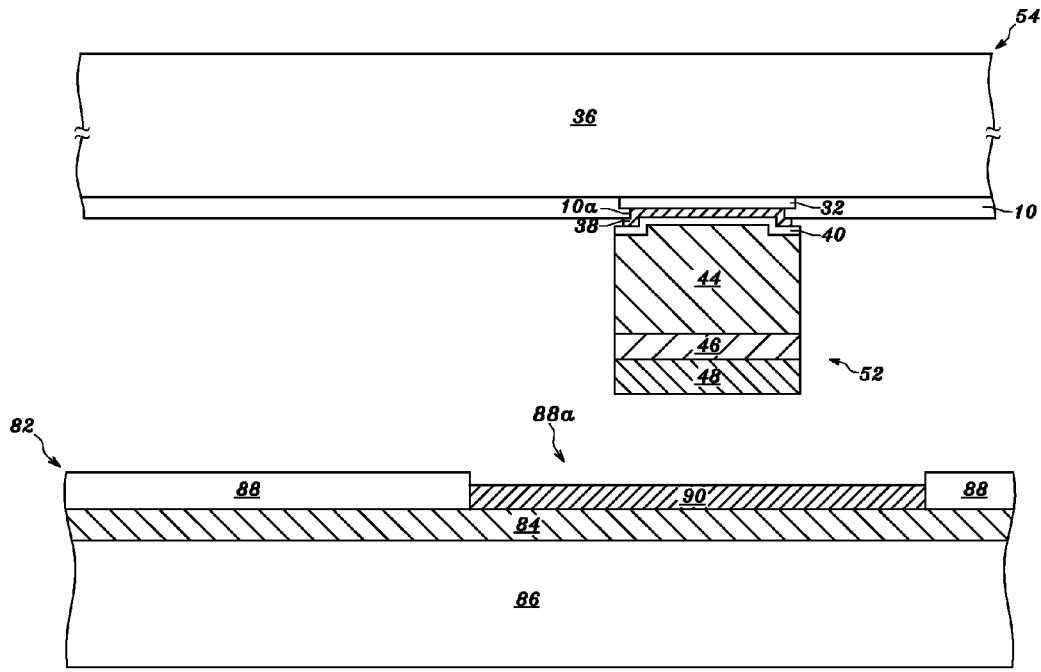

Referring to FIG. 2K, a flexible circuit film 82 includes multiple copper traces 84 (only one of them is shown), a polymer layer 86 on a bottom surface of the copper traces 84, a polymer layer 88 on a top surface of the copper traces 84, multiple openings 88a (only one of them is shown) in the polymer layer 88 exposing the top surface of the copper traces 84, and a tin-containing layer 90, such as pure tin, a tin-silver alloy, a tin-silver-copper alloy or a tin-lead alloy, on the top surface of the copper traces 84 exposed by the openings 88a to be joined with the metal bumps 52 preformed on the semiconductor chip 54. The flexible circuit film 82 is further connected to an external circuit, such as another semiconductor chip, printed circuit board containing a core with glass fiber and multiple circuit layers over and under the core, glass substrate, flexible film containing a polymer layer, such as polyimide, having a thickness of between 30 and 200 μm and a circuit layer on the polymer layer, or ceramic substrate, through the copper traces 84.

The copper traces 84 have a thickness of between 3 and 30 micrometers, and preferably of between 5 and 20 micrometers. The polymer layer 86 having a thickness of between 10 and 100 micrometers, and preferably of between 15 and 75 micrometers, can be polyimide, polyester or epoxy. The polymer layer 88 having a thickness of between 1 and 20 micrometers, and preferably of between 5 and 10 micrometers, can be polyimide, polyester or epoxy. The tin-containing layer 90 has a thickness of between 0.2 and 1 μm, of between 0.4 and 1 μm or of between 0.3 and 0.6 μm.

Figure 2L:
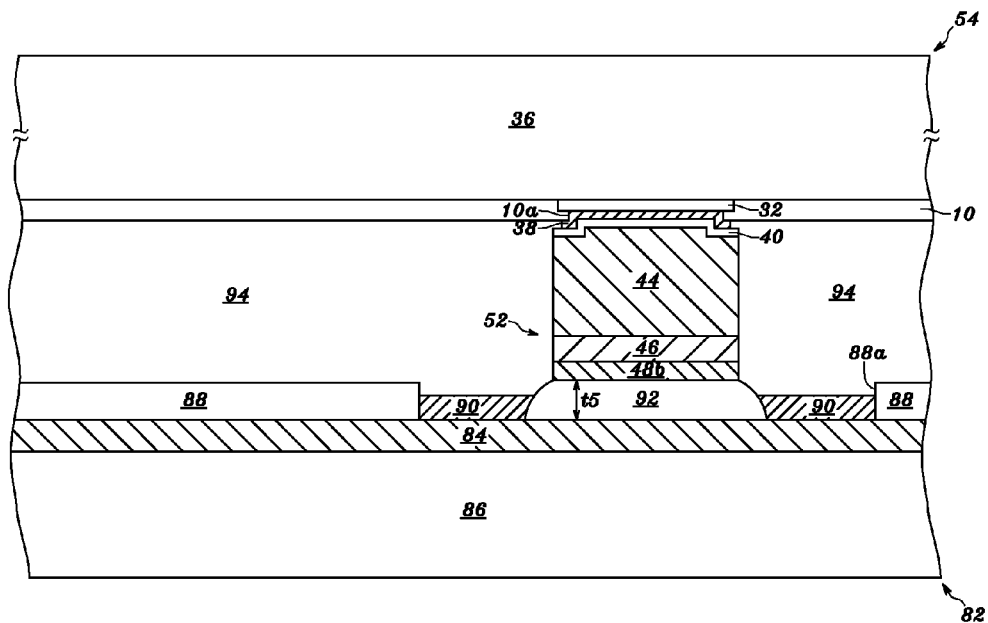

Referring to FIG. 2L, when the flexible circuit film 82 is bonded with the metal bumps 52 (only one of them is shown), the gold layer 48 of the metal bumps 52 can be thermally pressed on the tin-containing layer 90 of the flexible circuit film 82 at a temperature of between 490 and 540° C., and preferably of between 500 and 520° C., for a time of between 1 and 10 seconds, and preferably of between 3 and 6 seconds. Alternatively, when the flexible circuit film 82 is bonded with the metal bumps 52, the tin-containing layer 90 of the flexible circuit film 82 can be thermally pressed on the gold layer 48 of the metal bumps 52 at a temperature of between 490 and 540° C., and preferably of between 500 and 520° C., for a time of between 1 and 10 seconds, and preferably of between 3 and 6 seconds. Thereby, a tin-alloy layer 92 containing gold can be formed between the remaining gold layer 48b of the metal bumps 52 and the copper traces 84 of the flexible circuit film 82, wherein the remaining gold layer 48b has a thickness of between 0.2 and 6 micrometers, and preferably of between 1.5 and 4 micrometers. The tin-alloy layer 92 has a thickness t5 of between 0.5 and 10 micrometers, of between 1 and 5 micrometers or of between 1.5 and 3 micrometers. When the tin-containing layer 90 before bonded with the gold layer 48 is pure tin, the tin-alloy layer 92 is tin-gold alloy having a thickness t5 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 90 before bonded with the gold layer 48 is tin-silver alloy, the tin-alloy layer 92 is tin-silver-gold alloy having a thickness t5 of between 0.5 and 10 micrometers, of between 1 and 5 micrometers or of between 1.5 and 3 micrometers. When the tin-containing layer 90 before bonded with the gold layer 48 is tin-silver-copper alloy, the tin-alloy layer 92 is tin-silver-gold-copper alloy having a thickness t5 of between 0.5 and 10 micrometers, of between 1 and 5 micrometers or of between 1.5 and 3 micrometers.

After the metal bumps 52 are connected to the copper traces 84 using a thermal pressing process, a polymer material 94, such as epoxy or polyimide, can be formed between the passivation layer 10 of the semiconductor chip 54 and the polymer layer 88 of the flexible circuit film 82, and enclosing the metal bumps 52. Next, the polymer material 94 is cured at a temperature of between 150 and 250° C.

In the FIGS. 2K and 2L, the copper traces 84 can be replaced by multiple gold traces having a thickness of between 3 and 30 μm, and preferably of between 5 and 20 μm. Alternatively, the copper traces 84 can be replaced by multiple silver traces having a thickness of between 3 and 30 μm, and preferably of between 5 and 20 μm.

COF (Chip on Film) Package—Gold to Gold Connection

Figure 2M:
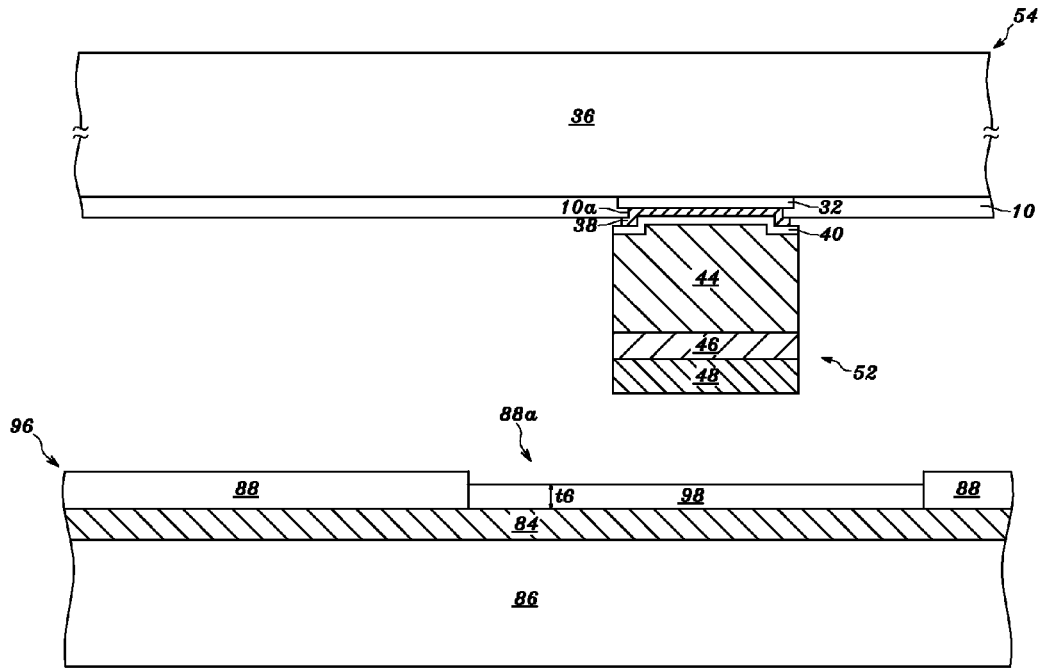

Referring to FIG. 2M, a flexible circuit film 96 includes multiple copper traces 84 (only one of them is shown), a polymer layer 86 on a bottom surface of the copper traces 84, a polymer layer 88 on a top surface of the copper traces 84, multiple openings 88a (only one of them is shown) in the polymer layer 88 exposing the top surface of the copper traces 84, and a gold layer 98 on the top surface of the copper traces 84 exposed by the openings 88a to be joined with the metal bumps 52 preformed on the semiconductor chip 54. The flexible circuit film 96 is further connected to an external circuit, such as another semiconductor chip, printed circuit board containing a core with glass fiber and multiple circuit layers over and under the core, glass substrate, flexible film containing a polymer layer, such as polyimide, having a thickness of between 30 and 200 μm and a circuit layer on the polymer layer, or ceramic substrate, through the copper traces 84. The specification of the copper traces 84 and the polymer layers 86 and 88 shown in FIGS. 2M-2N can be referred to as the specification of the copper traces 84 and the polymer layers 86 and 88 illustrated in FIG. 2K. The gold layer 98 has a thickness t6 of between 0.2 and 1 μm, of between 0.4 and 1 μm or of between 0.3 and 0.6 μm.

Figure 2N:
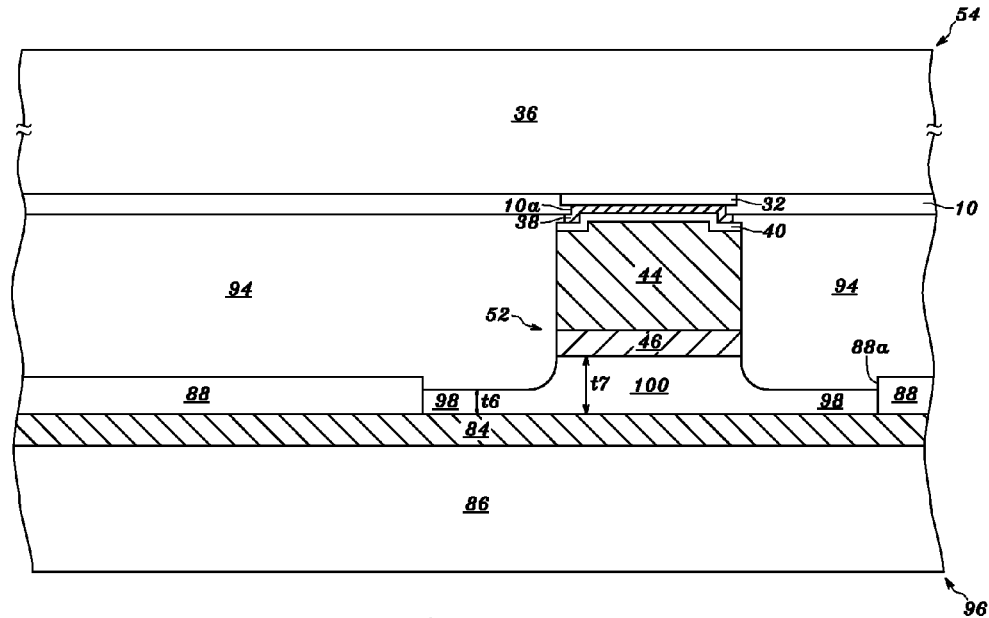

Referring to FIG. 2N, when the flexible circuit film 96 is bonded with the metal bumps 52 (only one of them is shown), the gold layer 48 of the metal bumps 52 can be thermally pressed on the gold layer 98 of the flexible circuit film 96 at a temperature of between 490 and 540° C., and preferably of between 500 and 520° C., for a time of between 1 and 10 seconds, and preferably of between 3 and 6 seconds. Alternatively, when the flexible circuit film 96 is bonded with the metal bumps 52, the gold layer 98 of the flexible circuit film 96 can be thermally pressed on the gold layer 48 of the metal bumps 52 at a temperature of between 490 and 540° C., and preferably of between 500 and 520° C., for a time of between 1 and 10 seconds, and preferably of between 3 and 6 seconds. Thereby, a gold layer 100 formed by the joint of the gold layer 98 and the gold layer 48 can be between the nickel layer 46 of the metal bumps 52 and the copper traces 84 of the flexible circuit film 96, wherein the gold layer 100 has a thickness t7 of between 1 and 10 micrometers, and preferably of between 3 and 6 micrometers.

After the metal bumps 52 are connected to the copper traces 84 using a thermal pressing process, a polymer material 94, such as epoxy or polyimide, can be formed between the passivation layer 10 of the semiconductor chip 54 and the polymer layer 88 of the flexible circuit film 96, and enclosing the metal bumps 52. Next, the polymer material 94 is cured at a temperature of between 150 and 250° C.

COG (Chip on Glass) Assembly—ACF/ACP

Figure 2O:
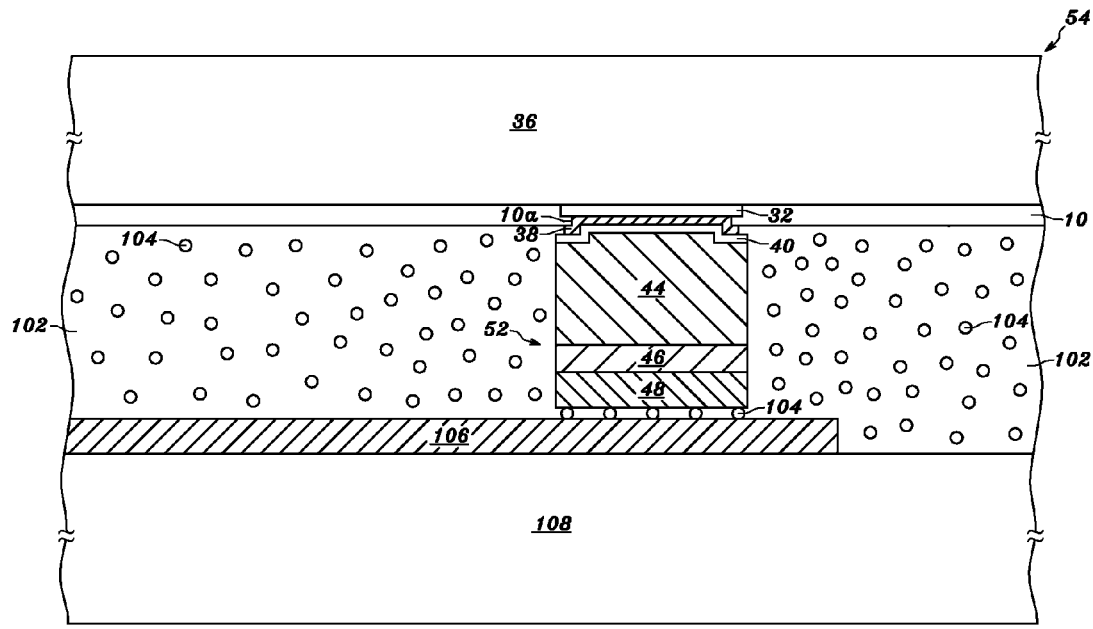

Referring to FIG. 2O, via a thermal pressing process, the gold layer 48 of the metal bumps 52 (only one of them is shown) is pressed into an anisotropic conductive film (ACF) or an anisotropic conductive paste (ACP) 102. Thus, metal particles 104 inside ACF or ACP 102 clusters between the gold layer 48 of the metal bumps 52 and multiple conductive traces 106 (only one of them is shown), such as indium tin oxide (ITO) or gold, on a glass substrate 108, leading the gold layer 48 of the metal bumps 52 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 48 of the metal bumps 52 may be pressed into ACF or ACP 102 preformed on a ceramic substrate or a printed circuit board to have metal particles 104 in the ACF or ACP 102 connecting the gold layer 48 of the metal bumps 52 to multiple pads on the ceramic substrate or on the organic substrate.

COG (Chip on Glass) Assembly—NCF

Figure 2P:
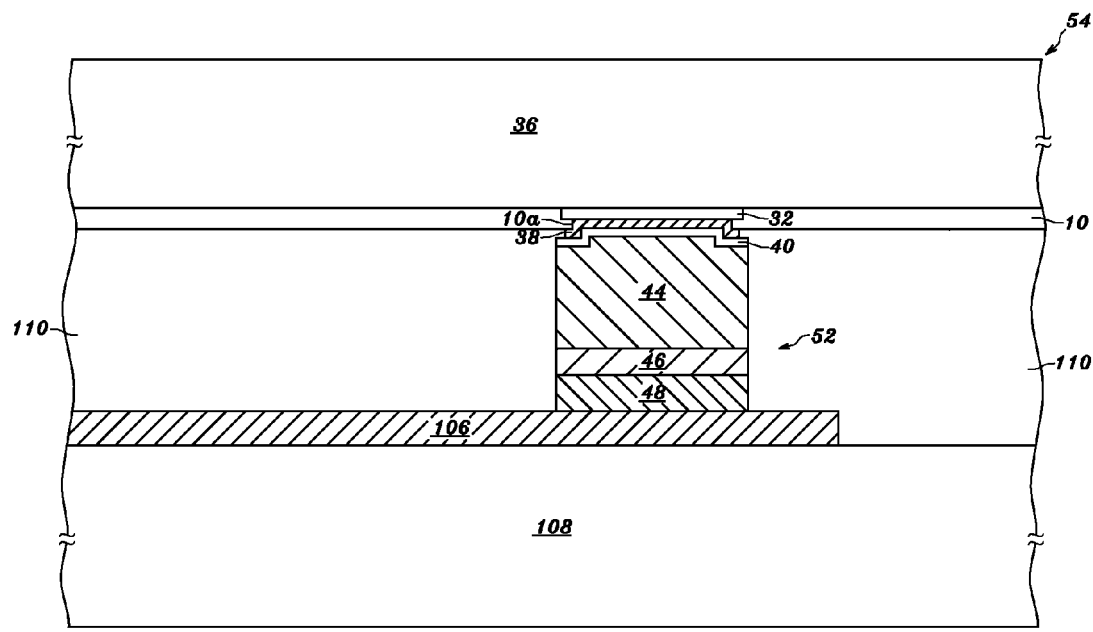

Referring to FIG. 2P, via a thermal pressing process, the gold layer 48 of the metal bumps 52 (only one of them is shown) is pressed into a non-conductive film (NCF) 110, and the gold layer 48 of the metal bumps 52 contacts with multiple conductive traces 106 (only one of them is shown), such as indium tin oxide (ITO) or gold, on a glass substrate 108, leading the gold layer 48 of the metal bumps 52 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 48 of the metal bumps 52 may be pressed into NCF 110 preformed on a ceramic substrate or a printed circuit board to have the gold layer 48 of the metal bumps 52 contacting with multiple pads on the ceramic substrate or on the organic substrate.

Embodiment 2

Figure 3A:
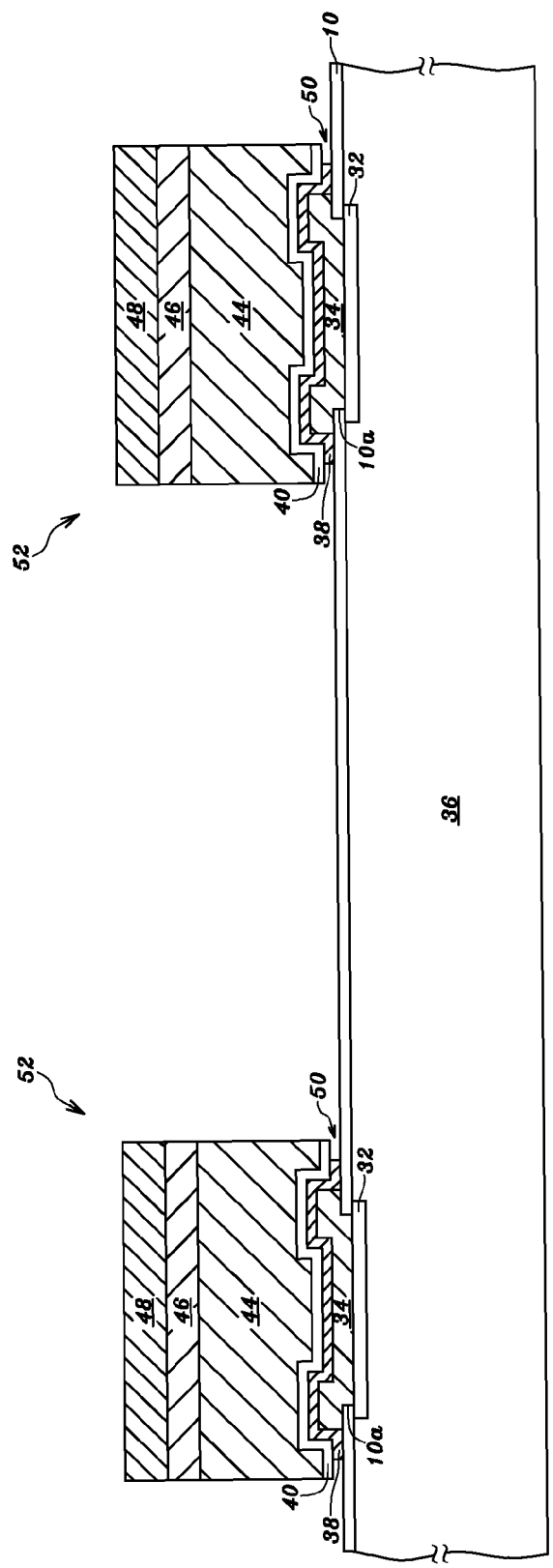
FIG. 3A and FIGS. 3C through 3H are cross-sectional views showing a process for fabricating multiple metal bumps on a wafer and packaging a chip singulated from the wafer according to one embodiment of the present invention.

Referring to FIG. 3A, the metal bumps 52 can be formed on the metal caps 34, respectively, that is, the adhesion/barrier layer 38 having a thickness of between 0.02 and 0.5 μm, and preferably of between 0.25 and 0.35 μm, can be formed on the passivation layer 10 and on the aluminum-containing layer of the metal caps 34, wherein the aluminum-containing layer may be an aluminum layer, an aluminum-copper-alloy layer or an Al—Si—Cu-alloy layer, followed by forming the seed layer 40, made of copper, having a thickness of between 0.03 and 1 μm, and preferably of between 0.05 and 0.2 μm, on the adhesion/barrier layer 38, followed by the above-mentioned steps as shown in FIGS. 2B-2E. The specification of the adhesion/barrier layer 38 and the seed layer 40 shown in FIG. 3A can be referred to as the specification of the adhesion/barrier layer 38 and the seed layer 40 illustrated in FIG. 2A. The process of forming the adhesion/barrier layer 38, as shown in FIG. 3A, can be referred to as the process of forming the adhesion/barrier layer 38, as illustrated in FIG. 2A. The process of forming the seed layer 40, as shown in FIG. 3A, can be referred to as the process of forming the seed layer 40, as illustrated in FIG. 2A.

Figure 3B:
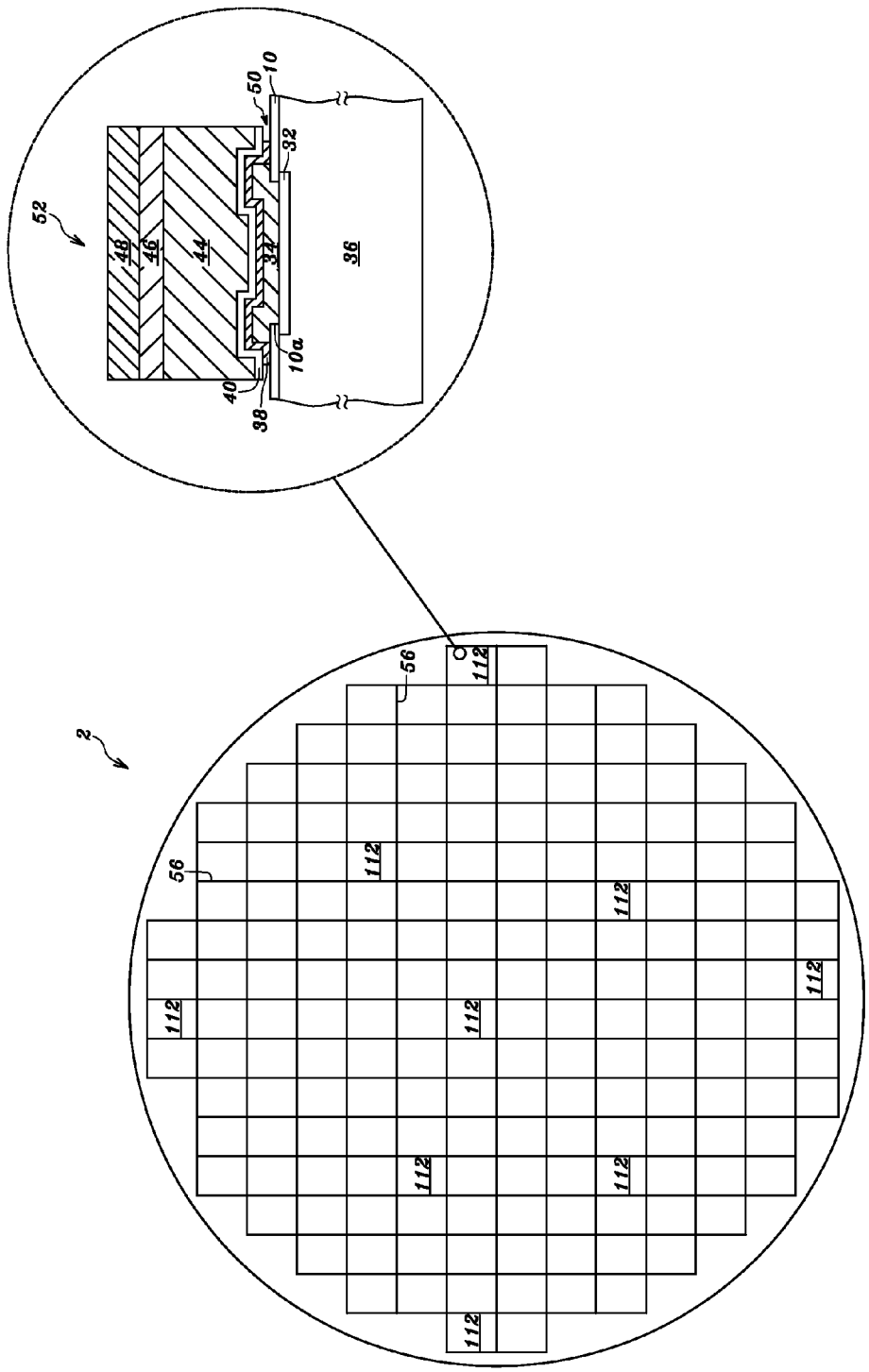
FIG. 3B is a top view showing a semiconductor wafer with multiple metal bumps.

After the metal bumps 52 are formed, the semiconductor wafer 2 can be cut into multiple chips 112. The detail can be referred as to FIG. 3B. Referring to FIG. 3B, the semiconductor wafer 2 includes multiple semiconductor chips 112 with scribe lines 56 between neighboring two of the semiconductor chips 112. The metal bumps 52 are on the metal caps 34, of each semiconductor chips 112, on the pads 32 exposed by the openings 10a. In a wafer dicing process, the semiconductor wafer 2 can be cut along the scribe lines 56 to separate the semiconductor chips 112.

TCP (Tape Carrier Package)—Gold to Tin Connection

Figure 3C:
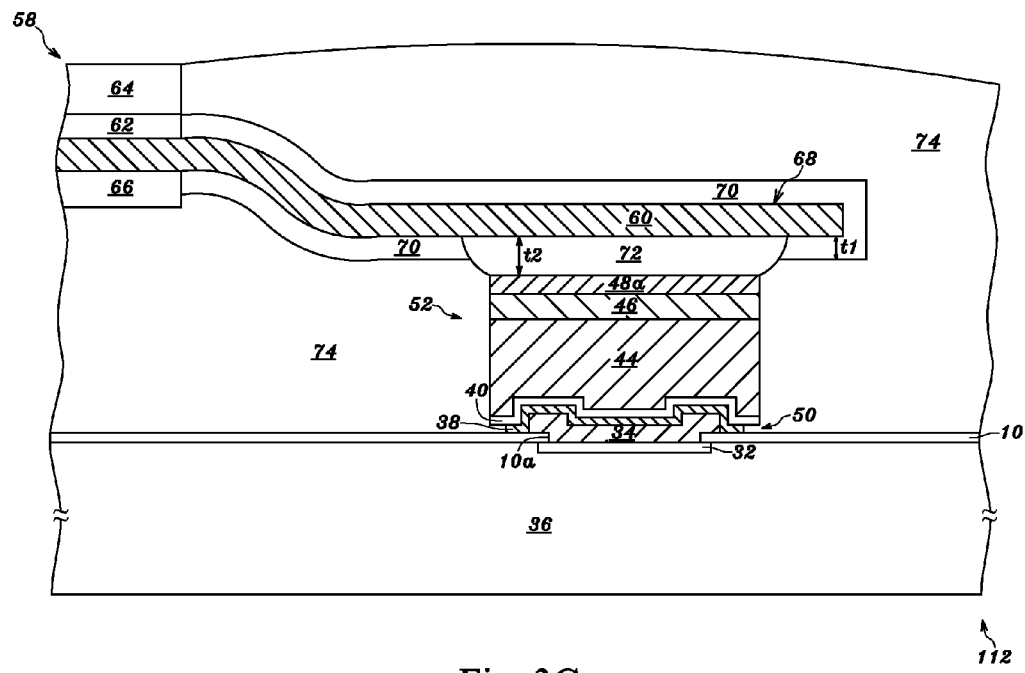

Referring to FIG. 3C, the flexible circuit film 58 as mentioned in FIG. 2G can be bonded with the metal bumps 52 (only one of them is shown) on the metal caps 34. The specification of the flexible circuit film 58 shown in FIG. 3C can be referred to as the specification of the flexible circuit film 58 illustrated in FIG. 2G The process of thermally pressing the tin-containing layer 70 of the flexible circuit film 58 on the gold layer 48 of the metal bumps 52, as shown in FIG. 3C, can be referred to as the process of thermally pressing the tin-containing layer 70 of the flexible circuit film 58 on the gold layer 48 of the metal bumps 52, as illustrated in FIG. 2H. Thereby, a tin-alloy layer 72 containing gold can be formed between the remaining gold layer 48a of the metal bumps 52 and the copper traces 60 of the flexible circuit film 58, wherein the remaining gold layer 48a has a thickness of between 0.2 and 6 micrometers, and preferably of between 1.5 and 4 micrometers. The specification of the tin-alloy layer 72 shown in FIG. 3C can be referred to as the specification of the tin-alloy layer 72 illustrated in FIG. 2H.

After the metal bumps 52 are connected to the tin-containing layer 70 on the bottom surface of the inner leads 68 using a thermal pressing process, a polymer material 74, such as epoxy or polyimide, can be formed between the semiconductor chip 112 and the tin-containing layer 70 on the bottom surface of the inner leads 68, and enclosing the metal bumps 52. Next, the polymer material 74 is cured at a temperature of between 150 and 250° C.

In the FIG. 3C, the copper traces 60 can be replaced by multiple gold traces having a thickness of between 3 and 30 μm, and preferably of between 5 and 20 μm. Alternatively, the copper traces 60 can be replaced by multiple silver traces having a thickness of between 3 and 30 μm, and preferably of between 5 and 20 μm.

TCP (Tape Carrier Package)—Gold to Gold Connection

Figure 3D:
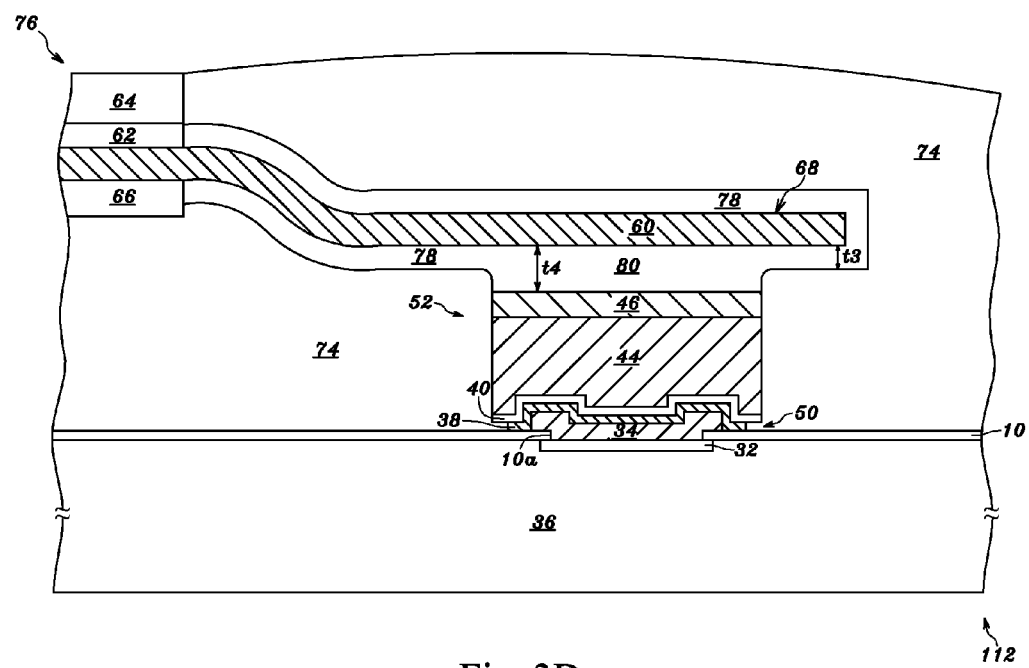

Referring to FIG. 3D, the flexible circuit film 76 as mentioned in FIG. 2I can be bonded with the metal bumps 52 (only one of them is shown) on the metal caps 34. The specification of the flexible circuit film 76 shown in FIG. 3D can be referred to as the specification of the flexible circuit film 76 illustrated in FIG. 2I. The process of thermally pressing the gold layer 78 of the flexible circuit film 76 on the gold layer 48 of the metal bumps 52, as shown in FIG. 3D, can be referred to as the process of thermally pressing the gold layer 78 of the flexible circuit film 76 on the gold layer 48 of the metal bumps 52, as illustrated in FIG. 2J. Thereby, a gold layer 80 formed by the joint of the gold layer 78 and the gold layer 48 can be between the nickel layer 46 of the metal bumps 52 and the copper traces 60 of the flexible circuit film 76, wherein the gold layer 80 has a thickness t4 of between 1 and 10 micrometers, and preferably of between 3 and 6 micrometers.

After the metal bumps 52 are connected to the copper traces 60 using a thermal pressing process, a polymer material 74, such as epoxy or polyimide, can be formed between the semiconductor chip 112 and the gold layer 78 on the bottom surface of the inner leads 68, and enclosing the metal bumps 52. Next, the polymer material 74 is cured at a temperature of between 150 and 250° C.

COF (Chip on Film) Package—Gold to Tin Connection

Figure 3E:
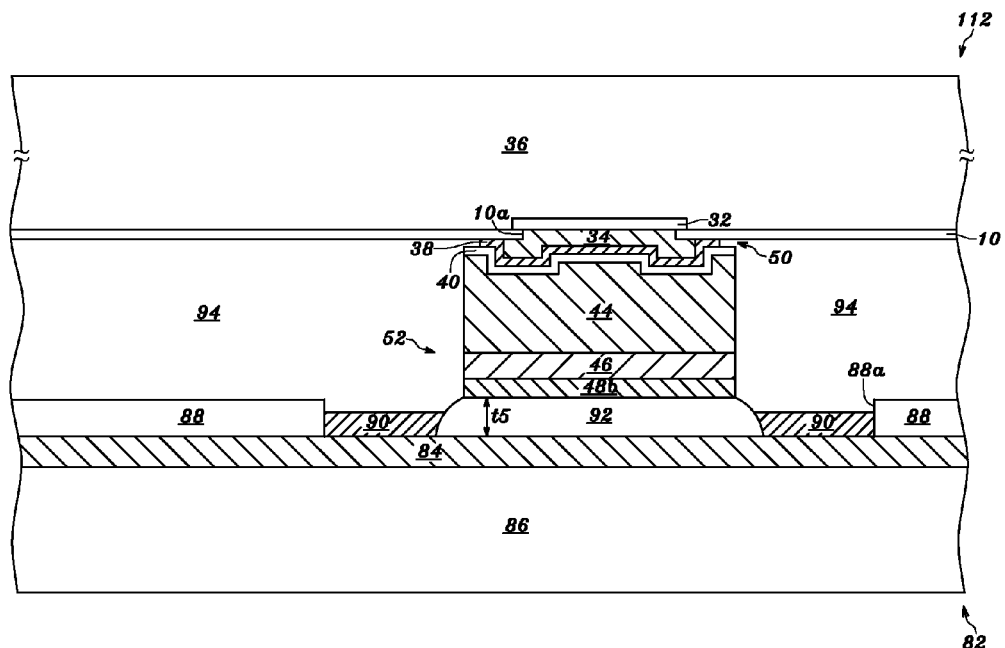

Referring to FIG. 3E, the flexible circuit film 82 as mentioned in FIG. 2K can be bonded with the metal bumps 52 (only one of them is shown) on the metal caps 34. The specification of the flexible circuit film 82 shown in FIG. 3E can be referred to as the specification of the flexible circuit film 82 illustrated in FIG. 2K. The process of thermally pressing the tin-containing layer 90 of the flexible circuit film 82 on the gold layer 48 of the metal bumps 52, as shown in FIG. 3E, can be referred to as the process of thermally pressing the tin-containing layer 90 of the flexible circuit film 82 on the gold layer 48 of the metal bumps 52, as illustrated in FIG. 2L. Alternatively, the process of thermally pressing the gold layer 48 of the metal bumps 52 on the tin-containing layer 90 of the flexible circuit film 82, as shown in FIG. 3E, can be referred to as the process of thermally pressing the gold layer 48 of the metal bumps 52 on the tin-containing layer 90 of the flexible circuit film 82, as illustrated in FIG. 2L. Thereby, a tin-alloy layer 92 containing gold can be formed between the remaining gold layer 48b of the metal bumps 52 and the copper traces 84 of the flexible circuit film 82, wherein the remaining gold layer 48b has a thickness of between 0.2 and 6 micrometers, and preferably of between 1.5 and 4 micrometers. The specification of the tin-alloy layer 92 shown in FIG. 3E can be referred to as the specification of the tin-alloy layer 92 illustrated in FIG. 2L.

After the metal bumps 52 are connected to the copper traces 84 using a thermal pressing process, a polymer material 94, such as epoxy or polyimide, can be formed between the passivation layer 10 of the semiconductor chip 112 and the polymer layer 88 of the flexible circuit film 82, and enclosing the metal bumps 52. Next, the polymer material 94 is cured at a temperature of between 150 and 250° C.

In the FIG. 3E, the copper traces 84 can be replaced by multiple gold traces having a thickness of between 3 and 30 μm, and preferably of between 5 and 20 μm. Alternatively, the copper traces 84 can be replaced by multiple silver traces having a thickness of between 3 and 30 μm, and preferably of between 5 and 20 μm.

COF (Chip on Film) Package—Gold to Gold Connection

Figure 3F:
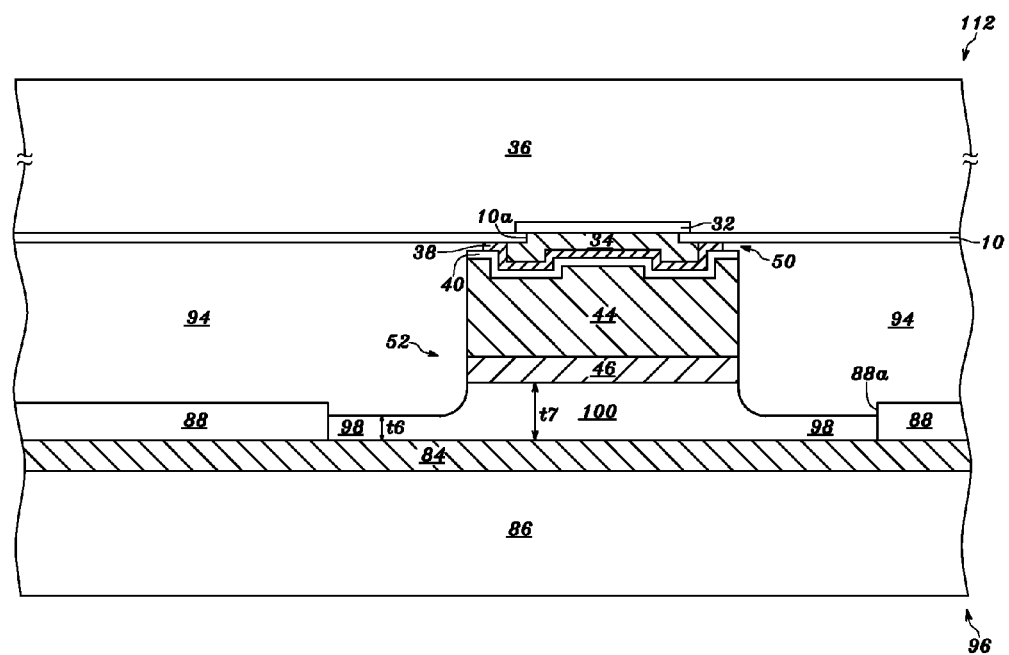

Referring to FIG. 3F, the flexible circuit film 96 as mentioned in FIG. 2M can be bonded with the metal bumps 52 (only one of them is shown) on the metal caps 34. The specification of the flexible circuit film 96 shown in FIG. 3F can be referred to as the specification of the flexible circuit film 96 illustrated in FIG. 2M. The process of thermally pressing the gold layer 98 of the flexible circuit film 96 on the gold layer 48 of the metal bumps 52, as shown in FIG. 3F, can be referred to as the process of thermally pressing the gold layer 98 of the flexible circuit film 96 on the gold layer 48 of the metal bumps 52, as illustrated in FIG. 2N. Alternatively, the process of thermally pressing the gold layer 48 of the metal bumps 52 on the gold layer 98 of the flexible circuit film 96, as shown in FIG. 3F, can be referred to as the process of thermally pressing the gold layer 48 of the metal bumps 52 on the gold layer 98 of the flexible circuit film 96, as illustrated in FIG. 2N. Thereby, a gold layer 100 formed by the joint of the gold layer 98 and the gold layer 48 can be between the nickel layer 46 of the metal bumps 52 and the copper traces 84 of the flexible circuit film 96, wherein the gold layer 100 has a thickness t7 of between 1 and 10 micrometers, and preferably of between 3 and 6 micrometers.

After the metal bumps 52 are connected to the copper traces 84 using a thermal pressing process, a polymer material 94, such as epoxy or polyimide, can be formed between the passivation layer 10 of the semiconductor chip 112 and the polymer layer 88 of the flexible circuit film 96, and enclosing the metal bumps 52. Next, the polymer material 94 is cured at a temperature of between 150 and 250° C.

COG (Chip on Glass) Assembly—ACF/ACP

Figure 3G:
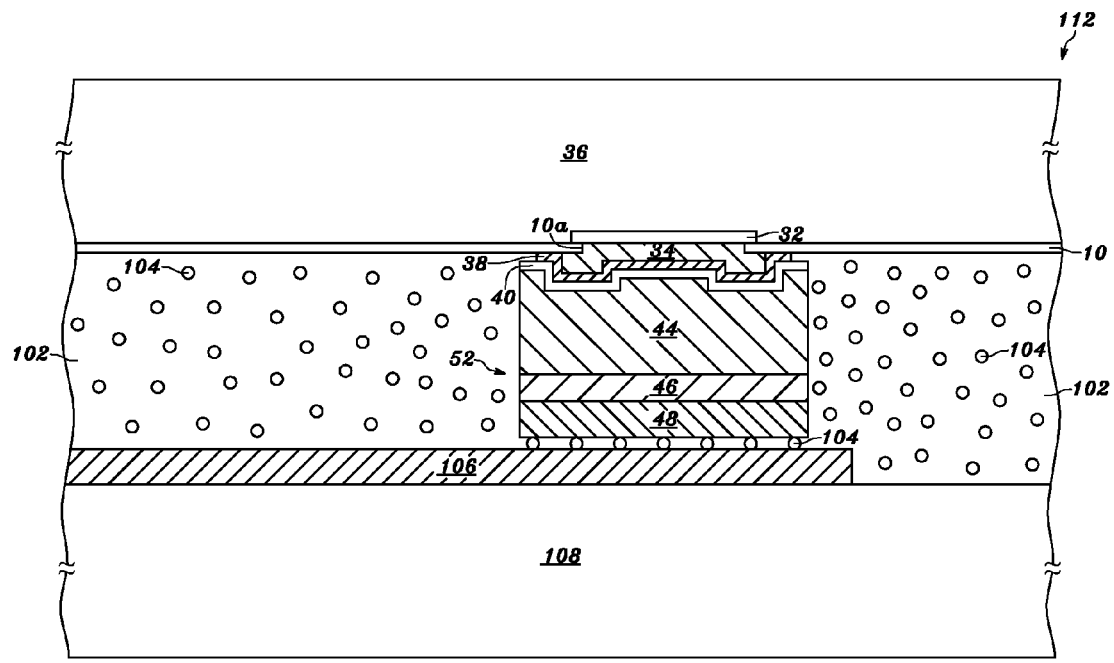

Referring to FIG. 3G, via a thermal pressing process, the gold layer 48 of the metal bumps 52 (only one of them is shown) on the metal caps 34 is pressed into an anisotropic conductive film (ACF) or an anisotropic conductive paste (ACP) 102. Thus, metal particles 104 inside ACF or ACP 102 clusters between the gold layer 48 of the metal bumps 52 and multiple conductive traces 106 (only one of them is shown), such as indium tin oxide (ITO) or gold, on a glass substrate 108, leading the gold layer 48 of the metal bumps 52 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 48 of the metal bumps 52 may be pressed into ACF or ACP 102 preformed on a ceramic substrate or a printed circuit board to have metal particles 104 in the ACF or ACP 102 connecting the gold layer 48 of the metal bumps 52 to multiple pads on the ceramic substrate or on the organic substrate.

COG (Chip on Glass) Assembly—NCF

Figure 3H:
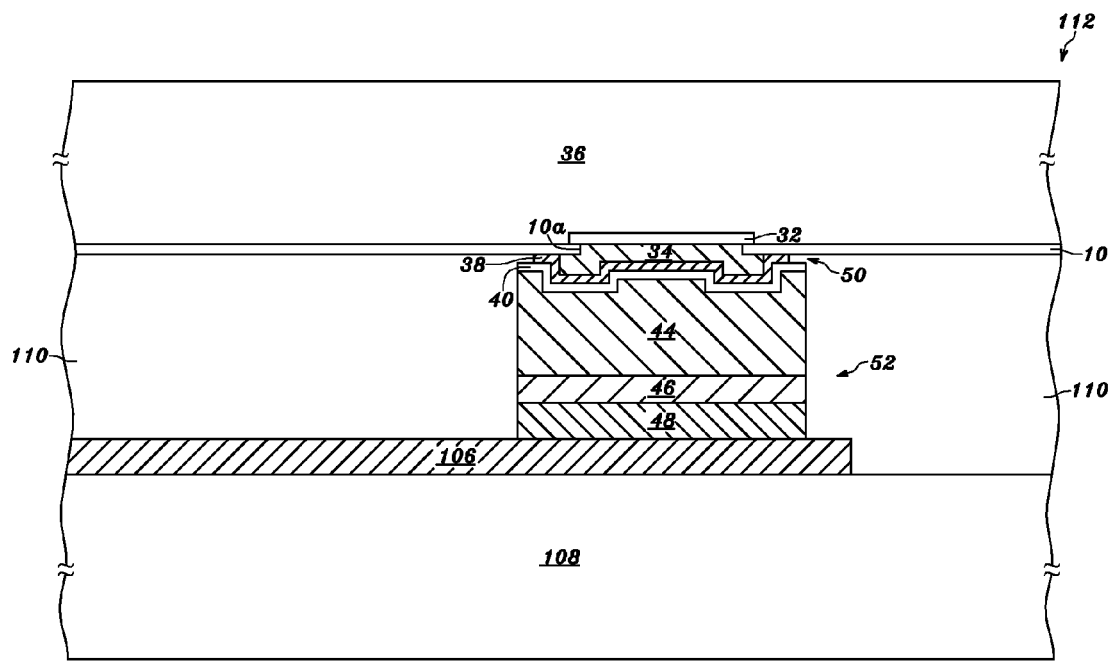

Referring to FIG. 3H, via a thermal pressing process, the gold layer 48 of the metal bumps 52 (only one of them is shown) on the metal caps 34 is pressed into a non-conductive film (NCF) 110, and the gold layer 48 of the metal bumps 52 contacts with multiple conductive traces 106 (only one of them is shown), such as indium tin oxide (ITO) or gold, on a glass substrate 108, leading the gold layer 48 of the metal bumps 52 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 48 of the metal bumps 52 may be pressed into NCF 110 preformed on a ceramic substrate or a printed circuit board to have the gold layer 48 of the metal bumps 52 contacting with multiple pads on the ceramic substrate or on the organic substrate.

Embodiment 3

Figure 4A:
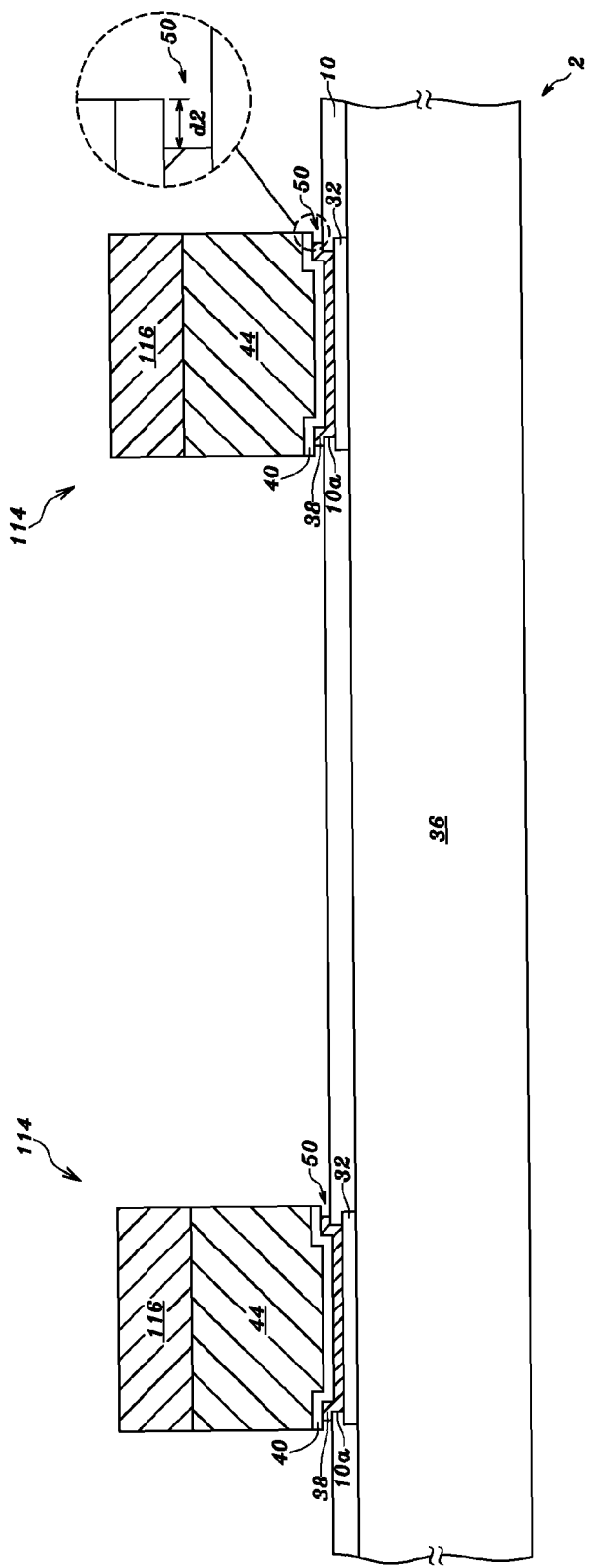
FIG. 4A and FIGS. 4C through 4H are cross-sectional views showing a process for fabricating multiple metal bumps on a wafer and packaging a chip singulated from the wafer according to one embodiment of the present invention.

Referring to FIG. 4A, multiple metal bumps 114 can be formed on the pads 32, such as copper pads or aluminum pads, exposed by the openings 10a. The process for forming the metal bumps 114 can be performed by the above-mentioned steps as shown in FIGS. 2A-2B, followed by electroplating a copper layer 44 having a thickness of between 5 and 30 micrometers, and preferably of between 10 and 20 micrometers, on the seed layer 40 exposed by the openings 42a, and then electroplating a gold layer 116 having a thickness of between 1 and 10 micrometers, and preferably of between 3 and 6 micrometers, on the electroplated copper layer 44 in the openings 42a with a non-cyanide electroplating solution, such as a solution containing gold sodium sulfite ($Na_3Au(SO_3)_2$) or a solution containing gold ammonium sulfite ($(NH_4)_3[Au(SO_3)_2]$), or with an electroplating solution containing cyanide, followed by the above-mentioned steps as shown in FIGS. 2D-2E. Thereby, the metal bumps 114 can be formed of the adhesion/barrier layer 38 on the pads 32, a copper layer (including the seed layer 40 and the electroplated copper layer 44), having a thickness of between 5 and 30 micrometers, and preferably of between 10 and 20 micrometers, on the adhesion/barrier layer 38 and the gold layer 116 on the copper layer. Alternatively, the gold layer 116 of the metal bumps 114 can be electroless plated with a thickness of between 500 and 5,000 angstroms for a COG structure or with a thickness of between 0.5 and 6 micrometers for a TCP or COF structure. Alternatively, the gold layer 116 can be replaced by a silver layer, having a thickness of between 1 and 10 μm, and preferably of between 3 and 6 μm, electroplated on the copper layer (including the seed layer 40 and the electroplated copper layer 44). Alternatively, the gold layer 116 can be replaced by a silver layer, having a thickness of between 500 and 5,000 angstroms or between 0.5 and 6 μm, electroless plated on the copper layer (including the seed layer 40 and the electroplated copper layer 44).

Figure 4B:
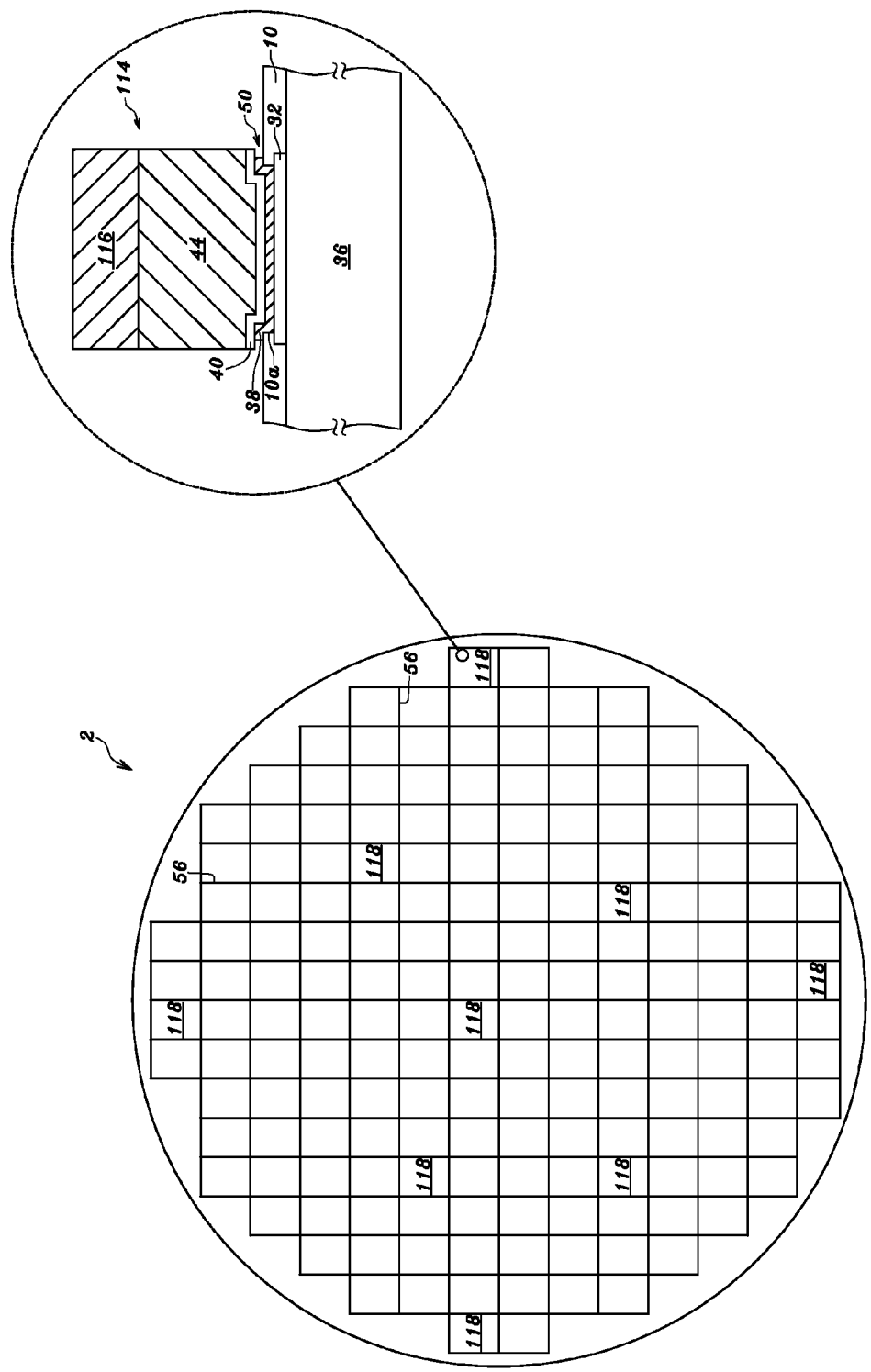
FIG. 4B is a top view showing a semiconductor wafer with multiple metal bumps.

After the metal bumps 114 are formed, the semiconductor wafer 2 can be cut into multiple chips 118. The detail can be referred as to FIG. 4B. Referring to FIG. 4B, the semiconductor wafer 2 includes multiple semiconductor chips 118 with scribe lines 56 between neighboring two of the semiconductor chips 118. The metal bumps 114 are on the pads 32, of each semiconductor chips 118, exposed by the openings 10a. In a wafer dicing process, the semiconductor wafer 2 can be cut along the scribe lines 56 to separate the semiconductor chips 118.

TCP (Tape Carrier Package)—Gold to Tin Connection

Figure 4C:
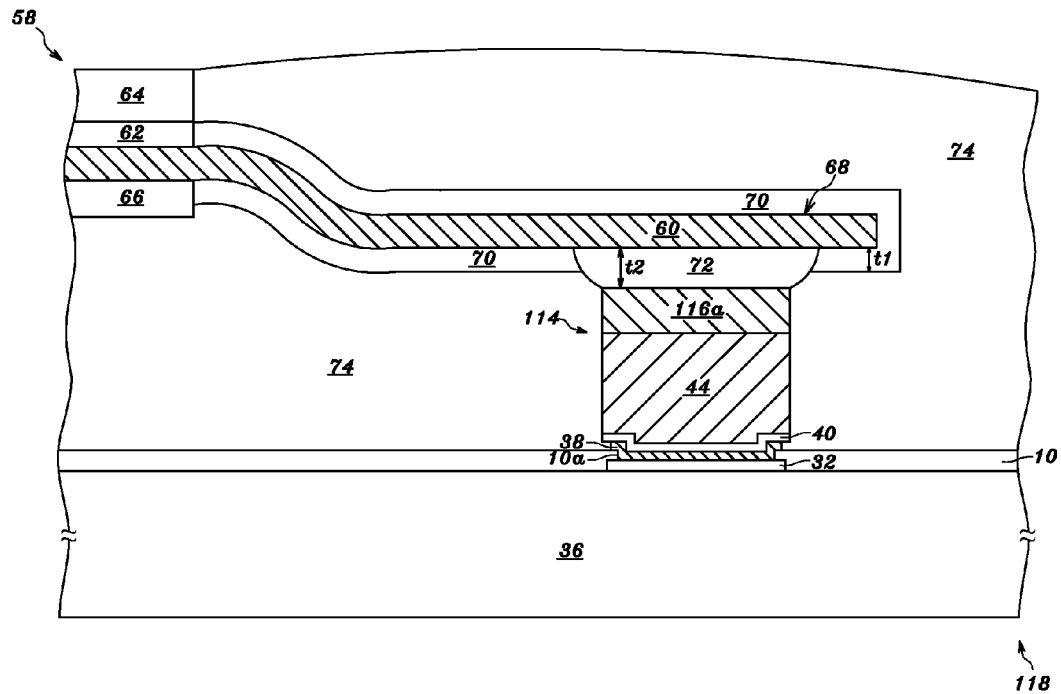

Referring to FIG. 4C, the flexible circuit film 58 as mentioned in FIG. 2G can be bonded with the metal bumps 114 (only one of them is shown). The specification of the flexible circuit film 58 shown in FIG. 4C can be referred to as the specification of the flexible circuit film 58 illustrated in FIG. 2G When the flexible circuit film 58 is bonded with the metal bumps 114, the tin-containing layer 70 on a bottom surface of the inner leads 68 (only one of them is shown) can be thermally pressed on the gold layer 116 of the metal bumps 114 at a temperature of between 490 and 540° C., and preferably of between 500 and 520° C., for a time of between 1 and 10 seconds, and preferably of between 3 and 6 seconds. Thereby, a tin-alloy layer 72 containing gold can be formed between the remaining gold layer 116a of the metal bumps 114 and the copper traces 60 of the flexible circuit film 58, wherein the remaining gold layer 116a has a thickness of between 0.2 and 6 micrometers, and preferably of between 1.5 and 4 micrometers. The tin-alloy layer 72 has a thickness t2 of between 0.5 and 10 micrometers, of between 1 and 5 micrometers or of between 1.5 and 3 micrometers. When the tin-containing layer 70 before bonded with the gold layer 116 is pure tin, the tin-alloy layer 72 is tin-gold alloy having a thickness t2 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 70 before bonded with the gold layer 116 is tin-silver alloy, the tin-alloy layer 72 is tin-silver-gold alloy having a thickness t2 of between 0.5 and 10 micrometers, of between 1 and 5 micrometers or of between 1.5 and 3 micrometers. When the tin-containing layer 70 before bonded with the gold layer 116 is tin-silver-copper alloy, the tin-alloy layer 72 is tin-silver-gold-copper alloy having a thickness t2 of between 0.5 and 10 micrometers, of between 1 and 5 micrometers or of between 1.5 and 3 micrometers.

After the metal bumps 114 are connected to the tin-containing layer 70 on the bottom surface of the inner leads 68 using a thermal pressing process, a polymer material 74, such as epoxy or polyimide, can be formed between the semiconductor chip 118 and the tin-containing layer 70 on the bottom surface of the inner leads 68, and enclosing the metal bumps 114. Next, the polymer material 74 is cured at a temperature of between 150 and 250° C.

In the FIG. 4C, the copper traces 60 can be replaced by multiple gold traces having a thickness of between 3 and 30 μm, and preferably of between 5 and 20 μm. Alternatively, the copper traces 60 can be replaced by multiple silver traces having a thickness of between 3 and 30 μm, and preferably of between 5 and 20 μm.

TCP (Tape Carrier Package)—Gold to Gold Connection

Figure 4D:
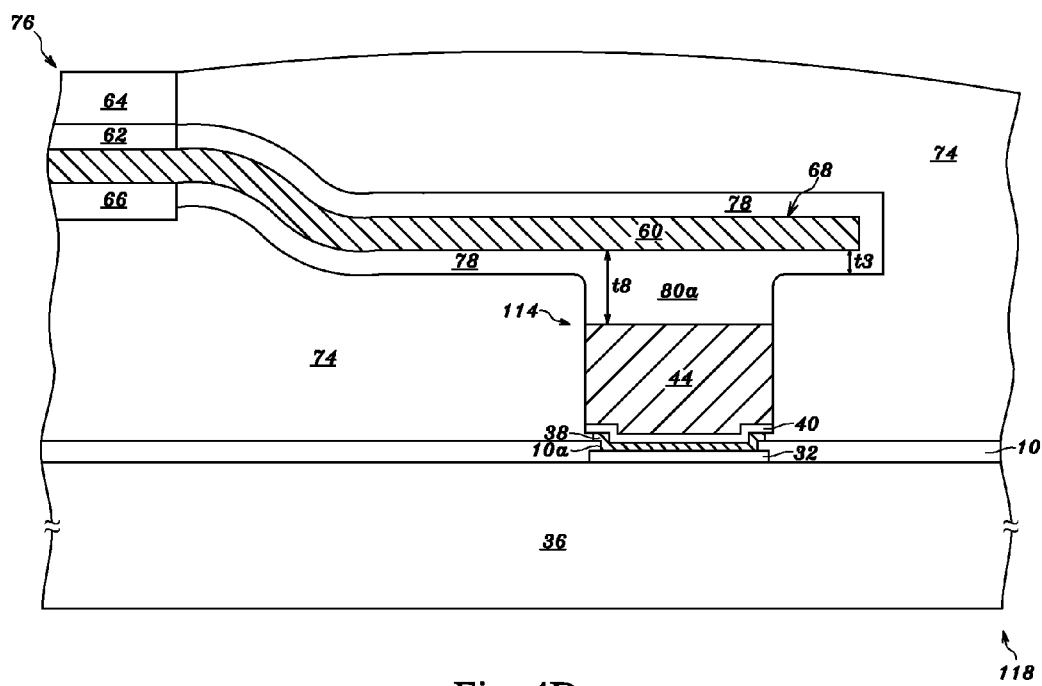

Referring to FIG. 4D, the flexible circuit film 76 as mentioned in FIG. 2I can be bonded with the metal bumps 114 (only one of them is shown). The specification of the flexible circuit film 76 shown in FIG. 4D can be referred to as the specification of the flexible circuit film 76 illustrated in FIG. 2I. When the flexible circuit film 76 is bonded with the metal bumps 114, the gold layer 78 on a bottom surface of the inner leads 68 (only one of them is shown) can be thermally pressed on the gold layer 116 of the metal bumps 114 at a temperature of between 490 and 540° C., and preferably of between 500 and 520° C., for a time of between 1 and 10 seconds, and preferably of between 3 and 6 seconds. Thereby, a gold layer 80a formed by the joint of the gold layer 78 and the gold layer 116 can be between the copper layer 44 of the metal bumps 114 and the copper traces 60 of the flexible circuit film 76, wherein the gold layer 80a has a thickness t8 of between 1 and 10 micrometers, and preferably of between 3 and 6 micrometers.

After the metal bumps 114 are connected to the copper traces 60 using a thermal pressing process, a polymer material 74, such as epoxy or polyimide, can be formed between the semiconductor chip 118 and the gold layer 78 on the bottom surface of the inner leads 68, and enclosing the metal bumps 114. Next, the polymer material 74 is cured at a temperature of between 150 and 250° C.

COF (Chip on Film) Package—Gold to Tin Connection

Figure 4E:
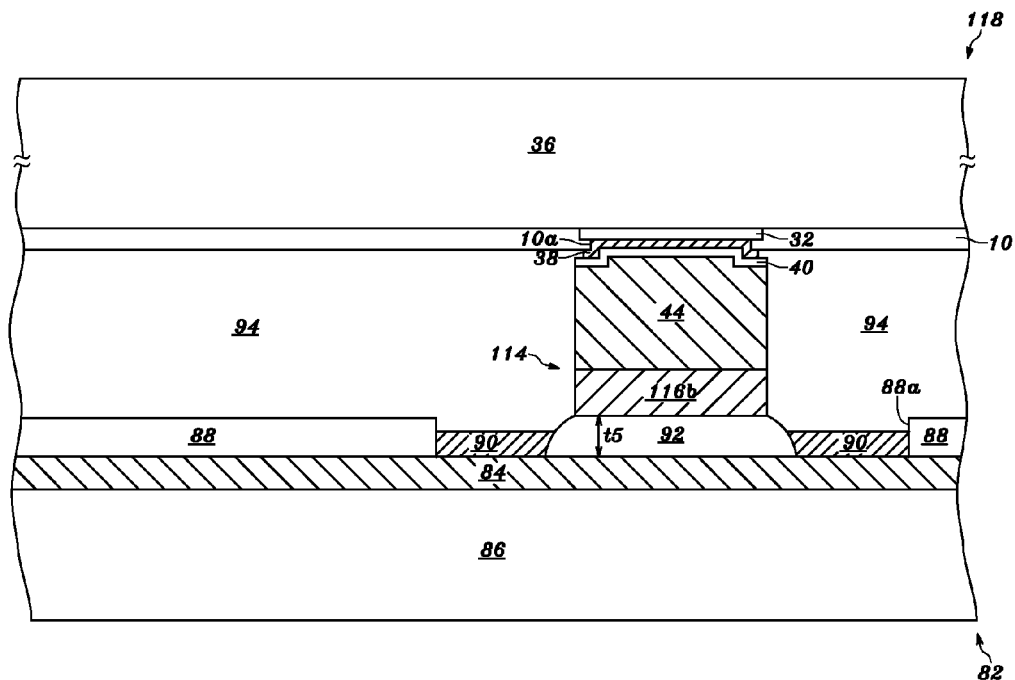

Referring to FIG. 4E, the flexible circuit film 82 as mentioned in FIG. 2K can be bonded with the metal bumps 114 (only one of them is shown). The specification of the flexible circuit film 82 shown in FIG. 4E can be referred to as the specification of the flexible circuit film 82 illustrated in FIG. 2K. When the flexible circuit film 82 is bonded with the metal bumps 114, the gold layer 116 of the metal bumps 114 can be thermally pressed on the tin-containing layer 90 of the flexible circuit film 82 at a temperature of between 490 and 540° C., and preferably of between 500 and 520° C., for a time of between 1 and 10 seconds, and preferably of between 3 and 6 seconds. Alternatively, when the flexible circuit film 82 is bonded with the metal bumps 114, the tin-containing layer 90 of the flexible circuit film 82 can be thermally pressed on the gold layer 116 of the metal bumps 114 at a temperature of between 490 and 540° C., and preferably of between 500 and 520° C., for a time of between 1 and 10 seconds, and preferably of between 3 and 6 seconds. Thereby, a tin-alloy layer 92 containing gold can be formed between the remaining gold layer 116b of the metal bumps 114 and the copper traces 84 of the flexible circuit film 82, wherein the remaining gold layer 116b has a thickness of between 0.2 and 6 micrometers, and preferably of between 1.5 and 4 micrometers. The tin-alloy layer 92 has a thickness t5 of between 0.5 and 10 micrometers, of between 1 and 5 micrometers or of between 1.5 and 3 micrometers. When the tin-containing layer 90 before bonded with the gold layer 116 is pure tin, the tin-alloy layer 92 is tin-gold alloy having a thickness t5 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 90 before bonded with the gold layer 116 is tin-silver alloy, the tin-alloy layer 92 is tin-silver-gold alloy having a thickness t5 of between 0.5 and 10 micrometers, of between 1 and 5 micrometers or of between 1.5 and 3 micrometers. When the tin-containing layer 90 before bonded with the gold layer 116 is tin-silver-copper alloy, the tin-alloy layer 92 is tin-silver-gold-copper alloy having a thickness t5 of between 0.5 and 10 micrometers, of between 1 and 5 micrometers or of between 1.5 and 3 micrometers.

After the metal bumps 114 are connected to the copper traces 84 using a thermal pressing process, a polymer material 94, such as epoxy or polyimide, can be formed between the passivation layer 10 of the semiconductor chip 118 and the polymer layer 88 of the flexible circuit film 82, and enclosing the metal bumps 114. Next, the polymer material 94 is cured at a temperature of between 150 and 250° C.

In the FIG. 4E, the copper traces 84 can be replaced by multiple gold traces having a thickness of between 3 and 30 μm, and preferably of between 5 and 20 μm. Alternatively, the copper traces 84 can be replaced by multiple silver traces having a thickness of between 3 and 30 μm, and preferably of between 5 and 20 μm.

COF (Chip on Film) Package—Gold to Gold Connection

Figure 4F:
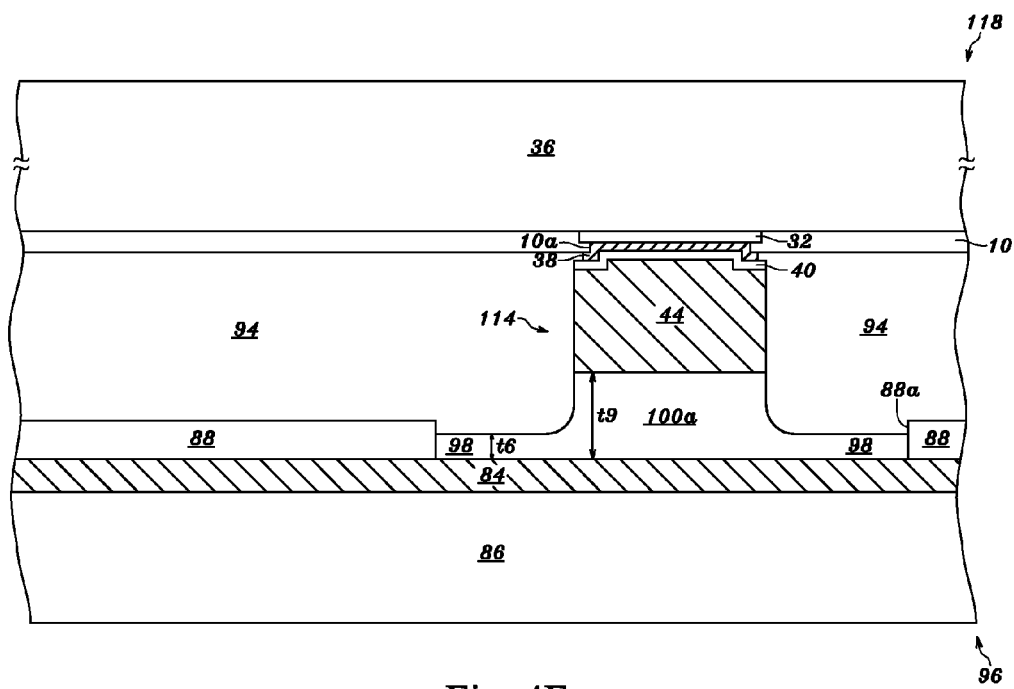

Referring to FIG. 4F, the flexible circuit film 96 as mentioned in FIG. 2M can be bonded with the metal bumps 114 (only one of them is shown). The specification of the flexible circuit film 96 shown in FIG. 4F can be referred to as the specification of the flexible circuit film 96 illustrated in FIG. 2M. When the flexible circuit film 96 is bonded with the metal bumps 114, the gold layer 116 of the metal bumps 114 can be thermally pressed on the gold layer 98 of the flexible circuit film 96 at a temperature of between 490 and 540° C., and preferably of between 500 and 520° C., for a time of between 1 and 10 seconds, and preferably of between 3 and 6 seconds. Alternatively, when the flexible circuit film 96 is bonded with the metal bumps 114, the gold layer 98 of the flexible circuit film 96 can be thermally pressed on the gold layer 116 of the metal bumps 114 at a temperature of between 490 and 540° C., and preferably of between 500 and 520° C., for a time of between 1 and 10 seconds, and preferably of between 3 and 6 seconds. Thereby, a gold layer 100a formed by the joint of the gold layer 98 and the gold layer 116 can be between the copper layer 44 of the metal bumps 114 and the copper traces 84 of the flexible circuit film 96, wherein the gold layer 100a has a thickness t9 of between 1 and 10 micrometers, and preferably of between 3 and 6 micrometers.

After the metal bumps 114 are connected to the copper traces 84 using a thermal pressing process, a polymer material 94, such as epoxy or polyimide, can be formed between the passivation layer 10 of the semiconductor chip 118 and the polymer layer 88 of the flexible circuit film 96, and enclosing the metal bumps 114. Next, the polymer material 94 is cured at a temperature of between 150 and 250° C.

COG (Chip on Glass) Assembly—ACF/ACP

Figure 4G:
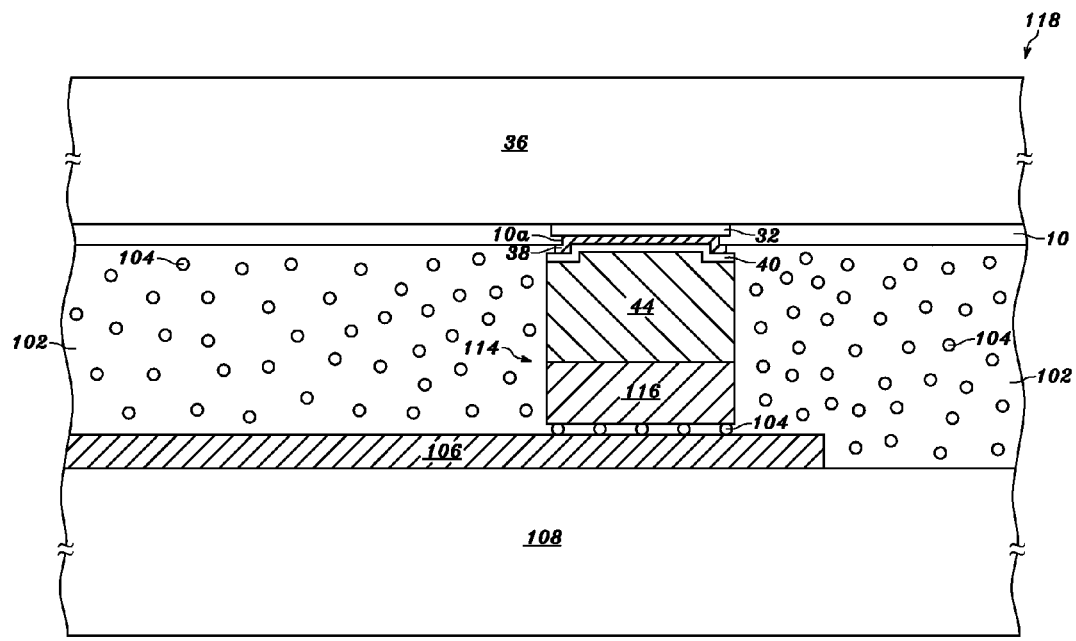

Referring to FIG. 4G, via a thermal pressing process, the gold layer 116 of the metal bumps 114 (only one of them is shown) is pressed into an anisotropic conductive film (ACF) or an anisotropic conductive paste (ACP) 102. Thus, metal particles 104 inside ACF or ACP 102 clusters between the gold layer 116 of the metal bumps 114 and multiple conductive traces 106 (only one of them is shown), such as indium tin oxide (ITO) or gold, on a glass substrate 108, leading the gold layer 116 of the metal bumps 114 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 116 of the metal bumps 114 may be pressed into ACF or ACP 102 preformed on a ceramic substrate or a printed circuit board to have metal particles 104 in the ACF or ACP 102 connecting the gold layer 116 of the metal bumps 114 to multiple pads on the ceramic substrate or on the organic substrate.

COG (Chip on Glass) Assembly—NCF

Figure 4H:
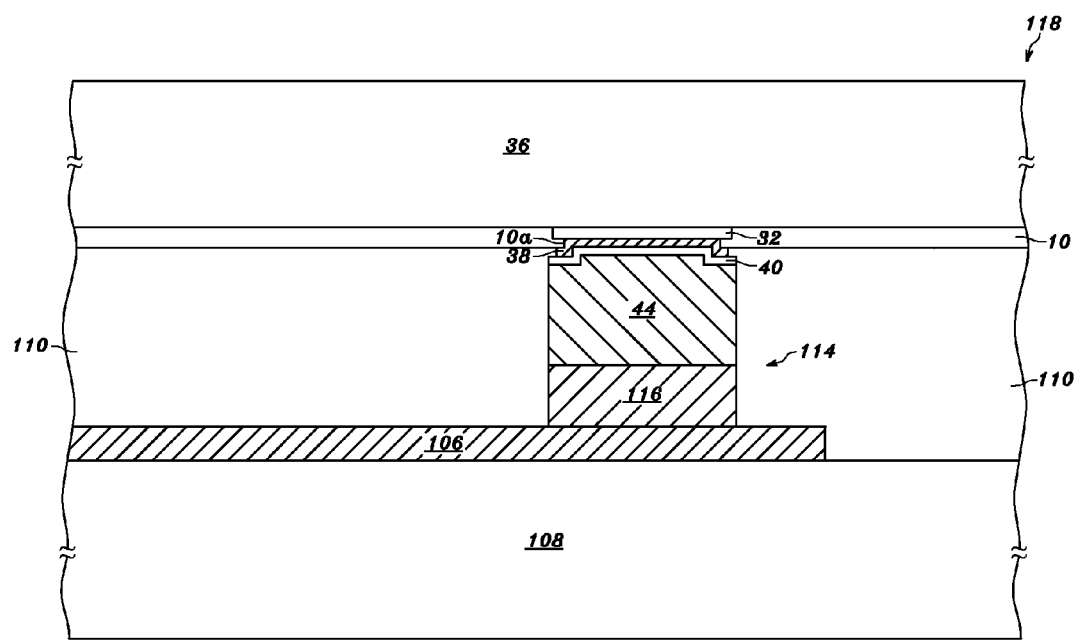

Referring to FIG. 4H, via a thermal pressing process, the gold layer 116 of the metal bumps 114 (only one of them is shown) is pressed into a non-conductive film (NCF) 110, and the gold layer 116 of the metal bumps 114 contacts with multiple conductive traces 106 (only one of them is shown), such as indium tin oxide (ITO) or gold, on a glass substrate 108, leading the gold layer 116 of the metal bumps 114 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 116 of the metal bumps 114 may be pressed into NCF 110 preformed on a ceramic substrate or a printed circuit board to have the gold layer 114 of the metal bumps 116 contacting with multiple pads on the ceramic substrate or on the organic substrate.

Embodiment 4

Figure 5A:
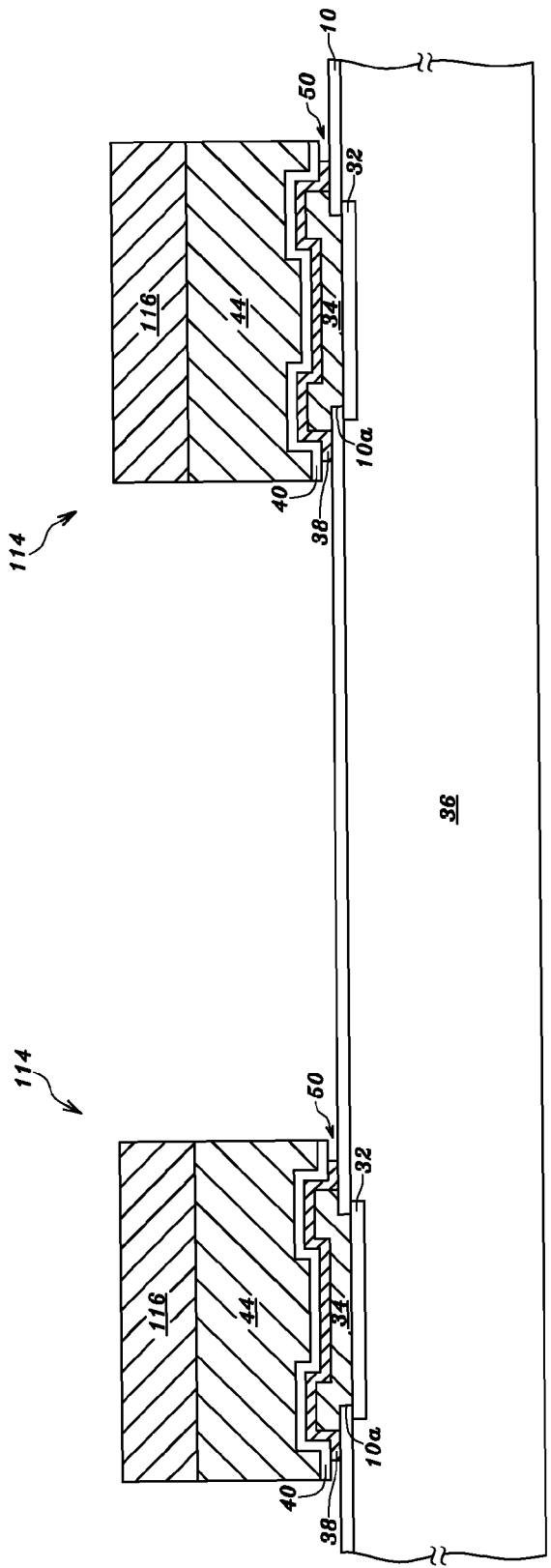
FIG. 5A and FIGS. 5C through 5H are cross-sectional views showing a process for fabricating multiple metal bumps on a wafer and packaging a chip singulated from the wafer according to one embodiment of the present invention.

Referring to FIG. 5A, the metal bumps 114 can be formed on the metal caps 34, respectively. The process for forming the metal bumps 114 on the metal caps 34 can be performed by forming an adhesion/barrier layer 38 having a thickness of between 0.02 and 0.5 µm, and preferably of between 0.25 and 0.35 µm, on the passivation layer 10 and on the aluminum-containing layer of the metal caps 34, wherein the aluminum-containing layer may be an aluminum-copper-alloy layer, an aluminum layer or an Al—Si—Cu-alloy layer, followed by forming the seed layer 40, made of copper, having a thickness of between 0.03 and 1 µm, and preferably of between 0.05 and 0.2 µm, on the adhesion/barrier layer 38, followed by the above-mentioned step as shown in FIG. 2B, followed by electroplating a copper layer 44 having a thickness of between 5 and 30 micrometers, and preferably of between 10 and 20 micrometers, on the seed layer 40 exposed by the openings 42a, and then electroplating a gold layer 116 having a thickness of between 1 and 10 micrometers, and preferably of between 3 and 6 micrometers, on the electroplated copper layer 44 in the openings 42a with a non-cyanide electroplating solution, such as a solution containing gold sodium sulfite ($Na_3Au(SO_3)_2$) or a solution containing gold ammonium sulfite (($NH_4)_3[Au(SO_3)_2]$), or with an electroplating solution containing cyanide, followed by the above-mentioned steps as shown in FIGS. 2D-2E. The specification of the adhesion/barrier layer 38 and the seed layer 40 shown in FIG. 5A can be referred to as the specification of the adhesion/barrier layer 38 and the seed layer 40 illustrated in FIG. 2A. The process of forming the adhesion/barrier layer 38, as shown in FIG. 5A, can be referred to as the process of forming the adhesion/barrier layer 38, as illustrated in FIG. 2A. The process of forming the seed layer 40, as shown in FIG. 5A, can be referred to as the process of forming the seed layer 40, as illustrated in FIG. 2A.

Thereby, the metal bumps 114 can be formed of the adhesion/barrier layer 38 on the metal caps 34, a copper layer (including the seed layer 40 and the electroplated copper layer 44), having a thickness of between 5 and 30 micrometers, and preferably of between 10 and 20 micrometers, on the adhesion/barrier layer 38 and the gold layer 116 on the copper layer. Alternatively, the gold layer 116 of the metal bumps 114 can be electroless plated with a thickness of between 500 and 5,000 angstroms for a COG structure or with a thickness of between 0.5 and 6 micrometers for a TCP or COF structure. Alternatively, the gold layer 116 can be replaced by a silver layer, having a thickness of between 1 and 10 µm, and preferably of between 3 and 6 µm, electroplated on the copper layer (including the seed layer 40 and the electroplated copper layer 44). Alternatively, the gold layer 116 can be replaced by a silver layer, having a thickness of between 500 and 5,000 angstroms or between 0.5 and 6 µm, electroless plated on the copper layer (including the seed layer 40 and the electroplated copper layer 44).

Figure 5B:
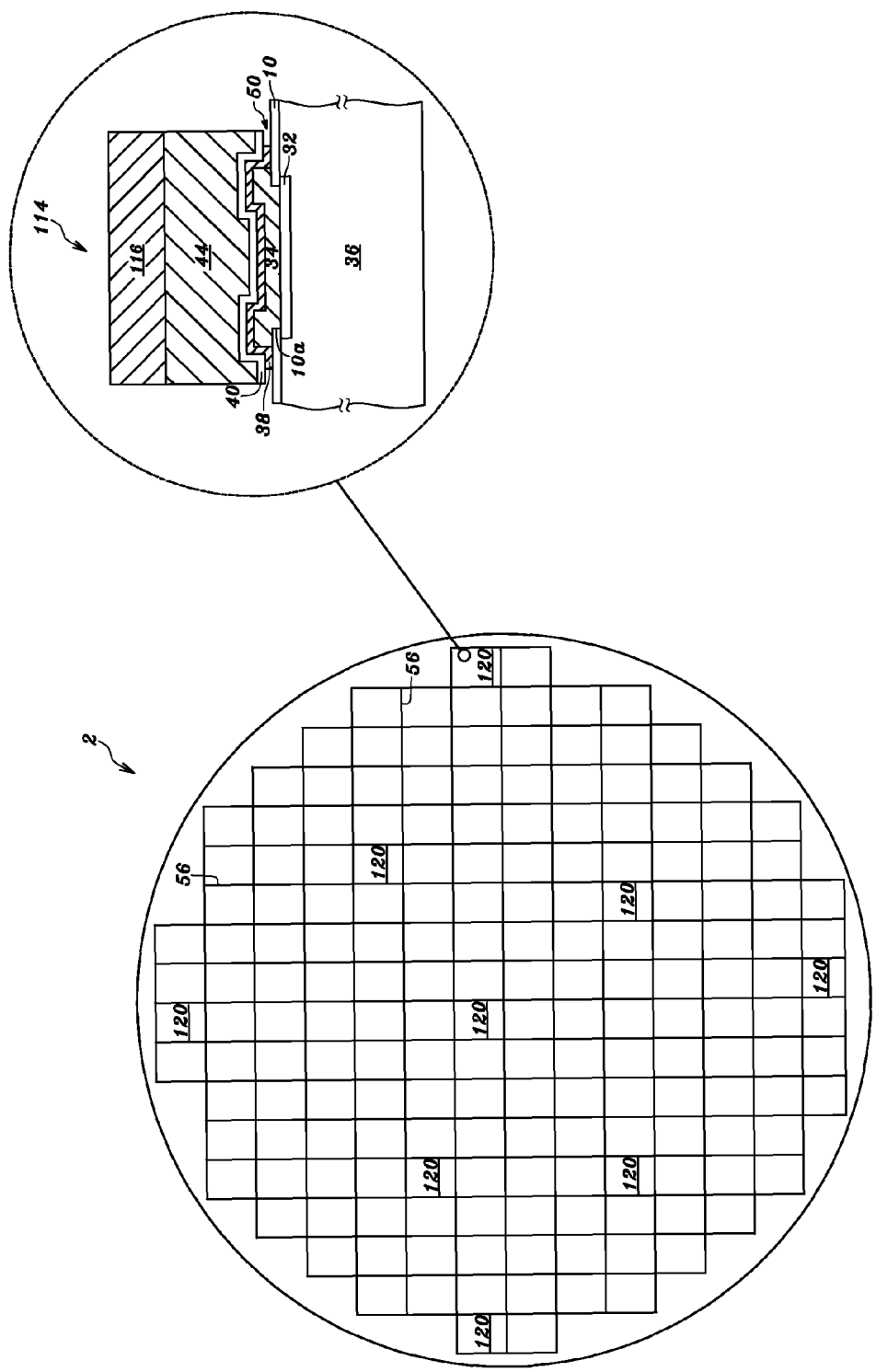
FIG. 5B is a top view showing a semiconductor wafer with multiple metal bumps.

After the metal bumps 114 are formed, the semiconductor wafer 2 can be cut into multiple chips 120. The detail can be referred as to FIG. 5B. Referring to FIG. 5B, the semiconductor wafer 2 includes multiple semiconductor chips 120 with scribe lines 56 between neighboring two of the semiconductor chips 120. The metal bumps 114 are on the metal caps 34, of each semiconductor chips 120, on the pads 32 exposed by the openings 10a. In a wafer dicing process, the semiconductor wafer 2 can be cut along the scribe lines 56 to separate the semiconductor chips 120.

TCP (Tape Carrier Package)—Gold to Tin Connection

Figure 5C:
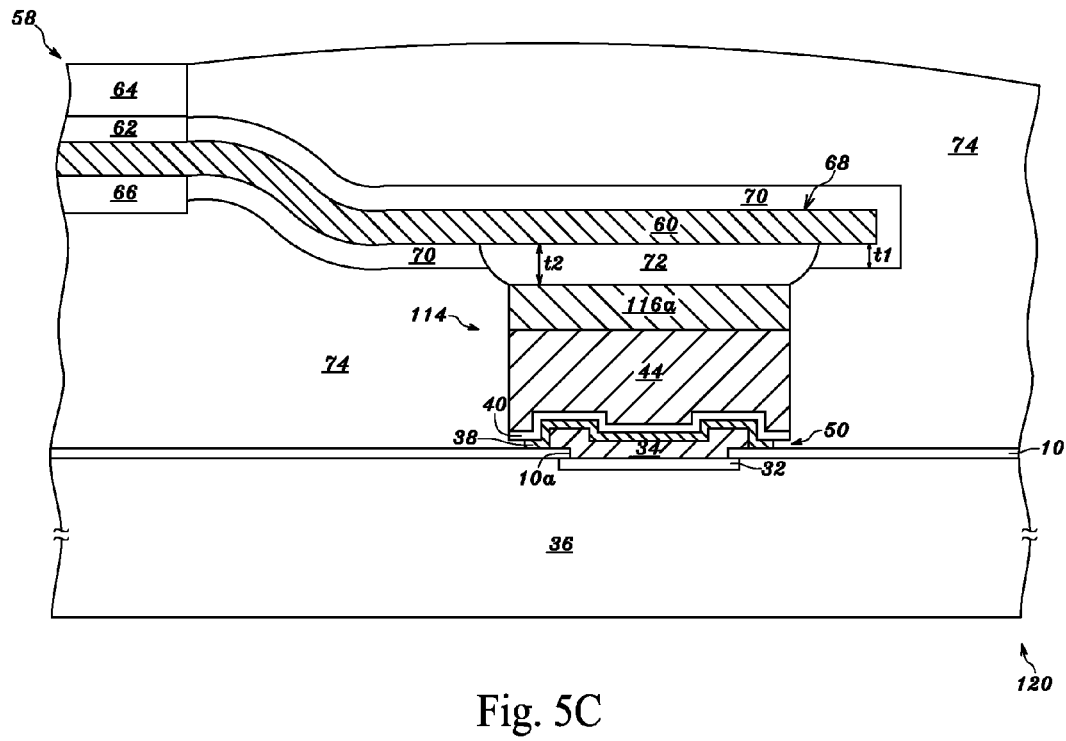

Referring to FIG. 5C, the flexible circuit film 58 as mentioned in FIG. 2G can be bonded with the metal bumps 114 (only one of them is shown) on the metal caps 34. The specification of the flexible circuit film 58 shown in FIG. 5C can be referred to as the specification of the flexible circuit film 58 illustrated in FIG. 2G The process of thermally pressing the tin-containing layer 70 of the flexible circuit film 58 on the gold layer 116 of the metal bumps 114, as shown in FIG. 5C, can be referred to as the process of thermally pressing the tin-containing layer 70 of the flexible circuit film 58 on the gold layer 116 of the metal bumps 114, as illustrated in FIG. 4C. Thereby, a tin-alloy layer 72 containing gold can be formed between the remaining gold layer 116a of the metal bumps 114 and the copper traces 60 of the flexible circuit film 58, wherein the remaining gold layer 116a has a thickness of between 0.2 and 6 micrometers, and preferably of between 1.5 and 4 micrometers. The specification of the tin-alloy layer 72 shown in FIG. 5C can be referred to as the specification of the tin-alloy layer 72 illustrated in FIG. 4C.

After the metal bumps 114 are connected to the tin-containing layer 70 on the bottom surface of the inner leads 68 using a thermal pressing process, a polymer material 74, such as epoxy or polyimide, can be formed between the semiconductor chip 120 and the tin-containing layer 70 on the bottom surface of the inner leads 68, and enclosing the metal bumps 114. Next, the polymer material 74 is cured at a temperature of between 150 and 250° C.

In the FIG. 5C, the copper traces 60 can be replaced by multiple gold traces having a thickness of between 3 and 30 μm, and preferably of between 5 and 20 μm. Alternatively, the copper traces 60 can be replaced by multiple silver traces having a thickness of between 3 and 30 μm, and preferably of between 5 and 20 μm.

TCP (Tape Carrier Package)—Gold to Gold Connection

Figure 5D:
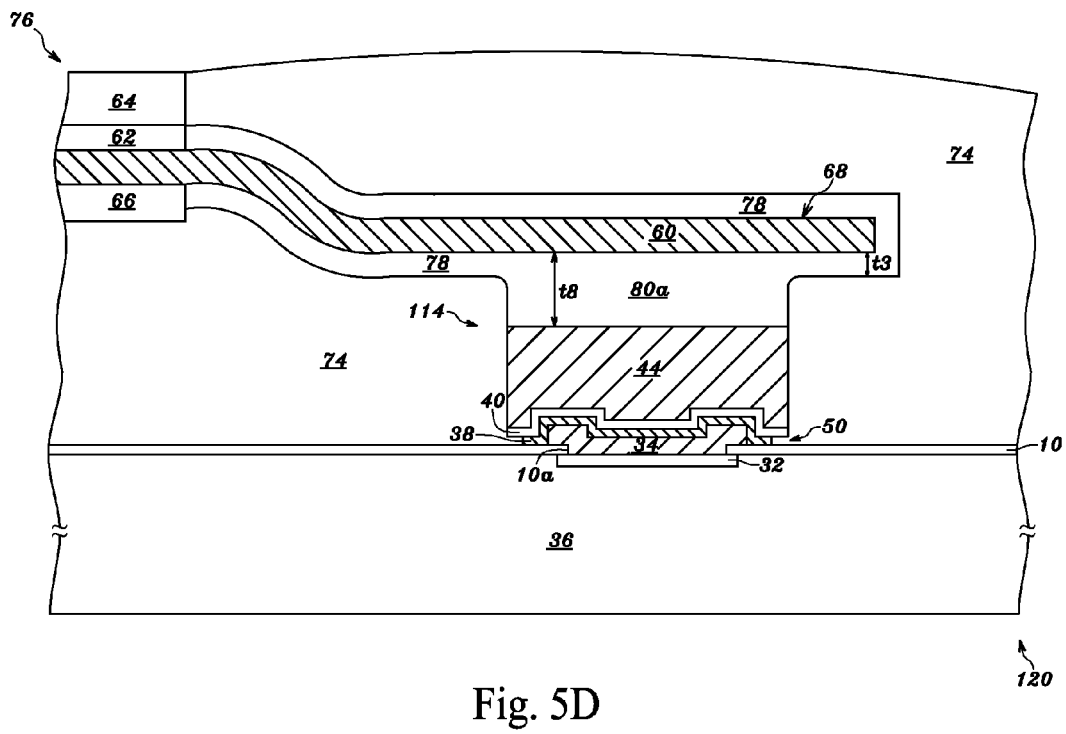

Referring to FIG. 5D, the flexible circuit film 76 as mentioned in FIG. 2I can be bonded with the metal bumps 114 (only one of them is shown) on the metal caps 34. The specification of the flexible circuit film 76 shown in FIG. 5D can be referred to as the specification of the flexible circuit film 76 illustrated in FIG. 2I. The process of thermally pressing the gold layer 78 of the flexible circuit film 76 on the gold layer 116 of the metal bumps 114, as shown in FIG. 5D, can be referred to as the process of thermally pressing the gold layer 78 of the flexible circuit film 76 on the gold layer 116 of the metal bumps 114, as illustrated in FIG. 4D. Thereby, a gold layer 80a formed by the joint of the gold layer 78 and the gold layer 116 can be between the copper layer 44 of the metal bumps 114 and the copper traces 60 of the flexible circuit film 76, wherein the gold layer 80a has a thickness t8 of between 1 and 10 micrometers, and preferably of between 3 and 6 micrometers.

After the metal bumps 114 are connected to the copper traces 60 using a thermal pressing process, a polymer material 74, such as epoxy or polyimide, can be formed between the semiconductor chip 120 and the gold layer 78 on the bottom surface of the inner leads 68, and enclosing the metal bumps 114. Next, the polymer material 74 is cured at a temperature of between 150 and 250° C.

COF (Chip on Film) Package—Gold to Tin Connection

Figure 5E:
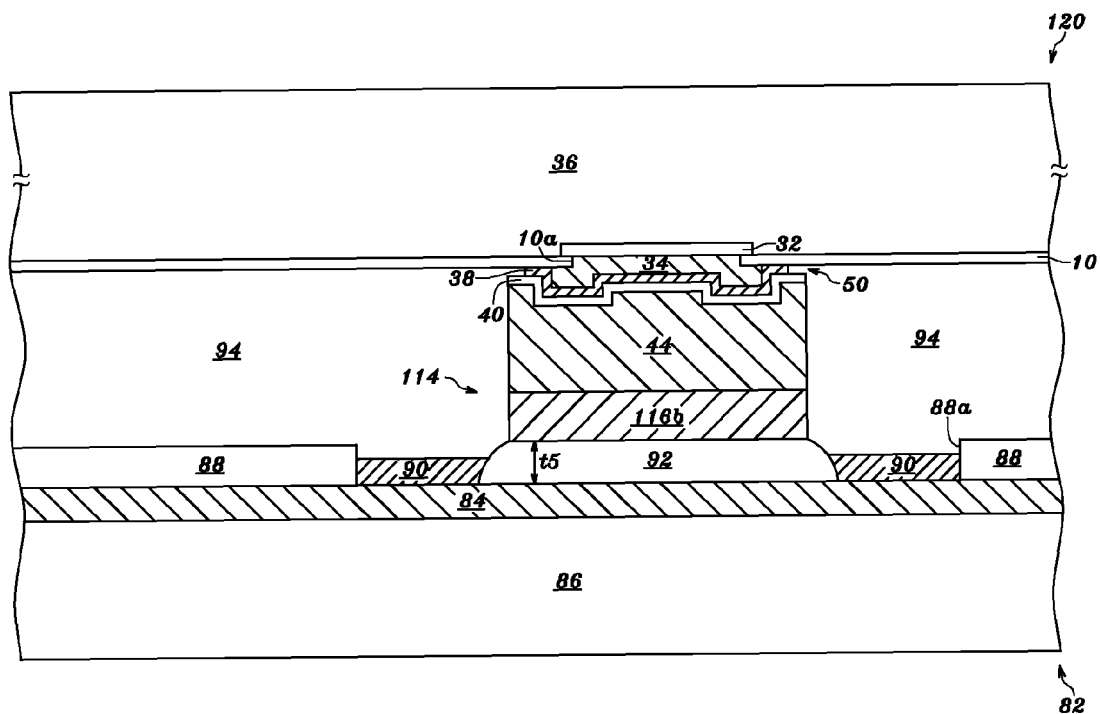

Referring to FIG. 5E, the flexible circuit film 82 as mentioned in FIG. 2K can be bonded with the metal bumps 114 (only one of them is shown) on the metal caps 34. The specification of the flexible circuit film 82 shown in FIG. 5E can be referred to as the specification of the flexible circuit film 82 illustrated in FIG. 2K. The process of thermally pressing the tin-containing layer 90 of the flexible circuit film 82 on the gold layer 116 of the metal bumps 114, as shown in FIG. 5E, can be referred to as the process of thermally pressing the tin-containing layer 90 of the flexible circuit film 82 on the gold layer 116 of the metal bumps 114, as illustrated in FIG. 4E. Alternatively, the process of thermally pressing the gold layer 116 of the metal bumps 114 on the tin-containing layer 90 of the flexible circuit film 82, as shown in FIG. 5E, can be referred to as the process of thermally pressing the gold layer 116 of the metal bumps 114 on the tin-containing layer 90 of the flexible circuit film 82, as illustrated in FIG. 4E. Thereby, a tin-alloy layer 92 containing gold can be formed between the remaining gold layer 116b of the metal bumps 114 and the copper traces 84 of the flexible circuit film 82, wherein the remaining gold layer 116b has a thickness of between 0.2 and 6 micrometers, and preferably of between 1.5 and 4 micrometers. The specification of the tin-alloy layer 92 shown in FIG. 5E can be referred to as the specification of the tin-alloy layer 92 illustrated in FIG. 4E.

After the metal bumps 114 are connected to the copper traces 84 using a thermal pressing process, a polymer material 94, such as epoxy or polyimide, can be formed between the passivation layer 10 of the semiconductor chip 120 and the polymer layer 88 of the flexible circuit film 82, and enclosing the metal bumps 114. Next, the polymer material 94 is cured at a temperature of between 150 and 250° C.

In the FIG. 5E, the copper traces 84 can be replaced by multiple gold traces having a thickness of between 3 and 30 μm, and preferably of between 5 and 20 μm. Alternatively, the copper traces 84 can be replaced by multiple silver traces having a thickness of between 3 and 30 μm, and preferably of between 5 and 20 μm.

COF (Chip on Film) Package—Gold to Gold Connection

Figure 5F:
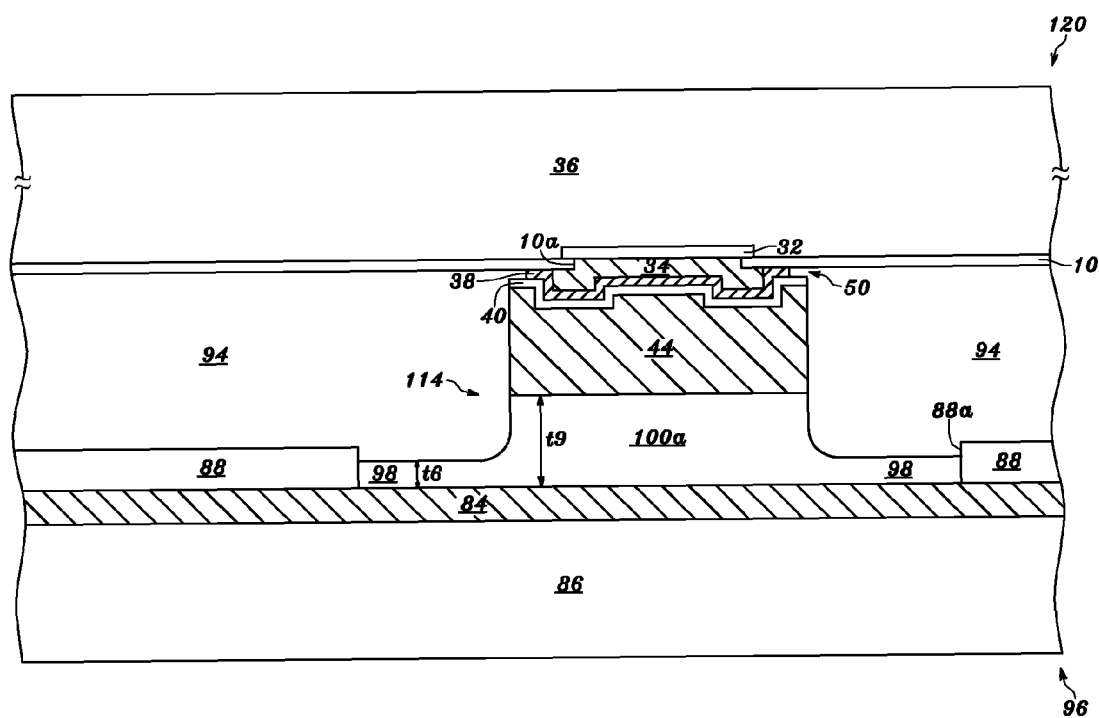

Referring to FIG. 5F, the flexible circuit film 96 as mentioned in FIG. 2M can be bonded with the metal bumps 114 (only one of them is shown) on the metal caps 34. The specification of the flexible circuit film 96 shown in FIG. 5F can be referred to as the specification of the flexible circuit film 96 illustrated in FIG. 2M. The process of thermally pressing the gold layer 98 of the flexible circuit film 96 on the gold layer 116 of the metal bumps 114, as shown in FIG. 5F, can be referred to as the process of thermally pressing the gold layer 98 of the flexible circuit film 96 on the gold layer 116 of the metal bumps 114, as illustrated in FIG. 4F. Alternatively, the process of thermally pressing the gold layer 116 of the metal bumps 114 on the gold layer 98 of the flexible circuit film 96, as shown in FIG. 5F, can be referred to as the process of thermally pressing the gold layer 116 of the metal bumps 114 on the gold layer 98 of the flexible circuit film 96, as illustrated in FIG. 4F. Thereby, a gold layer 100a formed by the joint of the gold layer 98 and the gold layer 116 can be between the copper layer 44 of the metal bumps 114 and the copper traces 84 of the flexible circuit film 96, wherein the gold layer 100a has a thickness t9 of between 1 and 10 micrometers, and preferably of between 3 and 6 micrometers.

After the metal bumps 114 are connected to the copper traces 84 using a thermal pressing process, a polymer material 94, such as epoxy or polyimide, can be formed between the passivation layer 10 of the semiconductor chip 120 and the polymer layer 88 of the flexible circuit film 96, and enclosing the metal bumps 114. Next, the polymer material 94 is cured at a temperature of between 150 and 250° C.

COG (Chip on Glass) Assembly—ACF/ACP

Figure 5G:
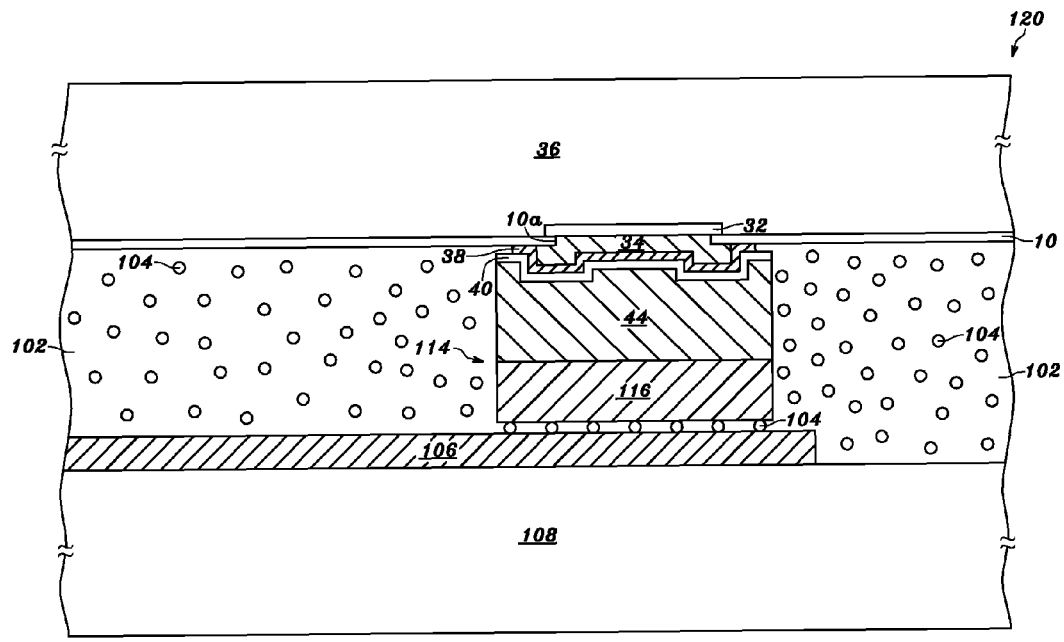

Referring to FIG. 5G, via a thermal pressing process, the gold layer 116 of the metal bumps 114 (only one of them is shown) on the metal caps 34 is pressed into an anisotropic conductive film (ACF) or an anisotropic conductive paste (ACP) 102. Thus, metal particles 104 inside ACF or ACP 102 clusters between the gold layer 116 of the metal bumps 114 and multiple conductive traces 106 (only one of them is shown), such as indium tin oxide (ITO) or gold, on a glass substrate 108, leading the gold layer 116 of the metal bumps 114 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 116 of the metal bumps 114 may be pressed into ACF or ACP 102 preformed on a ceramic substrate or a printed circuit board to have metal particles 104 in the ACF or ACP 102 connecting the gold layer 116 of the metal bumps 114 to multiple pads on the ceramic substrate or on the organic substrate.

COG (Chip on Glass) Assembly—NCF

Figure 5H:
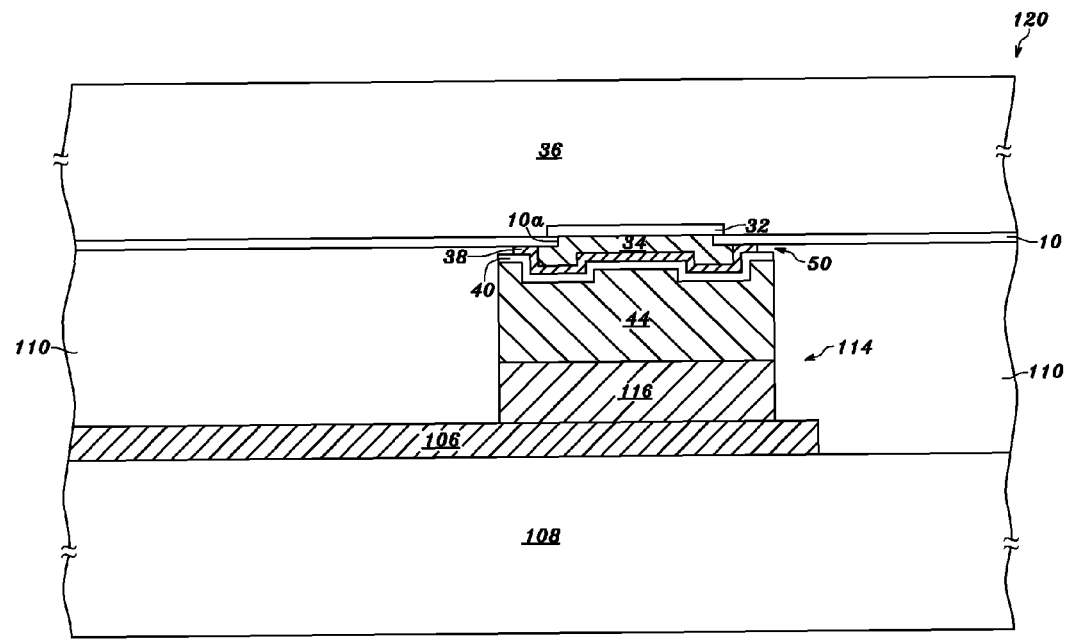

Referring to FIG. 5H, via a thermal pressing process, the gold layer 116 of the metal bumps 114 (only one of them is shown) on the metal caps 34 is pressed into a non-conductive film (NCF) 110, and the gold layer 116 of the metal bumps 114 contacts with multiple conductive traces 106 (only one of them is shown), such as indium tin oxide (ITO) or gold, on a glass substrate 108, leading the gold layer 116 of the metal bumps 114 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 116 of the metal bumps 114 may be pressed into NCF 110 preformed on a ceramic substrate or a printed circuit board to have the gold layer 116 of the metal bumps 114 contacting with multiple pads on the ceramic substrate or on the organic substrate.

Embodiment 5

Figure 6A:
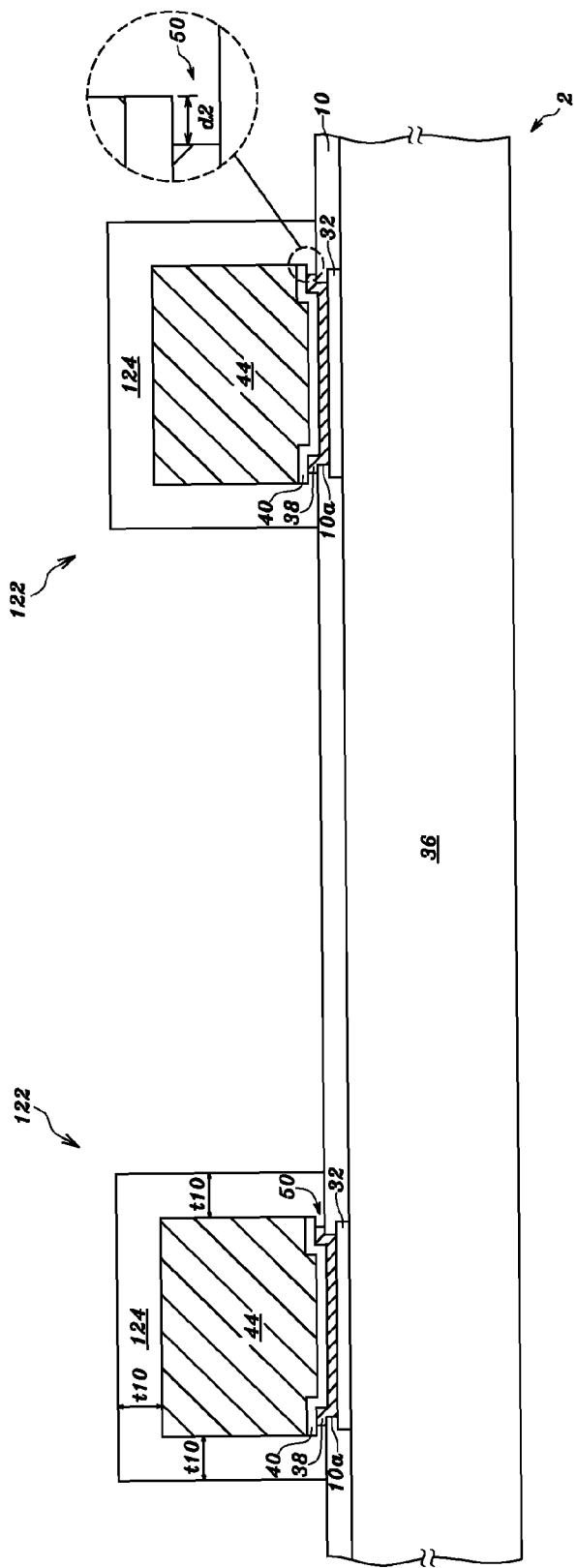
FIG. 6A and FIGS. 6C through 6H are cross-sectional views showing a process for fabricating multiple metal bumps on a wafer and packaging a chip singulated from the wafer according to one embodiment of the present invention.

Referring to FIG. 6A, multiple metal bumps 122 can be formed on the pads 32, such as copper pads or aluminum pads, exposed by the openings 10a. The process for forming the metal bumps 122 on the pads 32 can be performed by the above-mentioned steps as shown in FIGS. 2A-2B, followed by electroplating a copper layer 44 having a thickness of between 5 and 30 micrometers, and preferably of between 10 and 20 micrometers, on the seed layer 40 exposed by the openings 42a, followed by the above-mentioned steps as shown in FIGS. 2D-2E, followed by electroless plating a gold layer 124 having a thickness t10 of between 1 and 10 micrometers, and preferably of between 3 and 6 micrometers, on a top surface of the copper layer 44 and on a sidewall or sidewalls of the copper layer 44.

Thereby, the metal bumps 122 can be formed of the adhesion/barrier layer 38 on the pads 32, a copper layer (including the seed layer 40 and the electroplated copper layer 44), having a thickness of between 5 and 30 micrometers, and preferably of between 10 and 20 micrometers, on the adhesion/barrier layer 38 and the gold layer 124 on a top surface of the copper layer and on a sidewall or sidewalls of the copper layer. Alternatively, the gold layer 124 can be replaced by a silver layer, having a thickness of between 1 and 10 µm, and preferably of between 3 and 6 µm, electroless plated on the top surface of the copper layer (including the seed layer 40 and the electroplated copper layer 44) and on the sidewall or the sidewalls of the copper layer.

Figure 6B:
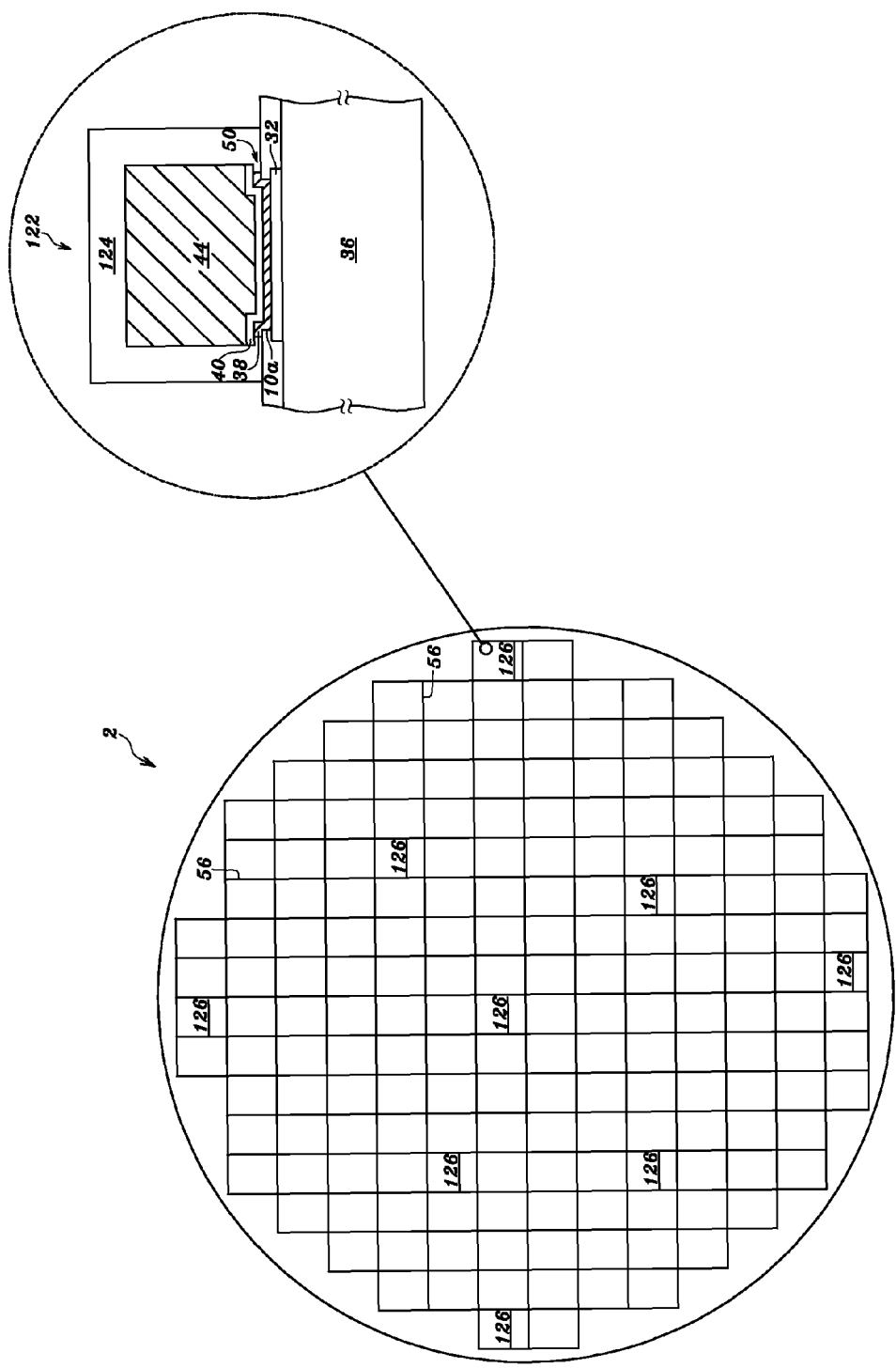
FIG. 6B is a top view showing a semiconductor wafer with multiple metal bumps.

After the metal bumps 122 are formed, the semiconductor wafer 2 can be cut into multiple chips 126. The detail can be referred as to FIG. 6B. Referring to FIG. 6B, the semiconductor wafer 2 includes multiple semiconductor chips 126 with scribe lines 56 between neighboring two of the semiconductor chips 126. The metal bumps 122 are on the pads 32, of each semiconductor chips 126, exposed by the openings 10a. In a wafer dicing process, the semiconductor wafer 2 can be cut along the scribe lines 56 to separate the semiconductor chips 126.

TCP (Tape Carrier Package)—Gold to Tin Connection

Figure 6C:
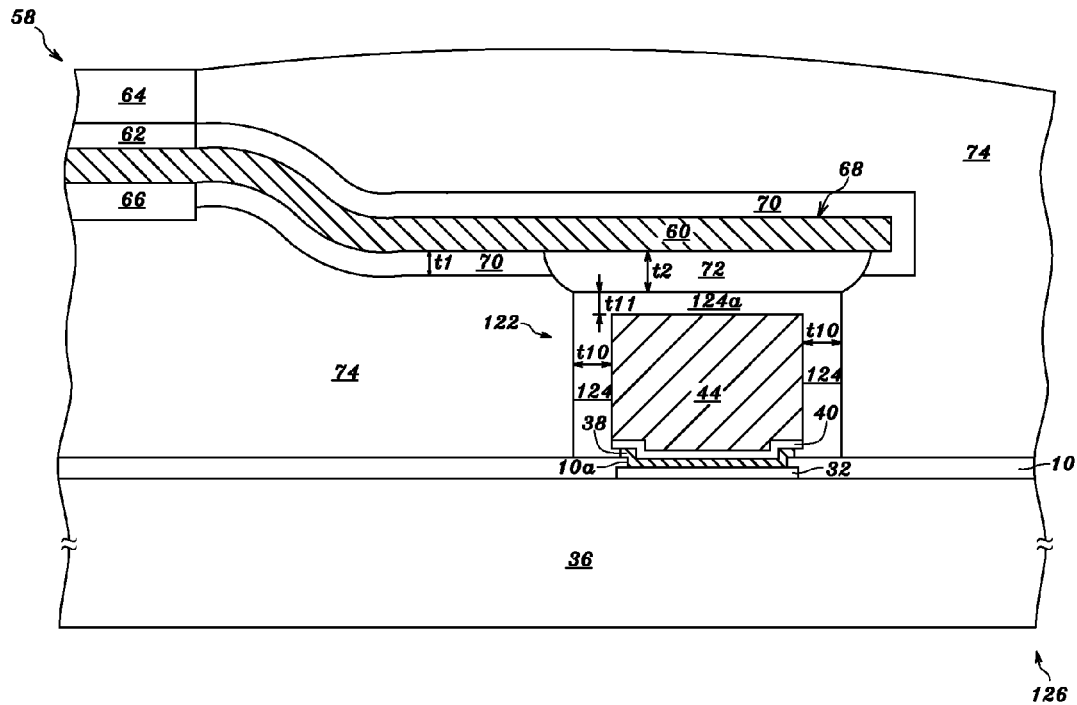

Referring to FIG. 6C, the flexible circuit film 58 as mentioned in FIG. 2G can be bonded with the metal bumps 122 (only one of them is shown). The specification of the flexible circuit film 58 shown in FIG. 6C can be referred to as the specification of the flexible circuit film 58 illustrated in FIG. 2G When the flexible circuit film 58 is bonded with the metal bumps 122, the tin-containing layer 70 on a bottom surface of the inner leads 68 (only one of them is shown) can be thermally pressed on a top surface of the gold layer 124 of the metal bumps 122 at a temperature of between 490 and 540° C., and preferably of between 500 and 520° C., for a time of between 1 and 10 seconds, and preferably of between 3 and 6 seconds. Thereby, a tin-alloy layer 72 containing gold can be formed between the remaining gold layer 124a of the metal bumps 122 and the copper traces 60 of the flexible circuit film 58, wherein the remaining gold layer 124a on the top surface of the copper layer 44 has a thickness t11 of between 0.2 and 6 micrometers, and preferably of between 1.5 and 4 micrometers. The tin-alloy layer 72 has a thickness t2 of between 0.5 and 10 micrometers, of between 1 and 5 micrometers or of between 1.5 and 3 micrometers. When the tin-containing layer 70 before bonded with the gold layer 124 is pure tin, the tin-alloy layer 72 is tin-gold alloy having a thickness t2 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 70 before bonded with the gold layer 124 is tin-silver alloy, the tin-alloy layer 72 is tin-silver-gold alloy having a thickness t2 of between 0.5 and 10 micrometers, of between 1 and 5 micrometers or of between 1.5 and 3 micrometers. When the tin-containing layer 70 before bonded with the gold layer 124 is tin-silver-copper alloy, the tin-alloy layer 72 is tin-silver-gold-copper alloy having a thickness t2 of between 0.5 and 10 micrometers, of between 1 and 5 micrometers or of between 1.5 and 3 micrometers.

After the metal bumps 122 are connected to the tin-containing layer 70 on the bottom surface of the inner leads 68 using a thermal pressing process, a polymer material 74, such as epoxy or polyimide, can be formed between the semiconductor chip 126 and the tin-containing layer 70 on the bottom surface of the inner leads 68, and enclosing the metal bumps 122. Next, the polymer material 74 is cured at a temperature of between 150 and 250° C.

In the FIG. 6C, the copper traces 60 can be replaced by multiple gold traces having a thickness of between 3 and 30 µm, and preferably of between 5 and 20 µm. Alternatively, the copper traces 60 can be replaced by multiple silver traces having a thickness of between 3 and 30 µm, and preferably of between 5 and 20 µm.

TCP (Tape Carrier Package)—Gold to Gold Connection

Figure 6D:
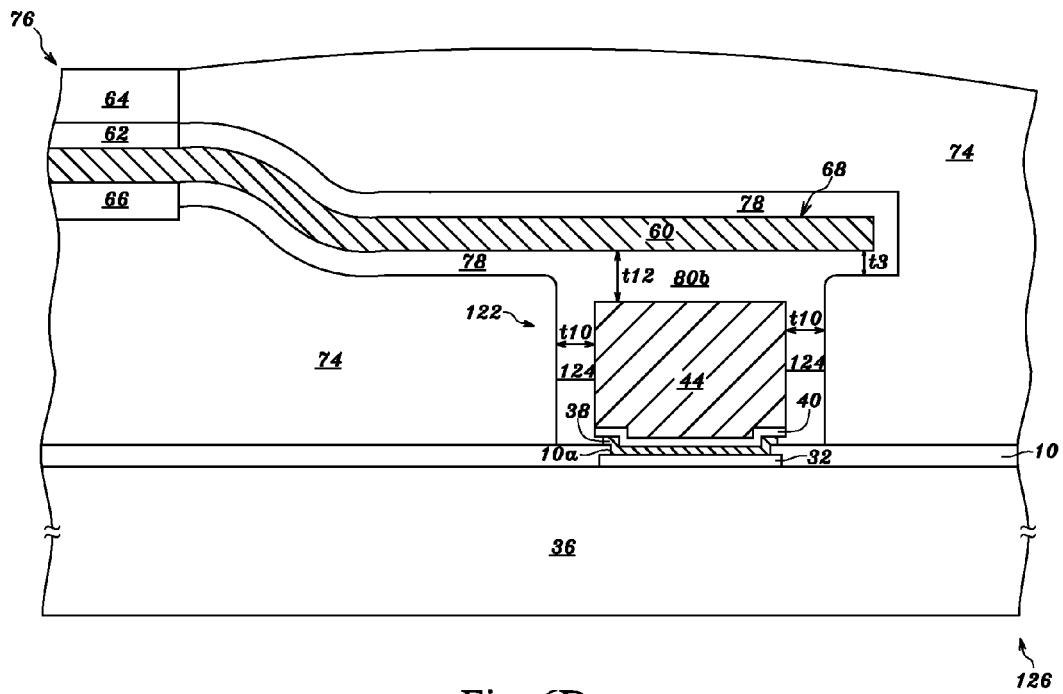

Referring to FIG. 6D, the flexible circuit film 76 as mentioned in FIG. 2I can be bonded with the metal bumps 122 (only one of them is shown). The specification of the flexible circuit film 76 shown in FIG. 6D can be referred to as the specification of the flexible circuit film 76 illustrated in FIG. 2I. When the flexible circuit film 76 is bonded with the metal bumps 122, the gold layer 78 on a bottom surface of the inner leads 68 (only one of them is shown) can be thermally pressed on a top surface of the gold layer 124 of the metal bumps 122 at a temperature of between 490 and 540° C., and preferably of between 500 and 520° C., for a time of between 1 and 10 seconds, and preferably of between 3 and 6 seconds. Thereby, a gold layer 80b formed by the joint of the gold layer 78 and the gold layer 124 can be between the copper layer 44 of the metal bumps 122 and the copper traces 60 of the flexible circuit film 76, wherein the gold layer 80b has a thickness t12 of between 1 and 10 micrometers, and preferably of between 3 and 6 micrometers.

After the metal bumps 122 are connected to the copper traces 60 using a thermal pressing process, a polymer material 74, such as epoxy or polyimide, can be formed between the semiconductor chip 126 and the gold layer 78 on the bottom surface of the inner leads 68, and enclosing the metal bumps 122. Next, the polymer material 74 is cured at a temperature of between 150 and 250° C.

COF (Chip on Film) Package—Gold to Tin Connection

Figure 6E:
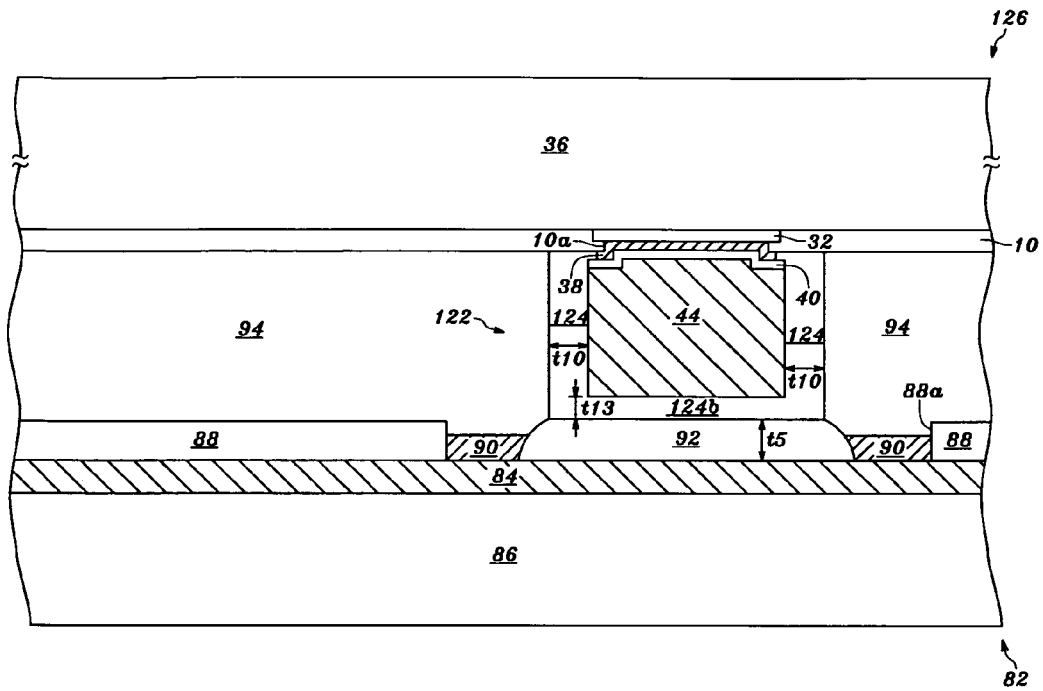

Referring to FIG. 6E, the flexible circuit film 82 as mentioned in FIG. 2K can be bonded with the metal bumps 122 (only one of them is shown). The specification of the flexible circuit film 82 shown in FIG. 6E can be referred to as the specification of the flexible circuit film 82 illustrated in FIG. 2K. When the flexible circuit film 82 is bonded with the metal bumps 122, a top surface of the gold layer 124 of the metal bumps 122 can be thermally pressed on the tin-containing layer 90 of the flexible circuit film 82 at a temperature of between 490 and 540° C., and preferably of between 500 and 520° C., for a time of between 1 and 10 seconds, and preferably of between 3 and 6 seconds. Alternatively, when the flexible circuit film 82 is bonded with the metal bumps 122, the tin-containing layer 90 of the flexible circuit film 82 can be thermally pressed on a top surface of the gold layer 124 of the metal bumps 122 at a temperature of between 490 and 540° C., and preferably of between 500 and 520° C., for a time of between 1 and 10 seconds, and preferably of between 3 and 6 seconds. Thereby, a tin-alloy layer 92 containing gold can be formed between the remaining gold layer 124$b$ of the metal bumps 122 and the copper traces 84 of the flexible circuit film 82, wherein the remaining gold layer 124$b$ on the top surface of the copper layer 44 has a thickness t13 of between 0.2 and 6 micrometers, and preferably of between 1.5 and 4 micrometers. The tin-alloy layer 92 has a thickness t5 of between 0.5 and 10 micrometers, of between 1 and 5 micrometers or of between 1.5 and 3 micrometers. When the tin-containing layer 90 before bonded with the gold layer 124 is pure tin, the tin-alloy layer 92 is tin-gold alloy having a thickness t5 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 90 before bonded with the gold layer 124 is tin-silver alloy, the tin-alloy layer 92 is tin-silver-gold alloy having a thickness t5 of between 0.5 and 10 micrometers, of between 1 and 5 micrometers or of between 1.5 and 3 micrometers. When the tin-containing layer 90 before bonded with the gold layer 124 is tin-silver-copper alloy, the tin-alloy layer 92 is tin-silver-gold-copper alloy having a thickness t5 of between 0.5 and 10 micrometers, of between 1 and 5 micrometers or of between 1.5 and 3 micrometers.

After the metal bumps 122 are connected to the copper traces 84 using a thermal pressing process, a polymer material 94, such as epoxy or polyimide, can be formed between the passivation layer 10 of the semiconductor chip 126 and the polymer layer 88 of the flexible circuit film 82, and enclosing the metal bumps 122. Next, the polymer material 94 is cured at a temperature of between 150 and 250° C.

In the FIG. 6E, the copper traces 84 can be replaced by multiple gold traces having a thickness of between 3 and 30 µm, and preferably of between 5 and 20 µm. Alternatively, the copper traces 84 can be replaced by multiple silver traces having a thickness of between 3 and 30 µm, and preferably of between 5 and 20 µm.

COF (Chip on Film) Package—Gold to Gold Connection

Figure 6F:
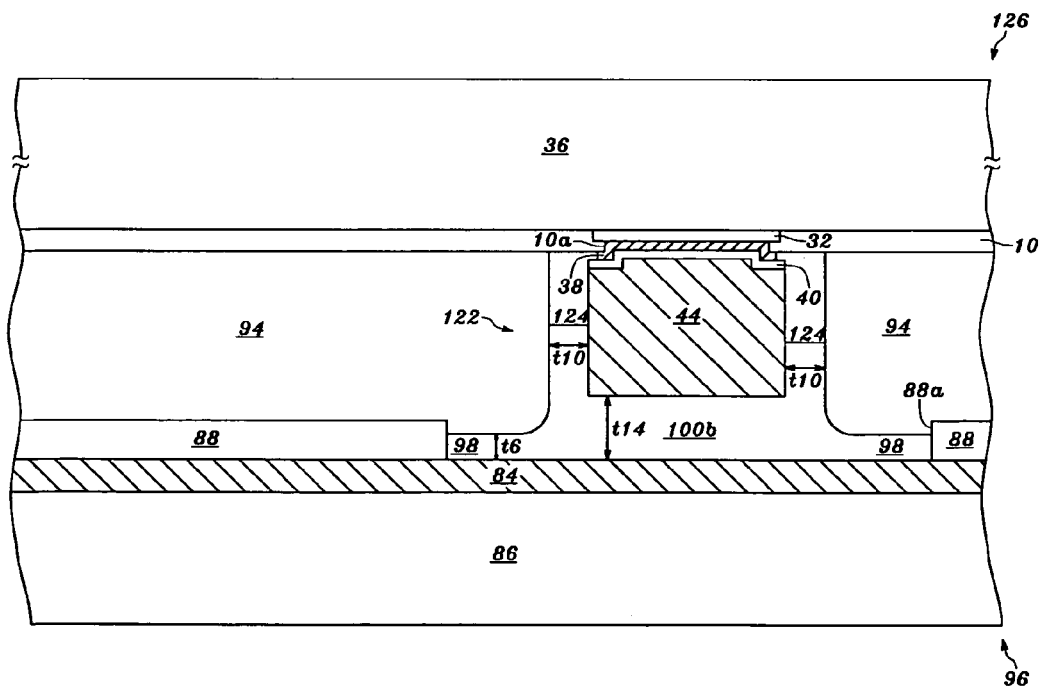

Referring to FIG. 6F, the flexible circuit film 96 as mentioned in FIG. 2M can be bonded with the metal bumps 122 (only one of them is shown). The specification of the flexible circuit film 96 shown in FIG. 6F can be referred to as the specification of the flexible circuit film 96 illustrated in FIG. 2M. When the flexible circuit film 96 is bonded with the metal bumps 122, a top surface of the gold layer 124 of the metal bumps 122 can be thermally pressed on the gold layer 98 of the flexible circuit film 96 at a temperature of between 490 and 540° C., and preferably of between 500 and 520° C., for a time of between 1 and 10 seconds, and preferably of between 3 and 6 seconds. Alternatively, when the flexible circuit film 96 is bonded with the metal bumps 122, the gold layer 98 of the flexible circuit film 96 can be thermally pressed on a top surface of the gold layer 124 of the metal bumps 122 at a temperature of between 490 and 540° C., and preferably of between 500 and 520° C., for a time of between 1 and 10 seconds, and preferably of between 3 and 6 seconds. Thereby, a gold layer 100$b$ formed by the joint of the gold layer 98 and the gold layer 124 can be between the copper layer 44 of the metal bumps 122 and the copper traces 84 of the flexible circuit film 96, wherein the gold layer 100$b$ has a thickness t14 of between 1 and 10 micrometers, and preferably of between 3 and 6 micrometers.

After the metal bumps 122 are connected to the copper traces 84 using a thermal pressing process, a polymer material 94, such as epoxy or polyimide, can be formed between the passivation layer 10 of the semiconductor chip 126 and the polymer layer 88 of the flexible circuit film 96, and enclosing the metal bumps 122. Next, the polymer material 94 is cured at a temperature of between 150 and 250° C.

COG (Chip on Glass) Assembly—ACF/ACP

Figure 6G:
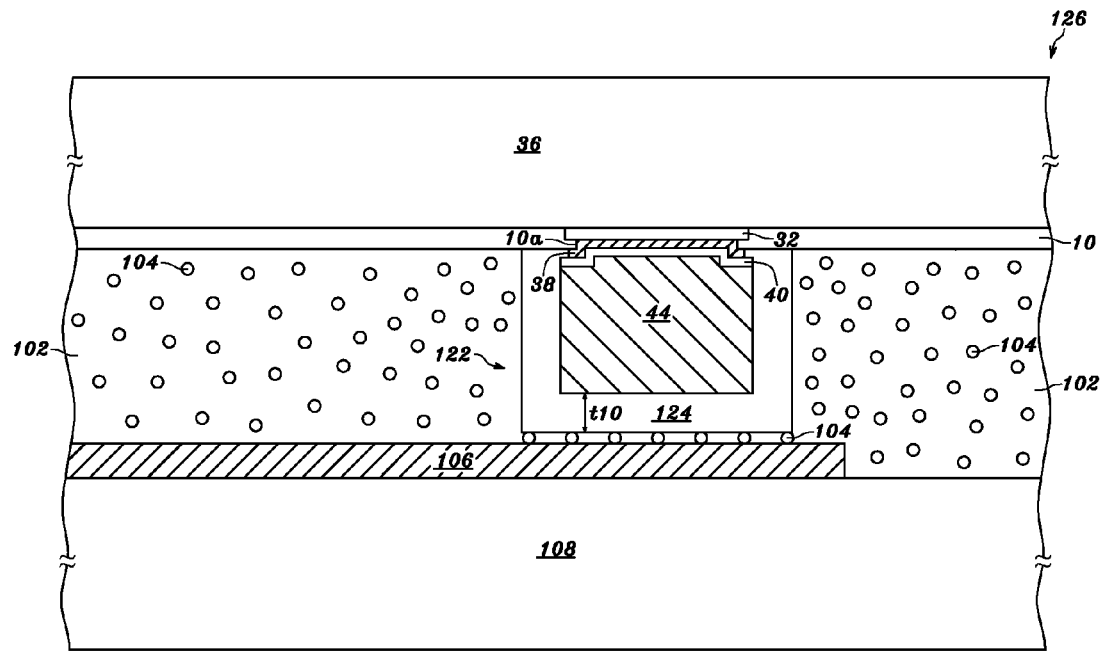

Referring to FIG. 6G, via a thermal pressing process, the gold layer 124 of the metal bumps 122 (only one of them is shown) is pressed into an anisotropic conductive film (ACF) or an anisotropic conductive paste (ACP) 102. Thus, metal particles 104 inside ACF or ACP 102 clusters between the gold layer 124 of the metal bumps 122 and multiple conductive traces 106 (only one of them is shown), such as indium tin oxide (ITO) or gold, on a glass substrate 108, leading the gold layer 124 of the metal bumps 122 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 124 of the metal bumps 122 may be pressed into ACF or ACP 102 preformed on a ceramic substrate or a printed circuit board to have metal particles 104 in the ACF or ACP 102 connecting the gold layer 124 of the metal bumps 122 to multiple pads on the ceramic substrate or on the organic substrate.

COG (Chip on Glass) Assembly—NCF

Figure 6H:
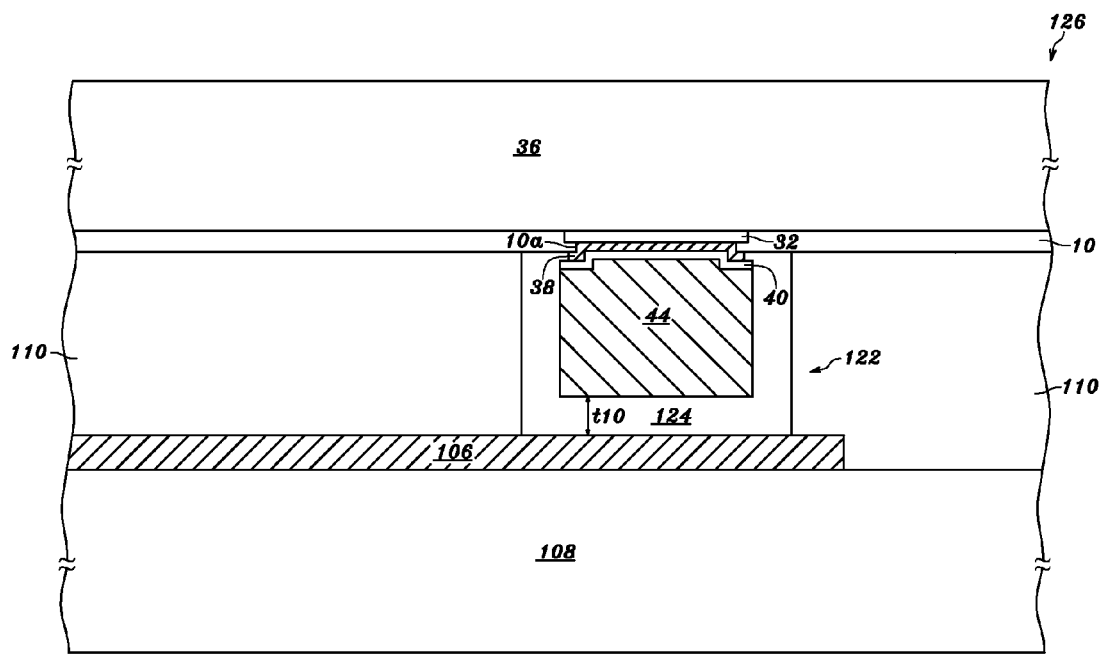

Referring to FIG. 6H, via a thermal pressing process, the gold layer 124 of the metal bumps 122 (only one of them is shown) is pressed into a non-conductive film (NCF) 110, and the gold layer 124 of the metal bumps 122 contacts with multiple conductive traces 106 (only one of them is shown), such as indium tin oxide (ITO) or gold, on a glass substrate 108, leading the gold layer 124 of the metal bumps 122 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 124 of the metal bumps 122 may be pressed into NCF 110 preformed on a ceramic substrate or a printed circuit board to have the gold layer 124 of the metal bumps 122 contacting with multiple pads on the ceramic substrate or on the organic substrate.

Embodiment 6

Figure 7A:
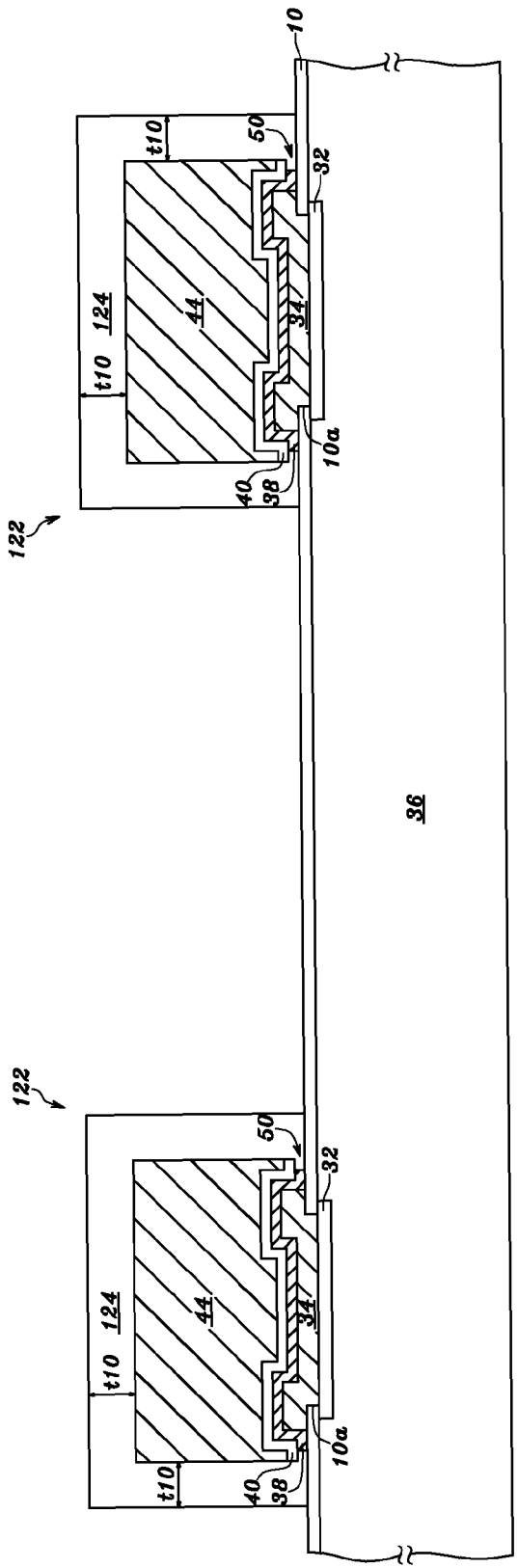
FIG. 7A and FIGS. 7C through 7H are cross-sectional views showing a process for fabricating multiple metal bumps on a wafer and packaging a chip singulated from the wafer according to one embodiment of the present invention.

Referring to FIG. 7A, the metal bumps 122 can be formed on the metal caps 34, respectively. The process for forming the metal bumps 122 on the metal caps 34 can be performed by forming an adhesion/barrier layer 38 having a thickness of between 0.02 and 0.5 µm, and preferably of between 0.25 and 0.35 µm, on the passivation layer 10 and on the aluminum-containing layer of the metal caps 34, wherein the aluminum-containing layer may be an aluminum-copper-alloy layer, an aluminum layer or an Al—Si—Cu-alloy layer, followed by forming the seed layer 40, made of copper, having a thickness of between 0.03 and 1 µm, and preferably of between 0.05 and 0.2 µm, on the adhesion/barrier layer 38, followed by the above-mentioned step as shown in FIG. 2B, followed by electroplating a copper layer 44 having a thickness of between 5 and 30 micrometers, and preferably of between 10 and 20 micrometers, on the seed layer 40 exposed by the openings 42a, followed by the above-mentioned steps as shown in FIGS. 2D-2E, followed by electroless plating a gold layer 124 having a thickness t10 of between 1 and 10 micrometers, and preferably of between 3 and 6 micrometers, on a top surface of the copper layer 44 and on a sidewall or sidewalls of the copper layer 44. The specification of the adhesion/barrier layer 38 and the seed layer 40 shown in FIG. 7A can be referred to as the specification of the adhesion/barrier layer 38 and the seed layer 40 illustrated in FIG. 2A. The process of forming the adhesion/barrier layer 38, as shown in FIG. 7A, can be referred to as the process of forming the adhesion/barrier layer 38, as illustrated in FIG. 2A. The process of forming the seed layer 40, as shown in FIG. 7A, can be referred to as the process of forming the seed layer 40, as illustrated in FIG. 2A.

Thereby, the metal bumps 122 can be formed of the adhesion/barrier layer 38 on the metal caps 34, a copper layer (including the seed layer 40 and the electroplated copper layer 44), having a thickness of between 5 and 30 micrometers, and preferably of between 10 and 20 micrometers, on the adhesion/barrier layer 38 and the gold layer 124 on a top surface of the copper layer and on a sidewall or sidewalls of the copper layer. Alternatively, the gold layer 124 can be replaced by a silver layer, having a thickness of between 1 and 10 µm, and preferably of between 3 and 6 µm, electroless plated on the top surface of the copper layer (including the seed layer 40 and the electroplated copper layer 44) and on the sidewall or the sidewalls of the copper layer.

Figure 7B:
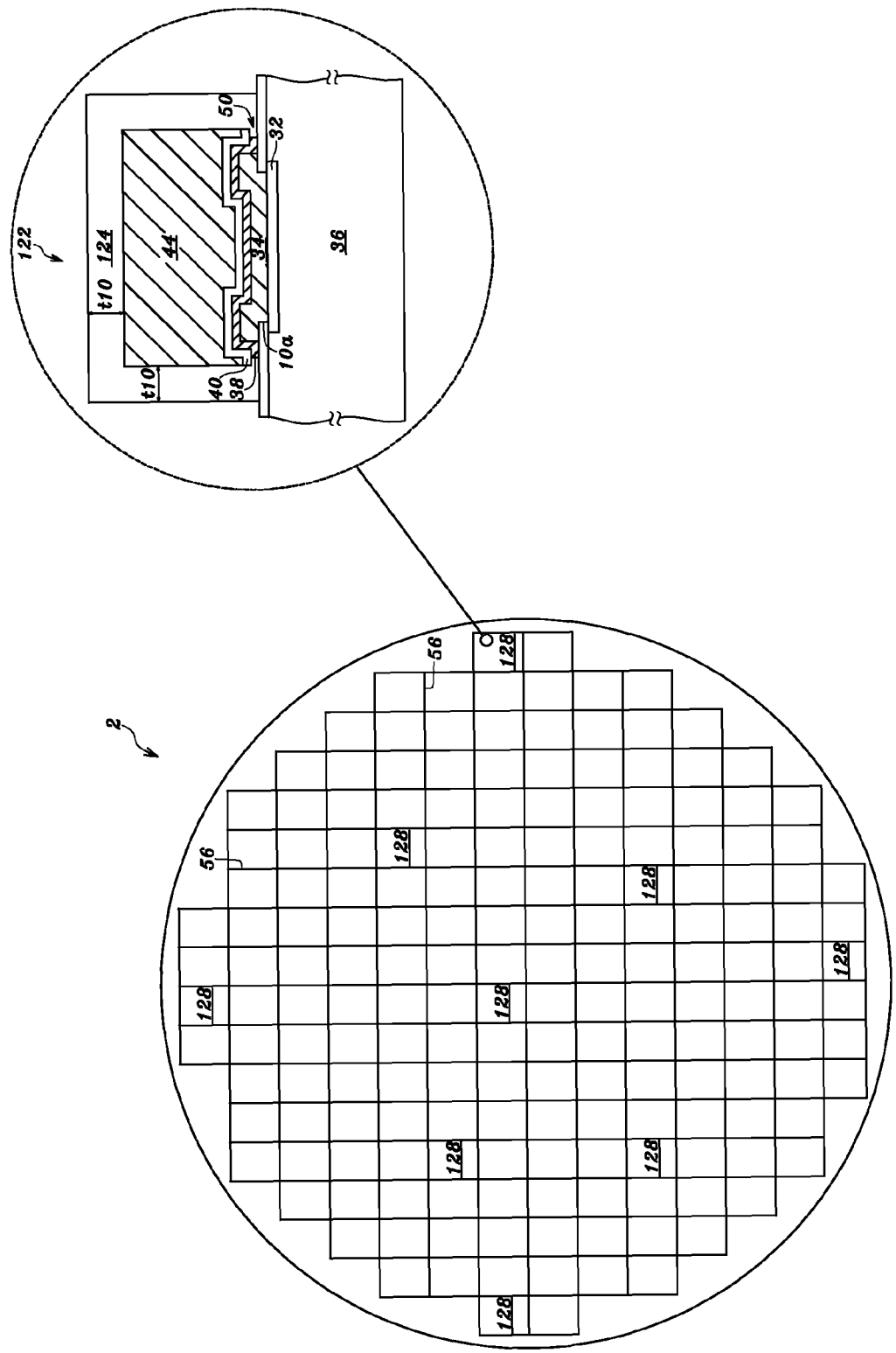
FIG. 7B is a top view showing a semiconductor wafer with multiple metal bumps.

After the metal bumps 122 are formed, the semiconductor wafer 2 can be cut into multiple chips 128. The detail can be referred as to FIG. 7B. Referring to FIG. 7B, the semiconductor wafer 2 includes multiple semiconductor chips 128 with scribe lines 56 between neighboring two of the semiconductor chips 128. The metal bumps 122 are on the metal caps 34, of each semiconductor chips 128, on the pads 32 exposed by the openings 10a. In a wafer dicing process, the semiconductor wafer 2 can be cut along the scribe lines 56 to separate the semiconductor chips 128.

TCP (Tape Carrier Package)—Gold to Tin Connection

Figure 7C:
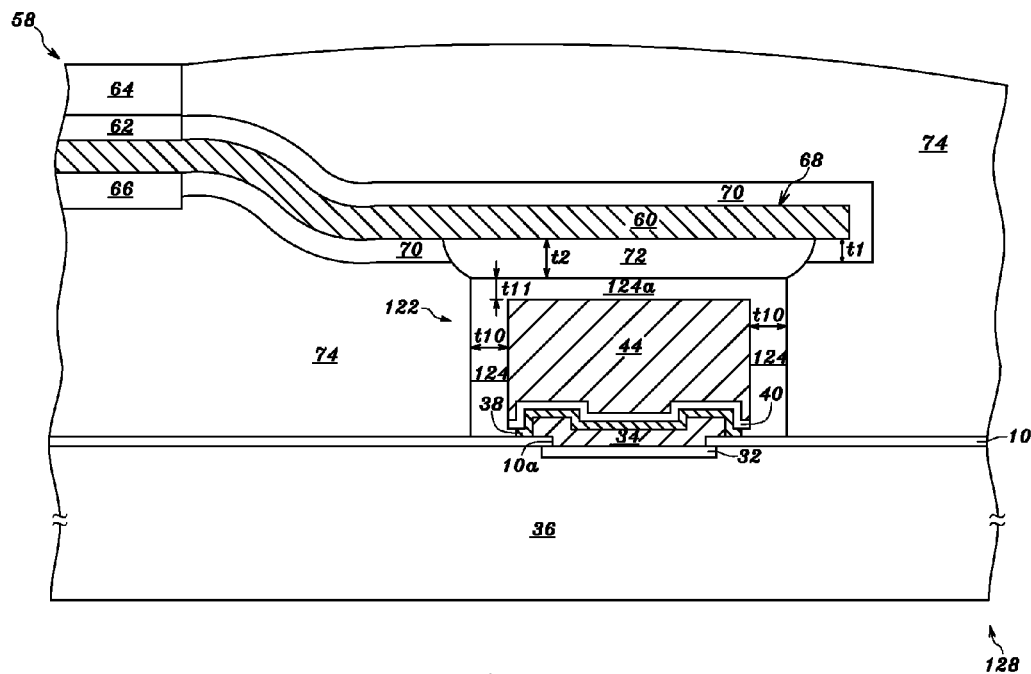

Referring to FIG. 7C, the flexible circuit film 58 as mentioned in FIG. 2G can be bonded with the metal bumps 122 (only one of them is shown) on the metal caps 34. The specification of the flexible circuit film 58 shown in FIG. 7C can be referred to as the specification of the flexible circuit film 58 illustrated in FIG. 2G The process of thermally pressing the tin-containing layer 70 of the flexible circuit film 58 on a top surface of the gold layer 124 of the metal bumps 122, as shown in FIG. 7C, can be referred to as the process of thermally pressing the tin-containing layer 70 of the flexible circuit film 58 on the top surface of the gold layer 124 of the metal bumps 122, as illustrated in FIG. 6C. Thereby, a tin-alloy layer 72 containing gold can be formed between the remaining gold layer 124a of the metal bumps 122 and the copper traces 60 of the flexible circuit film 58, wherein the remaining gold layer 124a on the top surface of the copper layer 44 has a thickness of between 0.2 and 6 micrometers, and preferably of between 1.5 and 4 micrometers. The specification of the tin-alloy layer 72 shown in FIG. 7C can be referred to as the specification of the tin-alloy layer 72 illustrated in FIG. 6C.

After the metal bumps 122 are connected to the tin-containing layer 70 on the bottom surface of the inner leads 68 using a thermal pressing process, a polymer material 74, such as epoxy or polyimide, can be formed between the semiconductor chip 128 and the tin-containing layer 70 on the bottom surface of the inner leads 68, and enclosing the metal bumps 122. Next, the polymer material 74 is cured at a temperature of between 150 and 250° C.

In the FIG. 7C, the copper traces 60 can be replaced by multiple gold traces having a thickness of between 3 and 30 µm, and preferably of between 5 and 20 µm. Alternatively, the copper traces 60 can be replaced by multiple silver traces having a thickness of between 3 and 30 µm, and preferably of between 5 and 20 µm.

TCP (Tape Carrier Package)—Gold to Gold Connection

Figure 7D:
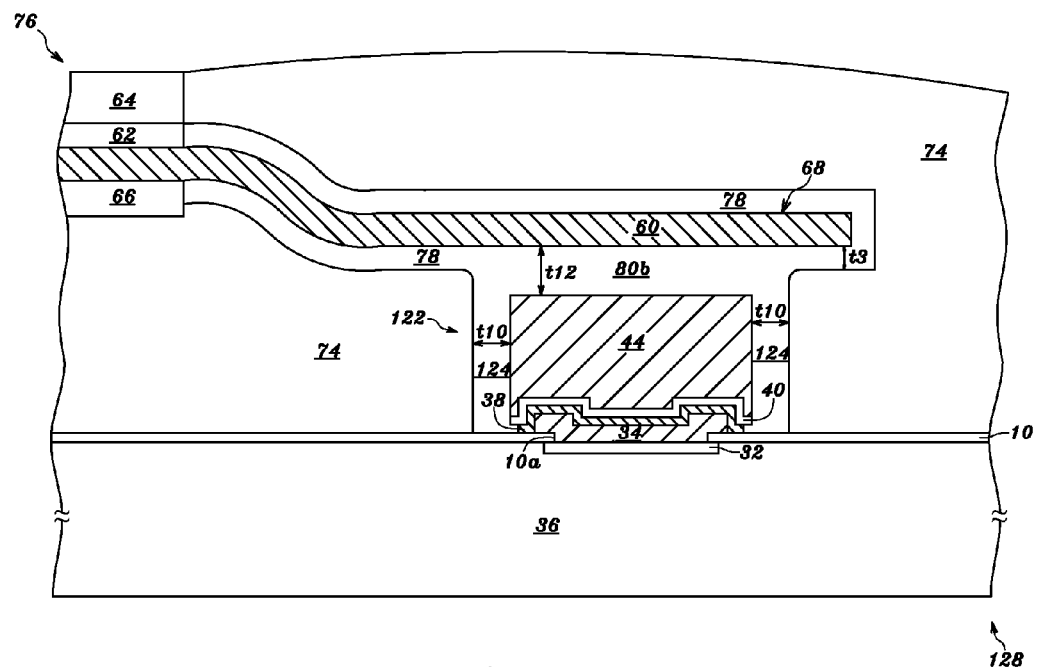

Referring to FIG. 7D, the flexible circuit film 76 as mentioned in FIG. 2I can be bonded with the metal bumps 122 (only one of them is shown) on the metal caps 34. The specification of the flexible circuit film 76 shown in FIG. 7D can be referred to as the specification of the flexible circuit film 76 illustrated in FIG. 2I. The process of thermally pressing the gold layer 78 of the flexible circuit film 76 on a top surface of the gold layer 124 of the metal bumps 122, as shown in FIG. 7D, can be referred to as the process of thermally pressing the gold layer 78 of the flexible circuit film 76 on the top surface of the gold layer 124 of the metal bumps 122, as illustrated in FIG. 6D. Thereby, a gold layer 80b formed by the joint of the gold layer 78 and the gold layer 124 can be between the copper layer 44 of the metal bumps 122 and the copper traces 60 of the flexible circuit film 76, wherein the gold layer 80b has a thickness t12 of between 1 and 10 micrometers, and preferably of between 3 and 6 micrometers.

After the metal bumps 122 are connected to the copper traces 60 using a thermal pressing process, a polymer material 74, such as epoxy or polyimide, can be formed between the semiconductor chip 128 and the gold layer 78 on the bottom surface of the inner leads 68, and enclosing the metal bumps 122. Next, the polymer material 74 is cured at a temperature of between 150 and 250° C.

COF (Chip on Film) Package—Gold to Tin Connection

Figure 7E:
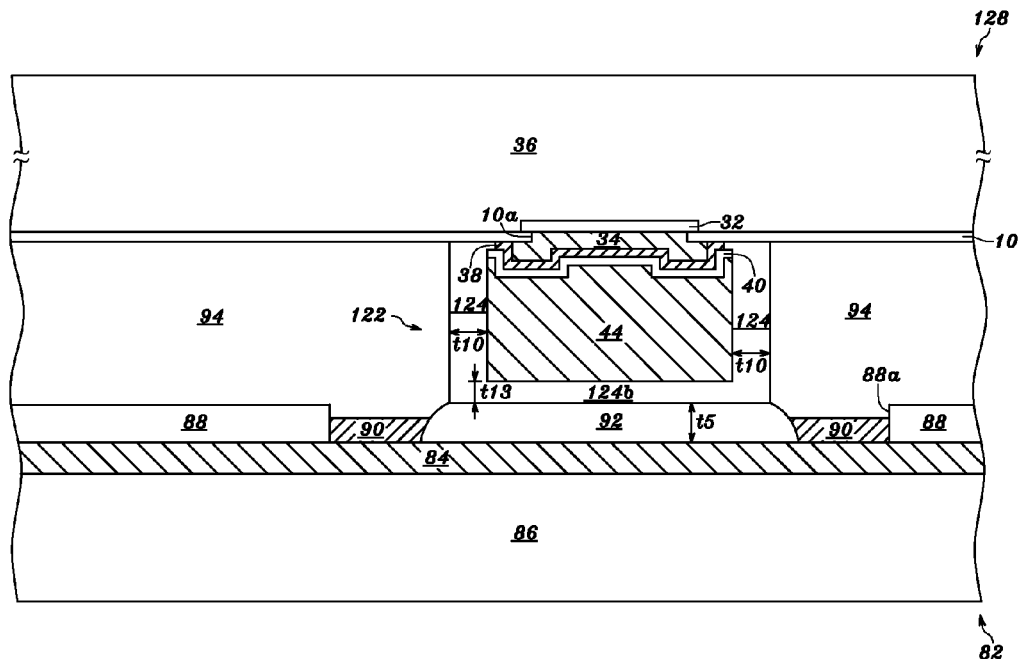

Referring to FIG. 7E, the flexible circuit film 82 as mentioned in FIG. 2K can be bonded with the metal bumps 122 (only one of them is shown) on the metal caps 34. The specification of the flexible circuit film 82 shown in FIG. 7E can be referred to as the specification of the flexible circuit film 82 illustrated in FIG. 2K. The process of thermally pressing the tin-containing layer 90 of the flexible circuit film 82 on a top surface of the gold layer 124 of the metal bumps 122, as shown in FIG. 7E, can be referred to as the process of thermally pressing the tin-containing layer 90 of the flexible circuit film 82 on the top surface of the gold layer 124 of the metal bumps 122, as illustrated in FIG. 6E. Alternatively, the process of thermally pressing a top surface of the gold layer 124 of the metal bumps 122 on the tin-containing layer 90 of the flexible circuit film 82, as shown in FIG. 7E, can be referred to as the process of thermally pressing the top surface of the gold layer 124 of the metal bumps 122 on the tin-containing layer 90 of the flexible circuit film 82, as illustrated in FIG. 6E. Thereby, a tin-alloy layer 92 containing gold can be formed between the remaining gold layer 124b of the metal bumps 122 and the copper traces 84 of the flexible circuit film 82, wherein the remaining gold layer 124b on the top surface of the copper layer 44 has a thickness of between 0.2 and 6 micrometers, and preferably of between 1.5 and 4 micrometers. The specification of the tin-alloy layer 92 shown in FIG. 7E can be referred to as the specification of the tin-alloy layer 92 illustrated in FIG. 6E.

After the metal bumps 122 are connected to the copper traces 84 using a thermal pressing process, a polymer material 94, such as epoxy or polyimide, can be formed between the passivation layer 10 of the semiconductor chip 128 and the polymer layer 88 of the flexible circuit film 82, and enclosing the metal bumps 122. Next, the polymer material 94 is cured at a temperature of between 150 and 250° C.

In the FIG. 7E, the copper traces 84 can be replaced by multiple gold traces having a thickness of between 3 and 30 μm, and preferably of between 5 and 20 μm. Alternatively, the copper traces 84 can be replaced by multiple silver traces having a thickness of between 3 and 30 μm, and preferably of between 5 and 20 μm.

COF (Chip on Film) Package—Gold to Gold Connection

Figure 7F:
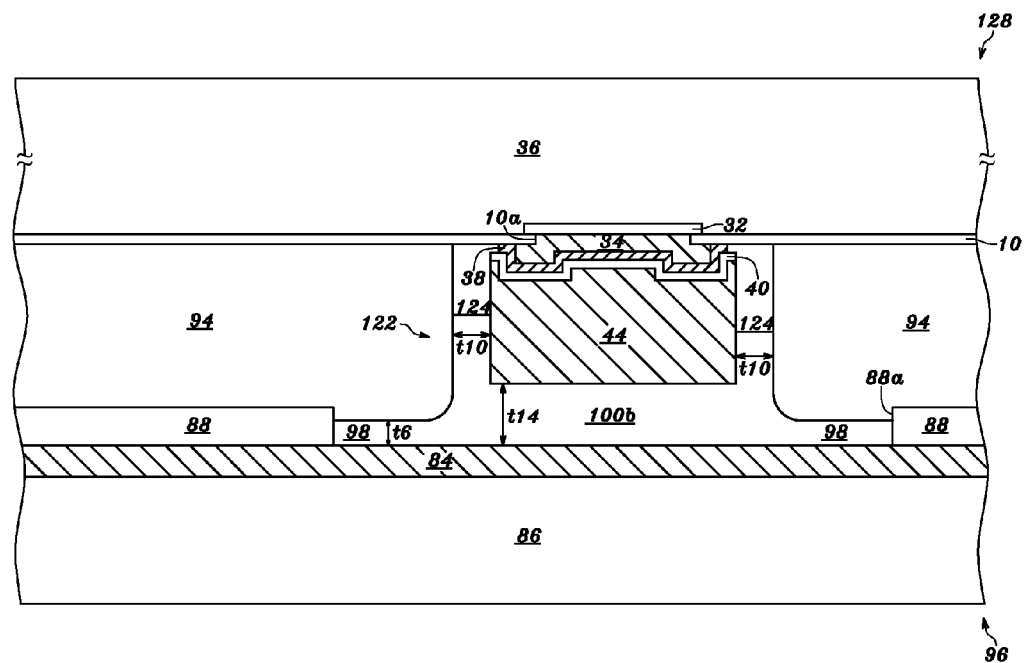

Referring to FIG. 7F, the flexible circuit film 96 as mentioned in FIG. 2M can be bonded with the metal bumps 122 (only one of them is shown) on the metal caps 34. The specification of the flexible circuit film 96 shown in FIG. 7F can be referred to as the specification of the flexible circuit film 96 illustrated in FIG. 2M. The process of thermally pressing the gold layer 98 of the flexible circuit film 96 on a top surface of the gold layer 124 of the metal bumps 122, as shown in FIG. 7F, can be referred to as the process of thermally pressing the gold layer 98 of the flexible circuit film 96 on the top surface of the gold layer 124 of the metal bumps 122, as illustrated in FIG. 6F. Alternatively, the process of thermally pressing a top surface of the gold layer 124 of the metal bumps 122 on the gold layer 98 of the flexible circuit film 96, as shown in FIG. 7F, can be referred to as the process of thermally pressing the top surface of the gold layer 124 of the metal bumps 122 on the gold layer 98 of the flexible circuit film 96, as illustrated in FIG. 6F. Thereby, a gold layer 100b formed by the joint of the gold layer 98 and the gold layer 124 can be between the copper layer 44 of the metal bumps 122 and the copper traces 84 of the flexible circuit film 96, wherein the gold layer 100b has a thickness t14 of between 1 and 10 micrometers, and preferably of between 3 and 6 micrometers.

After the metal bumps 122 are connected to the copper traces 84 using a thermal pressing process, a polymer material 94, such as epoxy or polyimide, can be formed between the passivation layer 10 of the semiconductor chip 128 and the polymer layer 88 of the flexible circuit film 96, and enclosing the metal bumps 122. Next, the polymer material 94 is cured at a temperature of between 150 and 250° C.

COG (Chip on Glass) Assembly—ACF/ACP

Figure 7G:
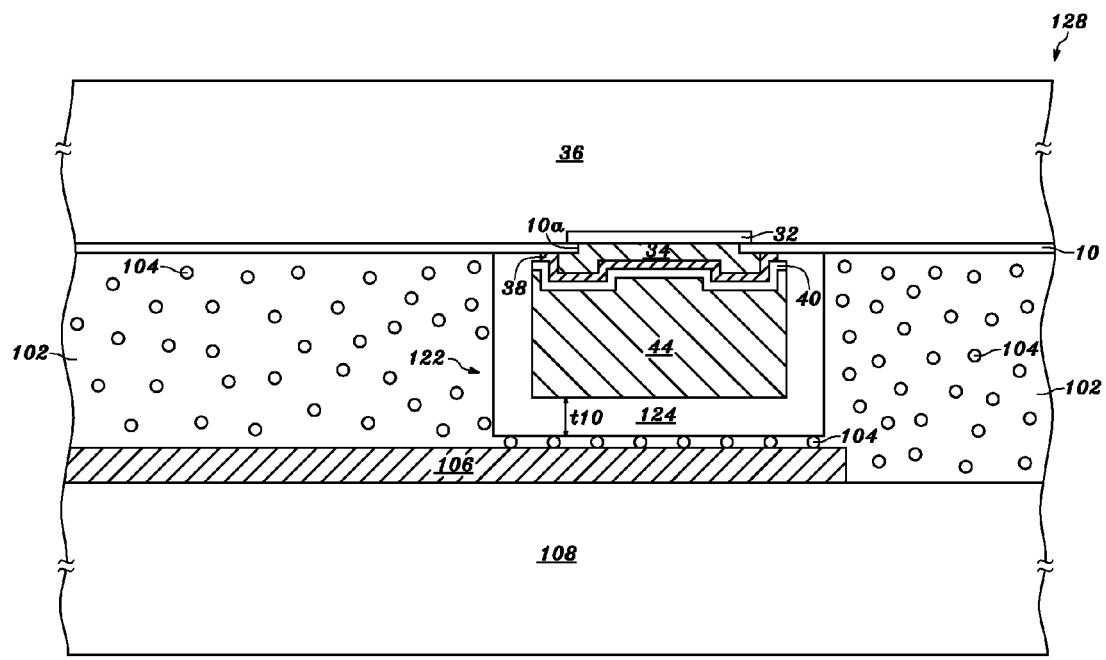

Referring to FIG. 7G, via a thermal pressing process, the gold layer 124 of the metal bumps 122 (only one of them is shown) on the metal caps 34 is pressed into an anisotropic conductive film (ACF) or an anisotropic conductive paste (ACP) 102. Thus, metal particles 104 inside ACF or ACP 102 clusters between the gold layer 124 of the metal bumps 122 and multiple conductive traces 106 (only one of them is shown), such as indium tin oxide (ITO) or gold, on a glass substrate 108, leading the gold layer 124 of the metal bumps 122 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 124 of the metal bumps 122 may be pressed into ACF or ACP 102 preformed on a ceramic substrate or a printed circuit board to have metal particles 104 in the ACF or ACP 102 connecting the gold layer 124 of the metal bumps 122 to multiple pads on the ceramic substrate or on the organic substrate.

COG (Chip on Glass) Assembly—NCF

Figure 7H:
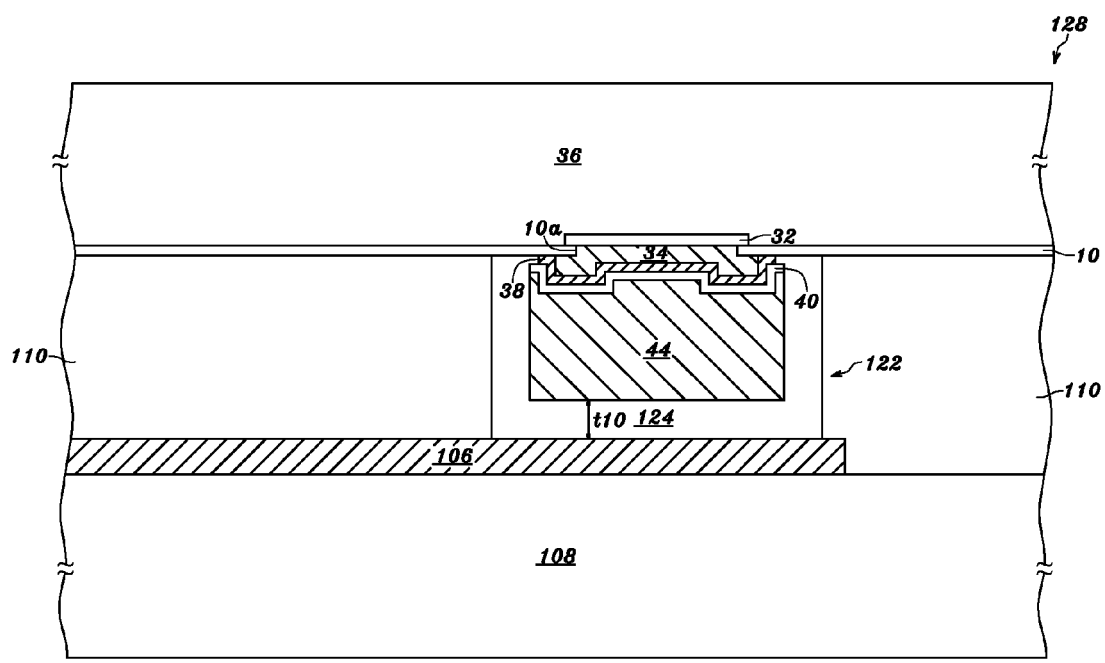

Referring to FIG. 7H, via a thermal pressing process, the gold layer 124 of the metal bumps 122 (only one of them is shown) on the metal caps 34 is pressed into a non-conductive film (NCF) 110, and the gold layer 124 of the metal bumps 122 contacts with multiple conductive traces 106 (only one of them is shown), such as indium tin oxide (ITO) or gold, on a glass substrate 108, leading the gold layer 124 of the metal bumps 122 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 124 of the metal bumps 122 may be pressed into NCF 110 preformed on a ceramic substrate or a printed circuit board to have the gold layer 124 of the metal bumps 122 contacting with multiple pads on the ceramic substrate or on the organic substrate.

Embodiment 7

Figure 8A:
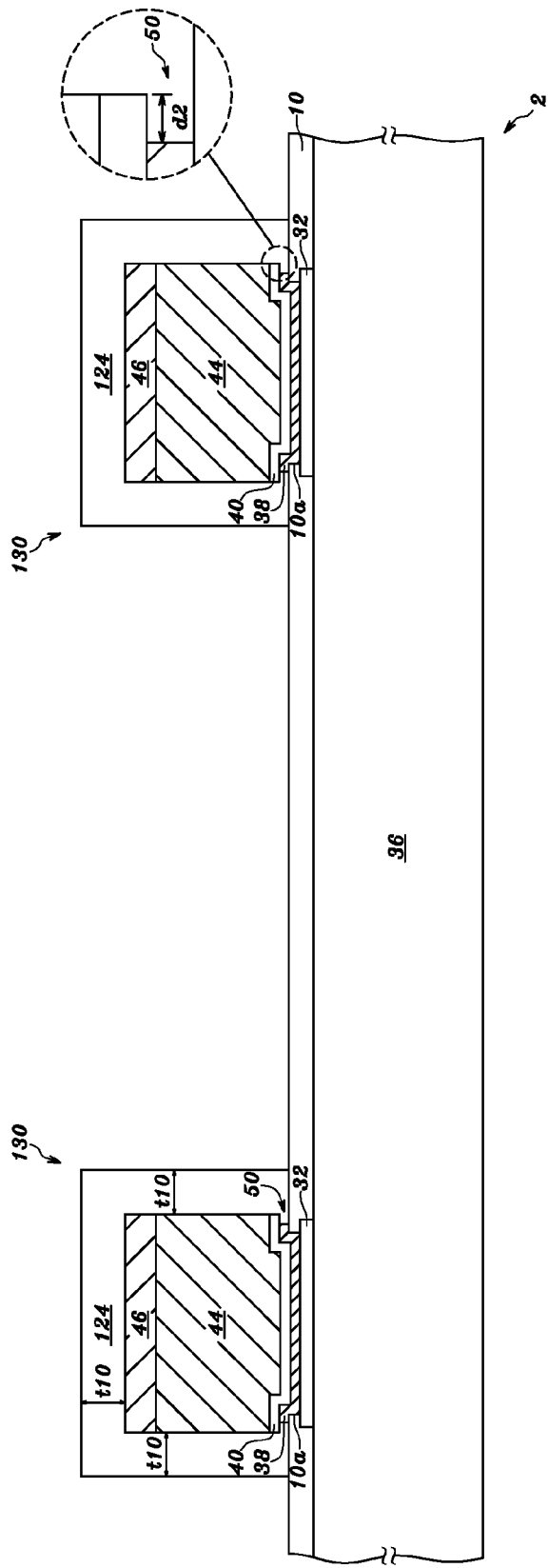
FIG. 8A and FIGS. 8C through 8H are cross-sectional views showing a process for fabricating multiple metal bumps on a wafer and packaging a chip singulated from the wafer according to one embodiment of the present invention.

Referring to FIG. 8A, multiple metal bumps 130 can be formed on the pads 32, such as copper pads or aluminum pads, exposed by the openings 10a. The process for forming the metal bumps 130 on the pads 32 can be performed by the above-mentioned steps as shown in FIGS. 2A-2B, followed by electroplating a copper layer 44 having a thickness of between 5 and 30 micrometers, and preferably of between 10 and 20 micrometers, on the seed layer 40 exposed by the openings 42a, and then electroplating a nickel layer 46 having a thickness of between 0.1 and 5 micrometers, and preferably of between 0.2 and 2 micrometers, on the electroplated copper layer 44 in the openings 42a, followed by the above-mentioned steps as shown in FIGS. 2D-2E, followed by electroless plating a gold layer 124 having a thickness t10 of between 1 and 10 micrometers, and preferably of between 3 and 6 micrometers, on a top surface of the nickel layer 46 and on a sidewall or sidewalls of the copper layer 44 and the nickel layer 46.

Thereby, the metal bumps 130 can be formed of the adhesion/barrier layer 38 on the pads 32, a copper layer (including the seed layer 40 and the electroplated copper layer 44), having a thickness of between 5 and 30 micrometers, and preferably of between 10 and 20 micrometers, on the adhesion/barrier layer 38, the nickel layer 46 on the copper layer and the gold layer 124 on the top surface of the nickel layer 46 and on a sidewall or sidewalls of the copper layer and the nickel layer 46. Alternatively, the gold layer 124 can be replaced by a silver layer, having a thickness of between 1 and 10 μm, and preferably of between 3 and 6 μm, electroless plated on the top surface of the nickel layer 46 and on the sidewall or sidewalls of the copper layer (including the seed layer 40 and the electroplated copper layer 44) and the nickel layer 46. Alternatively, the nickel layer 46 can be replaced by a cobalt layer, having a thickness of between 0.1 and 5 μm, and preferably of between 0.2 and 2 μm, electroplated on the copper layer 44.

Figure 8B:
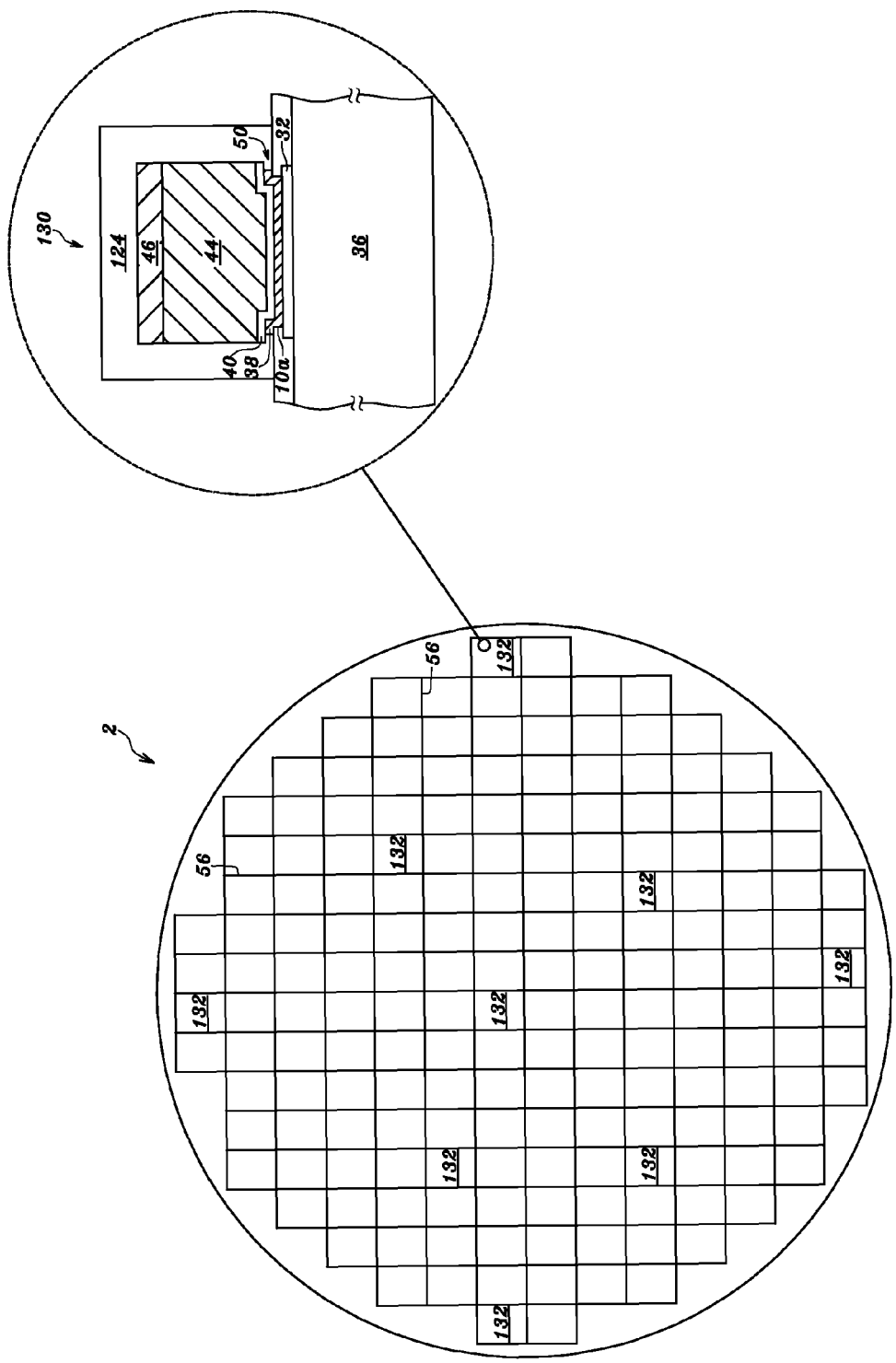
FIG. 8B is a top view showing a semiconductor wafer with multiple metal bumps.

After the metal bumps 130 are formed, the semiconductor wafer 2 can be cut into multiple chips 132. The detail can be referred as to FIG. 8B. Referring to FIG. 8B, the semiconductor wafer 2 includes multiple semiconductor chips 132 with scribe lines 56 between neighboring two of the semiconductor chips 132. The metal bumps 130 are on the pads 32, of each semiconductor chips 132, exposed by the openings 10a. In a wafer dicing process, the semiconductor wafer 2 can be cut along the scribe lines 56 to separate the semiconductor chips 132.

TCP (Tape Carrier Package)—Gold to Tin Connection

Figure 8C:
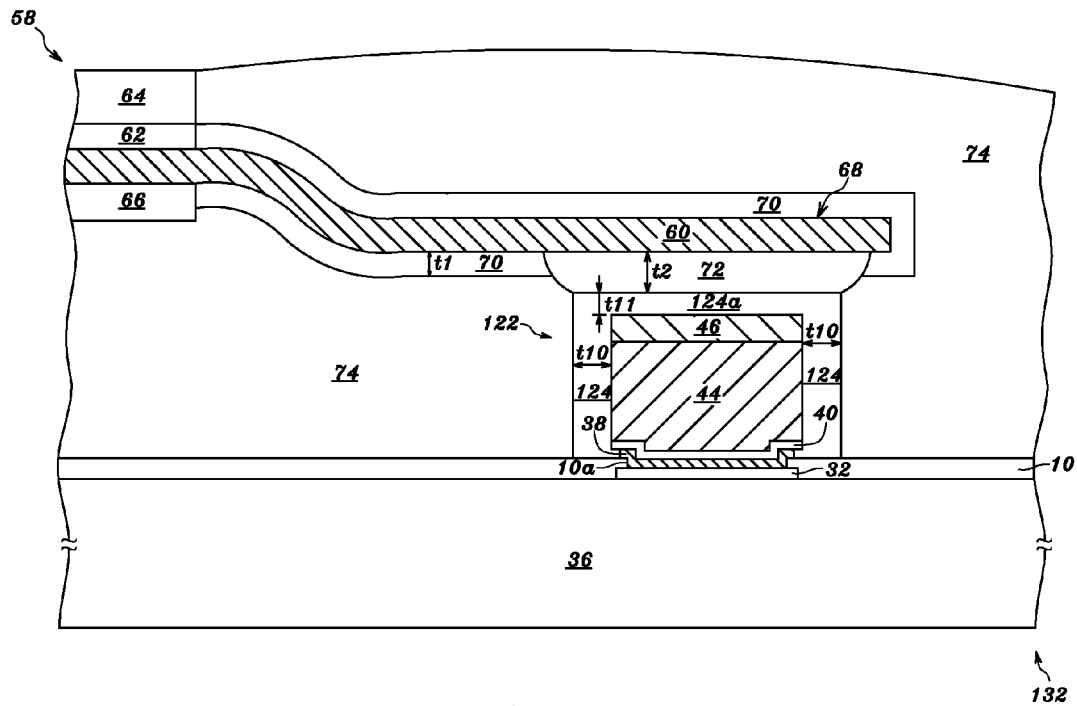

Referring to FIG. 8C, the flexible circuit film 58 as mentioned in FIG. 2G can be bonded with the metal bumps 130 (only one of them is shown). The specification of the flexible circuit film 58 shown in FIG. 8C can be referred to as the specification of the flexible circuit film 58 illustrated in FIG. 2G When the flexible circuit film 58 is bonded with the metal bumps 130, the tin-containing layer 70 on a bottom surface of the inner leads 68 (only one of them is shown) can be thermally pressed on a top surface of the gold layer 124 of the metal bumps 130 at a temperature of between 490 and 540° C., and preferably of between 500 and 520° C., for a time of between 1 and 10 seconds, and preferably of between 3 and 6 seconds. Thereby, a tin-alloy layer 72 containing gold can be formed between the remaining gold layer 124a of the metal bumps 130 and the copper traces 60 of the flexible circuit film 58, wherein the remaining gold layer 124a on the top surface of the nickel layer 46 has a thickness t11 of between 0.2 and 6 micrometers, and preferably of between 1.5 and 4 micrometers. The tin-alloy layer 72 has a thickness t2 of between 0.5 and 10 micrometers, of between 1 and 5 micrometers or of between 1.5 and 3 micrometers. When the tin-containing layer 70 before bonded with the gold layer 124 is pure tin, the tin-alloy layer 72 is tin-gold alloy having a thickness t2 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 70 before bonded with the gold layer 124 is tin-silver alloy, the tin-alloy layer 72 is tin-silver-gold alloy having a thickness t2 of between 0.5 and 10 micrometers, of between 1 and 5 micrometers or of between 1.5 and 3 micrometers. When the tin-containing layer 70 before bonded with the gold layer 124 is tin-silver-copper alloy, the tin-alloy layer 72 is tin-silver-gold-copper alloy having a thickness t2 of between 0.5 and 10 micrometers, of between 1 and 5 micrometers or of between 1.5 and 3 micrometers.

After the metal bumps 130 are connected to the tin-containing layer 70 on the bottom surface of the inner leads 68 using a thermal pressing process, a polymer material 74, such as epoxy or polyimide, can be formed between the semiconductor chip 132 and the tin-containing layer 70 on the bottom surface of the inner leads 68, and enclosing the metal bumps 130. Next, the polymer material 74 is cured at a temperature of between 150 and 250° C.

In the FIG. 8C, the copper traces 60 can be replaced by multiple gold traces having a thickness of between 3 and 30 μm, and preferably of between 5 and 20 μm. Alternatively, the copper traces 60 can be replaced by multiple silver traces having a thickness of between 3 and 30 μm, and preferably of between 5 and 20 μm.

TCP (Tape Carrier Package)—Gold to Gold Connection

Figure 8D:
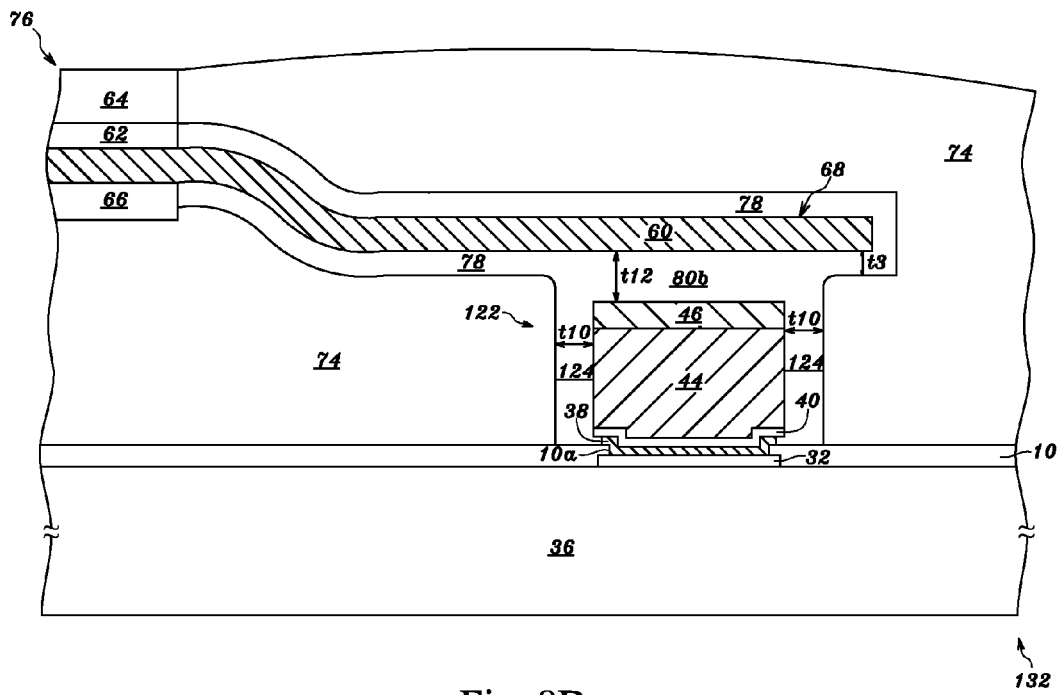

Referring to FIG. 8D, the flexible circuit film 76 as mentioned in FIG. 2I can be bonded with the metal bumps 130 (only one of them is shown). The specification of the flexible circuit film 76 shown in FIG. 8D can be referred to as the specification of the flexible circuit film 76 illustrated in FIG. 2I. When the flexible circuit film 76 is bonded with the metal bumps 130, the gold layer 78 on a bottom surface of the inner leads 68 (only one of them is shown) can be thermally pressed on a top surface of the gold layer 124 of the metal bumps 130 at a temperature of between 490 and 540° C., and preferably of between 500 and 520° C., for a time of between 1 and 10 seconds, and preferably of between 3 and 6 seconds. Thereby, a gold layer 80b formed by the joint of the gold layer 78 and the gold layer 124 can be between the nickel layer 46 of the metal bumps 130 and the copper traces 60 of the flexible circuit film 76, wherein the gold layer 80b has a thickness t12 of between 1 and 10 micrometers, and preferably of between 3 and 6 micrometers.

After the metal bumps 130 are connected to the copper traces 60 using a thermal pressing process, a polymer material 74, such as epoxy or polyimide, can be formed between the semiconductor chip 132 and the gold layer 78 on the bottom surface of the inner leads 68, and enclosing the metal bumps 130. Next, the polymer material 74 is cured at a temperature of between 150 and 250° C.

COF (Chip on Film) Package—Gold to Tin Connection

Figure 8E:
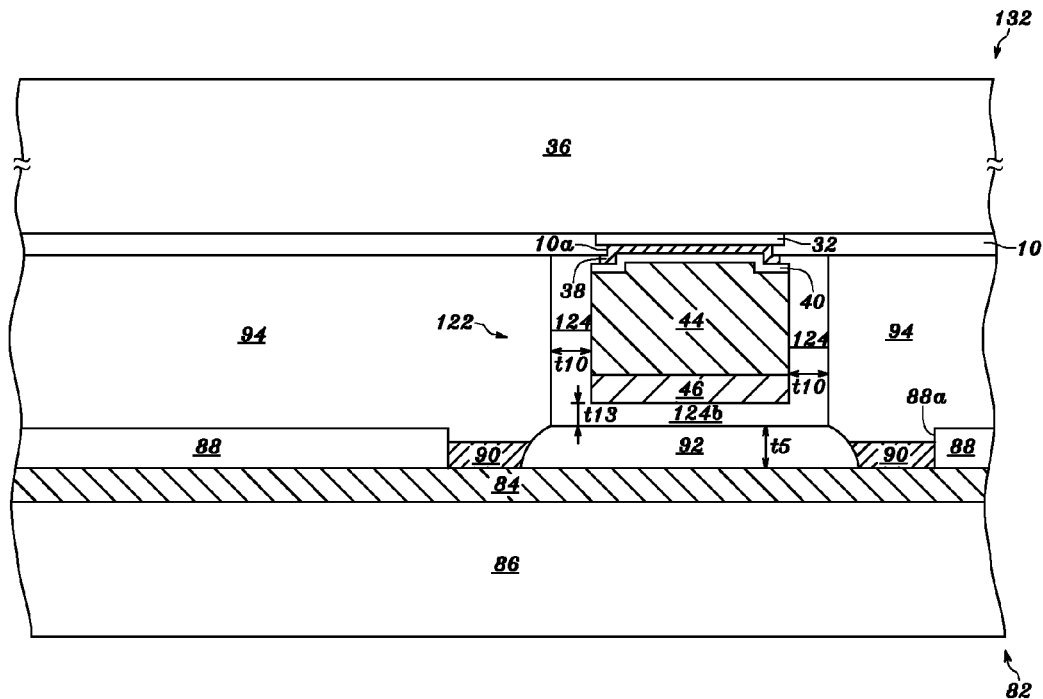

Referring to FIG. 8E, the flexible circuit film 82 as mentioned in FIG. 2K can be bonded with the metal bumps 130 (only one of them is shown). The specification of the flexible circuit film 82 shown in FIG. 8E can be referred to as the specification of the flexible circuit film 82 illustrated in FIG. 2K. When the flexible circuit film 82 is bonded with the metal bumps 130, a top surface of the gold layer 124 of the metal bumps 130 can be thermally pressed on the tin-containing layer 90 of the flexible circuit film 82 at a temperature of between 490 and 540° C., and preferably of between 500 and 520° C., for a time of between 1 and 10 seconds, and preferably of between 3 and 6 seconds. Alternatively, when the flexible circuit film 82 is bonded with the metal bumps 130, the tin-containing layer 90 of the flexible circuit film 82 can be thermally pressed on a top surface of the gold layer 124 of the metal bumps 130 at a temperature of between 490 and 540° C., and preferably of between 500 and 520° C., for a time of between 1 and 10 seconds, and preferably of between 3 and 6 seconds.

Thereby, a tin-alloy layer 92 containing gold can be formed between the remaining gold layer 124b of the metal bumps 130 and the copper traces 84 of the flexible circuit film 82, wherein the remaining gold layer 124b on the top surface of the nickel layer 46 has a thickness t13 of between 0.2 and 6 micrometers, and preferably of between 1.5 and 4 micrometers. The tin-alloy layer 92 has a thickness t5 of between 0.5 and 10 micrometers, of between 1 and 5 micrometers or of between 1.5 and 3 micrometers. When the tin-containing layer 90 before bonded with the gold layer 124 is pure tin, the tin-alloy layer 92 is tin-gold alloy having a thickness t5 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 90 before bonded with the gold layer 124 is tin-silver alloy, the tin-alloy layer 92 is tin-silver-gold alloy having a thickness t5 of between 0.5 and 10 micrometers, of between 1 and 5 micrometers or of between 1.5 and 3 micrometers. When the tin-containing layer 90 before bonded with the gold layer 124 is tin-silver-copper alloy, the tin-alloy layer 92 is tin-silver-gold-copper alloy having a thickness t5 of between 0.5 and 10 micrometers, of between 1 and 5 micrometers or of between 1.5 and 3 micrometers.

After the metal bumps 130 are connected to the copper traces 84 using a thermal pressing process, a polymer material 94, such as epoxy or polyimide, can be formed between the passivation layer 10 of the semiconductor chip 132 and the polymer layer 88 of the flexible circuit film 82, and enclosing the metal bumps 130. Next, the polymer material 94 is cured at a temperature of between 150 and 250° C.

In the FIG. 8E, the copper traces 84 can be replaced by multiple gold traces having a thickness of between 3 and 30 μm, and preferably of between 5 and 20 μm. Alternatively, the copper traces 84 can be replaced by multiple silver traces having a thickness of between 3 and 30 μm, and preferably of between 5 and 20 μm.

COF (Chip on Film) Package—Gold to Gold Connection

Figure 8F:
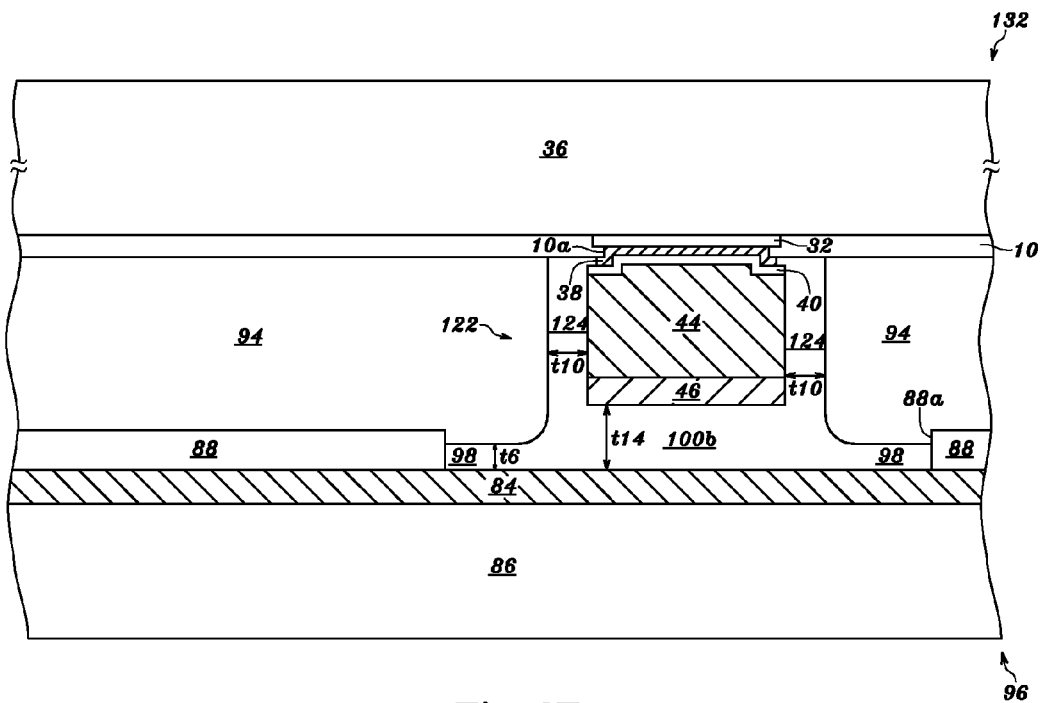

Referring to FIG. 8F, the flexible circuit film 96 as mentioned in FIG. 2M can be bonded with the metal bumps 130 (only one of them is shown). The specification of the flexible circuit film 96 shown in FIG. 8F can be referred to as the specification of the flexible circuit film 96 illustrated in FIG. 2M. When the flexible circuit film 96 is bonded with the metal bumps 130, a top surface of the gold layer 124 of the metal bumps 130 can be thermally pressed on the gold layer 98 of the flexible circuit film 96 at a temperature of between 490 and 540° C., and preferably of between 500 and 520° C., for a time of between 1 and 10 seconds, and preferably of between 3 and 6 seconds. Alternatively, when the flexible circuit film 96 is bonded with the metal bumps 130, the gold layer 98 of the flexible circuit film 96 can be thermally pressed on a top surface of the gold layer 124 of the metal bumps 130 at a temperature of between 490 and 540° C., and preferably of between 500 and 520° C., for a time of between 1 and 10 seconds, and preferably of between 3 and 6 seconds. Thereby, a gold layer 100b formed by the joint of the gold layer 98 and the gold layer 124 can be between the nickel layer 46 of the metal bumps 130 and the copper traces 84 of the flexible circuit film 96, wherein the gold layer 100b has a thickness t14 of between 1 and 10 micrometers, and preferably of between 3 and 6 micrometers.

After the metal bumps 130 are connected to the copper traces 84 using a thermal pressing process, a polymer material 94, such as epoxy or polyimide, can be formed between the passivation layer 10 of the semiconductor chip 132 and the polymer layer 88 of the flexible circuit film 96, and enclosing the metal bumps 130. Next, the polymer material 94 is cured at a temperature of between 150 and 250° C.

COG (Chip on Glass) Assembly—ACF/ACP

Figure 8G:
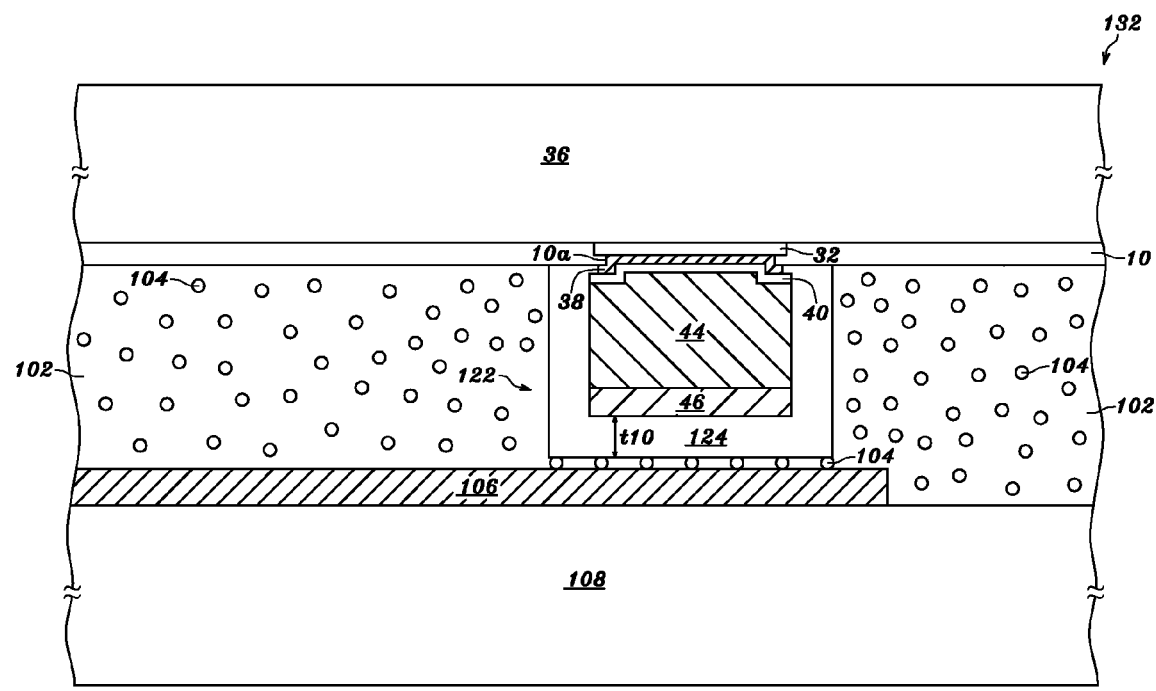

Referring to FIG. 8G, via a thermal pressing process, the gold layer 124 of the metal bumps 130 (only one of them is shown) is pressed into an anisotropic conductive film (ACF) or an anisotropic conductive paste (ACP) 102. Thus, metal particles 104 inside ACF or ACP 102 clusters between the gold layer 124 of the metal bumps 130 and multiple conductive traces 106 (only one of them is shown), such as indium tin oxide (ITO) or gold, on a glass substrate 108, leading the gold layer 124 of the metal bumps 130 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 124 of the metal bumps 130 may be pressed into ACF or ACP 102 preformed on a ceramic substrate or a printed circuit board to have metal particles 104 in the ACF or ACP 102 connecting the gold layer 124 of the metal bumps 130 to multiple pads on the ceramic substrate or on the organic substrate.

COG (Chip on Glass) Assembly—NCF

Figure 8H:
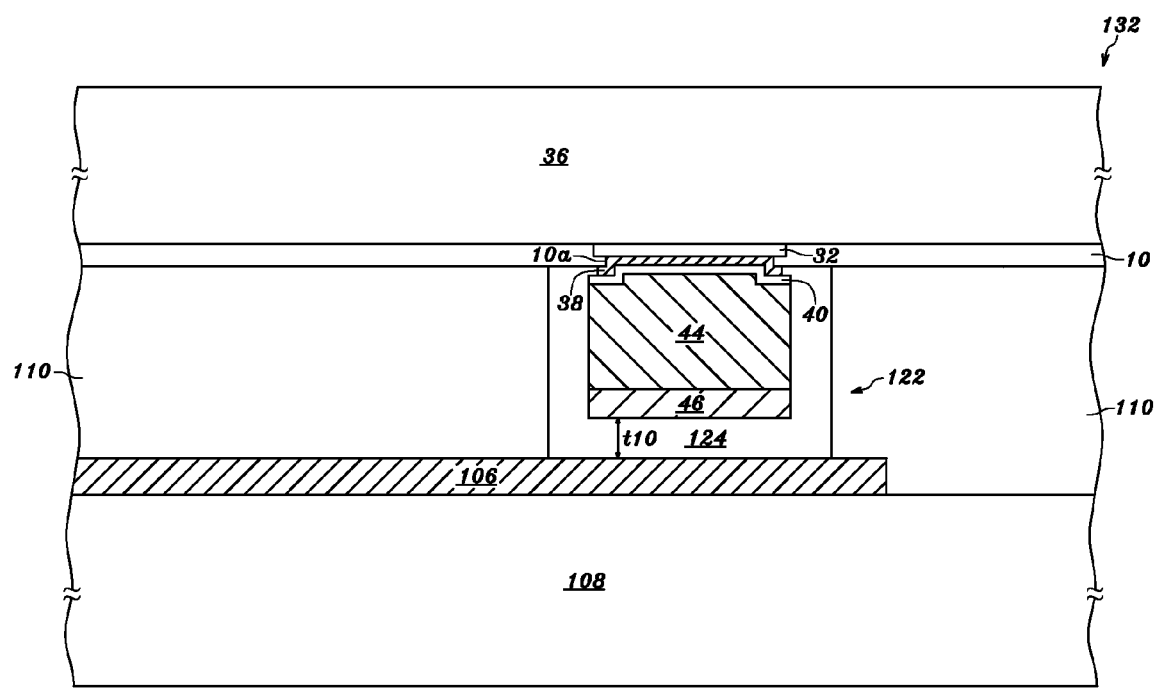

Referring to FIG. 8H, via a thermal pressing process, the gold layer 124 of the metal bumps 130 (only one of them is shown) is pressed into a non-conductive film (NCF) 110, and the gold layer 124 of the metal bumps 130 contacts with multiple conductive traces 106 (only one of them is shown), such as indium tin oxide (ITO) or gold, on a glass substrate 108, leading the gold layer 124 of the metal bumps 130 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 124 of the metal bumps 130 may be pressed into NCF 110 preformed on a ceramic substrate or a printed circuit board to have the gold layer 124 of the metal bumps 130 contacting with multiple pads on the ceramic substrate or on the organic substrate.

Embodiment 8

Figure 9A:
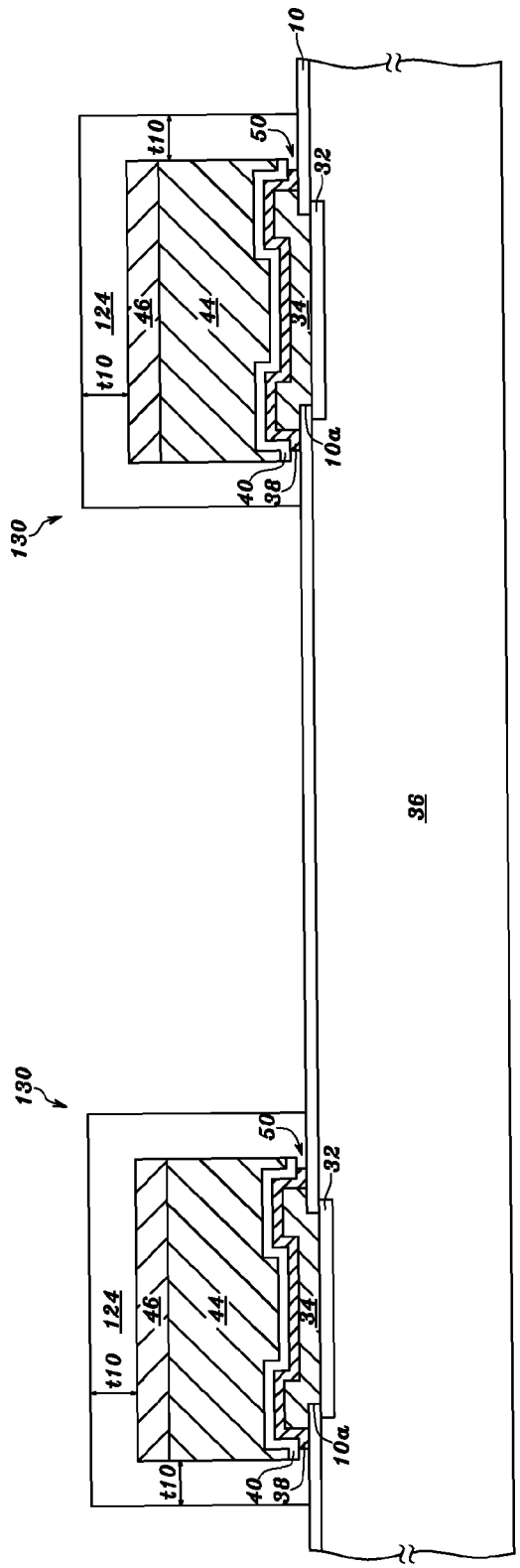
FIG. 9A and FIGS. 9C through 9H are cross-sectional views showing a process for fabricating multiple metal bumps on a wafer and packaging a chip singulated from the wafer according to one embodiment of the present invention.

Referring to FIG. 9A, the metal bumps 130 can be formed on the metal caps 34, respectively. The process for forming the metal bumps 130 on the metal caps 34 can be performed by forming an adhesion/barrier layer 38 having a thickness of between 0.02 and 0.5 µm, and preferably of between 0.25 and 0.35 µm, on the passivation layer 10 and on the aluminum-containing layer of the metal caps 34, wherein the aluminum-containing layer may be an aluminum-copper-alloy layer, an aluminum layer or an Al—Si—Cu-alloy layer, followed by forming the seed layer 40, made of copper, having a thickness of between 0.03 and 1 µm, and preferably of between 0.05 and 0.2 µm, on the adhesion/barrier layer 38, followed by the above-mentioned step as shown in FIG. 2B, followed by electroplating a copper layer 44 having a thickness of between 5 and 30 micrometers, and preferably of between 10 and 20 micrometers, on the seed layer 40 exposed by the openings 42a, and then electroplating a nickel layer 46 having a thickness of between 0.1 and 5 micrometers, and preferably of between 0.2 and 2 micrometers, on the electroplated copper layer 44 in the openings 42a, followed by the above-mentioned steps as shown in FIGS. 2D-2E, followed by electroless plating a gold layer 124 having a thickness t10 of between 1 and 10 micrometers, and preferably of between 3 and 6 micrometers, on a top surface of the nickel layer 46 and on a sidewall or sidewalls of the copper layer 44 and the nickel layer 46. The specification of the adhesion/barrier layer 38 and the seed layer 40 shown in FIG. 9A can be referred to as the specification of the adhesion/barrier layer 38 and the seed layer 40 illustrated in FIG. 2A. The process of forming the adhesion/barrier layer 38, as shown in FIG. 9A, can be referred to as the process of forming the adhesion/barrier layer 38, as illustrated in FIG. 2A. The process of forming the seed layer 40, as shown in FIG. 9A, can be referred to as the process of forming the seed layer 40, as illustrated in FIG. 2A.

Thereby, the metal bumps 130 can be formed of the adhesion/barrier layer 38 on the metal caps 34, a copper layer (including the seed layer 40 and the electroplated copper layer 44), having a thickness of between 5 and 30 micrometers, and preferably of between 10 and 20 micrometers, on the adhesion/barrier layer 38, the nickel layer 46 on the copper layer and the gold layer 124 on the top surface of the nickel layer 46 and on a sidewall or sidewalls of the copper layer and the nickel layer 46. Alternatively, the gold layer 124 can be replaced by a silver layer, having a thickness of between 1 and 10 µm, and preferably of between 3 and 6 µm, electroless plated on the top surface of the nickel layer 46 and on the sidewall or sidewalls of the copper layer (including the seed layer 40 and the electroplated copper layer 44) and the nickel layer 46. Alternatively, the nickel layer 46 can be replaced by a cobalt layer, having a thickness of between 0.1 and 5 µm, and preferably of between 0.2 and 2 µm, electroplated on the copper layer 44.

Figure 9B:
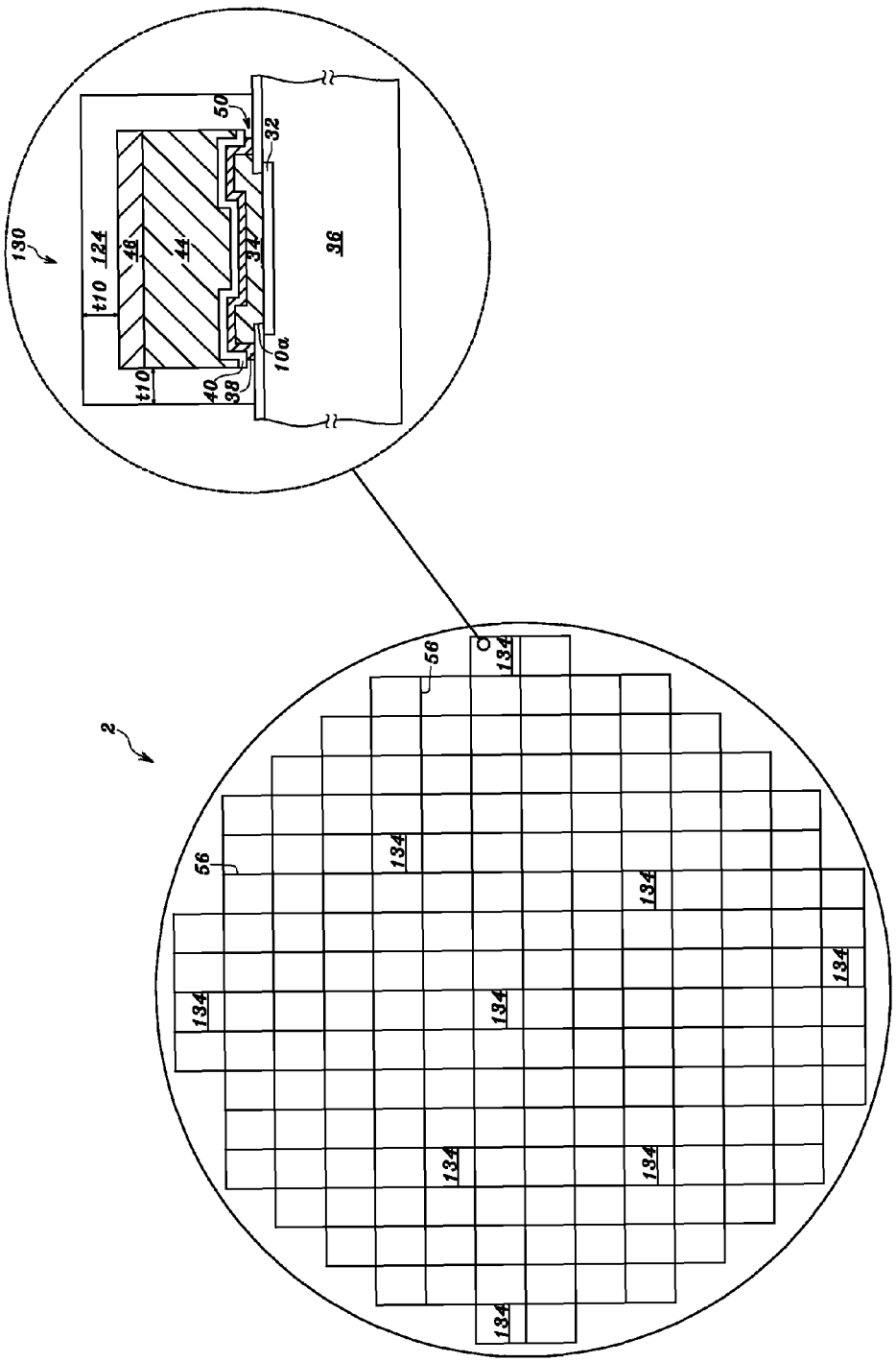
FIG. 9B is a top view showing a semiconductor wafer with multiple metal bumps.

After the metal bumps 130 are formed, the semiconductor wafer 2 can be cut into multiple chips 134. The detail can be referred as to FIG. 9B. Referring to FIG. 9B, the semiconductor wafer 2 includes multiple semiconductor chips 134 with scribe lines 56 between neighboring two of the semiconductor chips 134. The metal bumps 130 are on the metal caps 34, of each semiconductor chips 134, on the pads 32 exposed by the openings 10a. In a wafer dicing process, the semiconductor wafer 2 can be cut along the scribe lines 56 to separate the semiconductor chips 134.

TCP (Tape Carrier Package)—Gold to Tin Connection

Figure 9C:
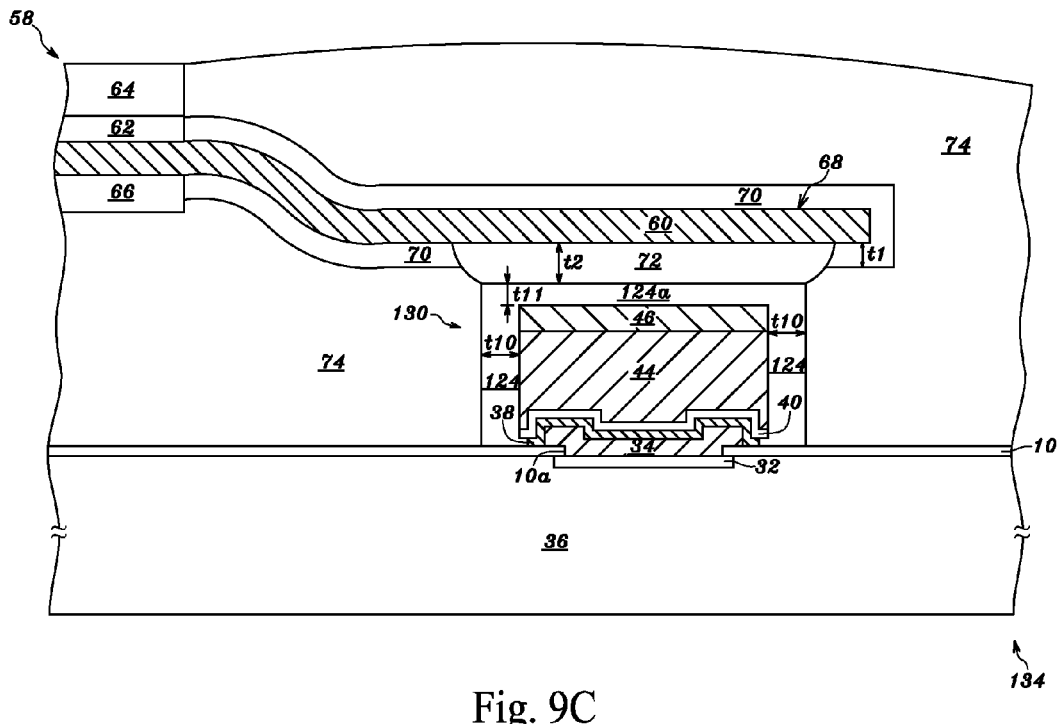

Referring to FIG. 9C, the flexible circuit film 58 as mentioned in FIG. 2G can be bonded with the metal bumps 130 (only one of them is shown) on the metal caps 34. The specification of the flexible circuit film 58 shown in FIG. 9C can be referred to as the specification of the flexible circuit film 58 illustrated in FIG. 2G The process of thermally pressing the tin-containing layer 70 of the flexible circuit film 58 on a top surface of the gold layer 124 of the metal bumps 130, as shown in FIG. 9C, can be referred to as the process of thermally pressing the tin-containing layer 70 of the flexible circuit film 58 on the top surface of the gold layer 124 of the metal bumps 130, as illustrated in FIG. 8C. Thereby, a tin-alloy layer 72 containing gold can be formed between the remaining gold layer 124a of the metal bumps 130 and the copper traces 60 of the flexible circuit film 58, wherein the remaining gold layer 124a on the top surface of the nickel layer 46 has a thickness of between 0.2 and 6 micrometers, and preferably of between 1.5 and 4 micrometers. The specification of the tin-alloy layer 72 shown in FIG. 9C can be referred to as the specification of the tin-alloy layer 72 illustrated in FIG. 8C.

After the metal bumps 130 are connected to the tin-containing layer 70 on the bottom surface of the inner leads 68 using a thermal pressing process, a polymer material 74, such as epoxy or polyimide, can be formed between the semiconductor chip 134 and the tin-containing layer 70 on the bottom surface of the inner leads 68, and enclosing the metal bumps 130. Next, the polymer material 74 is cured at a temperature of between 150 and 250° C.

In the FIG. 9C, the copper traces 60 can be replaced by multiple gold traces having a thickness of between 3 and 30 μm, and preferably of between 5 and 20 μm. Alternatively, the copper traces 60 can be replaced by multiple silver traces having a thickness of between 3 and 30 μm, and preferably of between 5 and 20 μm.

TCP (Tape Carrier Package)—Gold to Gold Connection

Figure 9D:
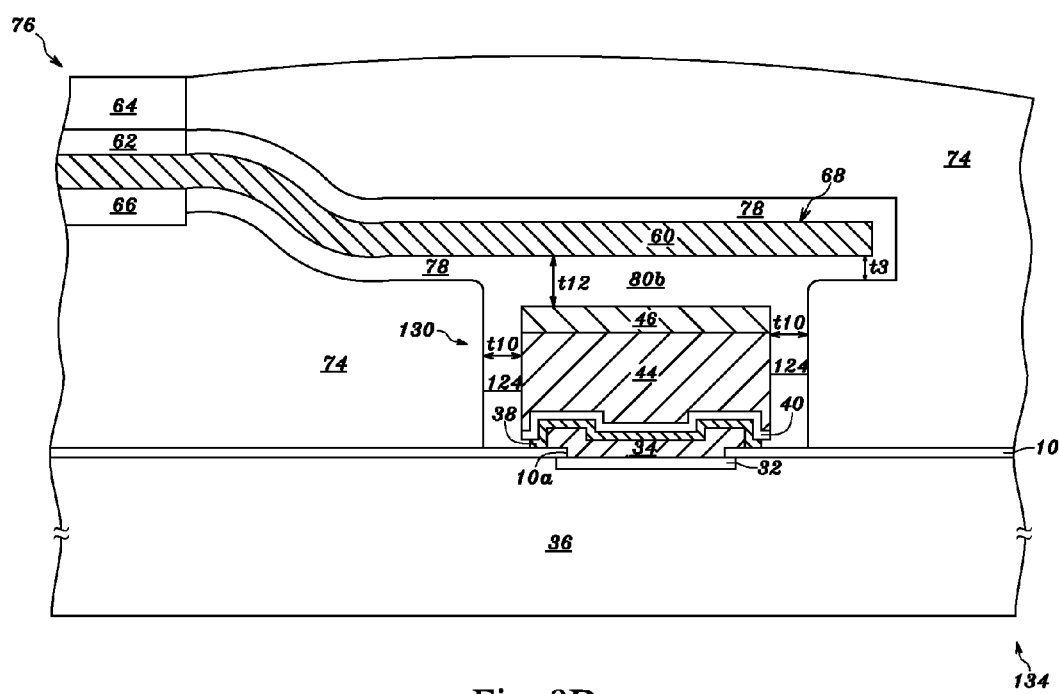

Referring to FIG. 9D, the flexible circuit film 76 as mentioned in FIG. 2I can be bonded with the metal bumps 130 (only one of them is shown) on the metal caps 34. The specification of the flexible circuit film 76 shown in FIG. 9D can be referred to as the specification of the flexible circuit film 76 illustrated in FIG. 2I. The process of thermally pressing the gold layer 78 of the flexible circuit film 76 on a top surface of the gold layer 124 of the metal bumps 130, as shown in FIG. 9D, can be referred to as the process of thermally pressing the gold layer 78 of the flexible circuit film 76 on the top surface of the gold layer 124 of the metal bumps 130, as illustrated in FIG. 8D. Thereby, a gold layer 80b formed by the joint of the gold layer 78 and the gold layer 124 can be between the nickel layer 46 of the metal bumps 130 and the copper traces 60 of the flexible circuit film 76, wherein the gold layer 80b has a thickness t12 of between 1 and 10 micrometers, and preferably of between 3 and 6 micrometers.

After the metal bumps 130 are connected to the copper traces 60 using a thermal pressing process, a polymer material 74, such as epoxy or polyimide, can be formed between the semiconductor chip 134 and the gold layer 78 on the bottom surface of the inner leads 68, and enclosing the metal bumps 130. Next, the polymer material 74 is cured at a temperature of between 150 and 250° C.

COF (Chip on Film) Package—Gold to Tin Connection

Figure 9E:
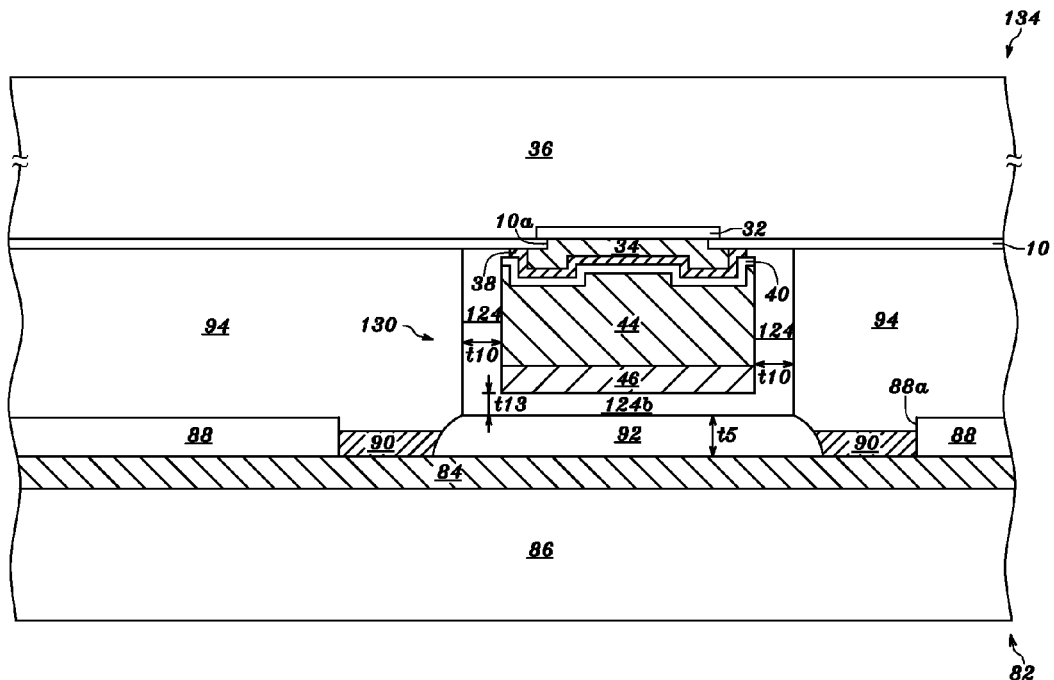

Referring to FIG. 9E, the flexible circuit film 82 as mentioned in FIG. 2K can be bonded with the metal bumps 130 (only one of them is shown) on the metal caps 34. The specification of the flexible circuit film 82 shown in FIG. 9E can be referred to as the specification of the flexible circuit film 82 illustrated in FIG. 2K. The process of thermally pressing the tin-containing layer 90 of the flexible circuit film 82 on a top surface of the gold layer 124 of the metal bumps 130, as shown in FIG. 9E, can be referred to as the process of thermally pressing the tin-containing layer 90 of the flexible circuit film 82 on the top surface of the gold layer 124 of the metal bumps 130, as illustrated in FIG. 8E. Alternatively, the process of thermally pressing a top surface of the gold layer 124 of the metal bumps 130 on the tin-containing layer 90 of the flexible circuit film 82, as shown in FIG. 9E, can be referred to as the process of thermally pressing the top surface of the gold layer 124 of the metal bumps 130 on the tin-containing layer 90 of the flexible circuit film 82, as illustrated in FIG. 8E. Thereby, a tin-alloy layer 92 containing gold can be formed between the remaining gold layer 124b of the metal bumps 130 and the copper traces 84 of the flexible circuit film 82, wherein the remaining gold layer 124b on the top surface of the nickel layer 46 has a thickness of between 0.2 and 6 micrometers, and preferably of between 1.5 and 4 micrometers. The specification of the tin-alloy layer 92 shown in FIG. 9E can be referred to as the specification of the tin-alloy layer 92 illustrated in FIG. 8E.

After the metal bumps 130 are connected to the copper traces 84 using a thermal pressing process, a polymer material 94, such as epoxy or polyimide, can be formed between the passivation layer 10 of the semiconductor chip 134 and the polymer layer 88 of the flexible circuit film 82, and enclosing the metal bumps 130. Next, the polymer material 94 is cured at a temperature of between 150 and 250° C.

In the FIG. 9E, the copper traces 84 can be replaced by multiple gold traces having a thickness of between 3 and 30 μm, and preferably of between 5 and 20 μm. Alternatively, the copper traces 84 can be replaced by multiple silver traces having a thickness of between 3 and 30 μm, and preferably of between 5 and 20 μm.

COF (Chip on Film) Package—Gold to Gold Connection

Figure 9F:
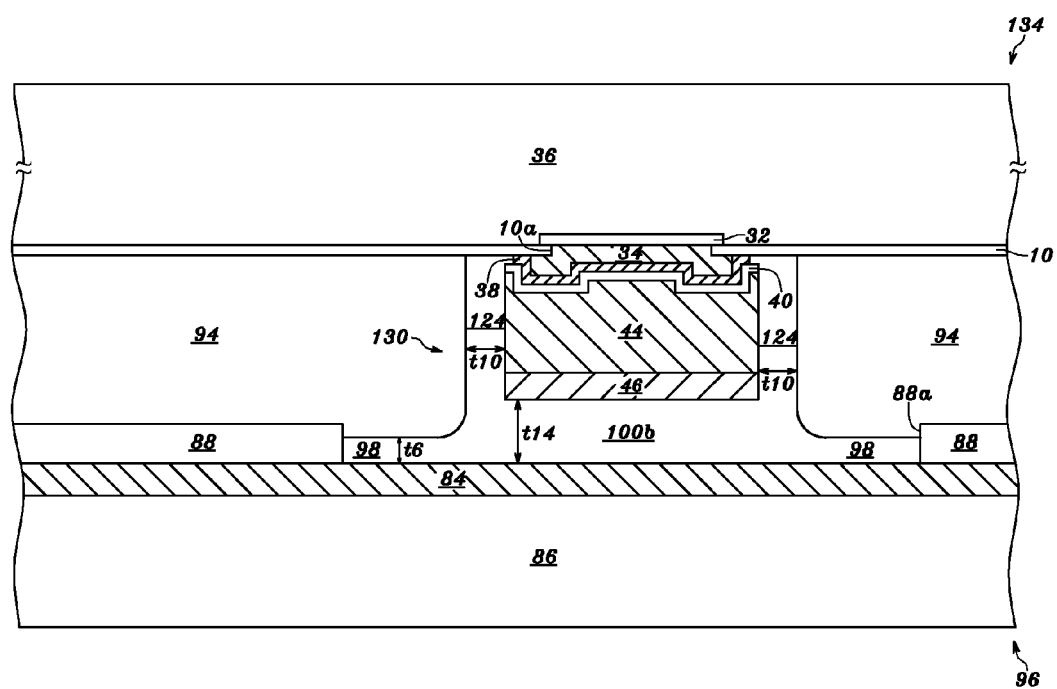

Referring to FIG. 9F, the flexible circuit film 96 as mentioned in FIG. 2M can be bonded with the metal bumps 130 (only one of them is shown) on the metal caps 34. The specification of the flexible circuit film 96 shown in FIG. 9F can be referred to as the specification of the flexible circuit film 96 illustrated in FIG. 2M. The process of thermally pressing the gold layer 98 of the flexible circuit film 96 on a top surface of the gold layer 124 of the metal bumps 130, as shown in FIG. 9F, can be referred to as the process of thermally pressing the gold layer 98 of the flexible circuit film 96 on the top surface of the gold layer 124 of the metal bumps 130, as illustrated in FIG. 8F. Alternatively, the process of thermally pressing a top surface of the gold layer 124 of the metal bumps 130 on the gold layer 98 of the flexible circuit film 96, as shown in FIG. 9F, can be referred to as the process of thermally pressing the top surface of the gold layer 124 of the metal bumps 130 on the gold layer 98 of the flexible circuit film 96, as illustrated in FIG. 8F. Thereby, a gold layer 100b formed by the joint of the gold layer 98 and the gold layer 124 can be between the nickel layer 46 of the metal bumps 130 and the copper traces 84 of the flexible circuit film 96, wherein the gold layer 100b has a thickness t14 of between 1 and 10 micrometers, and preferably of between 3 and 6 micrometers.

After the metal bumps 130 are connected to the copper traces 84 using a thermal pressing process, a polymer material 94, such as epoxy or polyimide, can be formed between the passivation layer 10 of the semiconductor chip 134 and the polymer layer 88 of the flexible circuit film 96, and enclosing the metal bumps 130. Next, the polymer material 94 is cured at a temperature of between 150 and 250° C.

COG (Chip on Glass) Assembly—ACF/ACP

Figure 9G:
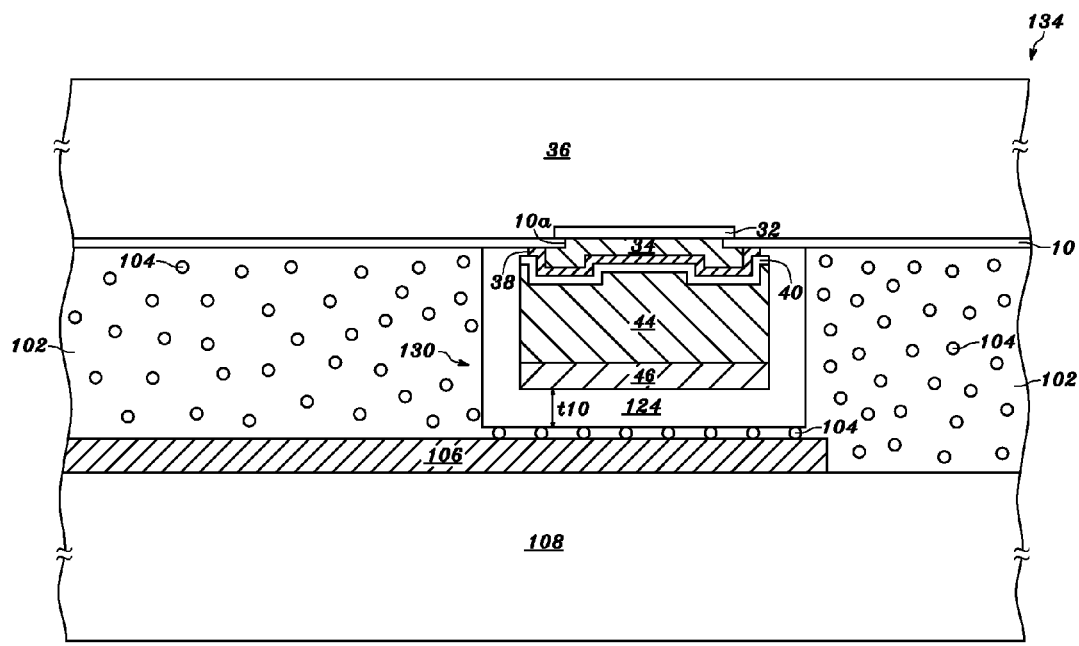

Referring to FIG. 9G, via a thermal pressing process, the gold layer 124 of the metal bumps 130 (only one of them is shown) on the metal caps 34 is pressed into an anisotropic conductive film (ACF) or an anisotropic conductive paste (ACP) 102. Thus, metal particles 104 inside ACF or ACP 102 clusters between the gold layer 124 of the metal bumps 130 and multiple conductive traces 106 (only one of them is shown), such as indium tin oxide (ITO) or gold, on a glass substrate 108, leading the gold layer 124 of the metal bumps 130 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 124 of the metal bumps 130 may be pressed into ACF or ACP 102 preformed on a ceramic substrate or a printed circuit board to have metal particles 104 in the ACF or ACP 102 connecting the gold layer 124 of the metal bumps 130 to multiple pads on the ceramic substrate or on the organic substrate.

COG (Chip on Glass) Assembly—NCF

Figure 9H:
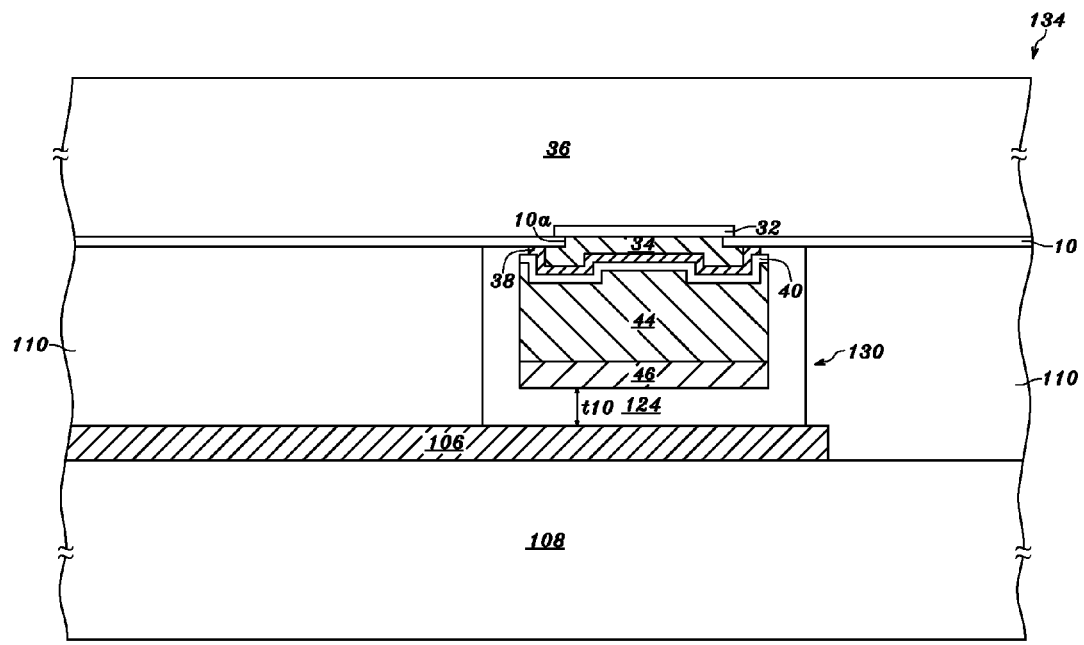

Referring to FIG. 9H, via a thermal pressing process, the gold layer 124 of the metal bumps 130 (only one of them is shown) on the metal caps 34 is pressed into a non-conductive film (NCF) 110, and the gold layer 124 of the metal bumps 130 contacts with multiple conductive traces 106 (only one of them is shown), such as indium tin oxide (ITO) or gold, on a glass substrate 108, leading the gold layer 124 of the metal bumps 130 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 124 of the metal bumps 130 may be pressed into NCF 110 preformed on a ceramic substrate or a printed circuit board to have the gold layer 124 of the metal bumps 130 contacting with multiple pads on the ceramic substrate or on the organic substrate.

Embodiment 9

Figure 10A:
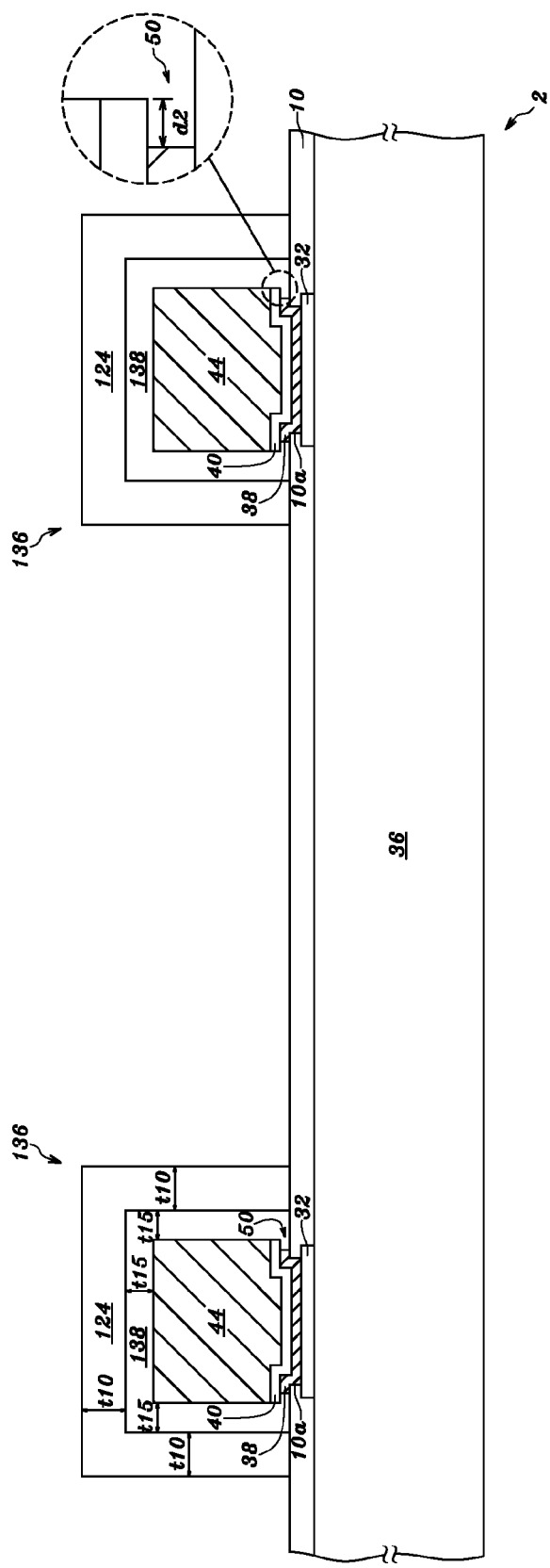
FIG. 10A and FIGS. 10C through 10H are cross-sectional views showing a process for fabricating multiple metal bumps on a wafer and packaging a chip singulated from the wafer according to one embodiment of the present invention.

Referring to FIG. 10A, multiple metal bumps 136 can be formed on the pads 32, such as copper pads or aluminum pads, exposed by the openings 10*a*. The process for forming the metal bumps 136 on the pads 32 can be performed by the above-mentioned steps as shown in FIGS. 2A-2B, followed by electroplating a copper layer 44 having a thickness of between 5 and 30 micrometers, and preferably of between 10 and 20 micrometers, on the seed layer 40 exposed by the openings 42*a*, followed by the above-mentioned steps as shown in FIGS. 2D-2E, followed by electroless plating a nickel layer 138 having a thickness t15 of between 0.1 and 5 micrometers, and preferably of between 0.2 and 2 micrometers, on a top surface of the copper layer 44 and on a sidewall or sidewalls of the copper layer 44, followed by electroless plating a gold layer 124 having a thickness t10 of between 1 and 10 micrometers, and preferably of between 3 and 6 micrometers, on the nickel layer 138 on the top surface of the copper layer 44, and on the nickel layer 138 on the sidewall or sidewalls of the copper layer 44.

Thereby, the metal bumps 136 can be formed of the adhesion/barrier layer 38 on the pads 32, a copper layer (including the seed layer 40 and the electroplated copper layer 44), having a thickness of between 5 and 30 micrometers, and preferably of between 10 and 20 micrometers, on the adhesion/barrier layer 38, the nickel layer 136 on a top surface of the copper layer and on a sidewall or sidewalls of the copper layer, and the gold layer 124 on the nickel layer 138 on the top surface of the copper layer and on the nickel layer 138 on the sidewall or sidewalls of the copper layer. Alternatively, the gold layer 124 can be replaced by a silver layer, having a thickness of between 1 and 10 μm, and preferably of between 3 and 6 μm, electroless plated on the nickel layer 138 on the top surface of the copper layer and on the nickel layer 138 on the sidewall or sidewalls of the copper layer. Alternatively, the nickel layer 138 can be replaced by a cobalt layer, having a thickness of between 0.1 and 5 μm, and preferably of between 0.2 and 2 μm, electroless plated on the top surface of the copper layer 44 and on the sidewall or sidewalls of the copper layer 44.

Figure 10B:
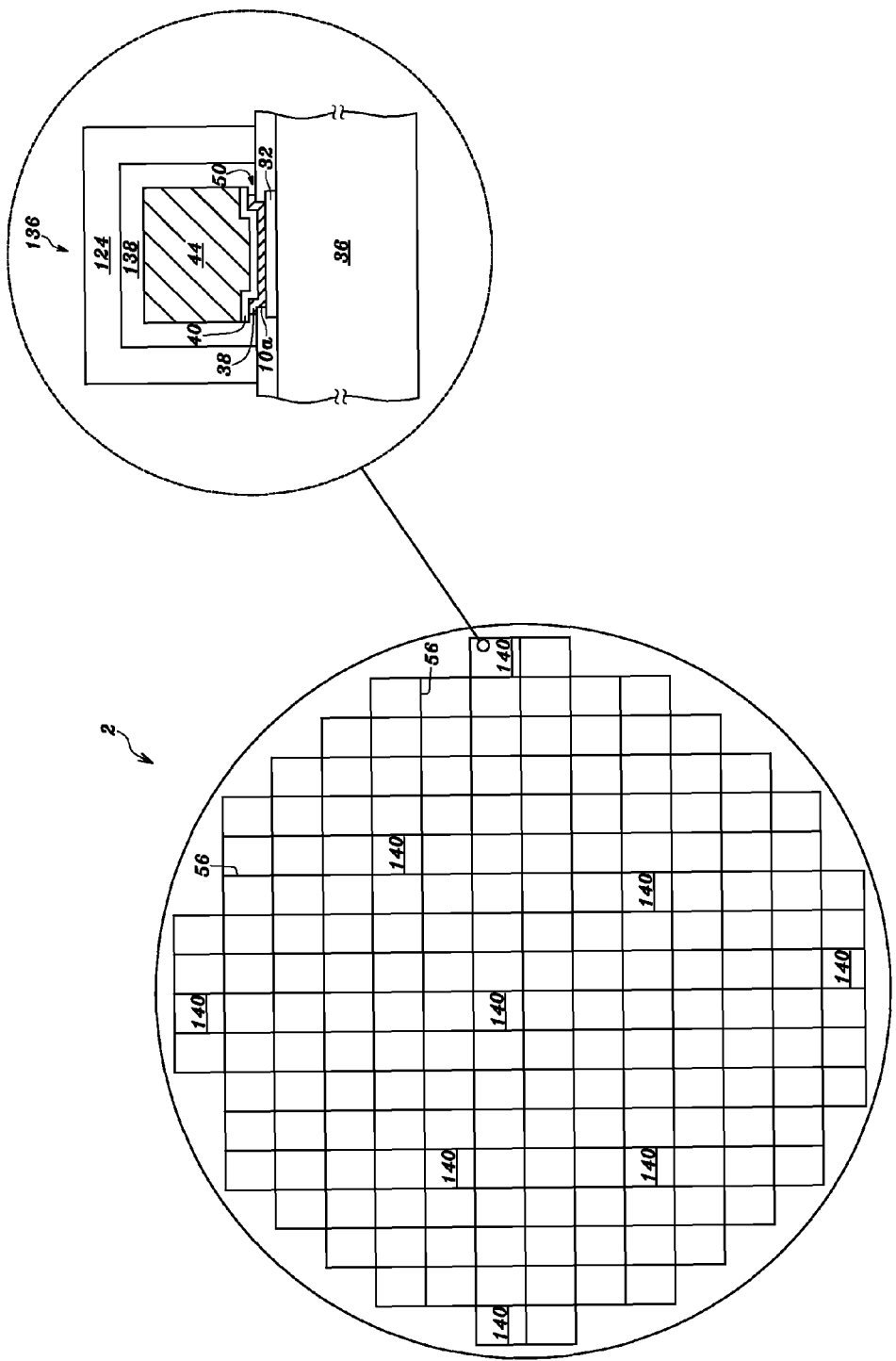
FIG. 10B is a top view showing a semiconductor wafer with multiple metal bumps.

After the metal bumps 136 are formed, the semiconductor wafer 2 can be cut into multiple chips 140. The detail can be referred as to FIG. 10B. Referring to FIG. 10B, the semiconductor wafer 2 includes multiple semiconductor chips 140 with scribe lines 56 between neighboring two of the semiconductor chips 140. The metal bumps 136 are on the pads 32, of each semiconductor chips 140, exposed by the openings 10*a*. In a wafer dicing process, the semiconductor wafer 2 can be cut along the scribe lines 56 to separate the semiconductor chips 140.

TCP (Tape Carrier Package)—Gold to Tin Connection

Figure 10C:
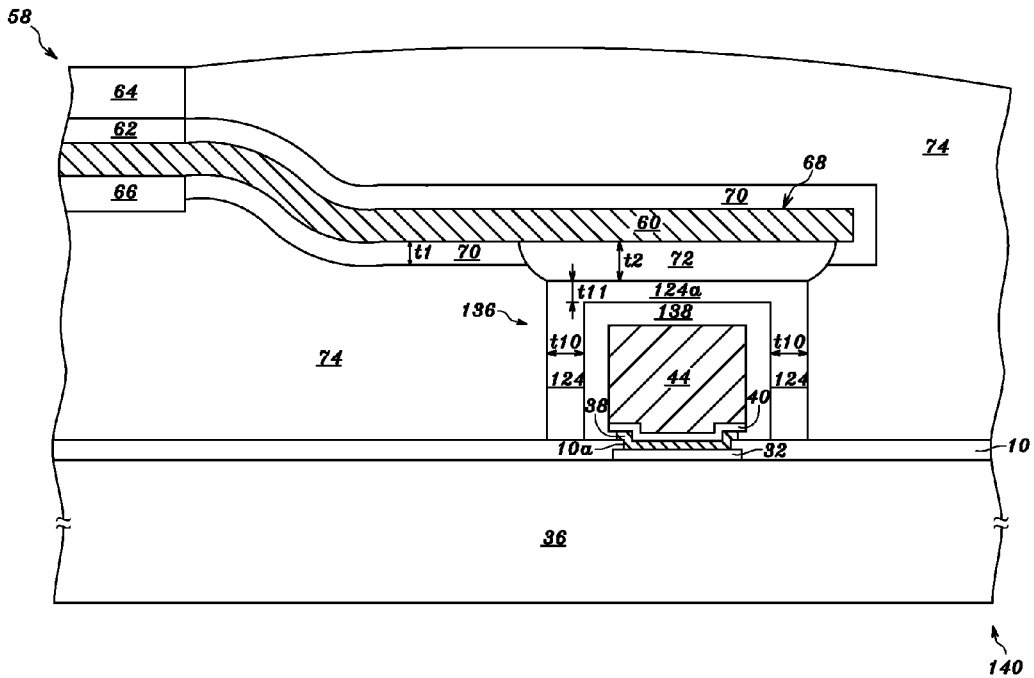

Referring to FIG. 10C, the flexible circuit film 58 as mentioned in FIG. 2G can be bonded with the metal bumps 136 (only one of them is shown). The specification of the flexible circuit film 58 shown in FIG. 10C can be referred to as the specification of the flexible circuit film 58 illustrated in FIG. 2G When the flexible circuit film 58 is bonded with the metal bumps 136, the tin-containing layer 70 on a bottom surface of the inner leads 68 (only one of them is shown) can be thermally pressed on a top surface of the gold layer 124 of the metal bumps 136 at a temperature of between 490 and 540° C., and preferably of between 500 and 520° C., for a time of between 1 and 10 seconds, and preferably of between 3 and 6 seconds. Thereby, a tin-alloy layer 72 containing gold can be formed between the remaining gold layer 124*a* of the metal bumps 136 and the copper traces 60 of the flexible circuit film 58, wherein the remaining gold layer 124*a* on a top surface of the nickel layer 138 has a thickness t11 of between 0.2 and 6 micrometers, and preferably of between 1.5 and 4 micrometers. The tin-alloy layer 72 has a thickness t2 of between 0.5 and 10 micrometers, of between 1 and 5 micrometers or of between 1.5 and 3 micrometers. When the tin-containing layer 70 before bonded with the gold layer 124 is pure tin, the tin-alloy layer 72 is tin-gold alloy having a thickness t2 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 70 before bonded with the gold layer 124 is tin-silver alloy, the tin-alloy layer 72 is tin-silver-gold alloy having a thickness t2 of between 0.5 and 10 micrometers, of between 1 and 5 micrometers or of between 1.5 and 3 micrometers. When the tin-containing layer 70 before bonded with the gold layer 124 is tin-silver-copper alloy, the tin-alloy layer 72 is tin-silver-gold-copper alloy having a thickness t2 of between 0.5 and 10 micrometers, of between 1 and 5 micrometers or of between 1.5 and 3 micrometers.

After the metal bumps 136 are connected to the tin-containing layer 70 on the bottom surface of the inner leads 68 using a thermal pressing process, a polymer material 74, such as epoxy or polyimide, can be formed between the semiconductor chip 140 and the tin-containing layer 70 on the bottom surface of the inner leads 68, and enclosing the metal bumps 136. Next, the polymer material 74 is cured at a temperature of between 150 and 250° C.

In the FIG. 10C, the copper traces 60 can be replaced by multiple gold traces having a thickness of between 3 and 30 μm, and preferably of between 5 and 20 μm. Alternatively, the copper traces 60 can be replaced by multiple silver traces having a thickness of between 3 and 30 μm, and preferably of between 5 and 20 μm.

TCP (Tape Carrier Package)—Gold to Gold Connection

Figure 10D:
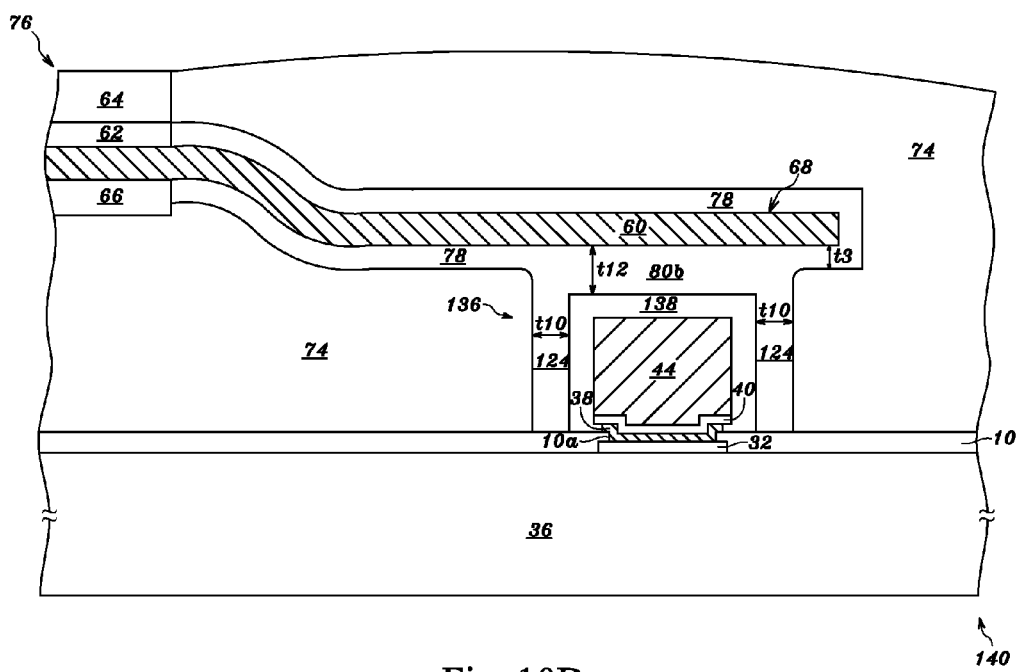

Referring to FIG. 10D, the flexible circuit film 76 as mentioned in FIG. 2I can be bonded with the metal bumps 136 (only one of them is shown). The specification of the flexible circuit film 76 shown in FIG. 10D can be referred to as the specification of the flexible circuit film 76 illustrated in FIG. 2I. When the flexible circuit film 76 is bonded with the metal bumps 136, the gold layer 78 on a bottom surface of the inner leads 68 (only one of them is shown) can be thermally pressed on a top surface of the gold layer 124 of the metal bumps 136 at a temperature of between 490 and 540° C., and preferably of between 500 and 520° C., for a time of between 1 and 10 seconds, and preferably of between 3 and 6 seconds. Thereby, a gold layer 80$b$ formed by the joint of the gold layer 78 and the gold layer 124 can be between the nickel layer 138 of the metal bumps 136 and the copper traces 60 of the flexible circuit film 76, wherein the gold layer 80$b$ has a thickness t12 of between 1 and 10 micrometers, and preferably of between 3 and 6 micrometers.

After the metal bumps 136 are connected to the copper traces 60 using a thermal pressing process, a polymer material 74, such as epoxy or polyimide, can be formed between the semiconductor chip 140 and the gold layer 78 on the bottom surface of the inner leads 68, and enclosing the metal bumps 136. Next, the polymer material 74 is cured at a temperature of between 150 and 250° C.

COF (Chip on Film) Package—Gold to Tin Connection

Figure 10E:
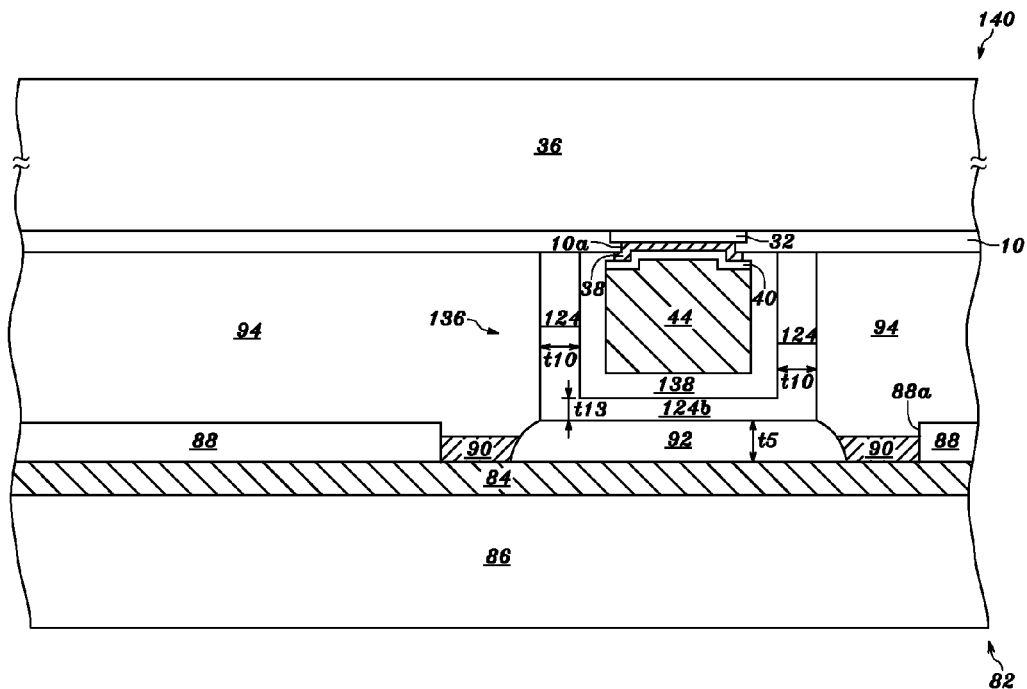

Referring to FIG. 10E, the flexible circuit film 82 as mentioned in FIG. 2K can be bonded with the metal bumps 136 (only one of them is shown). The specification of the flexible circuit film 82 shown in FIG. 10E can be referred to as the specification of the flexible circuit film 82 illustrated in FIG. 2K. When the flexible circuit film 82 is bonded with the metal bumps 136, a top surface of the gold layer 124 of the metal bumps 136 can be thermally pressed on the tin-containing layer 90 of the flexible circuit film 82 at a temperature of between 490 and 540° C., and preferably of between 500 and 520° C., for a time of between 1 and 10 seconds, and preferably of between 3 and 6 seconds. Alternatively, when the flexible circuit film 82 is bonded with the metal bumps 136, the tin-containing layer 90 of the flexible circuit film 82 can be thermally pressed on a top surface of the gold layer 124 of the metal bumps 136 at a temperature of between 490 and 540° C., and preferably of between 500 and 520° C., for a time of between 1 and 10 seconds, and preferably of between 3 and 6 seconds.

Thereby, a tin-alloy layer 92 containing gold can be formed between the remaining gold layer 124$b$ of the metal bumps 136 and the copper traces 84 of the flexible circuit film 82, wherein the remaining gold layer 124$b$ on a top surface of the nickel layer 138 has a thickness t13 of between 0.2 and 6 micrometers, and preferably of between 1.5 and 4 micrometers. The tin-alloy layer 92 has a thickness t5 of between 0.5 and 10 micrometers, of between 1 and 5 micrometers or of between 1.5 and 3 micrometers. When the tin-containing layer 90 before bonded with the gold layer 124 is pure tin, the tin-alloy layer 92 is tin-gold alloy having a thickness t5 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 90 before bonded with the gold layer 124 is tin-silver alloy, the tin-alloy layer 92 is tin-silver-gold alloy having a thickness t5 of between 0.5 and 10 micrometers, of between 1 and 5 micrometers or of between 1.5 and 3 micrometers. When the tin-containing layer 90 before bonded with the gold layer 124 is tin-silver-copper alloy, the tin-alloy layer 92 is tin-silver-gold-copper alloy having a thickness t5 of between 0.5 and 10 micrometers, of between 1 and 5 micrometers or of between 1.5 and 3 micrometers.

After the metal bumps 136 are connected to the copper traces 84 using a thermal pressing process, a polymer material 94, such as epoxy or polyimide, can be formed between the passivation layer 10 of the semiconductor chip 140 and the polymer layer 88 of the flexible circuit film 82, and enclosing the metal bumps 136. Next, the polymer material 94 is cured at a temperature of between 150 and 250° C.

In the FIG. 10E, the copper traces 84 can be replaced by multiple gold traces having a thickness of between 3 and 30 μm, and preferably of between 5 and 20 μm. Alternatively, the copper traces 84 can be replaced by multiple silver traces having a thickness of between 3 and 30 μm, and preferably of between 5 and 20 μm.

COF (Chip on Film) Package—Gold to Gold Connection

Figure 10F:
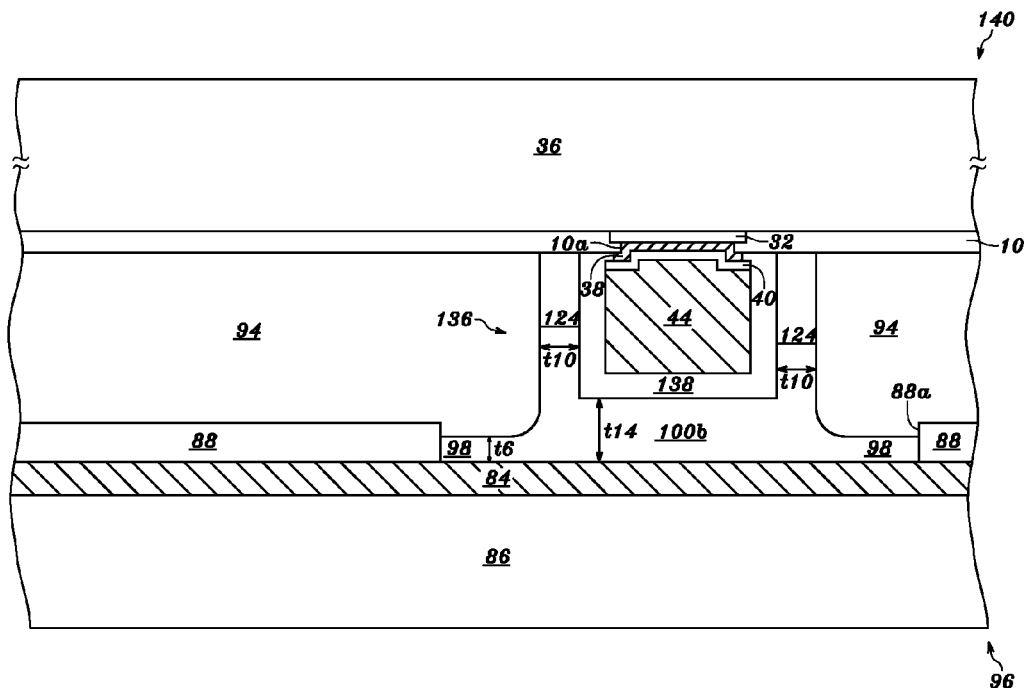

Referring to FIG. 10F, the flexible circuit film 96 as mentioned in FIG. 2M can be bonded with the metal bumps 136 (only one of them is shown). The specification of the flexible circuit film 96 shown in FIG. 10F can be referred to as the specification of the flexible circuit film 96 illustrated in FIG. 2M. When the flexible circuit film 96 is bonded with the metal bumps 136, a top surface of the gold layer 124 of the metal bumps 136 can be thermally pressed on the gold layer 98 of the flexible circuit film 96 at a temperature of between 490 and 540° C., and preferably of between 500 and 520° C., for a time of between 1 and 10 seconds, and preferably of between 3 and 6 seconds. Alternatively, when the flexible circuit film 96 is bonded with the metal bumps 136, the gold layer 98 of the flexible circuit film 96 can be thermally pressed on a top surface of the gold layer 124 of the metal bumps 136 at a temperature of between 490 and 540° C., and preferably of between 500 and 520° C., for a time of between 1 and 10 seconds, and preferably of between 3 and 6 seconds. Thereby, a gold layer 100$b$ formed by the joint of the gold layer 98 and the gold layer 124 can be between the nickel layer 138 of the metal bumps 136 and the copper traces 84 of the flexible circuit film 96, wherein the gold layer 100$b$ has a thickness t14 of between 1 and 10 micrometers, and preferably of between 3 and 6 micrometers.

After the metal bumps 136 are connected to the copper traces 84 using a thermal pressing process, a polymer material 94, such as epoxy or polyimide, can be formed between the passivation layer 10 of the semiconductor chip 140 and the polymer layer 88 of the flexible circuit film 96, and enclosing the metal bumps 136. Next, the polymer material 94 is cured at a temperature of between 150 and 250° C.

COG (Chip on Glass) Assembly—ACF/ACP

Figure 10G:
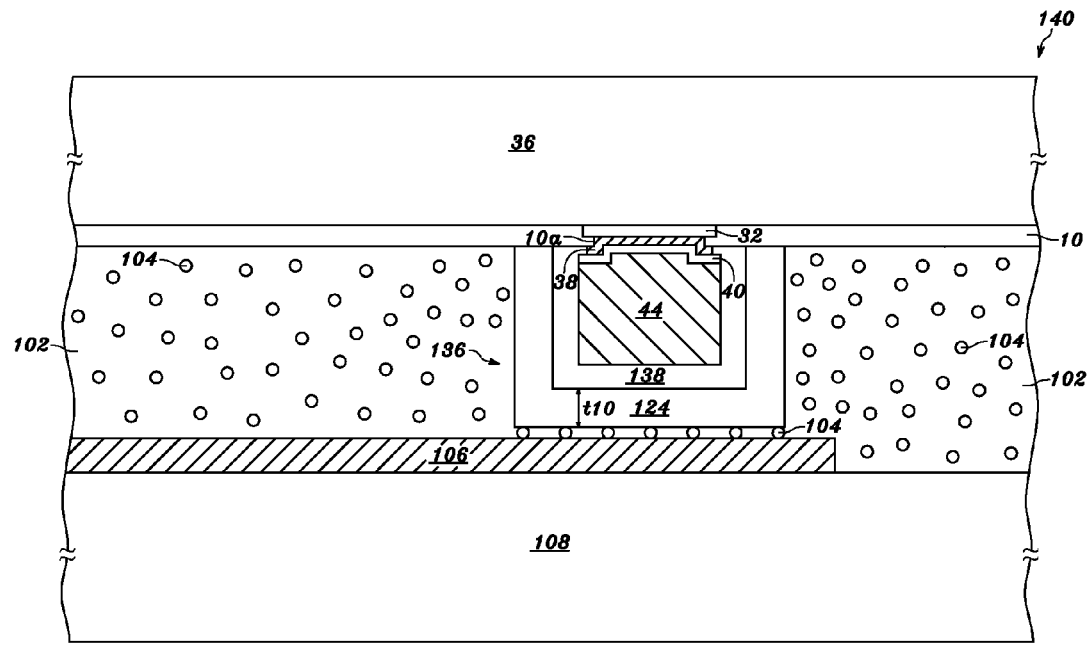

Referring to FIG. 10G, via a thermal pressing process, the gold layer 124 of the metal bumps 136 (only one of them is shown) is pressed into an anisotropic conductive film (ACF) or an anisotropic conductive paste (ACP) 102. Thus, metal particles 104 inside ACF or ACP 102 clusters between the gold layer 124 of the metal bumps 136 and multiple conductive traces 106 (only one of them is shown), such as indium tin oxide (ITO) or gold, on a glass substrate 108, leading the gold layer 124 of the metal bumps 136 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 124 of the metal bumps 136 may be pressed into ACF or ACP 102 preformed on a ceramic substrate or a printed circuit board to have metal particles 104 in the ACF or ACP 102 connecting the gold layer 124 of the metal bumps 136 to multiple pads on the ceramic substrate or on the organic substrate.

COG (Chip on Glass) Assembly—NCF

Figure 10H:
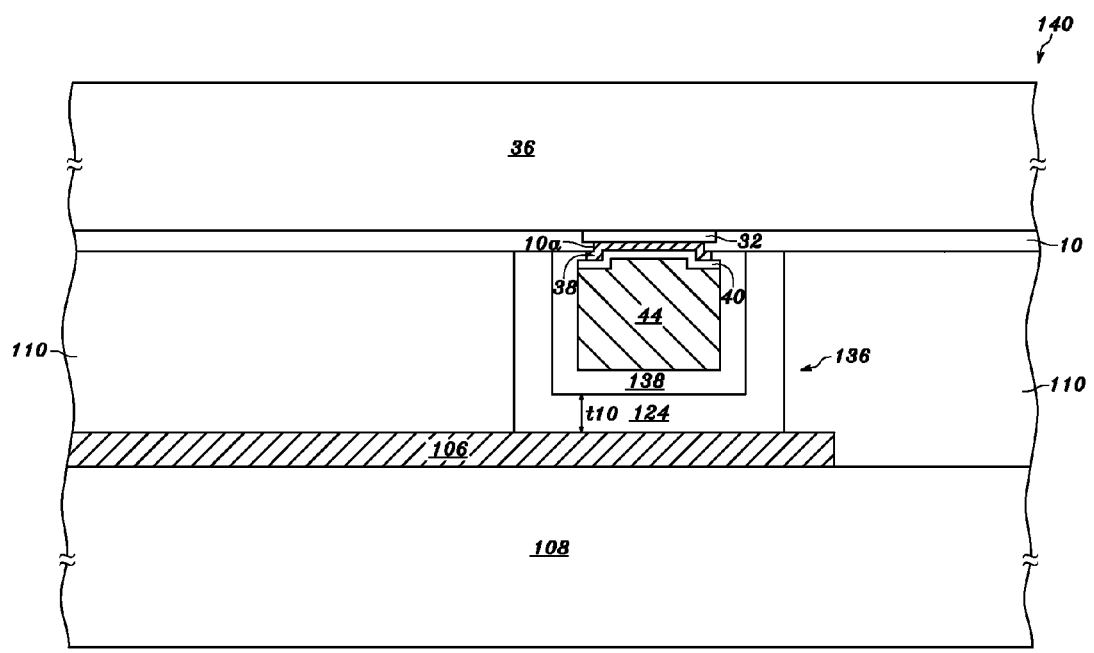

Referring to FIG. 10H, via a thermal pressing process, the gold layer 124 of the metal bumps 136 (only one of them is shown) is pressed into a non-conductive film (NCF) 110, and the gold layer 124 of the metal bumps 136 contacts with multiple conductive traces 106 (only one of them is shown), such as indium tin oxide (ITO) or gold, on a glass substrate 108, leading the gold layer 124 of the metal bumps 136 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 124 of the metal bumps 136 may be pressed into NCF 110 preformed on a ceramic substrate or a printed circuit board to have the gold layer 124 of the metal bumps 136 contacting with multiple pads on the ceramic substrate or on the organic substrate.

Embodiment 10

Figure 11A:
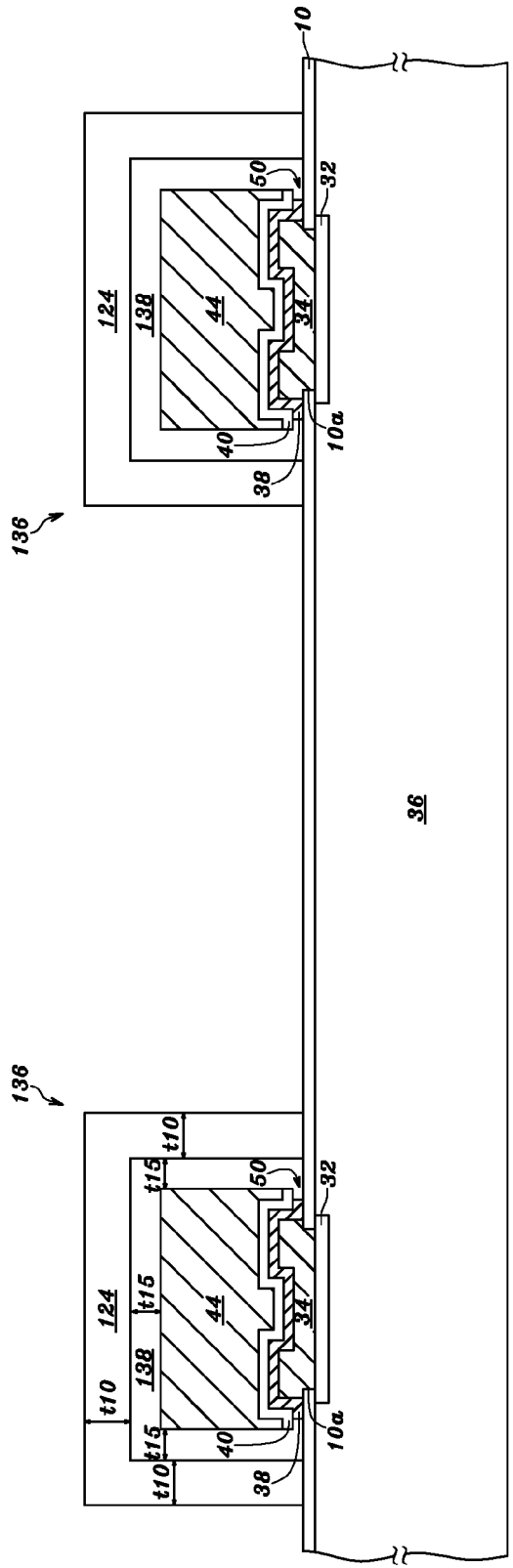
FIG. 11A and FIGS. 11C through 11H are cross-sectional views showing a process for fabricating multiple metal bumps on a wafer and packaging a chip singulated from the wafer according to one embodiment of the present invention.

Referring to FIG. 1A, the metal bumps 136 can be formed on the metal caps 34, respectively. The process for forming the metal bumps 136 on the metal caps 34 can be performed by forming an adhesion/barrier layer 38 having a thickness of between 0.02 and 0.5 µm, and preferably of between 0.25 and 0.35 µm, on the passivation layer 10 and on the aluminum-containing layer of the metal caps 34, wherein the aluminum-containing layer may be an aluminum-copper-alloy layer, an aluminum layer or an Al—Si—Cu-alloy layer, followed by forming the seed layer 40, made of copper, having a thickness of between 0.03 and 1 µm, and preferably of between 0.05 and 0.2 µm, on the adhesion/barrier layer 38, followed by the above-mentioned step as shown in FIG. 2B, followed by electroplating a copper layer 44 having a thickness of between 5 and 30 micrometers, and preferably of between 10 and 20 micrometers, on the seed layer 40 exposed by the openings 42a, followed by the above-mentioned steps as shown in FIGS. 2D-2E, followed by electroless plating a nickel layer 138 having a thickness t5 of between 0.1 and 5 micrometers, and preferably of between 0.2 and 2 micrometers, on a top surface of the copper layer 44 and on a sidewall or sidewalls of the copper layer 44, followed by electroless plating a gold layer 124 having a thickness t10 of between 1 and 10 micrometers, and preferably of between 3 and 6 micrometers, on the nickel layer 138 on the top surface of the copper layer 44, and on the nickel layer 138 on the sidewall or sidewalls of the copper layer 44. The specification of the adhesion/barrier layer 38 and the seed layer 40 shown in FIG. 11A can be referred to as the specification of the adhesion/barrier layer 38 and the seed layer 40 illustrated in FIG. 2A. The process of forming the adhesion/barrier layer 38, as shown in FIG. 11A, can be referred to as the process of forming the adhesion/barrier layer 38, as illustrated in FIG. 2A. The process of forming the seed layer 40, as shown in FIG. 11A, can be referred to as the process of forming the seed layer 40, as illustrated in FIG. 2A.

Thereby, the metal bumps 136 can be formed of the adhesion/barrier layer 38 on the metal caps 34, a copper layer (including the seed layer 40 and the electroplated copper layer 44), having a thickness of between 5 and 30 micrometers, and preferably of between 10 and 20 micrometers, on the adhesion/barrier layer 38, the nickel layer 136 on a top surface of the copper layer and on a sidewall or sidewalls of the copper layer, and the gold layer 124 on the nickel layer 138 on the top surface of the copper layer and on the nickel layer 138 on the sidewall or sidewalls of the copper layer. Alternatively, the gold layer 124 can be replaced by a silver layer, having a thickness of between 1 and 10 µm, and preferably of between 3 and 6 µm, electroless plated on the nickel layer 138 on the top surface of the copper layer and on the nickel layer 138 on the sidewall or sidewalls of the copper layer. Alternatively, the nickel layer 46 can be replaced by a cobalt layer, having a thickness of between 0.1 and 5 µm, and preferably of between 0.2 and 2 µm, electroless plated on the top surface of the copper layer 44 and on the sidewall or sidewalls of the copper layer 44.

Figure 11B:
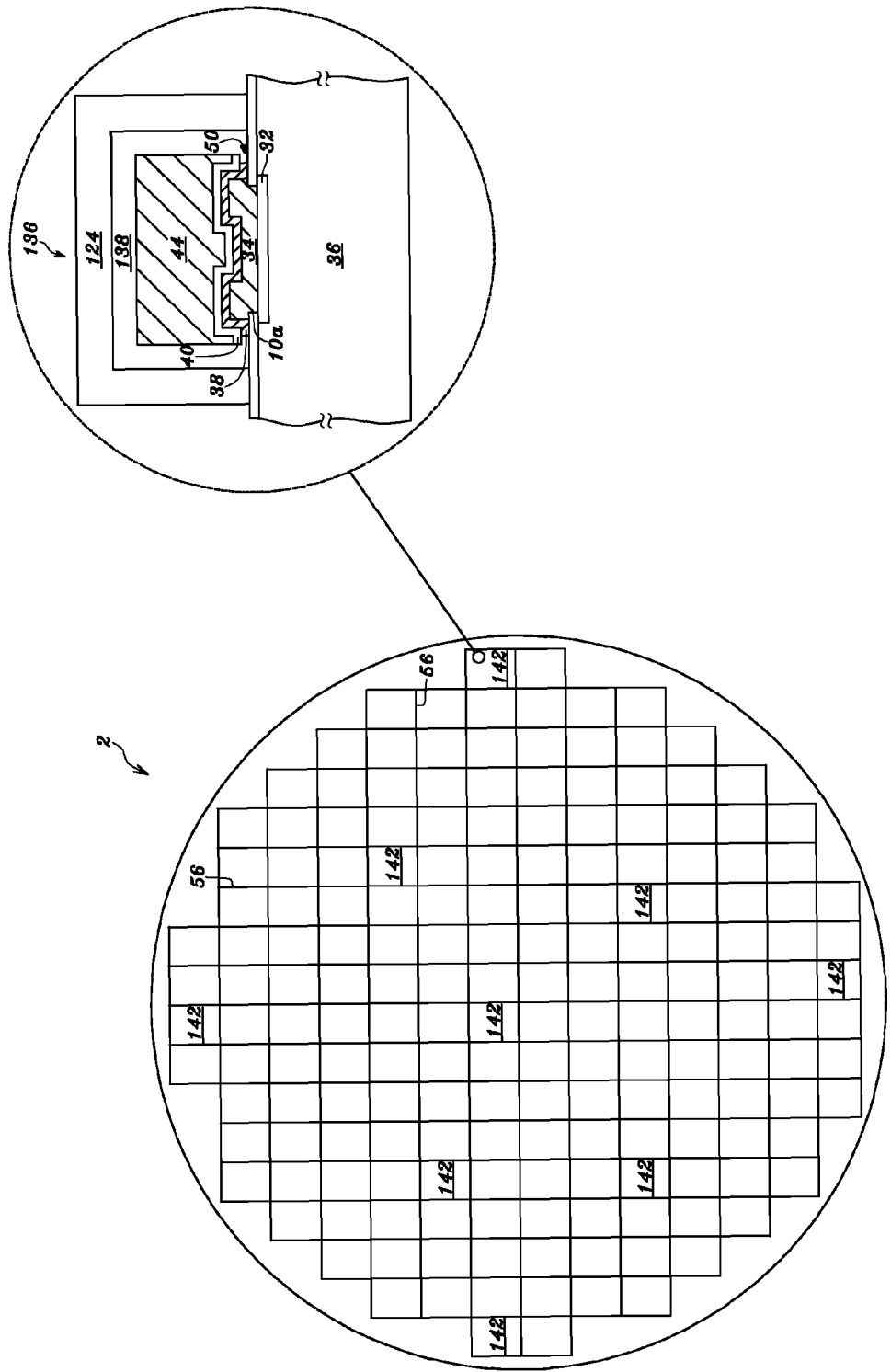
FIG. 11B is a top view showing a semiconductor wafer with multiple metal bumps.

After the metal bumps 136 are formed, the semiconductor wafer 2 can be cut into multiple chips 142. The detail can be referred as to FIG. 11B. Referring to FIG. 11B, the semiconductor wafer 2 includes multiple semiconductor chips 142 with scribe lines 56 between neighboring two of the semiconductor chips 142. The metal bumps 136 are on the metal caps 34, of each semiconductor chips 142, on the pads 32 exposed by the openings 10a. In a wafer dicing process, the semiconductor wafer 2 can be cut along the scribe lines 56 to separate the semiconductor chips 142.

TCP (Tape Carrier Package)—Gold to Tin Connection

Figure 11C:
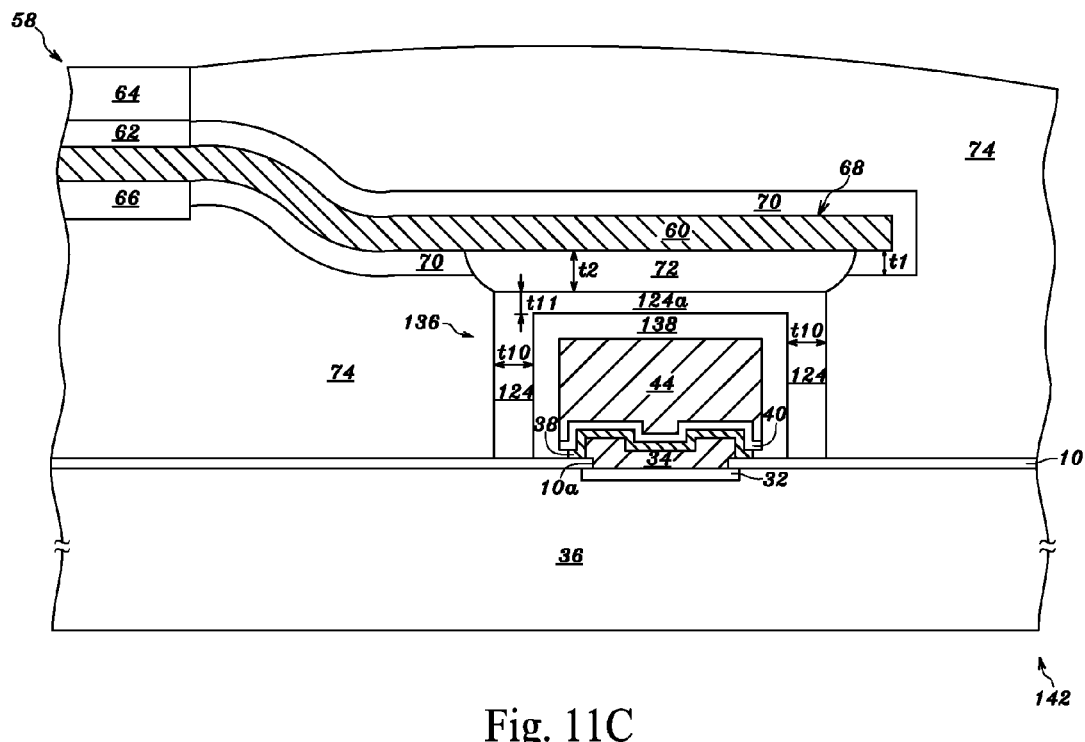

Referring to FIG. 11C, the flexible circuit film 58 as mentioned in FIG. 2G can be bonded with the metal bumps 136 (only one of them is shown) on the metal caps 34. The specification of the flexible circuit film 58 shown in FIG. 11C can be referred to as the specification of the flexible circuit film 58 illustrated in FIG. 2G The process of thermally pressing the tin-containing layer 70 of the flexible circuit film 58 on a top surface of the gold layer 124 of the metal bumps 136, as shown in FIG. 11C, can be referred to as the process of thermally pressing the tin-containing layer 70 of the flexible circuit film 58 on the top surface of the gold layer 124 of the metal bumps 136, as illustrated in FIG. 10C. Thereby, a tin-alloy layer 72 containing gold can be formed between the remaining gold layer 124a of the metal bumps 136 and the copper traces 60 of the flexible circuit film 58, wherein the remaining gold layer 124a on a top surface of the nickel layer 138 has a thickness of between 0.2 and 6 micrometers, and preferably of between 1.5 and 4 micrometers. The specification of the tin-alloy layer 72 shown in FIG. 11C can be referred to as the specification of the tin-alloy layer 72 illustrated in FIG. 10C.

After the metal bumps 136 are connected to the tin-containing layer 70 on the bottom surface of the inner leads 68 using a thermal pressing process, a polymer material 74, such as epoxy or polyimide, can be formed between the semiconductor chip 142 and the tin-containing layer 70 on the bottom surface of the inner leads 68, and enclosing the metal bumps 136. Next, the polymer material 74 is cured at a temperature of between 150 and 250° C.

In the FIG. 11C, the copper traces 60 can be replaced by multiple gold traces having a thickness of between 3 and 30 µm, and preferably of between 5 and 20 µm. Alternatively, the copper traces 60 can be replaced by multiple silver traces having a thickness of between 3 and 30 µm, and preferably of between 5 and 20 µm.

TCP (Tape Carrier Package)—Gold to Gold Connection

Figure 11D:
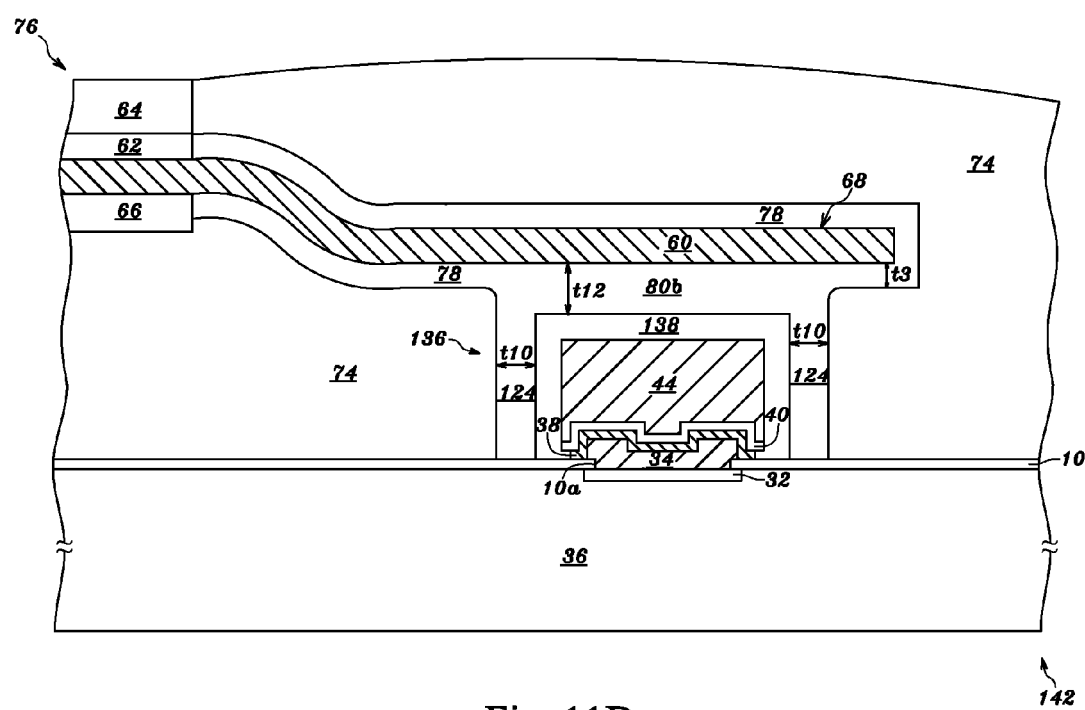

Referring to FIG. 11D, the flexible circuit film 76 as mentioned in FIG. 2I can be bonded with the metal bumps 136 (only one of them is shown) on the metal caps 34. The specification of the flexible circuit film 76 shown in FIG. 11D can be referred to as the specification of the flexible circuit film 76 illustrated in FIG. 2I. The process of thermally pressing the gold layer 78 of the flexible circuit film 76 on a top surface of the gold layer 124 of the metal bumps 136, as shown in FIG. 11D, can be referred to as the process of thermally pressing the gold layer 78 of the flexible circuit film 76 on the top surface of the gold layer 124 of the metal bumps 136, as illustrated in FIG. 10D. Thereby, a gold layer 80b formed by the joint of the gold layer 78 and the gold layer 124 can be between the nickel layer 138 of the metal bumps 136 and the copper traces 60 of the flexible circuit film 76, wherein the gold layer 80b has a thickness t12 of between 1 and 10 micrometers, and preferably of between 3 and 6 micrometers.

After the metal bumps 136 are connected to the copper traces 60 using a thermal pressing process, a polymer material 74, such as epoxy or polyimide, can be formed between the semiconductor chip 142 and the gold layer 78 on the bottom surface of the inner leads 68, and enclosing the metal bumps 136. Next, the polymer material 74 is cured at a temperature of between 150 and 250° C.

COF (Chip on Film) Package—Gold to Tin Connection

Figure 11E:
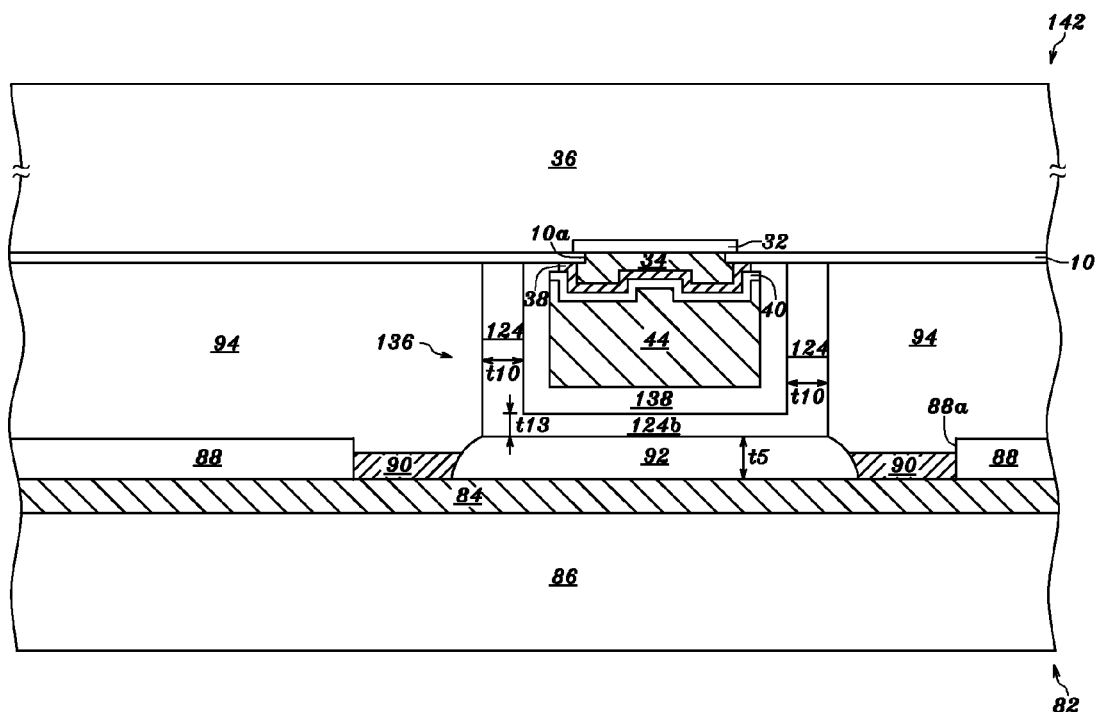

Referring to FIG. 11E, the flexible circuit film 82 as mentioned in FIG. 2K can be bonded with the metal bumps 136 (only one of them is shown) on the metal caps 34. The specification of the flexible circuit film 82 shown in FIG. 11E can be referred to as the specification of the flexible circuit film 82 illustrated in FIG. 2K. The process of thermally pressing the tin-containing layer 90 of the flexible circuit film 82 on a top surface of the gold layer 124 of the metal bumps 136, as shown in FIG. 11E, can be referred to as the process of thermally pressing the tin-containing layer 90 of the flexible circuit film 82 on the top surface of the gold layer 124 of the metal bumps 136, as illustrated in FIG. 10E. Alternatively, the process of thermally pressing a top surface of the gold layer 124 of the metal bumps 136 on the tin-containing layer 90 of the flexible circuit film 82, as shown in FIG. 11E, can be referred to as the process of thermally pressing the top surface of the gold layer 124 of the metal bumps 136 on the tin-containing layer 90 of the flexible circuit film 82, as illustrated in FIG. 10E. Thereby, a tin-alloy layer 92 containing gold can be formed between the remaining gold layer 124b of the metal bumps 136 and the copper traces 84 of the flexible circuit film 82, wherein the remaining gold layer 124b on a top surface of the nickel layer 138 has a thickness of between 0.2 and 6 micrometers, and preferably of between 1.5 and 4 micrometers. The specification of the tin-alloy layer 92 shown in FIG. 11E can be referred to as the specification of the tin-alloy layer 92 illustrated in FIG. 10E.

After the metal bumps 136 are connected to the copper traces 84 using a thermal pressing process, a polymer material 94, such as epoxy or polyimide, can be formed between the passivation layer 10 of the semiconductor chip 142 and the polymer layer 88 of the flexible circuit film 82, and enclosing the metal bumps 136. Next, the polymer material 94 is cured at a temperature of between 150 and 250° C.

In the FIG. 11E, the copper traces 84 can be replaced by multiple gold traces having a thickness of between 3 and 30 µm, and preferably of between 5 and 20 µm. Alternatively, the copper traces 84 can be replaced by multiple silver traces having a thickness of between 3 and 30 µm, and preferably of between 5 and 20 µm.

COF (Chip on Film) Package—Gold to Gold Connection

Figure 11F:
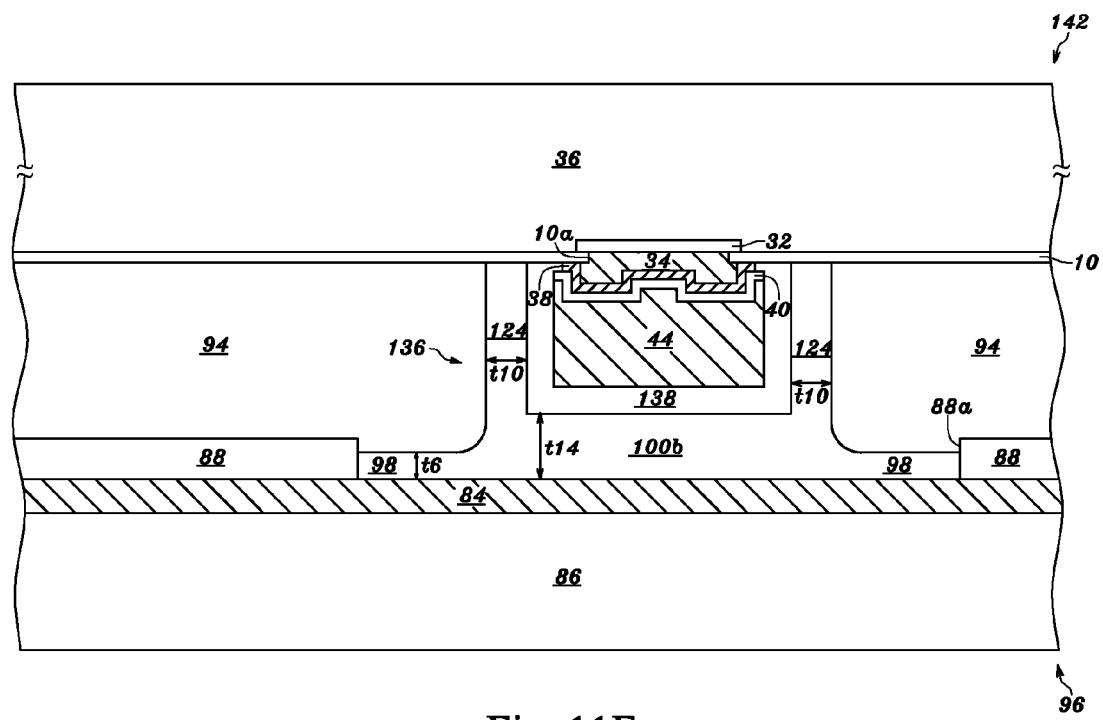

Referring to FIG. 11F, the flexible circuit film 96 as mentioned in FIG. 2M can be bonded with the metal bumps 136 (only one of them is shown) on the metal caps 34. The specification of the flexible circuit film 96 shown in FIG. 11F can be referred to as the specification of the flexible circuit film 96 illustrated in FIG. 2M. The process of thermally pressing the gold layer 98 of the flexible circuit film 96 on a top surface of the gold layer 124 of the metal bumps 136, as shown in FIG. 11F, can be referred to as the process of thermally pressing the gold layer 98 of the flexible circuit film 96 on the top surface of the gold layer 124 of the metal bumps 136, as illustrated in FIG. 10F. Alternatively, the process of thermally pressing a top surface of the gold layer 124 of the metal bumps 136 on the gold layer 98 of the flexible circuit film 96, as shown in FIG. 11F, can be referred to as the process of thermally pressing the top surface of the gold layer 124 of the metal bumps 136 on the gold layer 98 of the flexible circuit film 96, as illustrated in FIG. 10F. Thereby, a gold layer 100b formed by the joint of the gold layer 98 and the gold layer 124 can be between the nickel layer 138 of the metal bumps 136 and the copper traces 84 of the flexible circuit film 96, wherein the gold layer 100b has a thickness t14 of between 1 and 10 micrometers, and preferably of between 3 and 6 micrometers.

After the metal bumps 136 are connected to the copper traces 84 using a thermal pressing process, a polymer material 94, such as epoxy or polyimide, can be formed between the passivation layer 10 of the semiconductor chip 142 and the polymer layer 88 of the flexible circuit film 96, and enclosing the metal bumps 136. Next, the polymer material 94 is cured at a temperature of between 150 and 250° C.

COG (Chip on Glass) Assembly—ACF/ACP

Figure 11G:
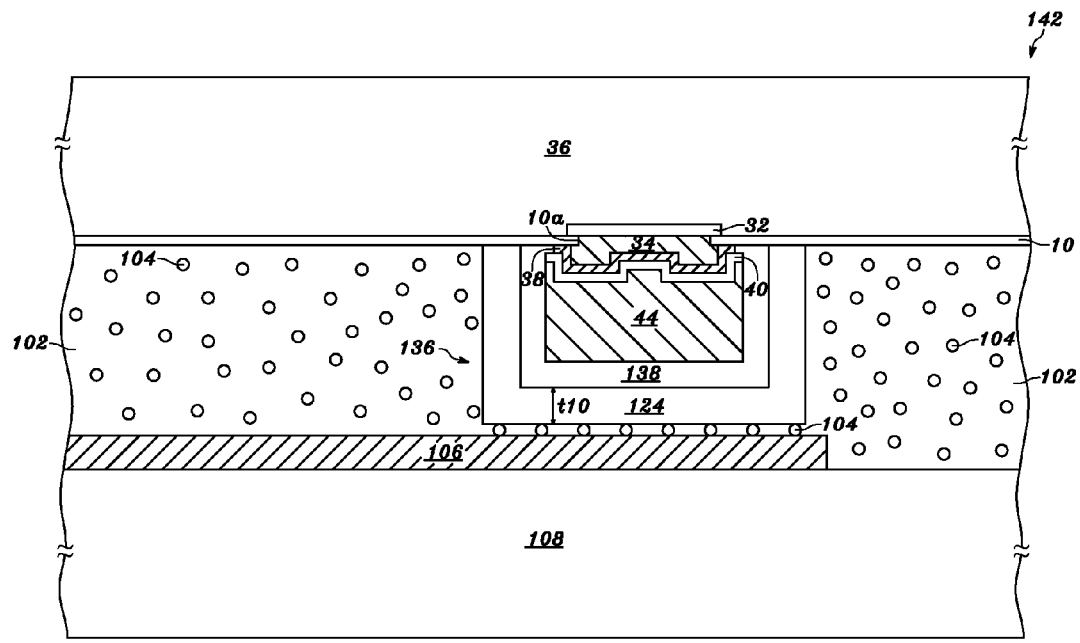

Referring to FIG. 11G, via a thermal pressing process, the gold layer 124 of the metal bumps 136 (only one of them is shown) on the metal caps 34 is pressed into an anisotropic conductive film (ACF) or an anisotropic conductive paste (ACP) 102. Thus, metal particles 104 inside ACF or ACP 102 clusters between the gold layer 124 of the metal bumps 136 and multiple conductive traces 106 (only one of them is shown), such as indium tin oxide (ITO) or gold, on a glass substrate 108, leading the gold layer 124 of the metal bumps 136 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 124 of the metal bumps 136 may be pressed into ACF or ACP 102 preformed on a ceramic substrate or a printed circuit board to have metal particles 104 in the ACF or ACP 102 connecting the gold layer 124 of the metal bumps 136 to multiple pads on the ceramic substrate or on the organic substrate.

COG (Chip on Glass) Assembly—NCF

Figure 11H:
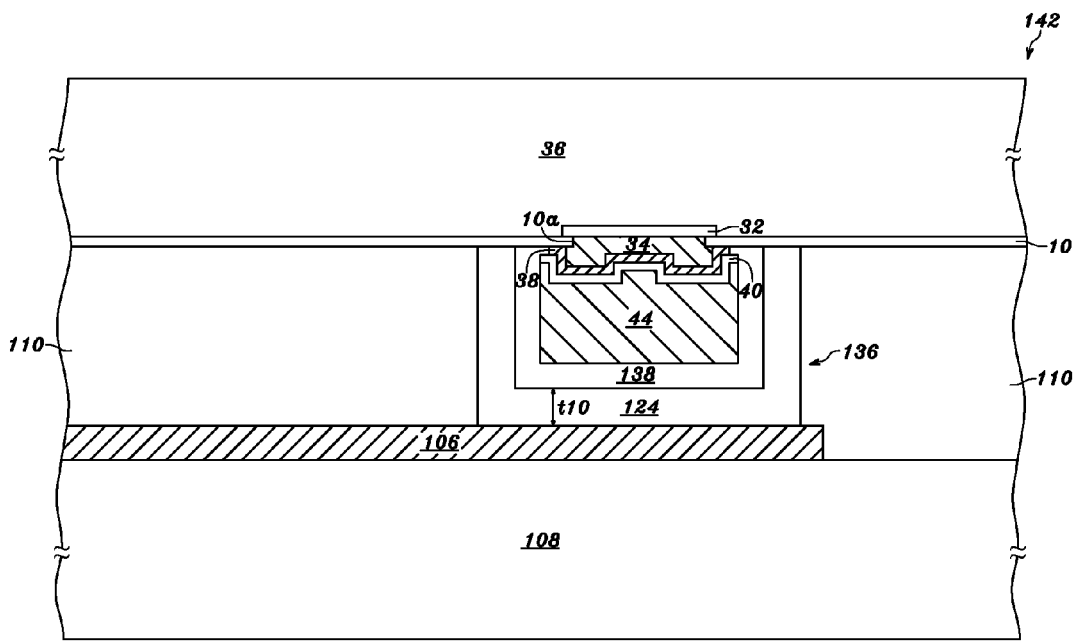

Referring to FIG. 11H, via a thermal pressing process, the gold layer 124 of the metal bumps 136 (only one of them is shown) on the metal caps 34 is pressed into a non-conductive film (NCF) 110, and the gold layer 124 of the metal bumps 136 contacts with multiple conductive traces 106 (only one of them is shown), such as indium tin oxide (ITO) or gold, on a glass substrate 108, leading the gold layer 124 of the metal bumps 136 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 124 of the metal bumps 136 may be pressed into NCF 110 preformed on a ceramic substrate or a printed circuit board to have the gold layer 124 of the metal bumps 136 contacting with multiple pads on the ceramic substrate or on the organic substrate.

Embodiment 11

Figure 12A:
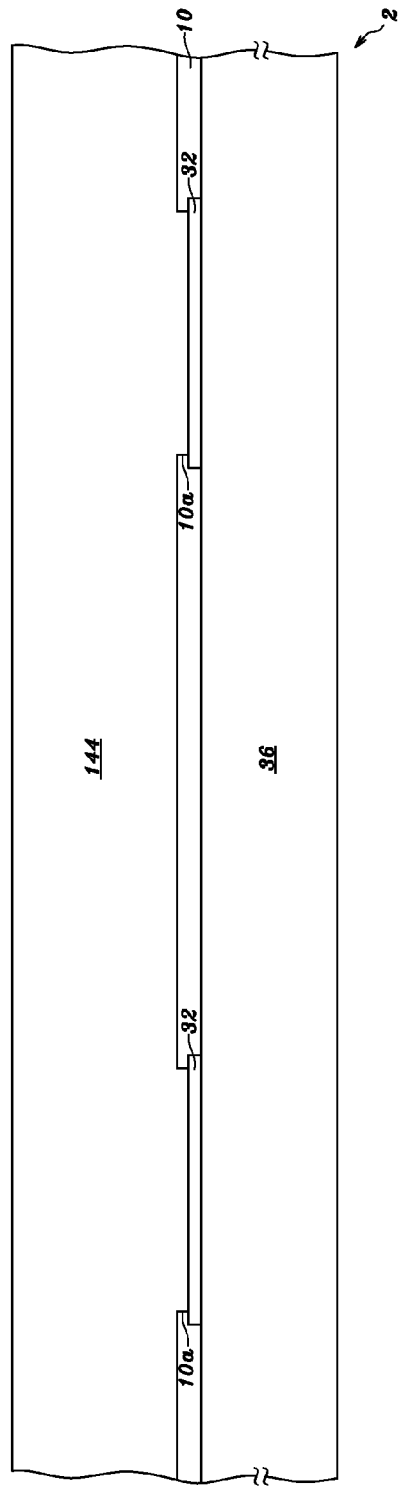

Referring to FIG. 12A, a polymer layer 144 can be spin-on coated on the passivation layer 10 and on the pads 32, such as aluminum pads or copper pads, exposed by the openings 10a. Alternatively, the polymer layer 144 can be formed by a lamination process or a screen-printing process. The material of the polymer layer 144 may include benzocyclobutane (BCB), polyimide (PI), polybenzoxazole (PBO) or epoxy resin.

Figure 12B:
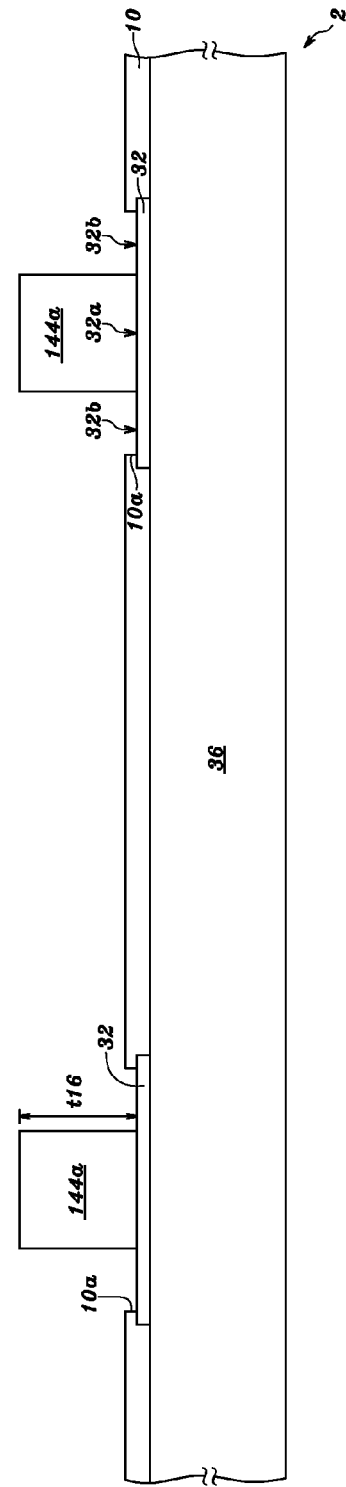
Figure 12E:
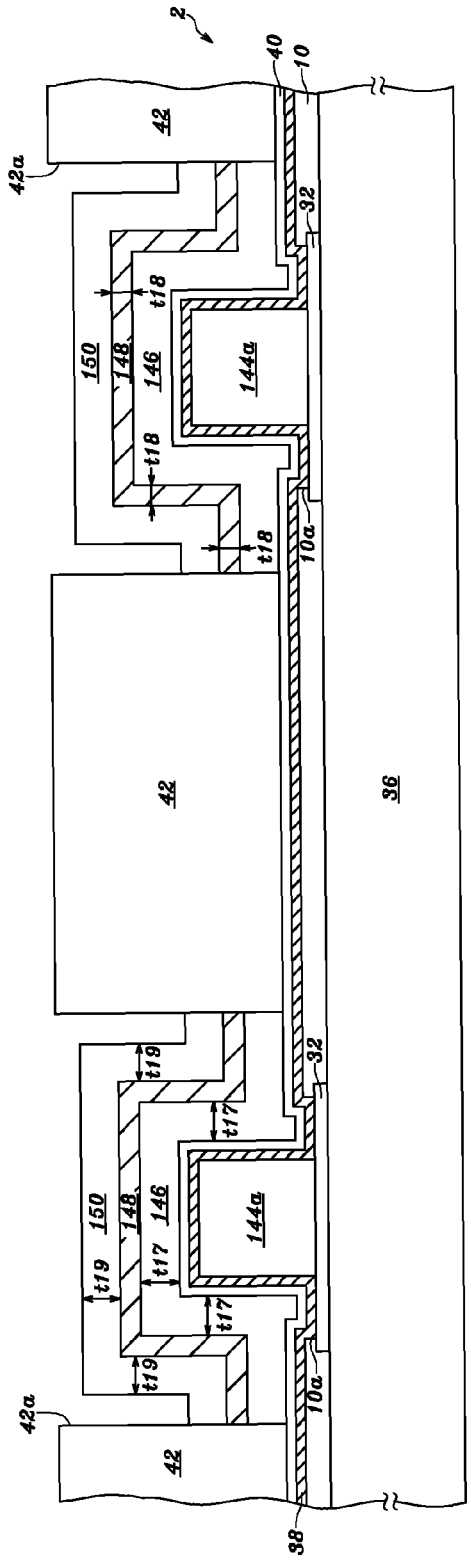
Figure 12F:
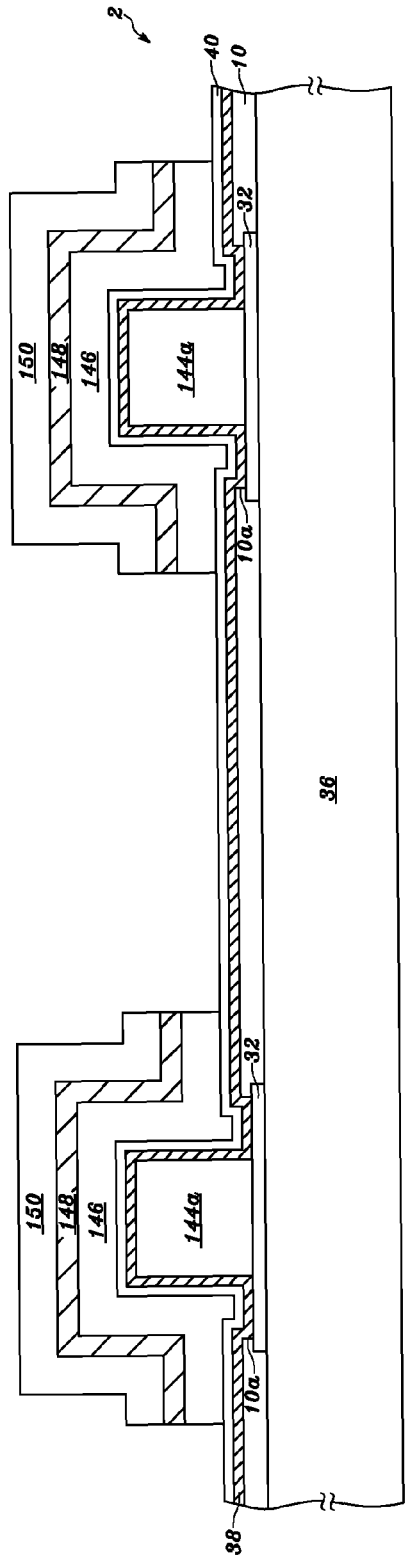
Figure 12G:
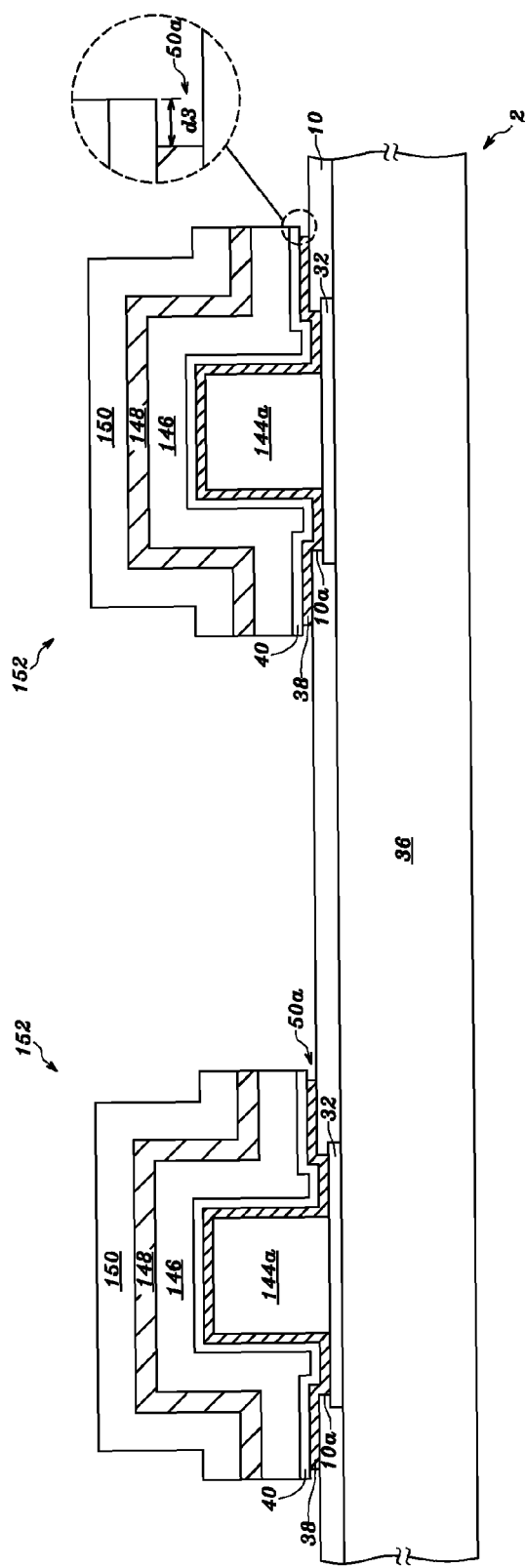
Figure 12H:
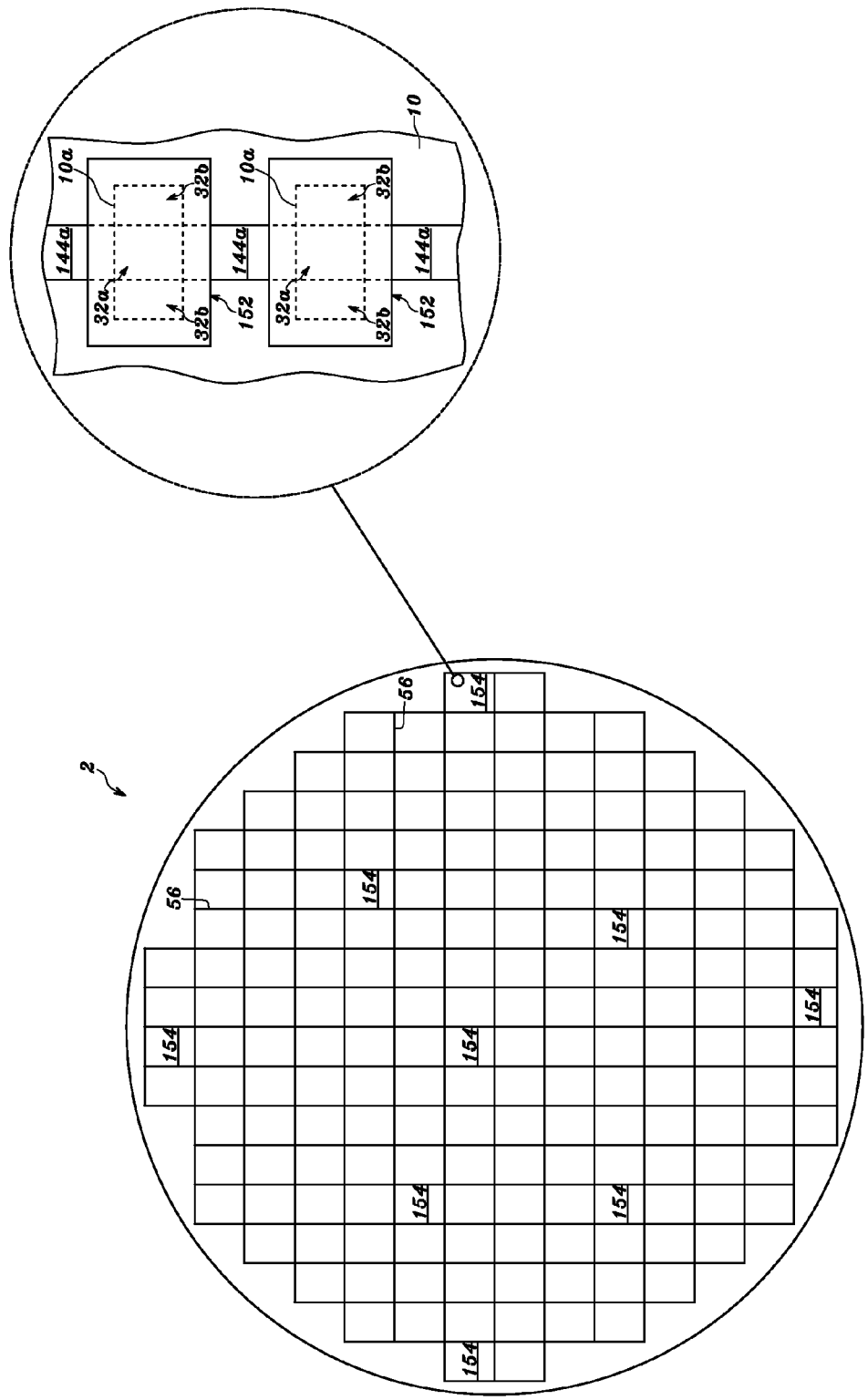
FIG. 12H is a top view showing a semiconductor wafer with multiple bumps.

Referring to FIGS. 12B and 12H, each polymer bump 144a is formed with a bar shape by patterning the polymer layer 144. Each polymer bump 144a extends in a direction parallel with a scribeline and across over multiple center regions 32a of the pads 32, exposed by the openings, aligned in a line parallel with the scribeline. The pads 32 have two peripheral regions 32b, which is not covered by the polymer bumps 144a and exposed by the openings 10a, at both sides the polymer bumps 144a. The polymer bumps 144a have a thickness t16 of between 5 and 50 micrometers. Below, the process of forming the polymer bumps 144a is exemplified with the case of spin-on coating a polyimide layer on the passivation layer 10 and on the pads 32, and then patterning the polyimide layer. Alternatively, the polymer bumps 144a can be formed by spin-on coating a layer of benzocyclobutene or epoxy resin on the passivation layer 10 and on the pads 32, and then patterning the layer.

For example, the polymer layer 144 can be formed by spin-on coating a negative-type photosensitive polyimide layer having a thickness of between 10 and 100 µm on the passivation layer 10 and on the pads 32 exposed by the openings 10a, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form multiple polyimide bumps each having a bar shape extending in a direction parallel with a scribeline and across over multiple center regions 32a of the pads 32, exposed by the openings, aligned in a line parallel with the scribeline, then curing or heating the polyimide bumps at a peak temperature of between 180 and 400° C. for a time of between 20 and 150 minutes in a nitrogen ambient or in an oxygen-free ambient, the cured polyimide bumps having a thickness t16 of between 5 and 50 µm, and then removing the residual polymeric material or other contaminants from the upper surface of the pads 32 at the peripheral regions 32b with an $O_2$ plasma or a plasma containing fluorine of below 200 PPM and oxygen, such that each of the polymer bumps 144a can be formed with a bar shape extending in a direction parallel with a scribeline and across over multiple center regions 32a of the pads 32, exposed by the openings, aligned in a line parallel with the scribeline. For example, the polyimide bumps can be cured or heated at a temperature between 180 and 250° C. for a time of between 20 and 150 minutes in a nitrogen ambient or in an oxygen-free ambient. Alternatively, the polyimide bumps can be cured or heated at a temperature between 250 and 290° C. for a time of between 20 and 150 minutes in a nitrogen ambient or in an oxygen-free ambient. Alternatively, the polyimide bumps can be cured or heated at a temperature between 290 and 400° C. for a time of between 20 and 150 minutes in a nitrogen ambient or in an oxygen-free ambient. Alternatively, the polyimide bumps can be cured or heated at a temperature between 250 and 400° C. for a time of between 20 and 150 minutes in a nitrogen ambient or in an oxygen-free ambient.

Referring to FIG. 12C, an adhesion/barrier layer 38 having a thickness of between 0.02 and 0.5 µm, and preferably of between 0.25 and 0.35 µm, can be formed on the polymer bumps 144a, on the passivation layer 10 and on the peripheral regions 32b of the pads 32, such as aluminum pads or copper pads, exposed by the openings 10a. The adhesion/barrier layer 38 can be formed by a physical vapor deposition (PVD) process, such as a sputtering process or an evaporation process, or a chemical vapor deposition (CVD) process. The material of the adhesion/barrier layer 38 may include titanium, a titanium-tungsten alloy, titanium nitride, chromium, tantalum, tantalum nitride or a composite of the abovementioned materials. In a case, the adhesion/barrier layer 38 can be formed by sputtering a titanium-tungsten-alloy layer with a thickness of between 0.02 and 0.5 µm, and preferably of between 0.25 and 0.35 µm, on the polymer bumps 144a, on the passivation layer 10 and on the peripheral regions 32b of the pads 32, such as aluminum pads or copper pads, exposed by the openings 10a. In another case, the adhesion/barrier layer 38 can be formed by sputtering a titanium layer with a thickness of between 0.02 and 0.5 µm, and preferably of between 0.25 and 0.35 µm, on the polymer bumps 144a, on the passivation layer 10 and on the peripheral regions 32b of the pads 32, such as aluminum pads or copper pads, exposed by the openings 10a. In another case, the adhesion/barrier layer 38 can be formed by sputtering a tantalum-nitride layer with a thickness of between 0.02 and 0.5 µm, and preferably of between 0.25 and 0.35 µm, on the polymer bumps 144a, on the passivation layer 10 and on the peripheral regions 32b of the pads 32, such as aluminum pads or copper pads, exposed by the openings 10a. In another case, the adhesion/barrier layer 38 can be formed by sputtering a tantalum layer with a thickness of between 0.02 and 0.5 µm, and preferably of between 0.25 and 0.35 µm, on the polymer bumps 144a, on the passivation layer 10 and on the peripheral regions 32b of the pads 32, such as aluminum pads or copper pads, exposed by the openings 10a. In another case, the adhesion/barrier layer 38 can be formed by sputtering a titanium layer on the polymer bumps 144a, on the passivation layer 10 and on the peripheral regions 32b of the pads 32, such as aluminum pads or copper pads, exposed by the openings 10a, and then sputtering a titanium-tungsten-alloy layer on the titanium layer.

Next, a seed layer 40, made of copper, having a thickness of between 0.03 and 1 µm, and preferably of between 0.05 and 0.2 µm, can be formed on the adhesion/barrier layer 38. The seed layer 40 can be formed by a physical vapor deposition (PVD) process, such as a sputtering process or an evaporation process, or a chemical vapor deposition (CVD) process. The specification of the adhesion/barrier layer 38 and the seed layer 40 shown in FIG. 12C can be referred to as the specification of the adhesion/barrier layer 38 and the seed layer 40 illustrated in FIG. 2A. The process of forming the adhesion/barrier layer 38 and the seed layer 40, as shown in FIG. 12C, can be referred to as the process of forming the adhesion/barrier layer 38 and the seed layer 40, as illustrated in FIG. 2A.

Referring to FIG. 12D, a photoresist layer 42, such as positive-type photoresist layer, having a thickness of between 10 and 60 micrometers, and preferably of between 15 and 25 micrometers, is spin-on coated on the seed layer 40. Next, the photoresist layer 42 is patterned with the processes of exposure and development to form openings 42a in the photoresist layer 42 exposing the seed layer 40. A 1× stepper or 1× contact aligner can be used to expose the photoresist layer 42 during the process of exposure.

For example, the photoresist layer 42 can be formed by spin-on coating a positive-type photosensitive polymer layer having a thickness of between 10 and 60 µm, and preferably of between 15 and 25 µm, on the seed layer 40, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 40 with an $O_2$ plasma or a plasma containing fluorine of below 200 PPM and oxygen, such that the photoresist layer 42 can be patterned with the openings 42a in the photoresist layer 42 exposing the seed layer 40.

Referring to FIG. 12E, a copper layer 146 having a thickness t17 of between 0.5 and 25 micrometers, and preferably of between 5 and 10 micrometers, is electroplated on the seed layer 40 exposed by the openings 42a. Next, a nickel layer 148 having a thickness t18 of between 0.1 and 5 micrometers, and preferably of between 0.2 and 2 micrometers, can be electroplated on the electroplated copper layer 146 in the openings 42a. Next, a gold layer 150 having a thickness t19 of between 0.5 and 10 micrometers, and preferably of between 3 and 6 micrometers, can be electroplated on the nickel layer 148 in the openings 42a with a non-cyanide electroplating solution, such as a solution containing gold sodium sulfite ($Na_3Au(SO_3)_2$) or a solution containing gold ammonium sulfite (($NH_4)_3[Au(SO_3)_2]$), or with an electroplating solution containing cyanide. The nickel layer 148 can be replaced by a cobalt layer having a thickness of between 0.1 and 5 μm, and preferably of between 0.2 and 2 μm. The gold layer 150 can be replaced by a silver layer having a thickness of between 0.5 and 10 μm, and preferably of between 3 and 6 μm.

Referring to FIG. 12F, after the gold layer 150 is formed, most of the photoresist layer 42 can be removed using an organic solution with amide. However, some residuals from the photoresist layer 42 could remain on the gold layer 150 and on the seed layer 40. Thereafter, the residuals can be removed from the gold layer 150 and from the seed layer 40 with a plasma, such as $O_2$ plasma or plasma containing fluorine of below 200 PPM and oxygen.

Referring to FIG. 12G, the seed layer 40 and the adhesion/barrier layer 38 not under the electroplated copper layer 146 are subsequently removed with a wet etching method or a dry etching method, such as an Ar sputtering etching process. As to the wet etching method, the seed layer 40, made of copper, can be etched with a solution containing $NH_4OH$ or with a solution containing $H_2SO_4$. When the adhesion/barrier layer 38 is a titanium-tungsten-alloy layer, it can be etched with a solution containing hydrogen peroxide or with a solution containing $NH_4OH$ and hydrogen peroxide; when the adhesion/barrier layer 38 is a titanium layer, it can be etched with a solution containing hydrogen fluoride or with a solution containing $NH_4OH$ and hydrogen peroxide.

Multiple undercuts 50a are formed under the seed layer 40 and under the electroplated copper layer 146 when the adhesion/barrier layer 38 not under the electroplated copper layer 146 is removed using a wet etching method. The adhesion/barrier layer 38 under the electroplated copper layer 146 has a first sidewall recessed from a second sidewall of the seed layer 40, wherein a distance d3 between the first sidewall and the second sidewall is between 0.3 and 2 micrometers.

Thereby, in the present invention, multiple bumps 152 can be formed, respectively, on the pads 32, such as aluminum pads or copper pads, exposed by the openings 10a. Each of the bumps 152 can be formed of one of the polymer bumps 144a on the center region 32a of one of the pads 32, the adhesion/barrier layer 38 on the peripheral regions 32b of said one of the pads 32 and on said one of the polymer bumps 144a, a copper layer (including the seed layer 40 and the electroplated copper layer 146), having a thickness of between 0.5 and 25 micrometers, and preferably of between 5 and 10 micrometers, on the adhesion/barrier layer 38, the nickel layer 148 on the copper layer and the gold layer 150 on the nickel layer 148.

After the bumps 152 are formed, the semiconductor wafer 2 can be cut into multiple chips 154. The detail can be referred as to FIG. 12H. Referring to FIG. 12H, the semiconductor wafer 2 includes multiple semiconductor chips 154 with scribe lines 56 between neighboring two of the semiconductor chips 154. The bumps 152 are on the pads 32, of each semiconductor chips 154, exposed by the openings 10a. In a wafer dicing process, the semiconductor wafer 2 can be cut along the scribe lines 56 to separate the semiconductor chips 154.

TCP (Tape Carrier Package)—Gold to Tin Connection

Figure 12I:
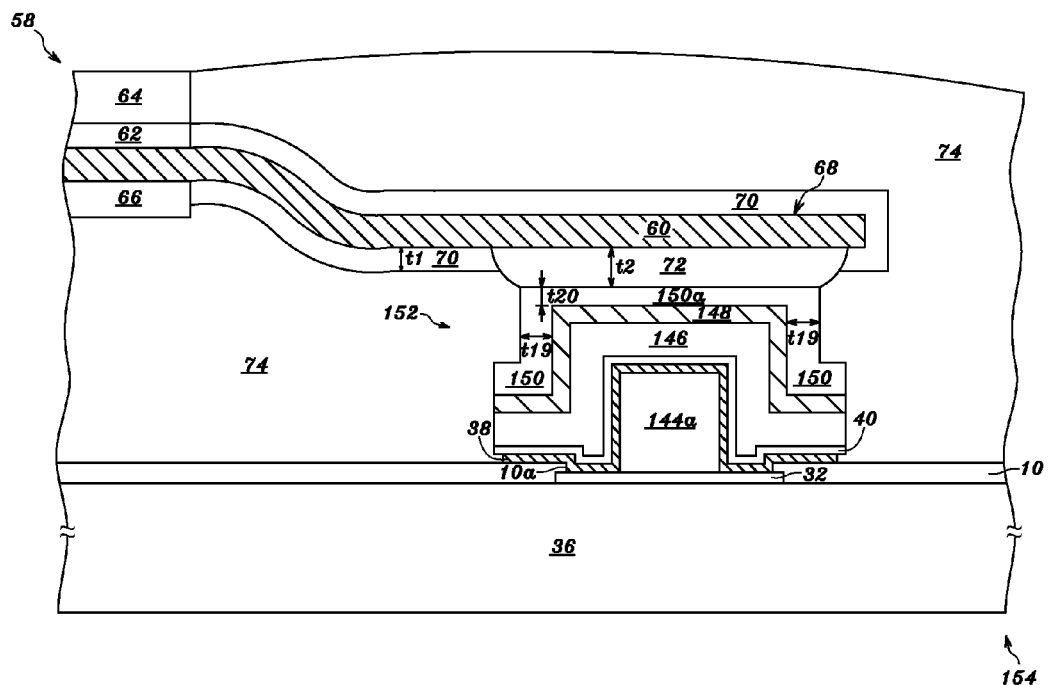

Referring to FIG. 12I, the flexible circuit film 58 as mentioned in FIG. 2G can be bonded with the bumps 152 (only one of them is shown). The specification of the flexible circuit film 58 shown in FIG. 12I can be referred to as the specification of the flexible circuit film 58 illustrated in FIG. 2G. When the flexible circuit film 58 is bonded with the bumps 152, the tin-containing layer 70 on a bottom surface of the inner leads 68 (only one of them is shown) can be thermally pressed on a top surface of the gold layer 150 of the bumps 152 at a temperature of between 490 and 540° C., and preferably of between 500 and 520° C., for a time of between 1 and 10 seconds, and preferably of between 3 and 6 seconds. Thereby, a tin-alloy layer 72 containing gold can be formed between the remaining gold layer 150a of the bumps 152 and the copper traces 60 of the flexible circuit film 58, wherein the remaining gold layer 150a has a thickness t20 of between 0.2 and 6 micrometers, and preferably of between 1.5 and 4 micrometers. The tin-alloy layer 72 has a thickness t2 of between 0.5 and 10 micrometers, of between 1 and 5 micrometers or of between 1.5 and 3 micrometers. When the tin-containing layer 70 before bonded with the gold layer 150 is pure tin, the tin-alloy layer 72 is tin-gold alloy having a thickness t2 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 70 before bonded with the gold layer 150 is tin-silver alloy, the tin-alloy layer 72 is tin-silver-gold alloy having a thickness t2 of between 0.5 and 10 micrometers, of between 1 and 5 micrometers or of between 1.5 and 3 micrometers. When the tin-containing layer 70 before bonded with the gold layer 150 is tin-silver-copper alloy, the tin-alloy layer 72 is tin-silver-gold-copper alloy having a thickness t2 of between 0.5 and 10 micrometers, of between 1 and 5 micrometers or of between 1.5 and 3 micrometers.

After the bumps 152 are connected to the tin-containing layer 70 on the bottom surface of the inner leads 68 using a thermal pressing process, a polymer material 74, such as epoxy or polyimide, can be formed between the semiconductor chip 154 and the tin-containing layer 70 on the bottom surface of the inner leads 68, and enclosing the bumps 152. Next, the polymer material 74 is cured at a temperature of between 150 and 250° C.

In the FIG. 12I, the copper traces 60 can be replaced by multiple gold traces having a thickness of between 3 and 30 μm, and preferably of between 5 and 20 μm. Alternatively, the copper traces 60 can be replaced by multiple silver traces having a thickness of between 3 and 30 μm, and preferably of between 5 and 20 μm.

TCP (Tape Carrier Package)—Gold to Gold Connection

Figure 12J:
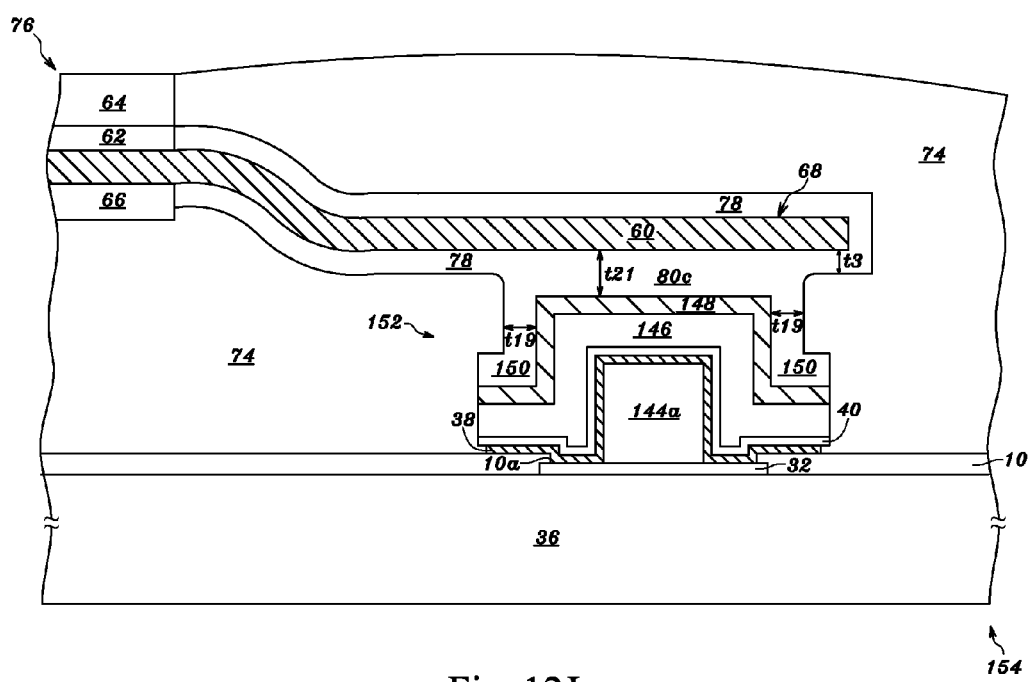

Referring to FIG. 12J, the flexible circuit film 76 as mentioned in FIG. 2I can be bonded with the bumps 152 (only one of them is shown). The specification of the flexible circuit film 76 shown in FIG. 12J can be referred to as the specification of the flexible circuit film 76 illustrated in FIG. 2I. When the flexible circuit film 76 is bonded with the bumps 152, the gold layer 78 on a bottom surface of the inner leads 68 (only one of them is shown) can be thermally pressed on a top surface of the gold layer 150 of the bumps 152 at a temperature of between 490 and 540° C., and preferably of between 500 and 520° C., for a time of between 1 and 10 seconds, and preferably of between 3 and 6 seconds. Thereby, a gold layer 80c formed by the joint of the gold layer 78 and the gold layer 150 can be between the nickel layer 148 of the bumps 152 and the copper traces 60 of the flexible circuit film 76, wherein the gold layer 80c has a thickness t21 of between 1 and 10 micrometers, and preferably of between 3 and 6 micrometers.

After the bumps 152 are connected to the copper traces 60 using a thermal pressing process, a polymer material 74, such as epoxy or polyimide, can be formed between the semiconductor chip 154 and the gold layer 78 on the bottom surface of the inner leads 68, and enclosing the bumps 152. Next, the polymer material 74 is cured at a temperature of between 150 and 250° C.

COF (Chip on Film) Package—Gold to Tin Connection

Figure 12K:
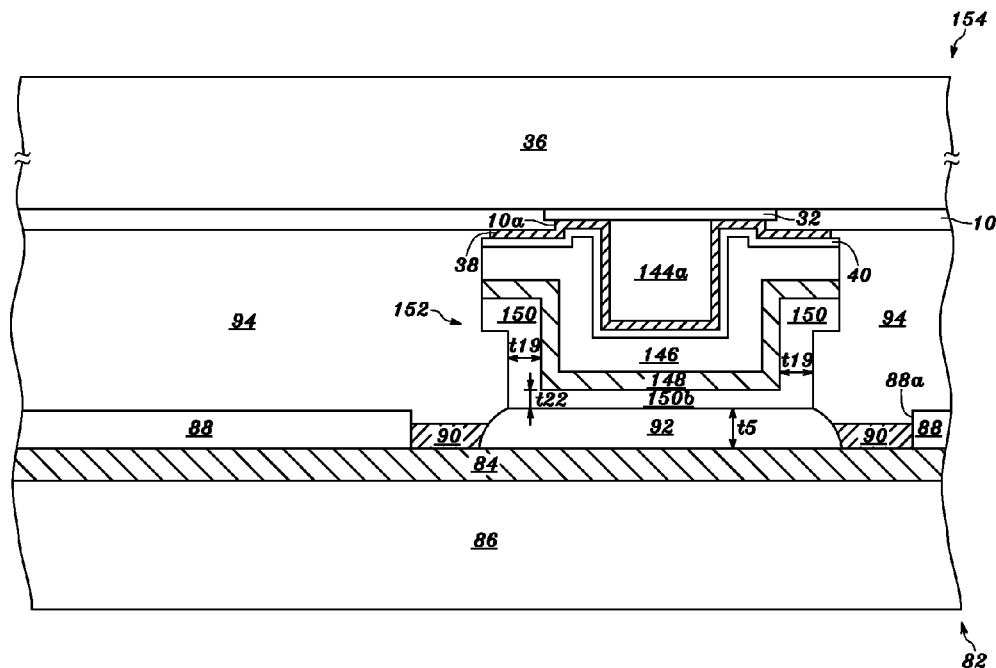

Referring to FIG. 12K, the flexible circuit film 82 as mentioned in FIG. 2K can be bonded with the bumps 152 (only one of them is shown). The specification of the flexible circuit film 82 shown in FIG. 12K can be referred to as the specification of the flexible circuit film 82 illustrated in FIG. 2K. When the flexible circuit film 82 is bonded with the bumps 152, a top surface of the gold layer 150 of the bumps 152 can be thermally pressed on the tin-containing layer 90 of the flexible circuit film 82 at a temperature of between 490 and 540° C., and preferably of between 500 and 520° C., for a time of between 1 and 10 seconds, and preferably of between 3 and 6 seconds. Alternatively, when the flexible circuit film 82 is bonded with the bumps 152, the tin-containing layer 90 of the flexible circuit film 82 can be thermally pressed on the top surface of the gold layer 150 of the bumps 152 at a temperature of between 490 and 540° C., and preferably of between 500 and 520° C., for a time of between 1 and 10 seconds, and preferably of between 3 and 6 seconds. Thereby, a tin-alloy layer 92 containing gold can be formed between the remaining gold layer 150b of the bumps 152 and the copper traces 84 of the flexible circuit film 82, wherein the remaining gold layer 150b has a thickness t22 of between 0.2 and 6 micrometers, and preferably of between 1.5 and 4 micrometers. The tin-alloy layer 92 has a thickness t5 of between 0.5 and 10 micrometers, of between 1 and 5 micrometers or of between 1.5 and 3 micrometers. When the tin-containing layer 90 before bonded with the gold layer 150 is pure tin, the tin-alloy layer 92 is tin-gold alloy having a thickness t5 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 90 before bonded with the gold layer 150 is tin-silver alloy, the tin-alloy layer 92 is tin-silver-gold alloy having a thickness t5 of between 0.5 and 10 micrometers, of between 1 and 5 micrometers or of between 1.5 and 3 micrometers. When the tin-containing layer 90 before bonded with the gold layer 150 is tin-silver-copper alloy, the tin-alloy layer 92 is tin-silver-gold-copper alloy having a thickness t5 of between 0.5 and 10 micrometers, of between 1 and 5 micrometers or of between 1.5 and 3 micrometers.

After the bumps 152 are connected to the copper traces 84 using a thermal pressing process, a polymer material 94, such as epoxy or polyimide, can be formed between the passivation layer 10 of the semiconductor chip 154 and the polymer layer 88 of the flexible circuit film 82, and enclosing the bumps 152. Next, the polymer material 94 is cured at a temperature of between 150 and 250° C.

In the FIG. 12K, the copper traces 84 can be replaced by multiple gold traces having a thickness of between 3 and 30 µm, and preferably of between 5 and 20 µm. Alternatively, the copper traces 84 can be replaced by multiple silver traces having a thickness of between 3 and 30 µm, and preferably of between 5 and 20 µm.

COF (Chip on Film) Package—Gold to Gold Connection

Figure 12L:
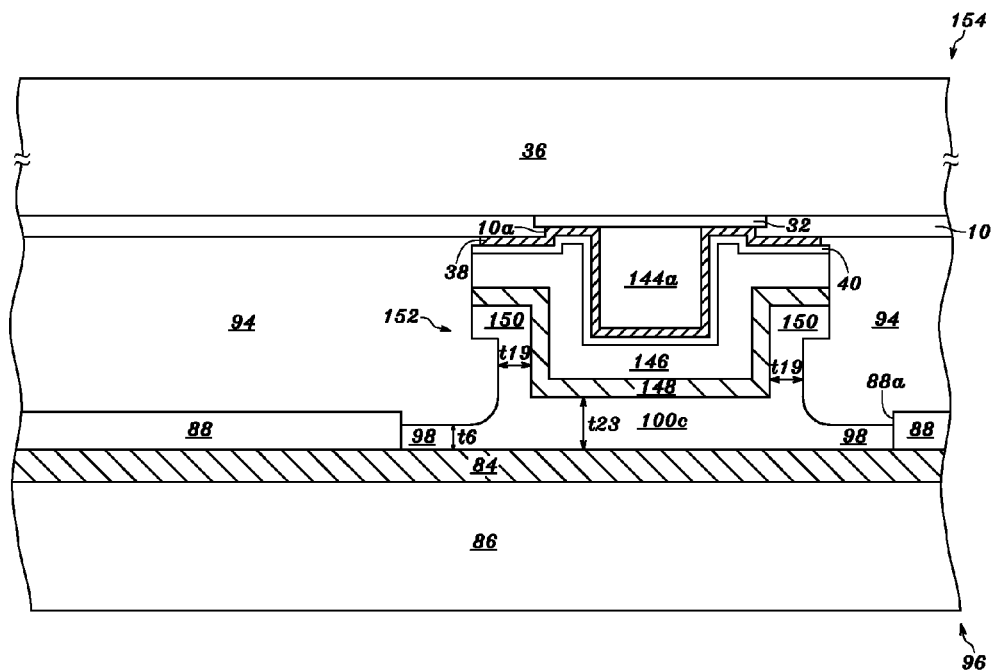

Referring to FIG. 12L, the flexible circuit film 96 as mentioned in FIG. 2M can be bonded with the bumps 152 (only one of them is shown). The specification of the flexible circuit film 96 shown in FIG. 12L can be referred to as the specification of the flexible circuit film 96 illustrated in FIG. 2M. When the flexible circuit film 96 is bonded with the bumps 152, a top surface of the gold layer 150 of the bumps 152 can be thermally pressed on the gold layer 98 of the flexible circuit film 96 at a temperature of between 490 and 540° C., and preferably of between 500 and 520° C., for a time of between 1 and 10 seconds, and preferably of between 3 and 6 seconds. Alternatively, when the flexible circuit film 96 is bonded with the bumps 152, the gold layer 98 of the flexible circuit film 96 can be thermally pressed on the top surface of the gold layer 150 of the bumps 152 at a temperature of between 490 and 540° C., and preferably of between 500 and 520° C., for a time of between 1 and 10 seconds, and preferably of between 3 and 6 seconds. Thereby, a gold layer 100c formed by the joint of the gold layer 98 and the gold layer 150 can be between the nickel layer 148 of the bumps 152 and the copper traces 84 of the flexible circuit film 96, wherein the gold layer 100c has a thickness t23 of between 1 and 10 micrometers, and preferably of between 3 and 6 micrometers.

After the bumps 152 are connected to the copper traces 84 using a thermal pressing process, a polymer material 94, such as epoxy or polyimide, can be formed between the passivation layer 10 of the semiconductor chip 154 and the polymer layer 88 of the flexible circuit film 96, and enclosing the bumps 152. Next, the polymer material 94 is cured at a temperature of between 150 and 250° C.

COG (Chip on Glass) Assembly—ACF/ACP

Figure 12M:
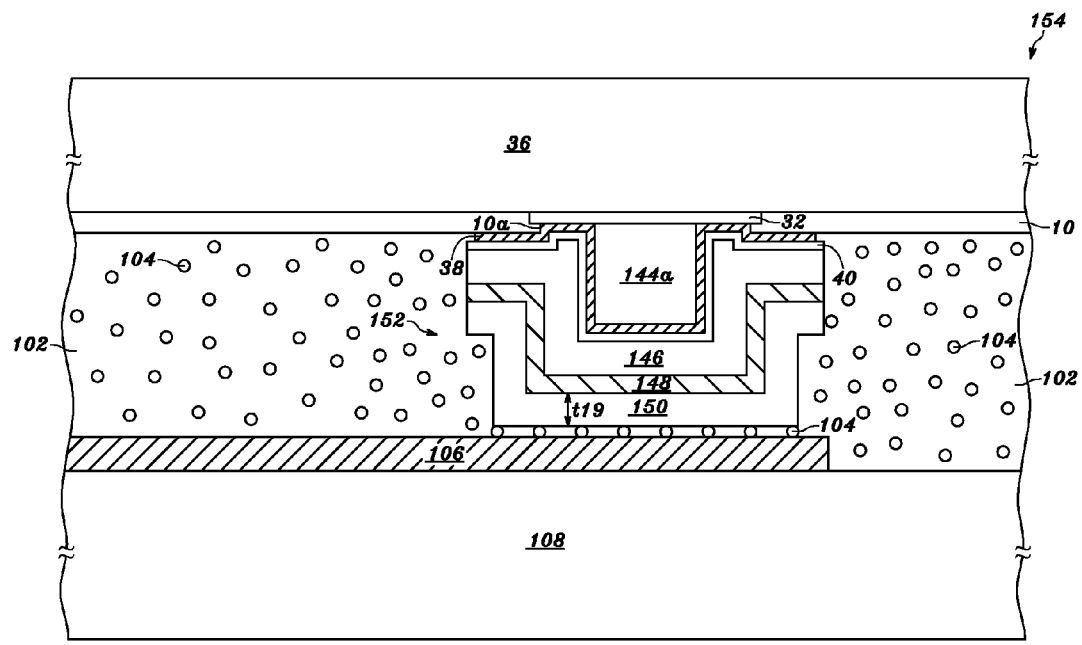

Referring to FIG. 12M, via a thermal pressing process, the gold layer 150 of the bumps 152 (only one of them is shown) is pressed into an anisotropic conductive film (ACF) or an anisotropic conductive paste (ACP) 102. Thus, metal particles 104 inside ACF or ACP 102 clusters between the gold layer 150 of the bumps 152 and multiple conductive traces 106 (only one of them is shown), such as indium tin oxide (ITO) or gold, on a glass substrate 108, leading the gold layer 150 of the bumps 152 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 150 of the bumps 152 may be pressed into ACF or ACP 102 preformed on a ceramic substrate or a printed circuit board to have metal particles 104 in the ACF or ACP 102 connecting the gold layer 150 of the bumps 152 to multiple pads on the ceramic substrate or on the organic substrate.

COG (Chip on Glass) Assembly—NCF

Figure 12N:
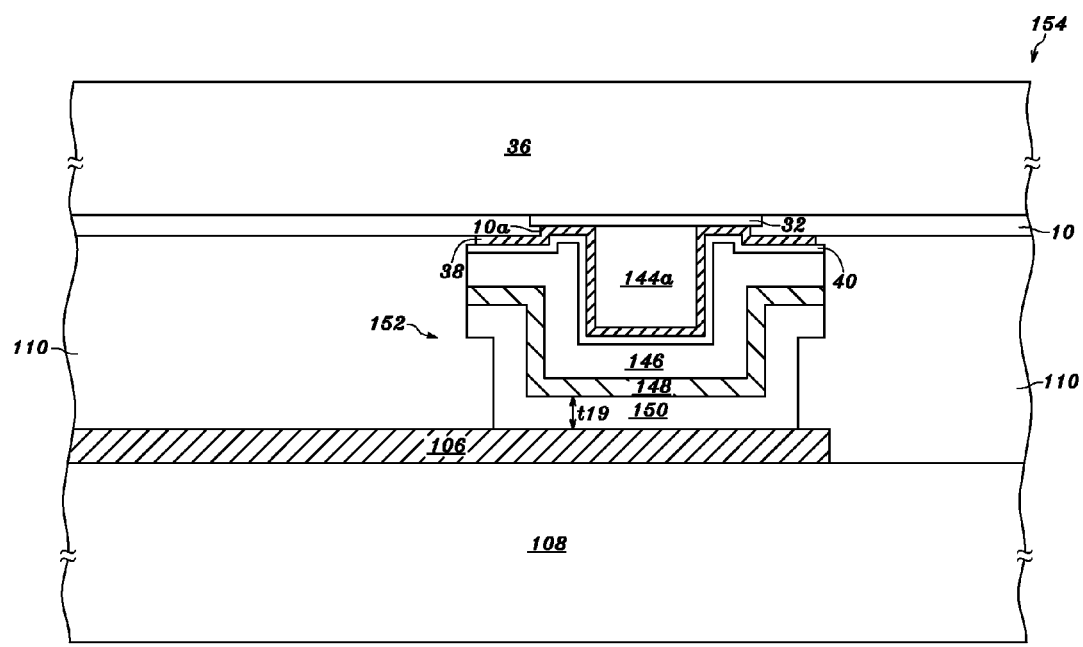

Referring to FIG. 12N, via a thermal pressing process, the gold layer 150 of the bumps 152 (only one of them is shown)

is pressed into a non-conductive film (NCF) 110, and the gold layer 150 of the bumps 152 contacts with multiple conductive traces 106 (only one of them is shown), such as indium tin oxide (ITO) or gold, on a glass substrate 108, leading the gold layer 150 of the bumps 152 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 150 of the bumps 152 may be pressed into NCF 110 preformed on a ceramic substrate or a printed circuit board to have the gold layer 150 of the bumps 152 contacting with multiple pads on the ceramic substrate or on the organic substrate.

Embodiment 12

Figure 13A:
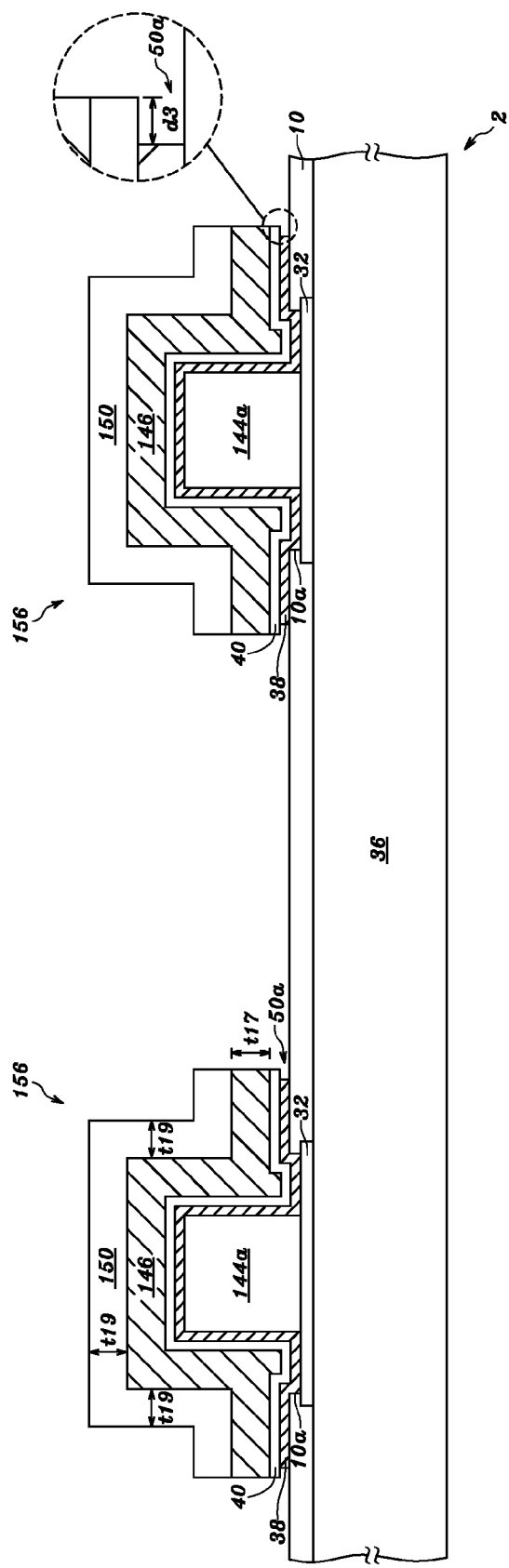
FIG. 13A and FIGS. 13C through 13H are cross-sectional views showing a process for fabricating multiple bumps on a wafer and packaging a chip singulated from the wafer according to one embodiment of the present invention.

Referring to FIG. 13A, multiple bumps 156 can be formed on the pads 32, such as copper pads or aluminum pads, exposed by the openings 10a. The process for forming the bumps 156 on the pads 32 can be performed by the above-mentioned steps as shown in FIGS. 12A-12D, followed by electroplating a copper layer 146 having a thickness t17 of between 0.5 and 25 micrometers, and preferably of between 5 and 10 micrometers, on the seed layer 40 exposed by the openings 42a, and then electroplating a gold layer 150 having a thickness t19 of between 0.5 and 10 micrometers, and preferably of between 3 and 6 micrometers, on the electroplated copper layer 146 in the openings 42a with a non-cyanide electroplating solution, such as a solution containing gold sodium sulfite ($Na_3Au(SO_3)_2$) or a solution containing gold ammonium sulfite (($NH_4)_3[Au(SO_3)_2]$), or with an electroplating solution containing cyanide, followed by the above-mentioned steps as shown in FIGS. 12F-12G.

Thereby, each of the bumps 156 can be formed of one of the polymer bumps 144a on the center region 32a of one of the pads 32, the adhesion/barrier layer 38 on the peripheral regions 32b of said one of the pads 32 and on said one of the polymer bumps 144a, a copper layer (including the seed layer 40 and the electroplated copper layer 146), having a thickness of between 0.5 and 25 micrometers, and preferably of between 5 and 10 micrometers, on the adhesion/barrier layer 38 and the gold layer 150 on the nickel layer 148.

Figure 13B:
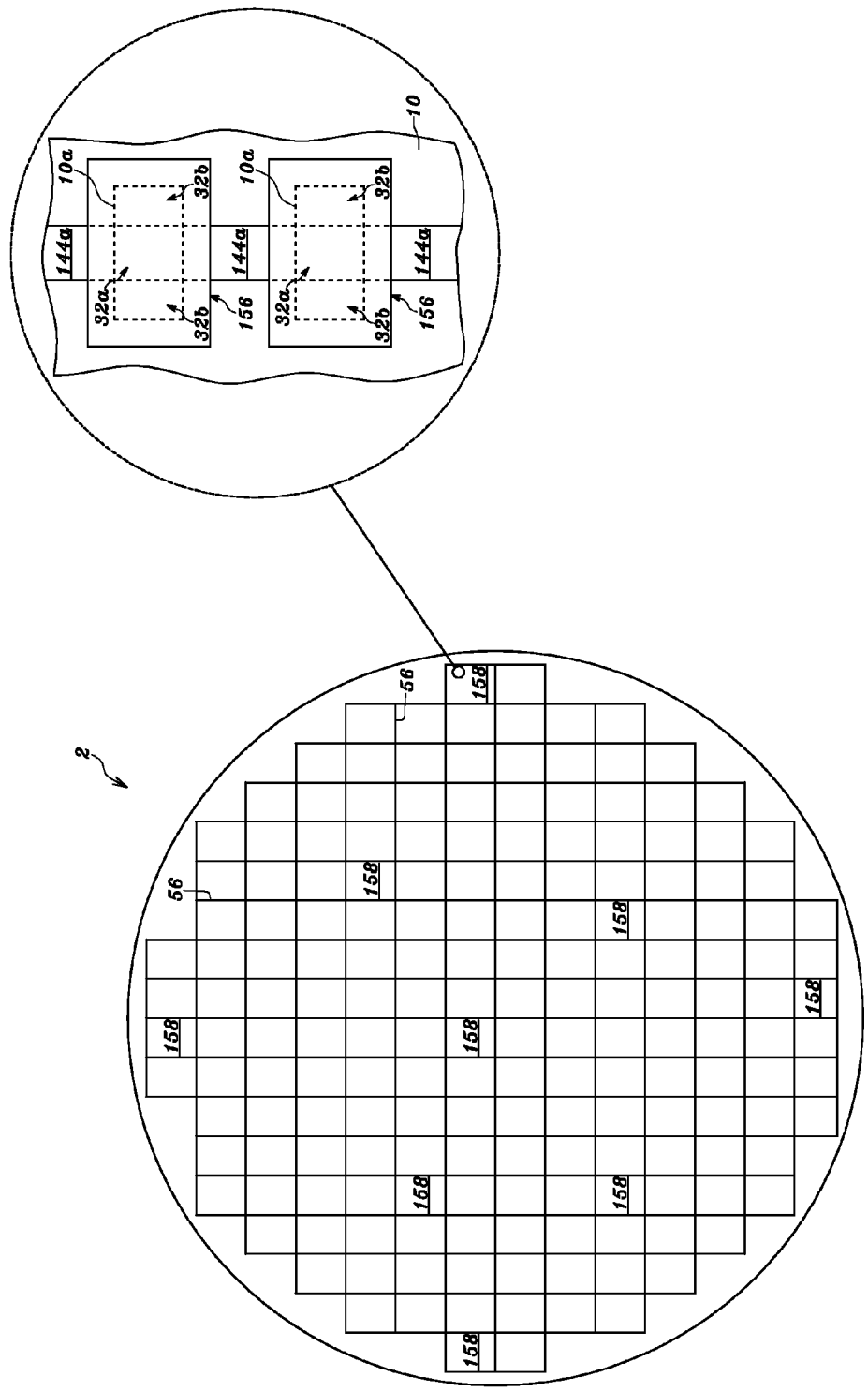
FIG. 13B is a top view showing a semiconductor wafer with multiple bumps.

After the bumps 156 are formed, the semiconductor wafer 2 can be cut into multiple chips 158. The detail can be referred as to FIG. 13B. Referring to FIG. 13B, the semiconductor wafer 2 includes multiple semiconductor chips 158 with scribe lines 56 between neighboring two of the semiconductor chips 158. The bumps 156 are on the pads 32, of each semiconductor chips 158, exposed by the openings 10a. In a wafer dicing process, the semiconductor wafer 2 can be cut along the scribe lines 56 to separate the semiconductor chips 158.

TCP (Tape Carrier Package)—Gold to Tin Connection

Figure 13C:
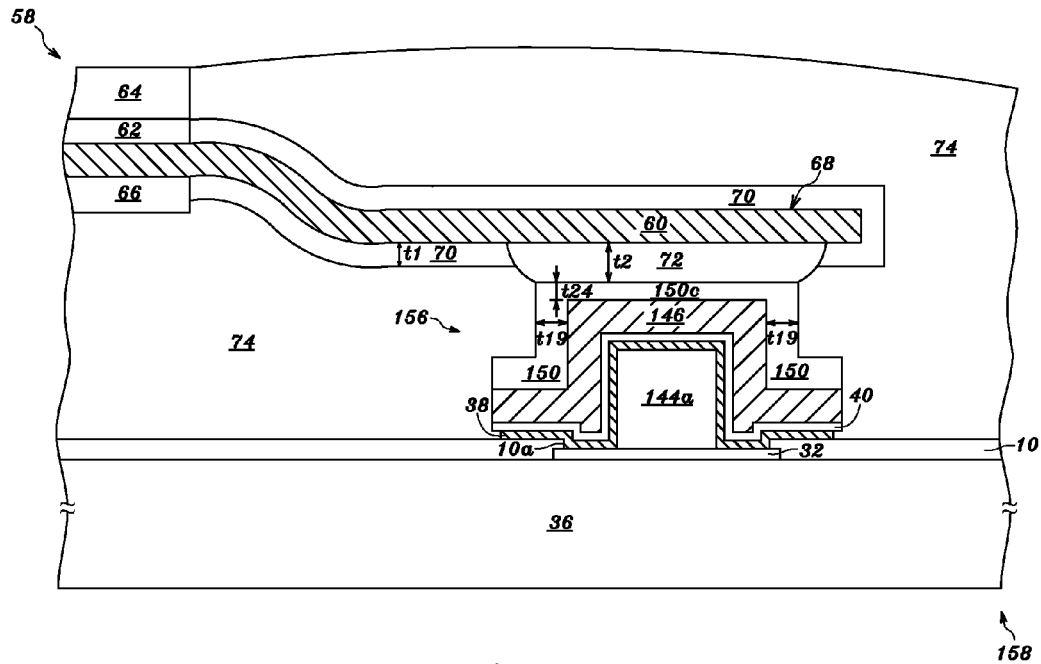

Referring to FIG. 13C, the flexible circuit film 58 as mentioned in FIG. 2G can be bonded with the bumps 156 (only one of them is shown). The specification of the flexible circuit film 58 shown in FIG. 13C can be referred to as the specification of the flexible circuit film 58 illustrated in FIG. 2G When the flexible circuit film 58 is bonded with the bumps 156, the tin-containing layer 70 on a bottom surface of the inner leads 68 (only one of them is shown) can be thermally pressed on a top surface of the gold layer 150 of the bumps 156 at a temperature of between 490 and 540° C., and preferably of between 500 and 520° C., for a time of between 1 and 10 seconds, and preferably of between 3 and 6 seconds. Thereby, a tin-alloy layer 72 containing gold can be formed between the remaining gold layer 150c of the bumps 156 and the copper traces 60 of the flexible circuit film 58, wherein the remaining gold layer 150c has a thickness t24 of between 0.2 and 6 micrometers, and preferably of between 1.5 and 4 micrometers. The tin-alloy layer 72 has a thickness t2 of between 0.5 and 10 micrometers, of between 1 and 5 micrometers or of between 1.5 and 3 micrometers. When the tin-containing layer 70 before bonded with the gold layer 150 is pure tin, the tin-alloy layer 72 is tin-gold alloy having a thickness t2 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 70 before bonded with the gold layer 150 is tin-silver alloy, the tin-alloy layer 72 is tin-silver-gold alloy having a thickness t2 of between 0.5 and 10 micrometers, of between 1 and 5 micrometers or of between 1.5 and 3 micrometers. When the tin-containing layer 70 before bonded with the gold layer 150 is tin-silver-copper alloy, the tin-alloy layer 72 is tin-silver-gold-copper alloy having a thickness t2 of between 0.5 and 10 micrometers, of between 1 and 5 micrometers or of between 1.5 and 3 micrometers.

After the bumps 156 are connected to the tin-containing layer 70 on the bottom surface of the inner leads 68 using a thermal pressing process, a polymer material 74, such as epoxy or polyimide, can be formed between the semiconductor chip 158 and the tin-containing layer 70 on the bottom surface of the inner leads 68, and enclosing the bumps 156. Next, the polymer material 74 is cured at a temperature of between 150 and 250° C.

In the FIG. 13C, the copper traces 60 can be replaced by multiple gold traces having a thickness of between 3 and 30 µm, and preferably of between 5 and 20 µm. Alternatively, the copper traces 60 can be replaced by multiple silver traces having a thickness of between 3 and 30 µm, and preferably of between 5 and 20 µm.

TCP (Tape Carrier Package)—Gold to Gold Connection

Figure 13D:
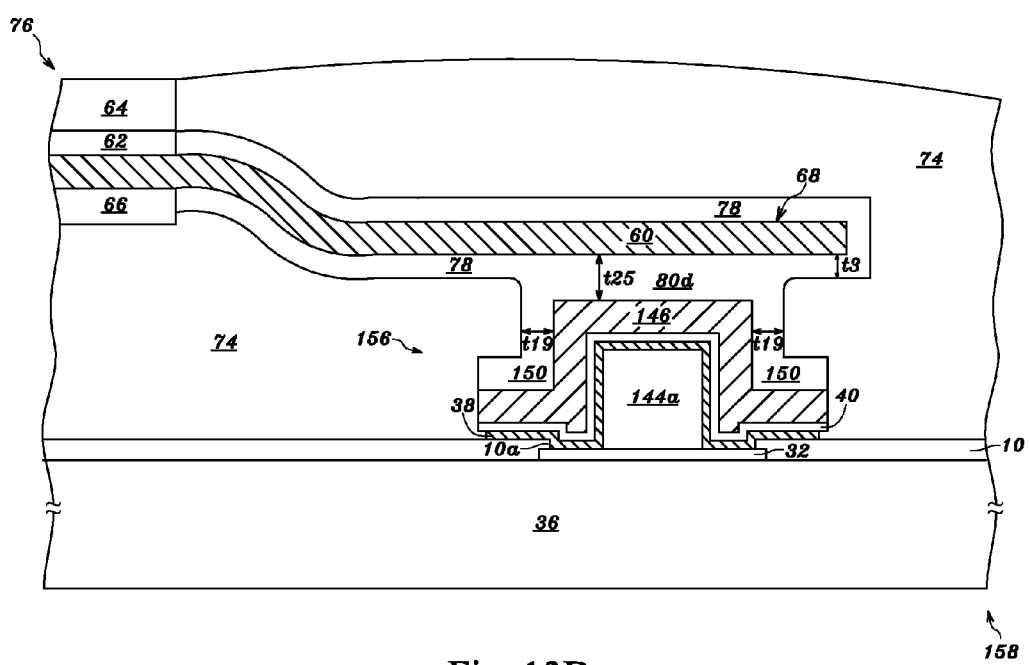

Referring to FIG. 13D, the flexible circuit film 76 as mentioned in FIG. 2I can be bonded with the bumps 156 (only one of them is shown). The specification of the flexible circuit film 76 shown in FIG. 13D can be referred to as the specification of the flexible circuit film 76 illustrated in FIG. 2I. When the flexible circuit film 76 is bonded with the bumps 156, the gold layer 78 on a bottom surface of the inner leads 68 (only one of them is shown) can be thermally pressed on a top surface of the gold layer 150 of the bumps 156 at a temperature of between 490 and 540° C., and preferably of between 500 and 520° C., for a time of between 1 and 10 seconds, and preferably of between 3 and 6 seconds. Thereby, a gold layer 80d formed by the joint of the gold layer 78 and the gold layer 150 can be between the copper layer 146 of the bumps 156 and the copper traces 60 of the flexible circuit film 76, wherein the gold layer 80d has a thickness t25 of between 1 and 10 micrometers, and preferably of between 3 and 6 micrometers.

After the bumps 156 are connected to the copper traces 60 using a thermal pressing process, a polymer material 74, such as epoxy or polyimide, can be formed between the semiconductor chip 158 and the gold layer 78 on the bottom surface of the inner leads 68, and enclosing the bumps 156. Next, the polymer material 74 is cured at a temperature of between 150 and 250° C.

COF (Chip on Film) Package—Gold to Tin Connection

Figure 13E:
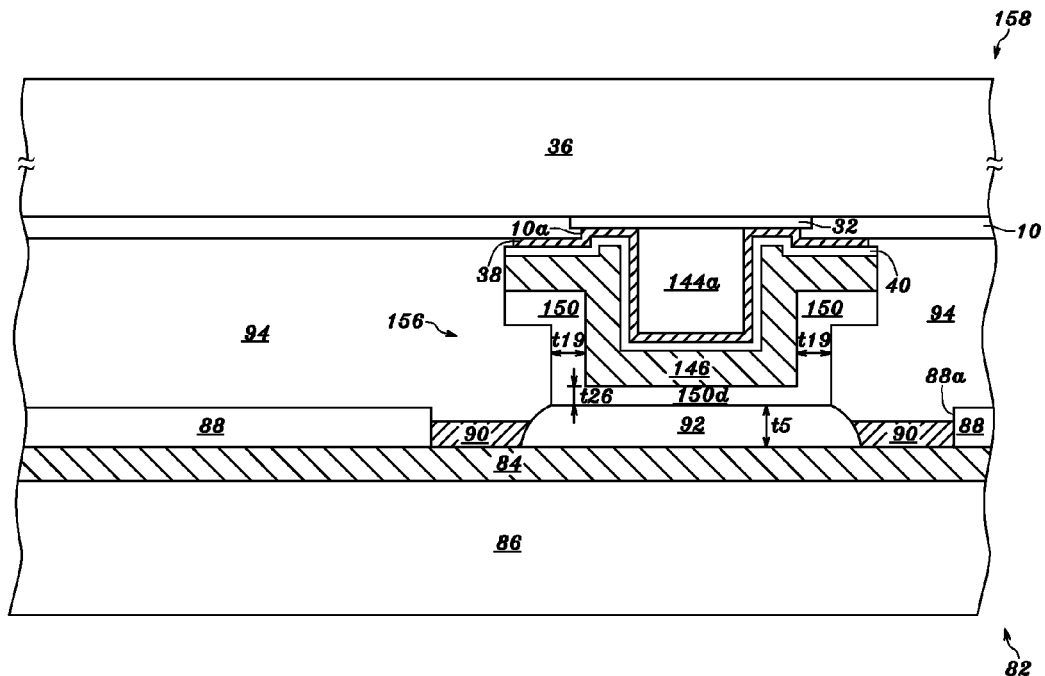

Referring to FIG. 13E, the flexible circuit film 82 as mentioned in FIG. 2K can be bonded with the bumps 156 (only one of them is shown). The specification of the flexible circuit film 82 shown in FIG. 13E can be referred to as the specification of the flexible circuit film 82 illustrated in FIG. 2K. When the flexible circuit film 82 is bonded with the bumps 156, a top surface of the gold layer 150 of the bumps 156 can be thermally pressed on the tin-containing layer 90 of the flexible circuit film 82 at a temperature of between 490 and 540° C., and preferably of between 500 and 520° C., for a time of between 1 and 10 seconds, and preferably of between 3 and 6 seconds. Alternatively, when the flexible circuit film 82 is bonded with the bumps 156, the tin-containing layer 90 of the flexible circuit film 82 can be thermally pressed on the top surface of the gold layer 150 of the bumps 156 at a temperature of between 490 and 540° C., and preferably of between 500 and 520° C., for a time of between 1 and 10 seconds, and preferably of between 3 and 6 seconds. Thereby, a tin-alloy layer 92 containing gold can be formed between the remaining gold layer 150$d$ of the bumps 156 and the copper traces 84 of the flexible circuit film 82, wherein the remaining gold layer 150$d$ has a thickness t26 of between 0.2 and 6 micrometers, and preferably of between 1.5 and 4 micrometers. The tin-alloy layer 92 has a thickness t5 of between 0.5 and 10 micrometers, of between 1 and 5 micrometers or of between 1.5 and 3 micrometers. When the tin-containing layer 90 before bonded with the gold layer 150 is pure tin, the tin-alloy layer 92 is tin-gold alloy having a thickness t5 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 90 before bonded with the gold layer 150 is tin-silver alloy, the tin-alloy layer 92 is tin-silver-gold alloy having a thickness t5 of between 0.5 and 10 micrometers, of between 1 and 5 micrometers or of between 1.5 and 3 micrometers. When the tin-containing layer 90 before bonded with the gold layer 150 is tin-silver-copper alloy, the tin-alloy layer 92 is tin-silver-gold-copper alloy having a thickness t5 of between 0.5 and 10 micrometers, of between 1 and 5 micrometers or of between 1.5 and 3 micrometers.

After the bumps 156 are connected to the copper traces 84 using a thermal pressing process, a polymer material 94, such as epoxy or polyimide, can be formed between the passivation layer 10 of the semiconductor chip 158 and the polymer layer 88 of the flexible circuit film 82, and enclosing the bumps 156. Next, the polymer material 94 is cured at a temperature of between 150 and 250° C.

In the FIG. 13E, the copper traces 84 can be replaced by multiple gold traces having a thickness of between 3 and 30 μm, and preferably of between 5 and 20 μm. Alternatively, the copper traces 84 can be replaced by multiple silver traces having a thickness of between 3 and 30 μm, and preferably of between 5 and 20 μm.

COF (Chip on Film) Package—Gold to Gold Connection

Figure 13F:
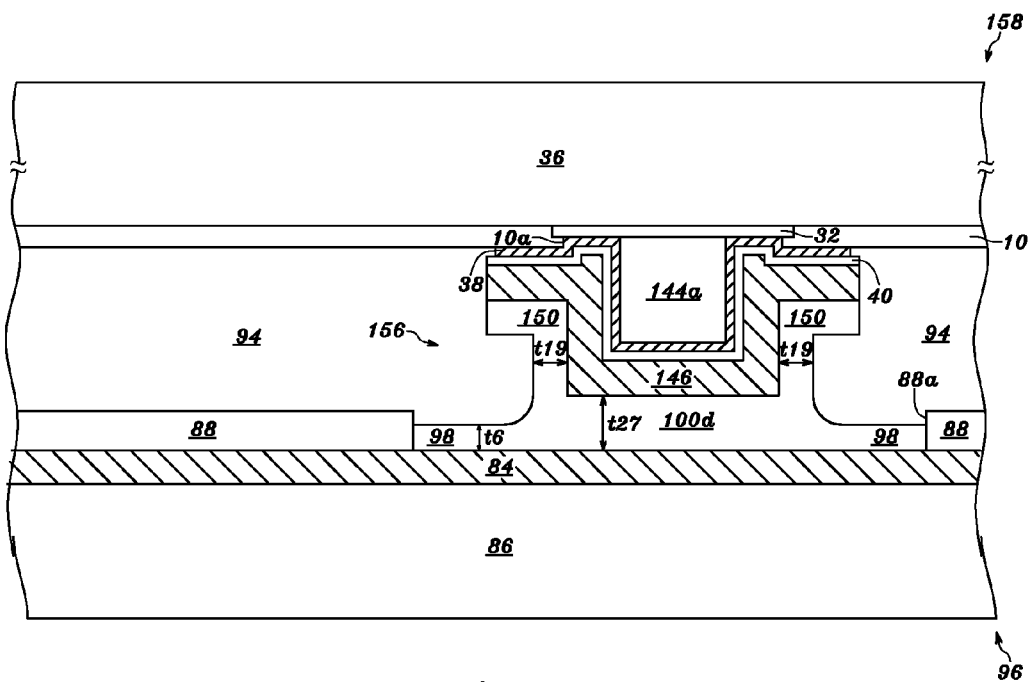

Referring to FIG. 13F, the flexible circuit film 96 as mentioned in FIG. 2M can be bonded with the bumps 156 (only one of them is shown). The specification of the flexible circuit film 96 shown in FIG. 13F can be referred to as the specification of the flexible circuit film 96 illustrated in FIG. 2M. When the flexible circuit film 96 is bonded with the bumps 156, a top surface of the gold layer 150 of the bumps 156 can be thermally pressed on the gold layer 98 of the flexible circuit film 96 at a temperature of between 490 and 540° C., and preferably of between 500 and 520° C., for a time of between 1 and 10 seconds, and preferably of between 3 and 6 seconds. Alternatively, when the flexible circuit film 96 is bonded with the bumps 156, the gold layer 98 of the flexible circuit film 96 can be thermally pressed on the top surface of the gold layer 150 of the bumps 156 at a temperature of between 490 and 540° C., and preferably of between 500 and 520° C., for a time of between 1 and 10 seconds, and preferably of between 3 and 6 seconds. Thereby, a gold layer 100$d$ formed by the joint of the gold layer 98 and the gold layer 150 can be between the copper layer 146 of the bumps 156 and the copper traces 84 of the flexible circuit film 96, wherein the gold layer 100$d$ has a thickness t27 of between 1 and 10 micrometers, and preferably of between 3 and 6 micrometers.

After the bumps 156 are connected to the copper traces 84 using a thermal pressing process, a polymer material 94, such as epoxy or polyimide, can be formed between the passivation layer 10 of the semiconductor chip 158 and the polymer layer 88 of the flexible circuit film 96, and enclosing the bumps 156. Next, the polymer material 94 is cured at a temperature of between 150 and 250° C.

COG (Chip on Glass) Assembly—ACF/ACP

Figure 13G:
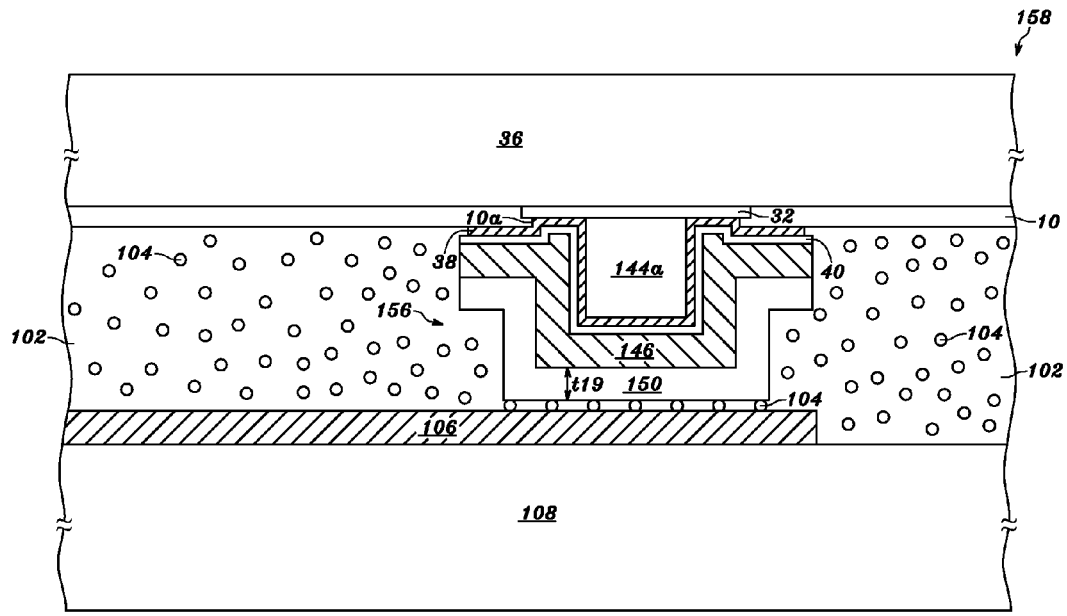

Referring to FIG. 13G, via a thermal pressing process, the gold layer 150 of the bumps 156 (only one of them is shown) is pressed into an anisotropic conductive film (ACF) or an anisotropic conductive paste (ACP) 102. Thus, metal particles 104 inside ACF or ACP 102 clusters between the gold layer 150 of the bumps 156 and multiple conductive traces 106 (only one of them is shown), such as indium tin oxide (ITO) or gold, on a glass substrate 108, leading the gold layer 150 of the bumps 156 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 150 of the bumps 156 may be pressed into ACF or ACP 102 preformed on a ceramic substrate or a printed circuit board to have metal particles 104 in the ACF or ACP 102 connecting the gold layer 150 of the bumps 156 to multiple pads on the ceramic substrate or on the organic substrate.

COG (Chip on Glass) Assembly—NCF

Figure 13H:
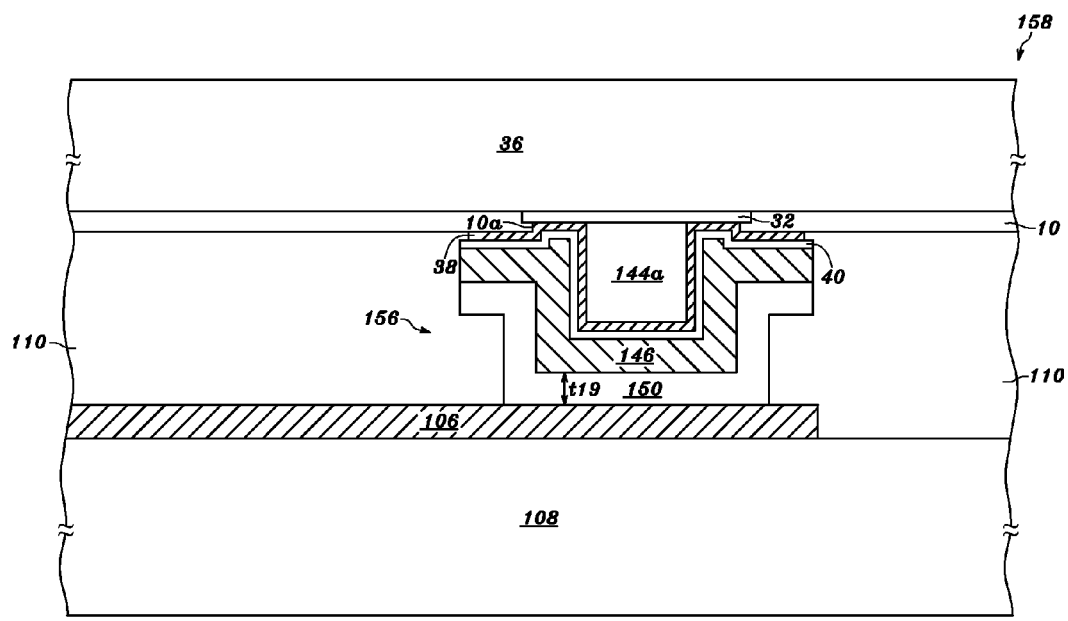

Referring to FIG. 13H, via a thermal pressing process, the gold layer 150 of the bumps 156 (only one of them is shown) is pressed into a non-conductive film (NCF) 110, and the gold layer 150 of the bumps 156 contacts with multiple conductive traces 106 (only one of them is shown), such as indium tin oxide (ITO) or gold, on a glass substrate 108, leading the gold layer 150 of the bumps 156 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 150 of the bumps 156 may be pressed into NCF 110 preformed on a ceramic substrate or a printed circuit board to have the gold layer 150 of the bumps 156 contacting with multiple pads on the ceramic substrate or on the organic substrate.

Embodiment 13

Figure 14A:
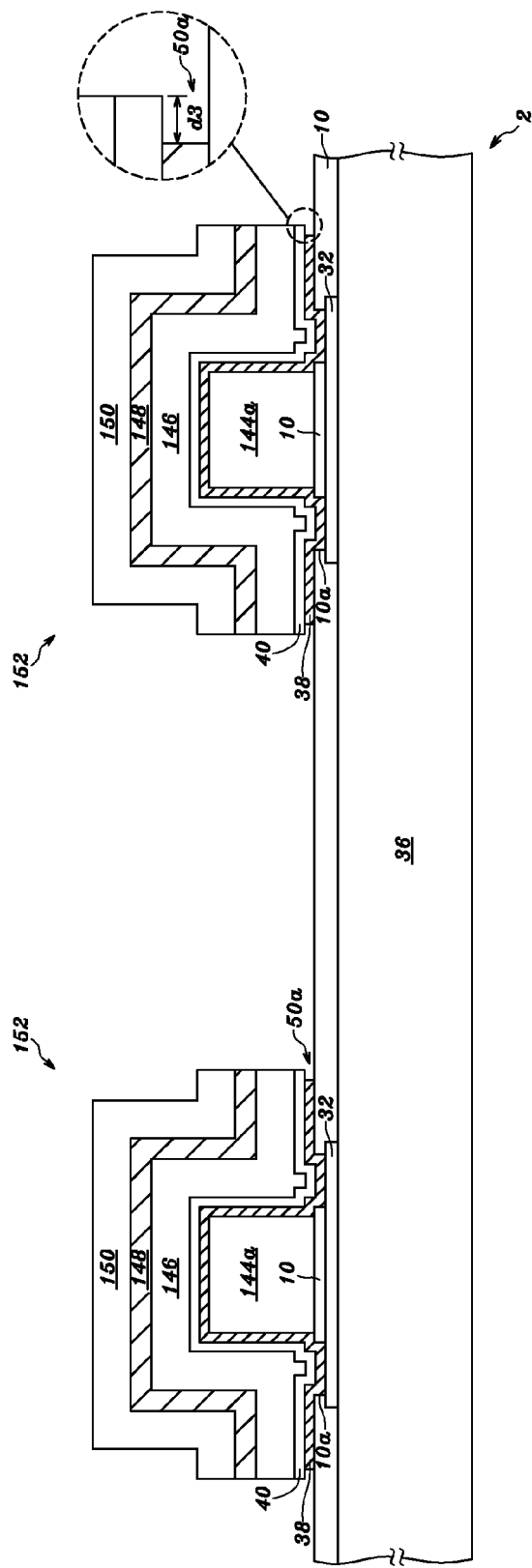
FIG. 14A and FIGS. 14C through 14H are cross-sectional views showing a process for fabricating multiple bumps on a wafer and packaging a chip singulated from the wafer according to one embodiment of the present invention.

Referring to FIG. 14A, multiple bumps 152 can be formed by multiple polymer bumps 144$a$ and multiple metal layers 38, 40, 146, 148 and 150. The polymer bumps 144$a$ can be formed with a bar shape extending on the passivation layer 10 in a direction parallel with a scribeline. In this embodiment, two of the openings 10$a$ at different sides of one of the polymer bumps 144$a$ expose one of the pads 32, such as copper pads or aluminum pads, exposed by the openings 10$a$. Alternatively, two of the openings 10$a$ at different sides of one of the polymer bumps 144$a$ expose separate pads that can be connected to each other using an interconnecting trace under the passivation layer 10 or can be disconnected from each other under the passivation layer 10. The metal layer 38 can be formed on the polymer bumps 144 and on the pads 32 each exposed by two of the openings 10$a$. The process for forming the bumps 152 on the pads 32 can be performed by forming the polymer bumps 144$a$ with a bar shape extending on the passivation layer 10 in a direction parallel with a scribeline and between the openings 10a aligned in two lines parallel with the scribe line, followed by forming the adhesion/barrier layer 38 having a thickness of between 0.02 and 0.5 µm, and preferably of between 0.25 and 0.35 µm, on the polymer bumps 144a, on the passivation layer 10 and on the pads 32 exposed by the openings 10a, followed by forming the seed layer 40, made of copper, having a thickness of between 0.03 and 1 µm, and preferably of between 0.05 and 0.2 µm, on the adhesion/barrier layer 38, followed by the above-mentioned steps as shown in FIGS. 12D-12G The process of forming the polymer bumps 144a, as shown in FIG. 14A, can be referred to as the process of forming the polymer bumps 144a, as illustrated in FIGS. 12A-12B. The specification of the adhesion/barrier layer 38 and the seed layer 40 shown in FIG. 14A can be referred to as the specification of the adhesion/barrier layer 38 and the seed layer 40 illustrated in FIG. 2A. The process of forming the adhesion/barrier layer 38 and the seed layer 40, as shown in FIG. 14A, can be referred to as the process of forming the adhesion/barrier layer 38 and the seed layer 40, as illustrated in FIG. 2A.

Thereby, each of the bumps 152 can be formed of one of the polymer bumps 144a on the passivation layer 10 and between the openings 10a formed in two lines, the adhesion/barrier layer 38 on the polymer bump 144a and on a single large pad 32 or multiple separate pads 32 exposed by the openings 10a, a copper layer (including the seed layer 40 and the electroplated copper layer 146), having a thickness of between 0.5 and 25 micrometers, and preferably of between 5 and 10 micrometers, on the adhesion/barrier layer 38, the nickel layer 148 on the copper layer and the gold layer 150 on the nickel layer 148. Alternatively, the gold layer 150 of the bumps 152 can be electroless plated with a thickness of between 500 and 5,000 angstroms for a COG structure or with a thickness of between 0.5 and 6 micrometers for a TCP or COF structure. Alternatively, the gold layer 150 can be replaced by a silver layer, having a thickness of between 1 and 10 µm, and preferably of between 3 and 6 µm, electroplated on the copper layer (including the seed layer 40 and the electroplated copper layer 146). Alternatively, the gold layer 150 can be replaced by a silver layer, having a thickness of between 500 and 5,000 angstroms or between 0.5 and 6 µm, electroless plated on the copper layer (including the seed layer 40 and the electroplated copper layer 146).

Figure 14B:
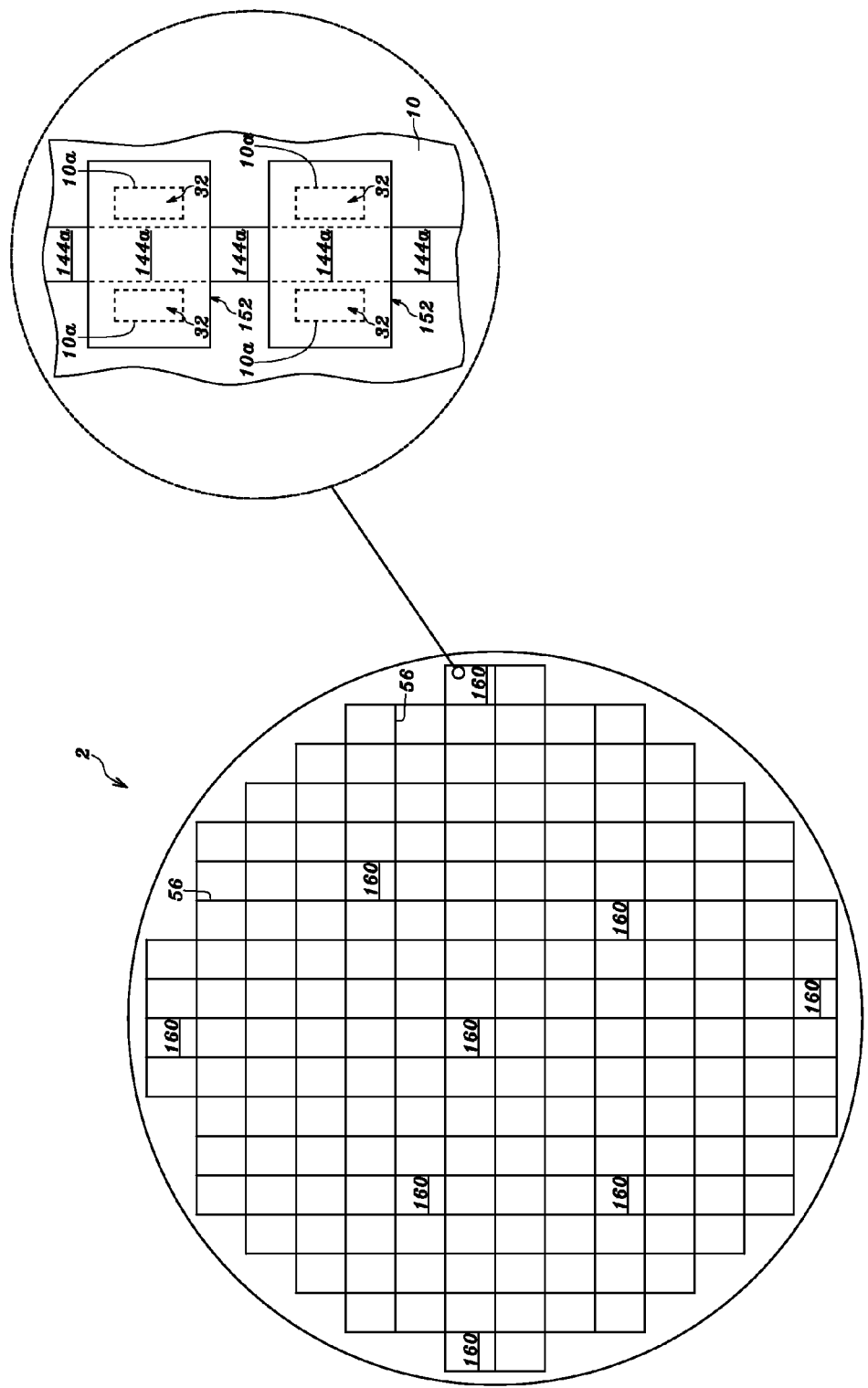
FIG. 14B is a top view showing a semiconductor wafer with multiple bumps.

After the bumps 152 are formed, the semiconductor wafer 2 can be cut into multiple chips 160. The detail can be referred as to FIG. 14B. Referring to FIG. 14B, the semiconductor wafer 2 includes multiple semiconductor chips 160 with scribe lines 56 between neighboring two of the semiconductor chips 160. The bumps 152 are on the pads 32, of each semiconductor chips 160, exposed by the openings 10a. In a wafer dicing process, the semiconductor wafer 2 can be cut along the scribe lines 56 to separate the semiconductor chips 160.

TCP (Tape Carrier Package)—Gold to Tin Connection

Figure 14C:
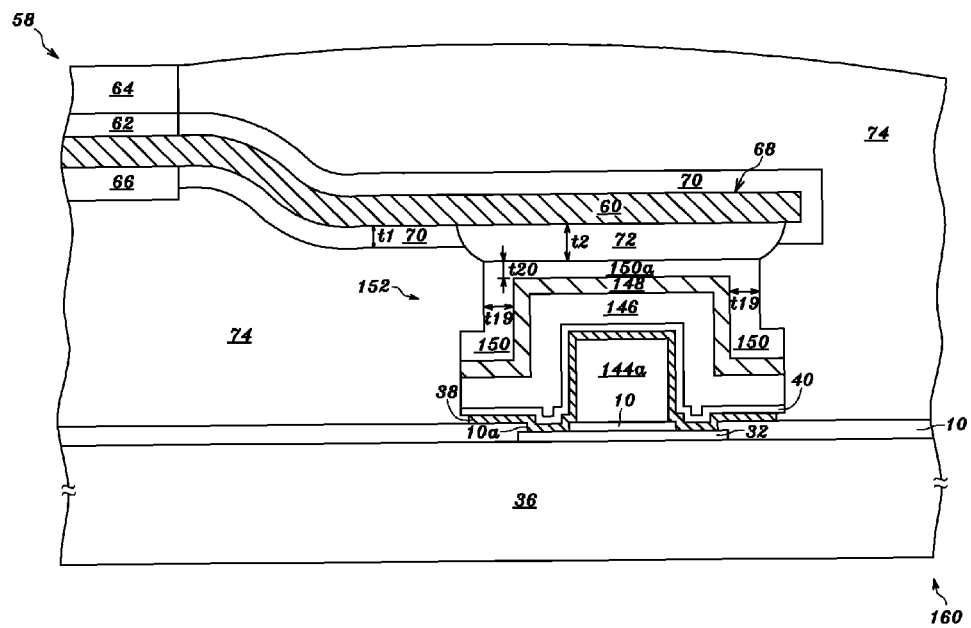

Referring to FIG. 14C, the flexible circuit film 58 as mentioned in FIG. 2G can be bonded with the bumps 152 (only one of them is shown). The specification of the flexible circuit film 58 shown in FIG. 14C can be referred to as the specification of the flexible circuit film 58 illustrated in FIG. 2G When the flexible circuit film 58 is bonded with the bumps 152, the tin-containing layer 70 on a bottom surface of the inner leads 68 (only one of them is shown) can be thermally pressed on a top surface of the gold layer 150 of the bumps 152 at a temperature of between 490 and 540° C., and preferably of between 500 and 520° C., for a time of between 1 and 10 seconds, and preferably of between 3 and 6 seconds.

Thereby, a tin-alloy layer 72 containing gold can be formed between the remaining gold layer 150a of the bumps 152 and the copper traces 60 of the flexible circuit film 58, wherein the remaining gold layer 150a has a thickness t20 of between 0.2 and 6 micrometers, and preferably of between 1.5 and 4 micrometers. The tin-alloy layer 72 has a thickness t2 of between 0.5 and 10 micrometers, of between 1 and 5 micrometers or of between 1.5 and 3 micrometers. When the tin-containing layer 70 before bonded with the gold layer 150 is pure tin, the tin-alloy layer 72 is tin-gold alloy having a thickness t2 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 70 before bonded with the gold layer 150 is tin-silver alloy, the tin-alloy layer 72 is tin-silver-gold alloy having a thickness t2 of between 0.5 and 10 micrometers, of between 1 and 5 micrometers or of between 1.5 and 3 micrometers. When the tin-containing layer 70 before bonded with the gold layer 150 is tin-silver-copper alloy, the tin-alloy layer 72 is tin-silver-gold-copper alloy having a thickness t2 of between 0.5 and 10 micrometers, of between 1 and 5 micrometers or of between 1.5 and 3 micrometers.

After the bumps 152 are connected to the tin-containing layer 70 on the bottom surface of the inner leads 68 using a thermal pressing process, a polymer material 74, such as epoxy or polyimide, can be formed between the semiconductor chip 160 and the tin-containing layer 70 on the bottom surface of the inner leads 68, and enclosing the bumps 152. Next, the polymer material 74 is cured at a temperature of between 150 and 250° C.

In the FIG. 14C, the copper traces 60 can be replaced by multiple gold traces having a thickness of between 3 and 30 µm, and preferably of between 5 and 20 µm. Alternatively, the copper traces 60 can be replaced by multiple silver traces having a thickness of between 3 and 30 µm, and preferably of between 5 and 20 µm.

TCP (Tape Carrier Package)—Gold to Gold Connection

Figure 14D:
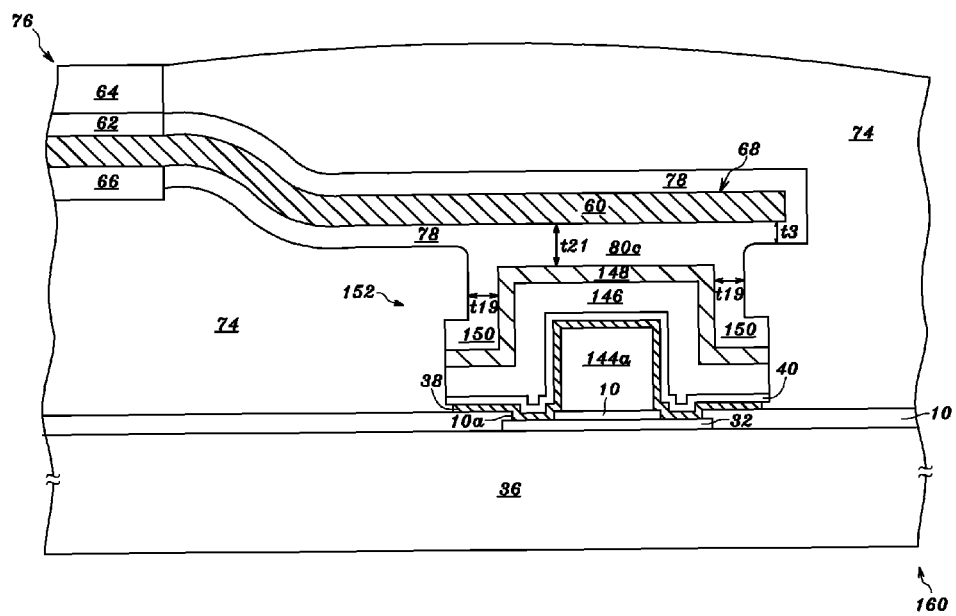

Referring to FIG. 14D, the flexible circuit film 76 as mentioned in FIG. 2I can be bonded with the bumps 152 (only one of them is shown). The specification of the flexible circuit film 76 shown in FIG. 14D can be referred to as the specification of the flexible circuit film 76 illustrated in FIG. 2I. When the flexible circuit film 76 is bonded with the bumps 152, the gold layer 78 on a bottom surface of the inner leads 68 (only one of them is shown) can be thermally pressed on a top surface of the gold layer 150 of the bumps 152 at a temperature of between 490 and 540° C., and preferably of between 500 and 520° C., for a time of between 1 and 10 seconds, and preferably of between 3 and 6 seconds. Thereby, a gold layer 80c formed by the joint of the gold layer 78 and the gold layer 150 can be between the nickel layer 148 of the bumps 152 and the copper traces 60 of the flexible circuit film 76, wherein the gold layer 80c has a thickness t21 of between 1 and 10 micrometers, and preferably of between 3 and 6 micrometers.

After the bumps 152 are connected to the copper traces 60 using a thermal pressing process, a polymer material 74, such as epoxy or polyimide, can be formed between the semiconductor chip 160 and the gold layer 78 on the bottom surface of the inner leads 68, and enclosing the bumps 152. Next, the polymer material 74 is cured at a temperature of between 150 and 250° C.

COF (Chip on Film) Package—Gold to Tin Connection

Figure 14E:
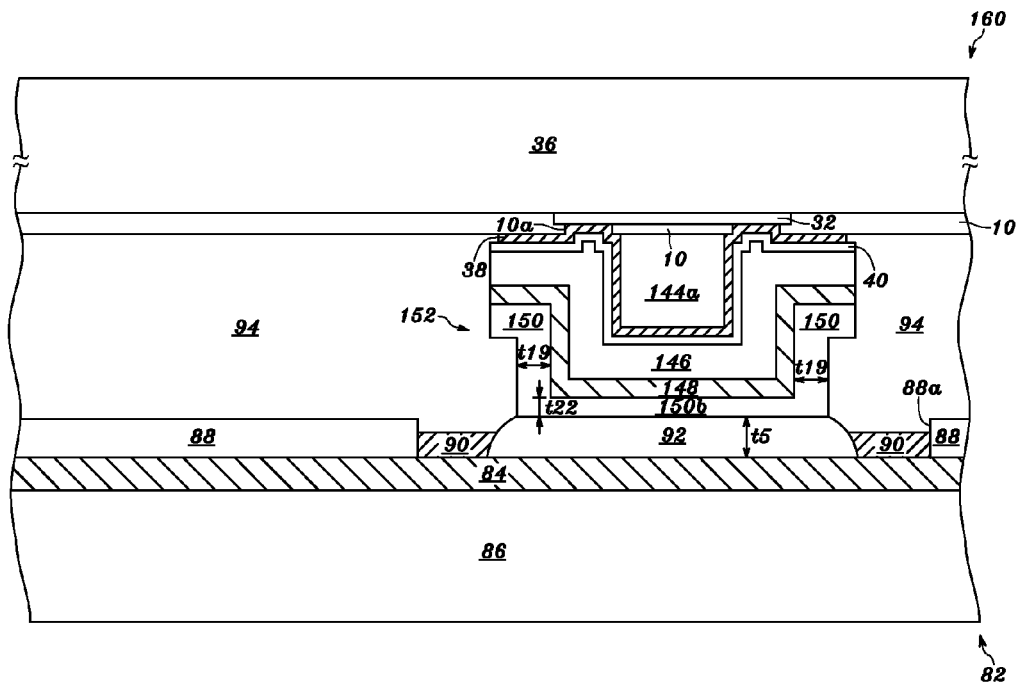

Referring to FIG. 14E, the flexible circuit film 82 as mentioned in FIG. 2K can be bonded with the bumps 152 (only one of them is shown). The specification of the flexible circuit film 82 shown in FIG. 14E can be referred to as the specification of the flexible circuit film 82 illustrated in FIG. 2K. When the flexible circuit film 82 is bonded with the bumps 152, a top surface of the gold layer 150 of the bumps 152 can be thermally pressed on the tin-containing layer 90 of the flexible circuit film 82 at a temperature of between 490 and 540° C., and preferably of between 500 and 520° C., for a time of between 1 and 10 seconds, and preferably of between 3 and 6 seconds. Alternatively, when the flexible circuit film 82 is bonded with the bumps 152, the tin-containing layer 90 of the flexible circuit film 82 can be thermally pressed on a top surface of the gold layer 150 of the bumps 152 at a temperature of between 490 and 540° C., and preferably of between 500 and 520° C., for a time of between 1 and 10 seconds, and preferably of between 3 and 6 seconds. Thereby, a tin-alloy layer 92 containing gold can be formed between the remaining gold layer 150b of the bumps 152 and the copper traces 84 of the flexible circuit film 82, wherein the remaining gold layer 150b has a thickness t22 of between 0.2 and 6 micrometers, and preferably of between 1.5 and 4 micrometers. The tin-alloy layer 92 has a thickness t5 of between 0.5 and 10 micrometers, of between 1 and 5 micrometers or of between 1.5 and 3 micrometers. When the tin-containing layer 90 before bonded with the gold layer 150 is pure tin, the tin-alloy layer 92 is tin-gold alloy having a thickness t5 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 90 before bonded with the gold layer 150 is tin-silver alloy, the tin-alloy layer 92 is tin-silver-gold alloy having a thickness t5 of between 0.5 and 10 micrometers, of between 1 and 5 micrometers or of between 1.5 and 3 micrometers. When the tin-containing layer 90 before bonded with the gold layer 150 is tin-silver-copper alloy, the tin-alloy layer 92 is tin-silver-gold-copper alloy having a thickness t5 of between 0.5 and 10 micrometers, of between 1 and 5 micrometers or of between 1.5 and 3 micrometers.

After the bumps 152 are connected to the copper traces 84 using a thermal pressing process, a polymer material 94, such as epoxy or polyimide, can be formed between the passivation layer 10 of the semiconductor chip 160 and the polymer layer 88 of the flexible circuit film 82, and enclosing the bumps 152. Next, the polymer material 94 is cured at a temperature of between 150 and 250° C.

In the FIG. 14E, the copper traces 84 can be replaced by multiple gold traces having a thickness of between 3 and 30 μm, and preferably of between 5 and 20 μm. Alternatively, the copper traces 84 can be replaced by multiple silver traces having a thickness of between 3 and 30 μm, and preferably of between 5 and 20 μm.

COF (Chip on Film) Package—Gold to Gold Connection

Figure 14F:
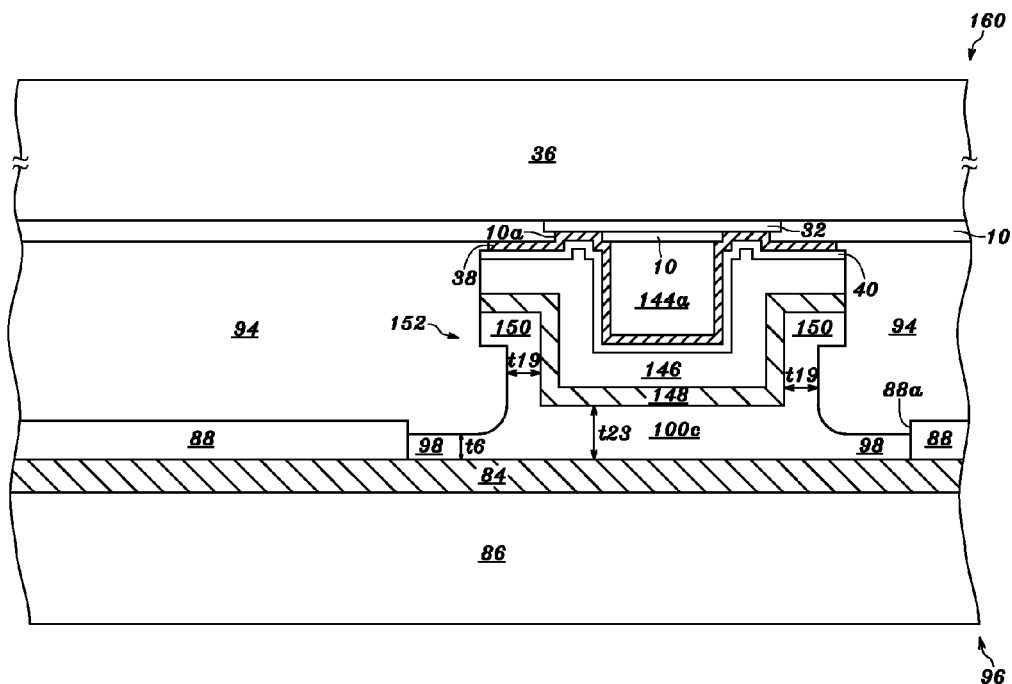

Referring to FIG. 14F, the flexible circuit film 96 as mentioned in FIG. 2M can be bonded with the bumps 152 (only one of them is shown). The specification of the flexible circuit film 96 shown in FIG. 14F can be referred to as the specification of the flexible circuit film 96 illustrated in FIG. 2M. When the flexible circuit film 96 is bonded with the bumps 152, a top surface of the gold layer 150 of the bumps 152 can be thermally pressed on the gold layer 98 of the flexible circuit film 96 at a temperature of between 490 and 540° C., and preferably of between 500 and 520° C., for a time of between 1 and 10 seconds, and preferably of between 3 and 6 seconds. Alternatively, when the flexible circuit film 96 is bonded with the bumps 152, the gold layer 98 of the flexible circuit film 96 can be thermally pressed on a top surface of the gold layer 150 of the bumps 152 at a temperature of between 490 and 540° C., and preferably of between 500 and 520° C., for a time of between 1 and 10 seconds, and preferably of between 3 and 6 seconds. Thereby, a gold layer 100c formed by the joint of the gold layer 98 and the gold layer 150 can be between the nickel layer 148 of the bumps 152 and the copper traces 84 of the flexible circuit film 96, wherein the gold layer 100c has a thickness t23 of between 1 and 10 micrometers, and preferably of between 3 and 6 micrometers.

After the bumps 152 are connected to the copper traces 84 using a thermal pressing process, a polymer material 94, such as epoxy or polyimide, can be formed between the passivation layer 10 of the semiconductor chip 160 and the polymer layer 88 of the flexible circuit film 96, and enclosing the bumps 152. Next, the polymer material 94 is cured at a temperature of between 150 and 250° C.

COG (Chip on Glass) Assembly—ACF/ACP

Figure 14G:
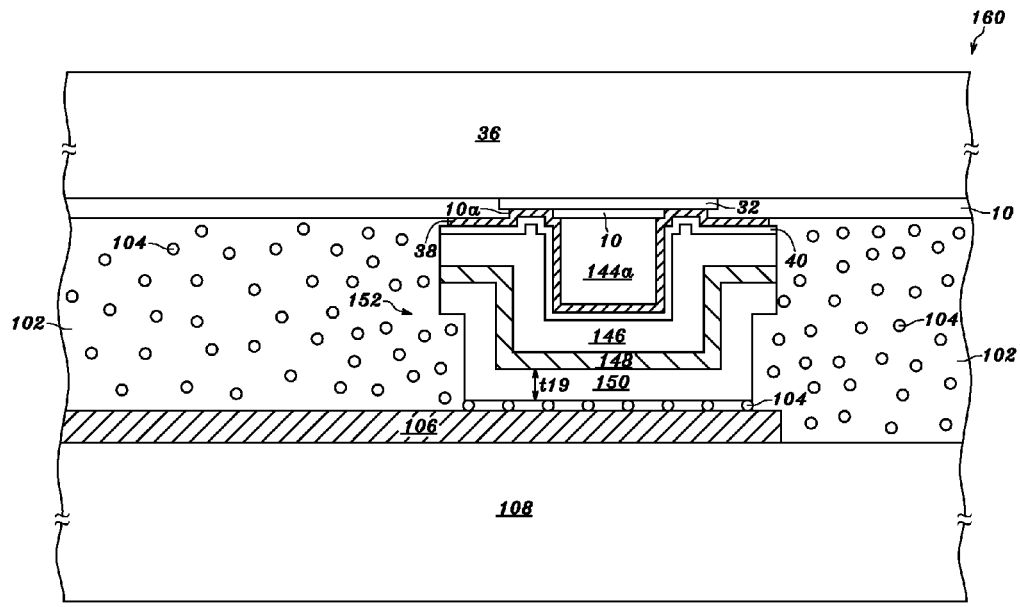

Referring to FIG. 14G, via a thermal pressing process, the gold layer 150 of the bumps 152 (only one of them is shown) is pressed into an anisotropic conductive film (ACF) or an anisotropic conductive paste (ACP) 102. Thus, metal particles 104 inside ACF or ACP 102 clusters between the gold layer 150 of the bumps 152 and multiple conductive traces 106 (only one of them is shown), such as indium tin oxide (ITO) or gold, on a glass substrate 108, leading the gold layer 150 of the bumps 152 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 150 of the bumps 152 may be pressed into ACF or ACP 102 preformed on a ceramic substrate or a printed circuit board to have metal particles 104 in the ACF or ACP 102 connecting the gold layer 150 of the bumps 152 to multiple pads on the ceramic substrate or on the organic substrate.

COG (Chip on Glass) Assembly—NCF

Figure 14H:
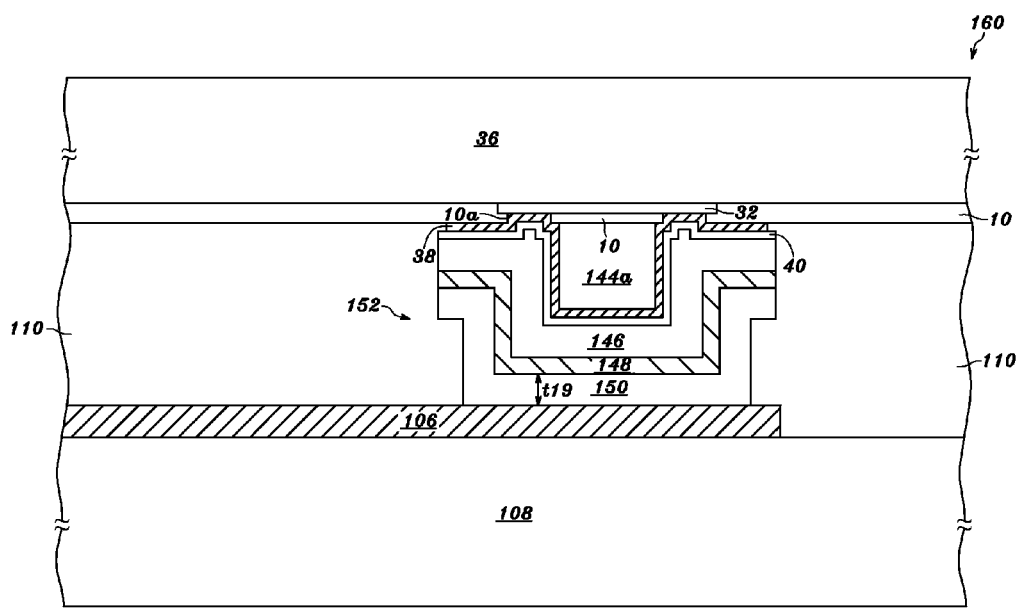

Referring to FIG. 14H, via a thermal pressing process, the gold layer 150 of the bumps 152 (only one of them is shown) is pressed into a non-conductive film (NCF) 110, and the gold layer 150 of the bumps 152 contacts with multiple conductive traces 106 (only one of them is shown), such as indium tin oxide (ITO) or gold, on a glass substrate 108, leading the gold layer 150 of the bumps 152 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 150 of the bumps 152 may be pressed into NCF 110 preformed on a ceramic substrate or a printed circuit board to have the gold layer 150 of the bumps 152 contacting with multiple pads on the ceramic substrate or on the organic substrate.

Embodiment 14

Figure 15A:
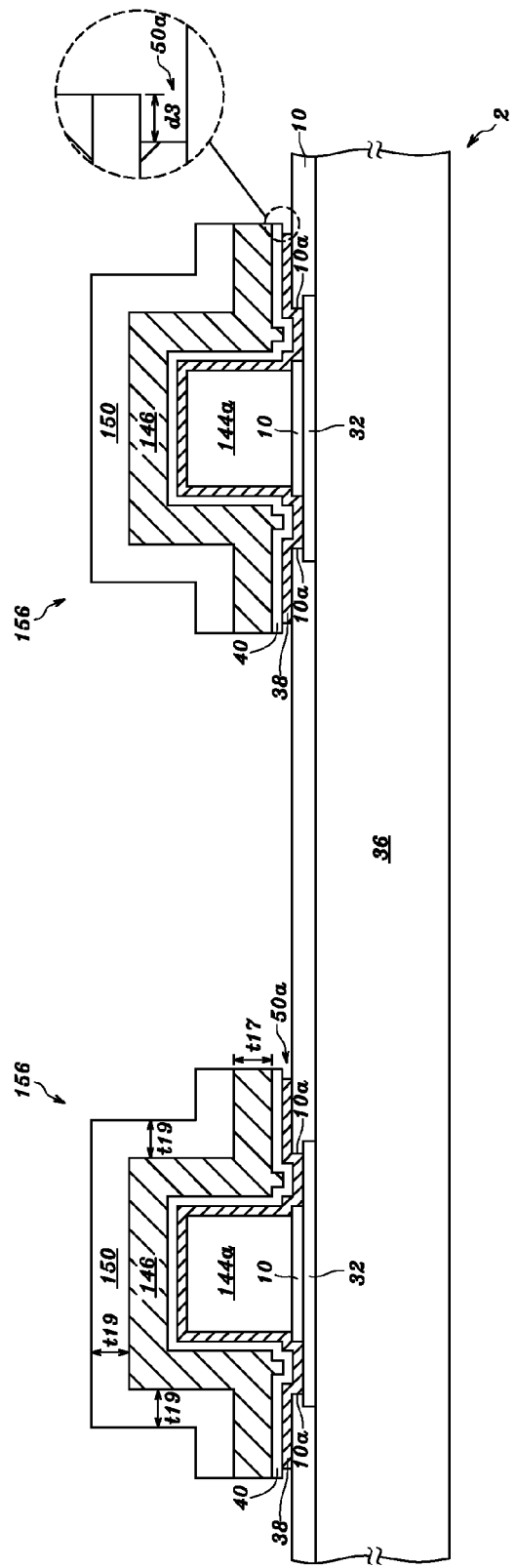
FIG. 15A and FIGS. 15C through 15H are cross-sectional views showing a process for fabricating multiple bumps on a wafer and packaging a chip singulated from the wafer according to one embodiment of the present invention.

Referring to FIG. 15A, multiple bumps 156 can be formed by multiple polymer bumps 144a and multiple metal layers 38, 40, 146 and 150. The polymer bumps 144a can be formed with a bar shape extending on the passivation layer 10 in a direction parallel with a scribeline. In this embodiment, two of the openings 10a at different sides of one of the polymer bumps 144a expose one of the pads 32, such as copper pads or aluminum pads, exposed by the openings 10a. Alternatively, two of the openings 10a at different sides of one of the polymer bumps 144a expose separate pads that can be connected to each other using an interconnecting trace under the passivation layer 10 or can be disconnected from each other under the passivation layer 10. The metal layer 38 can be formed on the polymer bumps 144 and on the pads 32 each exposed by two of the openings 10a. The process for forming the bumps 156 on the pads 32 can be performed by forming the polymer bumps 144a with a bar shape extending on the passivation layer 10 in a direction parallel with a scribeline and between the openings 10a aligned in two lines parallel with the scribe line, followed by forming the adhesion/barrier layer 38 having a thickness of between 0.02 and 0.5 μm, and preferably of between 0.25 and 0.35 μm, on the polymer bumps 144a, on the passivation layer 10 and on the pads 32 exposed by the openings 10a, followed by forming the seed layer 40, made of copper, having a thickness of between 0.03 and 1 μm, and preferably of between 0.05 and 0.2 μm, on the adhesion/barrier layer 38, followed by the above-mentioned step as shown in FIG. 12D, followed by electroplating the copper layer 146 having a thickness t17 of between 0.5 and 25 micrometers, and preferably of between 5 and 10 micrometers, is electroplated on the seed layer 40 exposed by the openings 42a, and then electroplating the gold layer 150 having a thickness t19 of between 0.5 and 10 micrometers, and preferably of between 3 and 6 micrometers, can be electroplated on the copper layer 146 in the openings 42a with a non-cyanide electroplating solution, such as a solution containing gold sodium sulfite ($Na_3Au(SO_3)_2$) or a solution containing gold ammonium sulfite ($(NH_4)_3[Au(SO_3)_2]$), or with an electroplating solution containing cyanide, followed by the above-mentioned steps as shown in FIGS. 12F-12G The process of forming the polymer bumps 144a, as shown in FIG. 15A, can be referred to as the process of forming the polymer bumps 144a, as illustrated in FIGS. 12A-12B. The specification of the adhesion/barrier layer 38 and the seed layer 40 shown in FIG. 15A can be referred to as the specification of the adhesion/barrier layer 38 and the seed layer 40 illustrated in FIG. 2A. The process of forming the adhesion/barrier layer 38 and the seed layer 40, as shown in FIG. 15A, can be referred to as the process of forming the adhesion/barrier layer 38 and the seed layer 40, as illustrated in FIG. 2A.

Thereby, each of the bumps 156 can be formed of one of the polymer bumps 144a on the passivation layer 10 and between the openings 10a formed in two lines, the adhesion/barrier layer 38 on the polymer bump 144a and on a single large pad 32 or multiple separate pads 32 exposed by the openings 10a, a copper layer (including the seed layer 40 and the electroplated copper layer 146), having a thickness of between 0.5 and 25 micrometers, and preferably of between 5 and 10 micrometers, on the adhesion/barrier layer 38 and the gold layer 150 on the copper layer. Alternatively, the gold layer 150 of the bumps 156 can be electroless plated with a thickness of between 500 and 5,000 angstroms for a COG structure or with a thickness of between 0.5 and 6 micrometers for a TCP or COF structure. Alternatively, the gold layer 150 can be replaced by a silver layer, having a thickness of between 1 and 10 μm, and preferably of between 3 and 6 μm, electroplated on the copper layer (including the seed layer 40 and the electroplated copper layer 146). Alternatively, the gold layer 150 can be replaced by a silver layer, having a thickness of between 500 and 5,000 angstroms or between 0.5 and 6 μm, electroless plated on the copper layer (including the seed layer 40 and the electroplated copper layer 146).

Figure 15B:
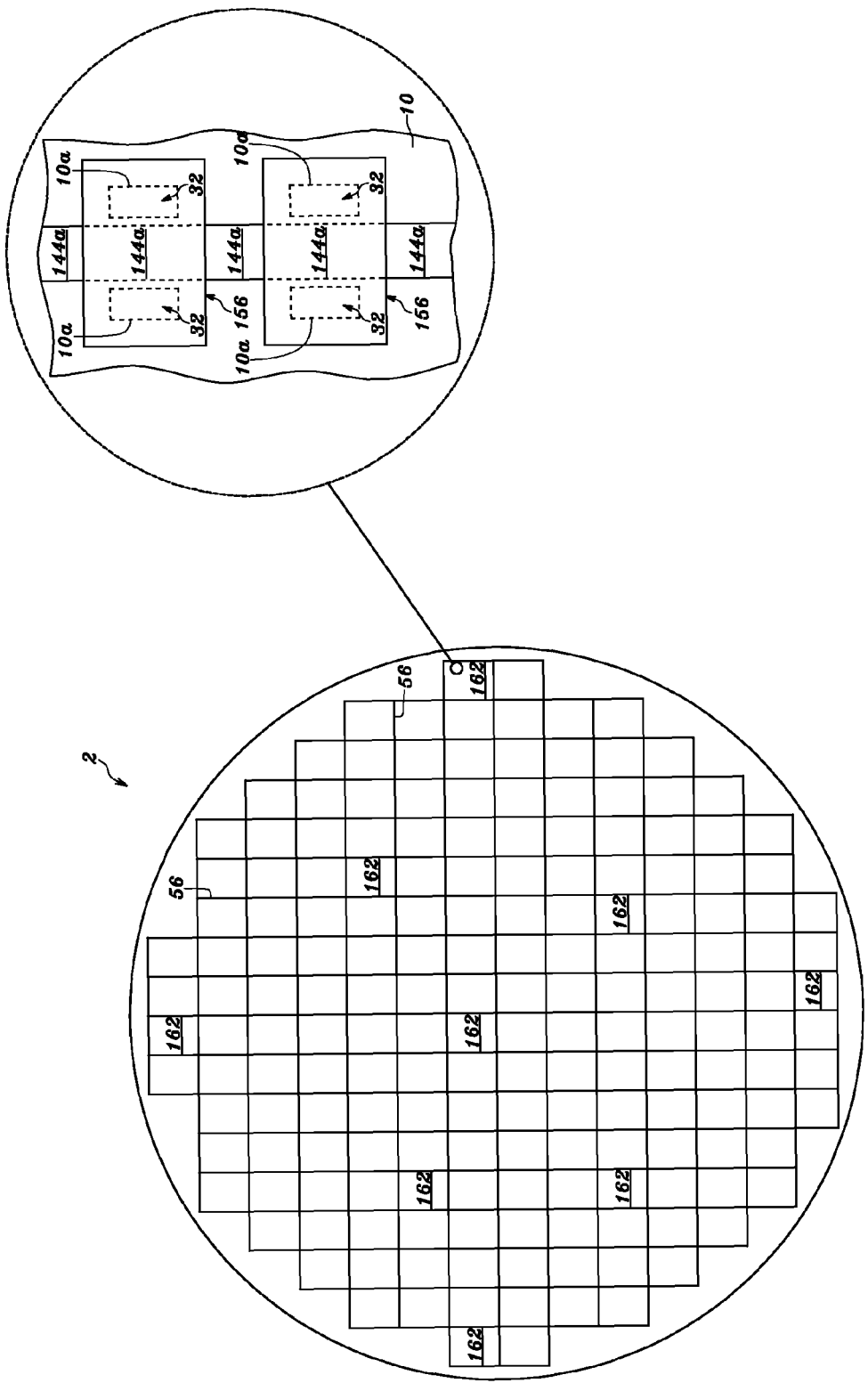
FIG. 15B is a top view showing a semiconductor wafer with multiple bumps.

After the bumps 156 are formed, the semiconductor wafer 2 can be cut into multiple chips 162. The detail can be referred as to FIG. 15B. Referring to FIG. 15B, the semiconductor wafer 2 includes multiple semiconductor chips 162 with scribe lines 56 between neighboring two of the semiconductor chips 162. The bumps 156 are on the pads 32, of each semiconductor chips 162, exposed by the openings 10a. In a wafer dicing process, the semiconductor wafer 2 can be cut along the scribe lines 56 to separate the semiconductor chips 162.

TCP (Tape Carrier Package)—Gold to Tin Connection

Figure 15C:
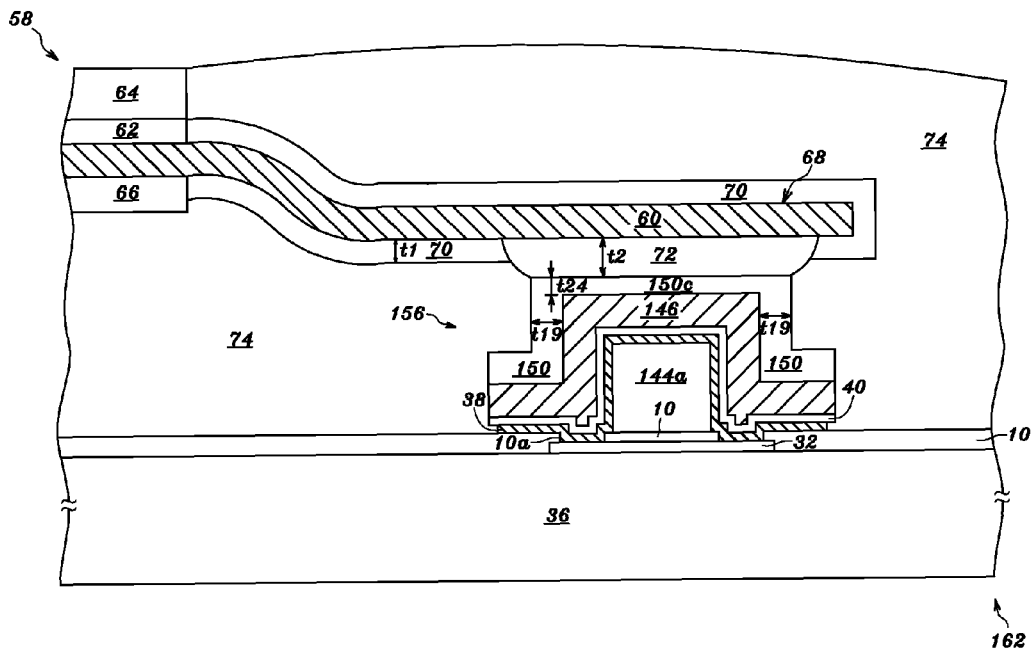

Referring to FIG. 15C, the flexible circuit film 58 as mentioned in FIG. 2G can be bonded with the bumps 156 (only one of them is shown). The specification of the flexible circuit film 58 shown in FIG. 15C can be referred to as the specification of the flexible circuit film 58 illustrated in FIG. 2G When the flexible circuit film 58 is bonded with the bumps 156, the tin-containing layer 70 on a bottom surface of the inner leads 68 (only one of them is shown) can be thermally pressed on a top surface of the gold layer 150 of the bumps 156 at a temperature of between 490 and 540° C., and preferably of between 500 and 520° C., for a time of between 1 and 10 seconds, and preferably of between 3 and 6 seconds. Thereby, a tin-alloy layer 72 containing gold can be formed between the remaining gold layer 150c of the bumps 156 and the copper traces 60 of the flexible circuit film 58, wherein the remaining gold layer 150c has a thickness t24 of between 0.2 and 6 micrometers, and preferably of between 1.5 and 4 micrometers. The tin-alloy layer 72 has a thickness t2 of between 0.5 and 10 micrometers, of between 1 and 5 micrometers or of between 1.5 and 3 micrometers. When the tin-containing layer 70 before bonded with the gold layer 150 is pure tin, the tin-alloy layer 72 is tin-gold alloy having a thickness t2 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 70 before bonded with the gold layer 150 is tin-silver alloy, the tin-alloy layer 72 is tin-silver-gold alloy having a thickness t2 of between 0.5 and 10 micrometers, of between 1 and 5 micrometers or of between 1.5 and 3 micrometers. When the tin-containing layer 70 before bonded with the gold layer 150 is tin-silver-copper alloy, the tin-alloy layer 72 is tin-silver-gold-copper alloy having a thickness t2 of between 0.5 and 10 micrometers, of between 1 and 5 micrometers or of between 1.5 and 3 micrometers.

After the bumps 156 are connected to the tin-containing layer 70 on the bottom surface of the inner leads 68 using a thermal pressing process, a polymer material 74, such as epoxy or polyimide, can be formed between the semiconductor chip 162 and the tin-containing layer 70 on the bottom surface of the inner leads 68, and enclosing the bumps 156. Next, the polymer material 74 is cured at a temperature of between 150 and 250° C.

In the FIG. 15C, the copper traces 60 can be replaced by multiple gold traces having a thickness of between 3 and 30 μm, and preferably of between 5 and 20 μm. Alternatively, the copper traces 60 can be replaced by multiple silver traces having a thickness of between 3 and 30 μm, and preferably of between 5 and 20 μm.

TCP (Tape Carrier Package)—Gold to Gold Connection

Figure 15D:
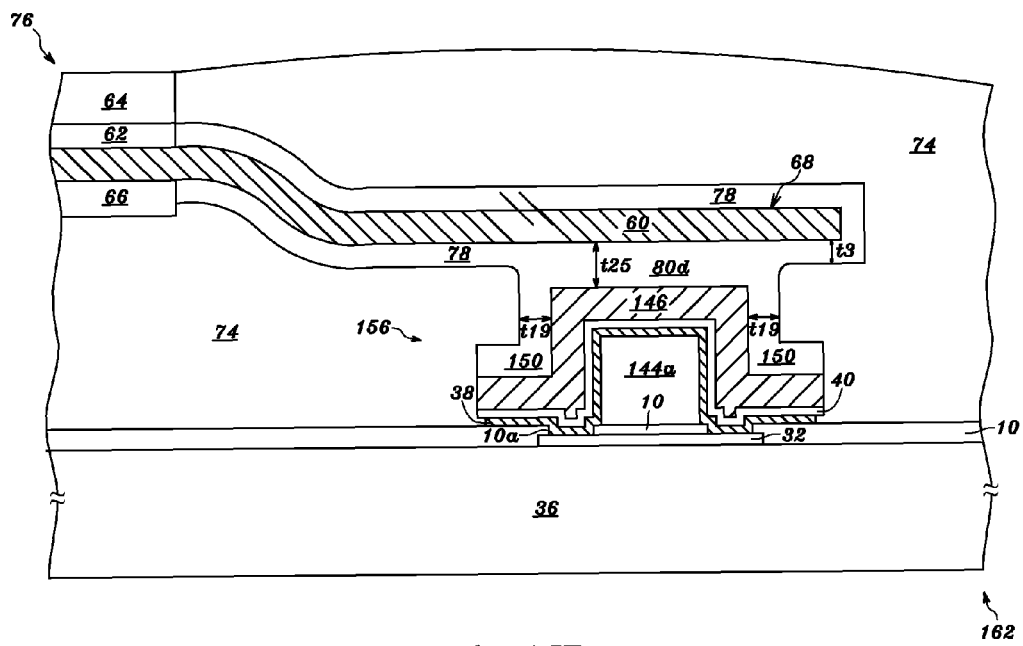

Referring to FIG. 15D, the flexible circuit film 76 as mentioned in FIG. 2I can be bonded with the bumps 156 (only one of them is shown). The specification of the flexible circuit film 76 shown in FIG. 15D can be referred to as the specification of the flexible circuit film 76 illustrated in FIG. 2I. When the flexible circuit film 76 is bonded with the bumps 156, the gold layer 78 on a bottom surface of the inner leads 68 (only one of them is shown) can be thermally pressed on a top surface of the gold layer 150 of the bumps 156 at a temperature of between 490 and 540° C., and preferably of between 500 and 520° C., for a time of between 1 and 10 seconds, and preferably of between 3 and 6 seconds. Thereby, a gold layer 80d formed by the joint of the gold layer 78 and the gold layer 150 can be between the copper layer 146 of the bumps 156 and the copper traces 60 of the flexible circuit film 76, wherein the gold layer 80d has a thickness t25 of between 1 and 10 micrometers, and preferably of between 3 and 6 micrometers.

After the bumps 156 are connected to the copper traces 60 using a thermal pressing process, a polymer material 74, such as epoxy or polyimide, can be formed between the semiconductor chip 162 and the gold layer 78 on the bottom surface of the inner leads 68, and enclosing the bumps 156. Next, the polymer material 74 is cured at a temperature of between 150 and 250° C.

COF (Chip on Film) Package—Gold to Tin Connection

Figure 15E:
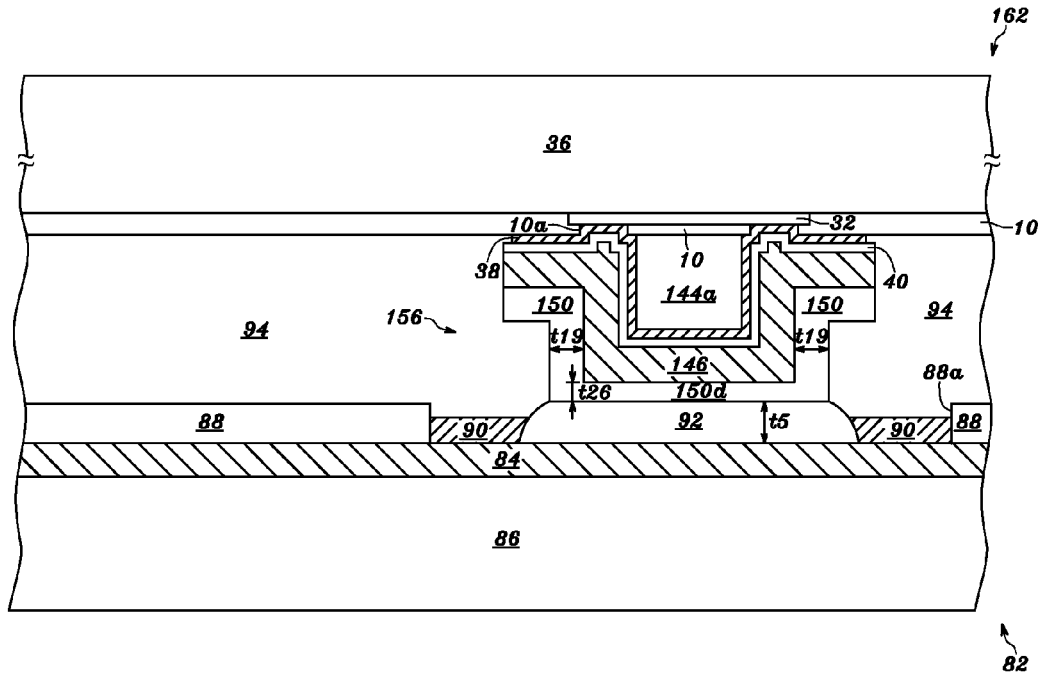

Referring to FIG. 15E, the flexible circuit film 82 as mentioned in FIG. 2K can be bonded with the bumps 156 (only one of them is shown). The specification of the flexible circuit film 82 shown in FIG. 15E can be referred to as the specification of the flexible circuit film 82 illustrated in FIG. 2K. When the flexible circuit film 82 is bonded with the bumps 156, a top surface of the gold layer 150 of the bumps 156 can be thermally pressed on the tin-containing layer 90 of the flexible circuit film 82 at a temperature of between 490 and 540° C., and preferably of between 500 and 520° C., for a time of between 1 and 10 seconds, and preferably of between 3 and 6 seconds. Alternatively, when the flexible circuit film 82 is bonded with the bumps 156, the tin-containing layer 90 of the flexible circuit film 82 can be thermally pressed on a top surface of the gold layer 150 of the bumps 156 at a temperature of between 490 and 540° C., and preferably of between 500 and 520° C., for a time of between 1 and 10 seconds, and preferably of between 3 and 6 seconds. Thereby, a tin-alloy layer 92 containing gold can be formed between the remaining gold layer 150d of the bumps 156 and the copper traces 84 of the flexible circuit film 82, wherein the remaining gold layer 150d has a thickness t26 of between 0.2 and 6 micrometers, and preferably of between 1.5 and 4 micrometers. The tin-alloy layer 92 has a thickness t5 of between 0.5 and 10 micrometers, of between 1 and 5 micrometers or of between 1.5 and 3 micrometers. When the tin-containing layer 90 before bonded with the gold layer 150 is pure tin, the tin-alloy layer 92 is tin-gold alloy having a thickness t5 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 90 before bonded with the gold layer 150 is tin-silver alloy, the tin-alloy layer 92 is tin-silver-gold alloy having a thickness t5 of between 0.5 and 10 micrometers, of between 1 and 5 micrometers or of between 1.5 and 3 micrometers. When the tin-containing layer 90 before bonded with the gold layer 150 is tin-silver-copper alloy, the tin-alloy layer 92 is tin-silver-gold-copper alloy having a thickness t5 of between 0.5 and 10 micrometers, of between 1 and 5 micrometers or of between 1.5 and 3 micrometers.

After the bumps 156 are connected to the copper traces 84 using a thermal pressing process, a polymer material 94, such as epoxy or polyimide, can be formed between the passivation layer 10 of the semiconductor chip 162 and the polymer layer 88 of the flexible circuit film 82, and enclosing the bumps 156. Next, the polymer material 94 is cured at a temperature of between 150 and 250° C.

In the FIG. 15E, the copper traces 84 can be replaced by multiple gold traces having a thickness of between 3 and 30 μm, and preferably of between 5 and 20 μm. Alternatively, the copper traces 84 can be replaced by multiple silver traces having a thickness of between 3 and 30 μm, and preferably of between 5 and 20 μm.

COF (Chip on Film) Package—Gold to Gold Connection

Figure 15F:
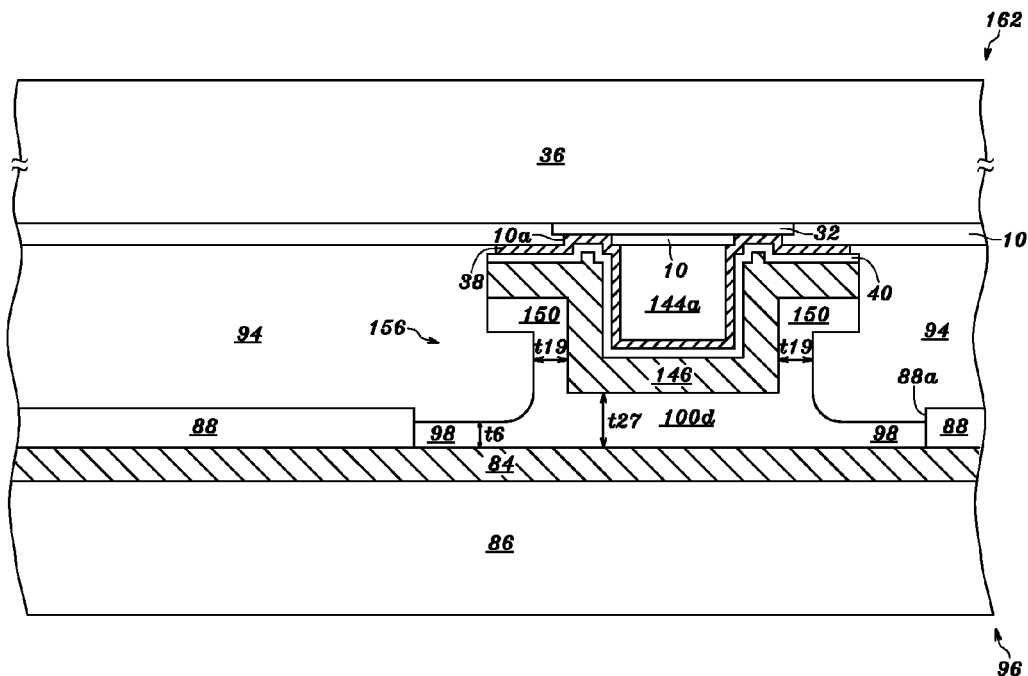

Referring to FIG. 15F, the flexible circuit film 96 as mentioned in FIG. 2M can be bonded with the bumps 156 (only one of them is shown). The specification of the flexible circuit film 96 shown in FIG. 15F can be referred to as the specification of the flexible circuit film 96 illustrated in FIG. 2M. When the flexible circuit film 96 is bonded with the bumps 156, a top surface of the gold layer 150 of the bumps 156 can be thermally pressed on the gold layer 98 of the flexible circuit film 96 at a temperature of between 490 and 540° C., and preferably of between 500 and 520° C., for a time of between 1 and 10 seconds, and preferably of between 3 and 6 seconds. Alternatively, when the flexible circuit film 96 is bonded with the bumps 156, the gold layer 98 of the flexible circuit film 96 can be thermally pressed on a top surface of the gold layer 150 of the bumps 156 at a temperature of between 490 and 540° C., and preferably of between 500 and 520° C., for a time of between 1 and 10 seconds, and preferably of between 3 and 6 seconds. Thereby, a gold layer 100d formed by the joint of the gold layer 98 and the gold layer 150 can be between the copper layer 146 of the bumps 156 and the copper traces 84 of the flexible circuit film 96, wherein the gold layer 100d has a thickness t27 of between 1 and 10 micrometers, and preferably of between 3 and 6 micrometers.

After the bumps 156 are connected to the copper traces 84 using a thermal pressing process, a polymer material 94, such as epoxy or polyimide, can be formed between the passivation layer 10 of the semiconductor chip 162 and the polymer layer 88 of the flexible circuit film 96, and enclosing the bumps 156. Next, the polymer material 94 is cured at a temperature of between 150 and 250° C.

COG (Chip on Glass) Assembly—ACF/ACP

Figure 15G:
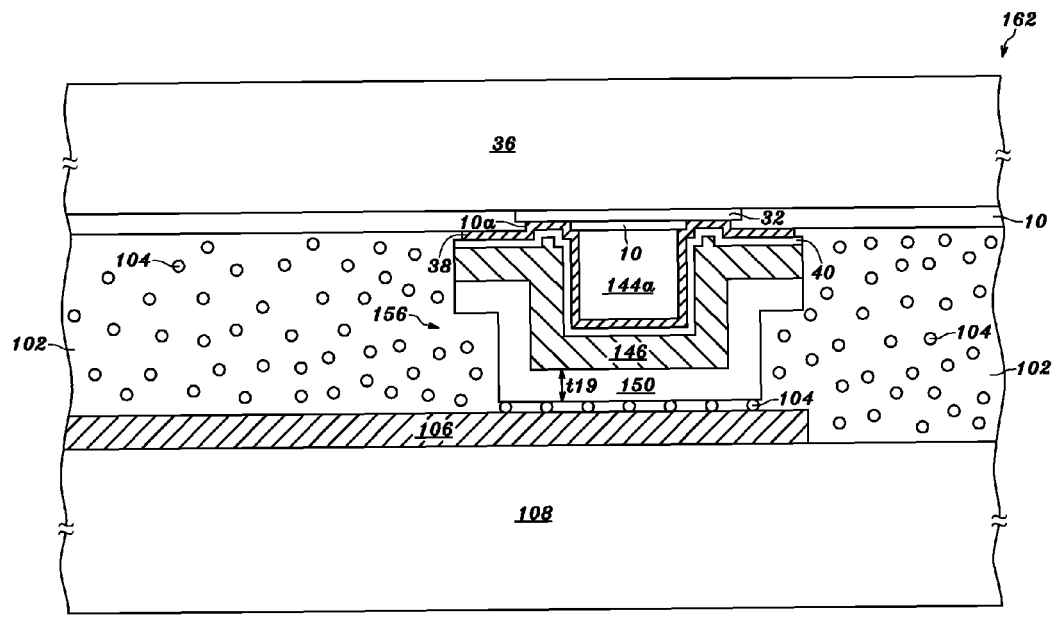

Referring to FIG. 15G, via a thermal pressing process, the gold layer 150 of the bumps 156 (only one of them is shown) is pressed into an anisotropic conductive film (ACF) or an anisotropic conductive paste (ACP) 102. Thus, metal particles 104 inside ACF or ACP 102 clusters between the gold layer 150 of the bumps 156 and multiple conductive traces 106 (only one of them is shown), such as indium tin oxide (ITO) or gold, on a glass substrate 108, leading the gold layer 150 of the bumps 156 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 150 of the bumps 156 may be pressed into ACF or ACP 102 preformed on a ceramic substrate or a printed circuit board to have metal particles 104 in the ACF or ACP 102 connecting the gold layer 150 of the bumps 156 to multiple pads on the ceramic substrate or on the organic substrate.

COG (Chip on Glass) Assembly—NCF

Figure 15H:
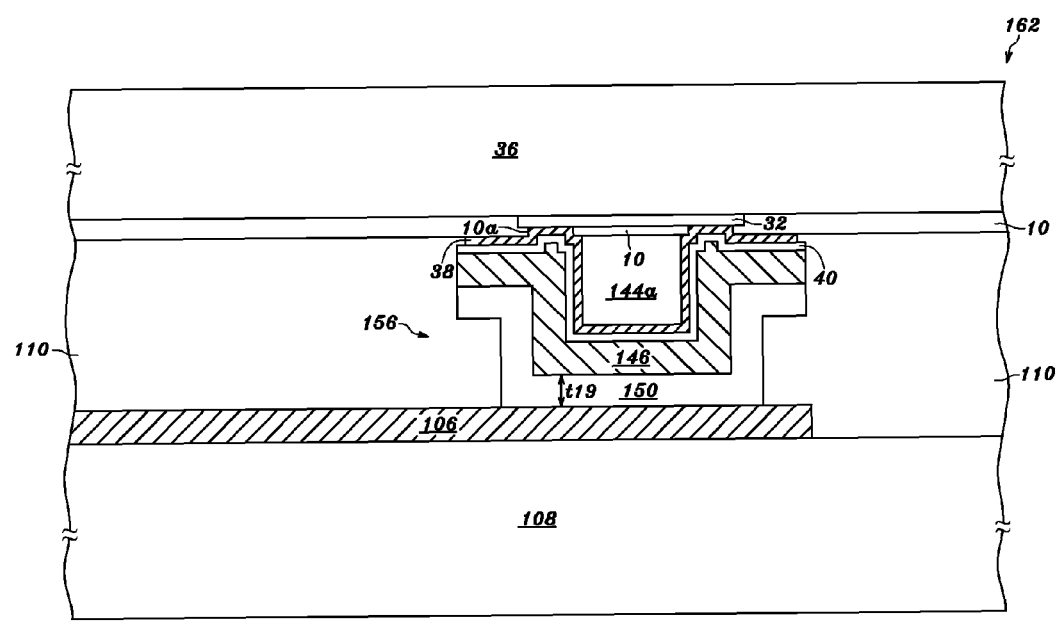

Referring to FIG. 15H, via a thermal pressing process, the gold layer 150 of the bumps 156 (only one of them is shown) is pressed into a non-conductive film (NCF) 110, and the gold layer 150 of the bumps 156 contacts with multiple conductive traces 106 (only one of them is shown), such as indium tin oxide (ITO) or gold, on a glass substrate 108, leading the gold layer 150 of the bumps 156 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 150 of the bumps 156 may be pressed into NCF 110 preformed on a ceramic substrate or a printed circuit board to have the gold layer 150 of the bumps 156 contacting with multiple pads on the ceramic substrate or on the organic substrate.

Embodiment 15

Figure 16A:
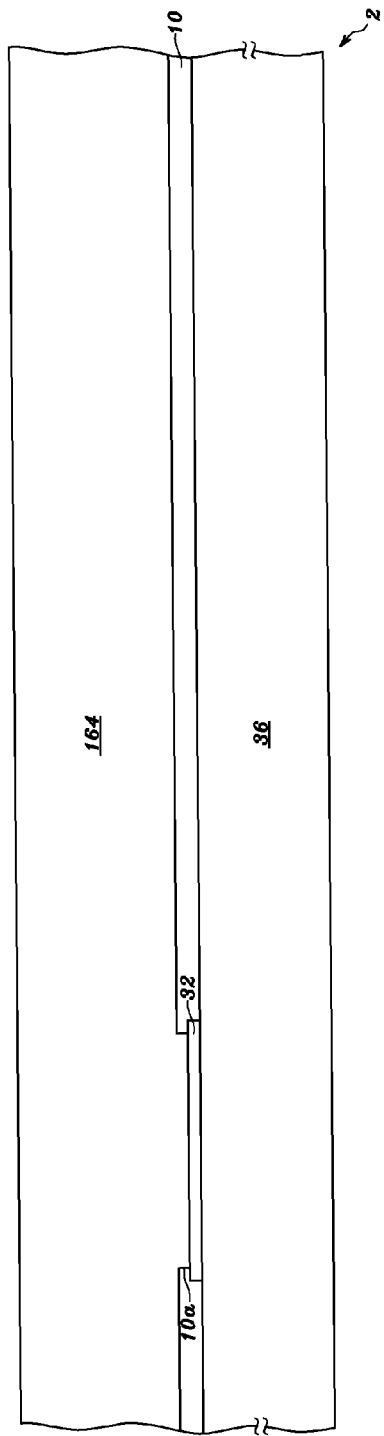

Referring to FIG. 16A, a polymer layer 164 can be spin-on coated on the passivation layer 10 and on the pads 32, such as aluminum pads or copper pads, exposed by the openings 10*a*. Alternatively, the polymer layer 164 can be formed by a lamination process or a screen-printing process. The material of the polymer layer 164 may include benzocyclobutane (BCB), polyimide (PI), polybenzoxazole (PBO) or epoxy resin.

Figure 16B:
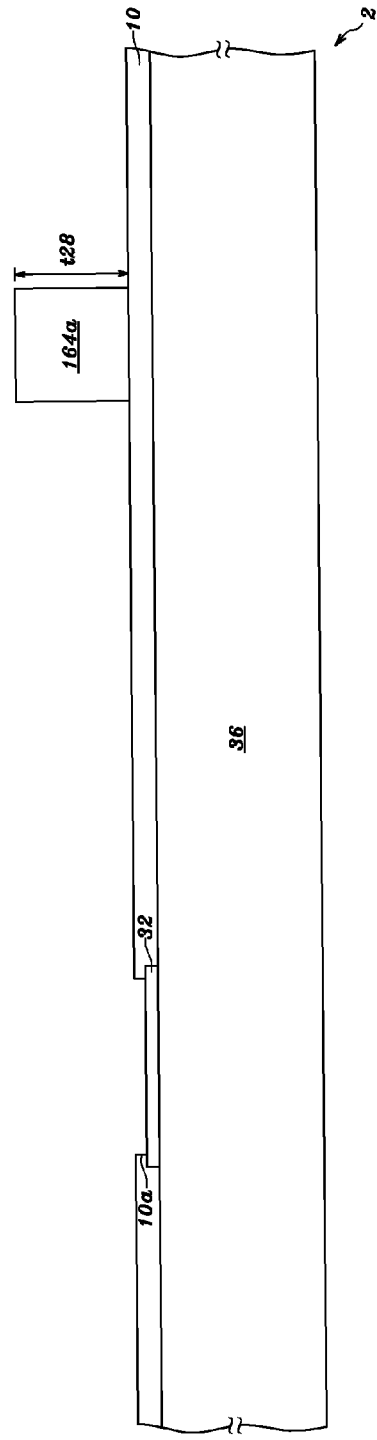

Referring to FIG. 16B, multiple polymer bumps 164*a* (only one of them is shown) are formed on the passivation layer 10 by patterning the polymer layer 164. The polymer bumps 164*a* have a thickness t28 of between 5 and 50 micrometers. From a top perspective view, each of the polymer bumps 164*a* comprises a bar-shaped portion extending in a direction parallel with one of scribe lines 56 of the semiconductor wafer 2 or parallel with an edge of a chip after being cut from the semiconductor wafer 2 and parallel with the direction in which the openings 10*a* are aligned. The positions of the polymer bumps 164*a* (only one of them is shown) are different from those of the pads 32 exposed by the openings 10*a*. Below, the process of forming the polymer bumps 164*a* is exemplified with the case of spin-on coating a polyimide layer on the passivation layer 10 and on the pads 32, and then patterning the polyimide layer. Alternatively, the polymer bumps 164*a* can be formed by spin-on coating a layer of benzocyclobutene or epoxy resin on the passivation layer 10 and on the pads 32, and then patterning the layer.

For example, the polymer layer 164 can be formed by spin-on coating a negative-type photosensitive polyimide layer having a thickness of between 10 and 100 µm on the passivation layer 10 and on the pads 32 exposed by the openings 10*a*, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form multiple polyimide bumps each having a bar shape extending in a direction parallel with a scribeline and parallel with a line, in which the openings 10*a* are aligned, then curing or heating the polyimide bumps at a peak temperature of between 180 and 400° C. for a time of between 20 and 150 minutes in a nitrogen ambient or in an oxygen-free ambient, the cured polyimide bumps having a thickness t28 of between 5 and 50 µm, and then removing the residual polymeric material or other contaminants from the upper surface of the pads 32 exposed by the openings 10*a* with an O₂ plasma or a plasma containing fluorine of below 200 PPM and oxygen, such that the polymer bumps 164*a* can be formed on the passivation layer 10 and each has a bar shape extending in a direction parallel with a scribeline and parallel with a line, in which the openings 10*a* are aligned. For example, the polyimide bumps can be cured or heated at a temperature between 180 and 250° C. for a time of between 20 and 150 minutes in a nitrogen ambient or in an oxygen-free ambient. Alternatively, the polyimide bumps can be cured or heated at a temperature between 250 and 290° C. for a time of between 20 and 150 minutes in a nitrogen ambient or in an oxygen-free ambient. Alternatively, the polyimide bumps can be cured or heated at a temperature between 290 and 400° C. for a time of between 20 and 150 minutes in a nitrogen ambient or in an oxygen-free ambient. Alternatively, the polyimide bumps can be cured or heated at a temperature between 250 and 400° C. for a time of between 20 and 150 minutes in a nitrogen ambient or in an oxygen-free ambient.

Figure 16C:
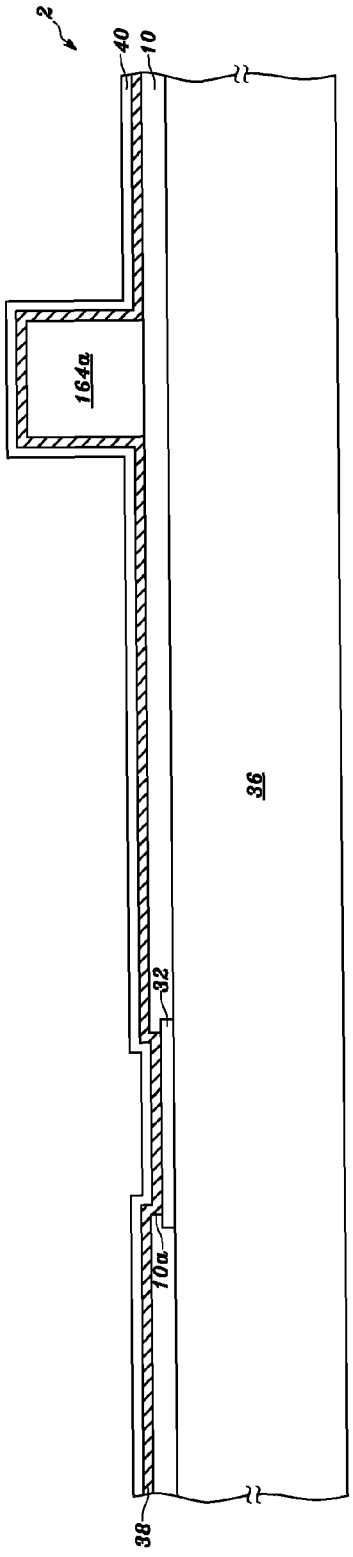

Referring to FIG. 16C, an adhesion/barrier layer 38 having a thickness of between 0.02 and 0.5 µm, and preferably of between 0.25 and 0.35 µm, can be formed on the polymer bumps 164*a*, on the passivation layer 10 and on the pads 32, such as aluminum pads or copper pads, exposed by the openings 10*a*. Alternatively, referring to FIG. 16O, when the metal caps 34, shown in FIG. 1B, are preformed on the pads 32, the adhesion/barrier layer 38 having a thickness of between 0.02 and 0.5 µm, and preferably of between 0.25 and 0.35 µm, can be formed on the polymer bumps 164*a*, on the passivation layer 10 and on the metal caps 34. The adhesion/barrier layer 38 can be formed by a physical vapor deposition (PVD) process, such as a sputtering process or an evaporation process, or a chemical vapor deposition (CVD) process. The material of the adhesion/barrier layer 38 may include titanium, a titanium-tungsten alloy, titanium nitride, chromium, tantalum, tantalum nitride or a composite of the abovementioned materials. Below, the process of forming the adhesion/barrier layer 38 is exemplified with the case of forming the adhesion/barrier layer 38 on the polymer bumps 164*a*, on the passivation layer 10 and on the pads 32, such as aluminum pads or copper pads, exposed by the openings 10*a*.

In a case, the adhesion/barrier layer 38 can be formed by sputtering a titanium-tungsten-alloy layer with a thickness of between 0.02 and 0.5 µm, and preferably of between 0.25 and 0.35 µm, on the polymer bumps 164*a*, on the passivation layer 10 and on the pads 32, such as aluminum pads or copper pads, exposed by the openings 10*a*. In another case, the adhesion/barrier layer 38 can be formed by sputtering a titanium layer with a thickness of between 0.02 and 0.5 µm, and preferably of between 0.25 and 0.35 µm, on the polymer bumps 164*a*, on the passivation layer 10 and on the pads 32, such as aluminum pads or copper pads, exposed by the openings 10*a*. In another case, the adhesion/barrier layer 38 can be formed by sputtering a tantalum-nitride layer with a thickness of between 0.02 and 0.5 µm, and preferably of between 0.25 and 0.35 µm, on the polymer bumps 164*a*, on the passivation layer 10 and on the pads 32, such as aluminum pads or copper pads, exposed by the openings 10*a*. In another case, the adhesion/barrier layer 38 can be formed by sputtering a tantalum layer with a thickness of between 0.02 and 0.5 µm, and preferably of between 0.25 and 0.35 µm, on the polymer bumps 164*a*, on the passivation layer 10 and on the pads 32, such as aluminum pads or copper pads, exposed by the openings 10*a*. In another case, the adhesion/barrier layer 38 can be formed by sputtering a titanium layer on the polymer bumps 164*a*, on the passivation layer 10 and on the pads 32, such as aluminum pads or copper pads, exposed by the openings 10*a*, and then sputtering a titanium-tungsten-alloy layer on the titanium layer.

Figure 16D:
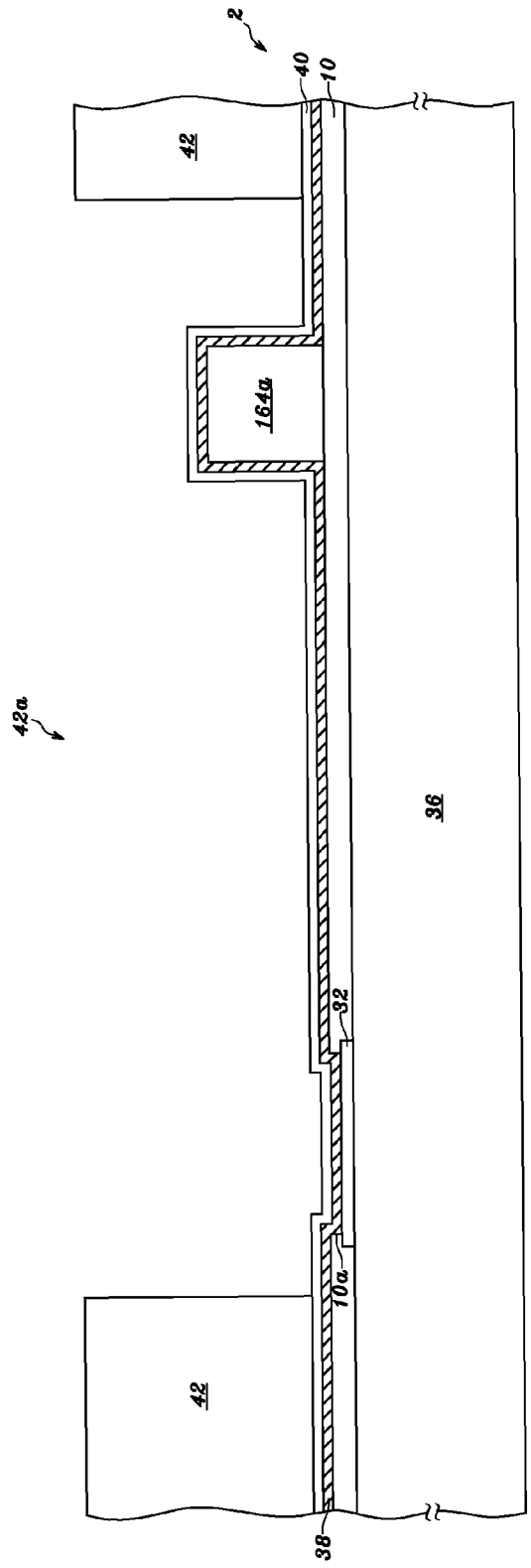
Figure 16E:
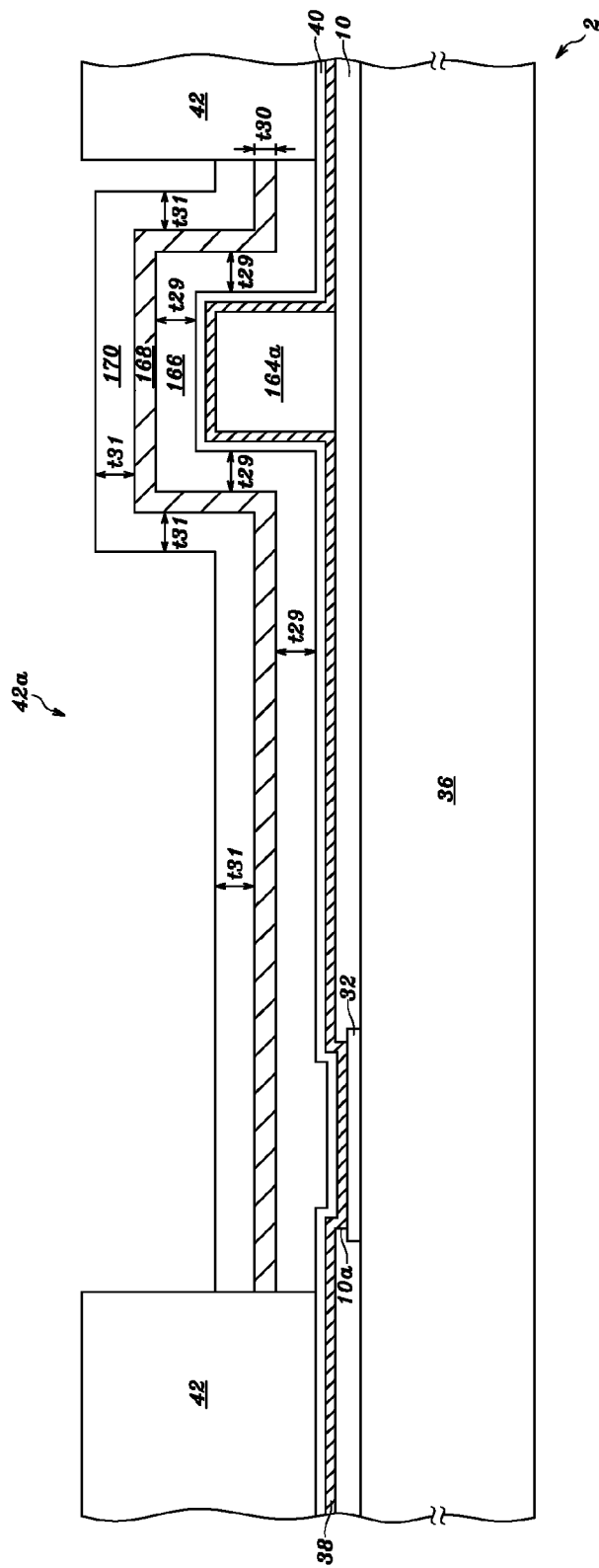
Figure 16H:
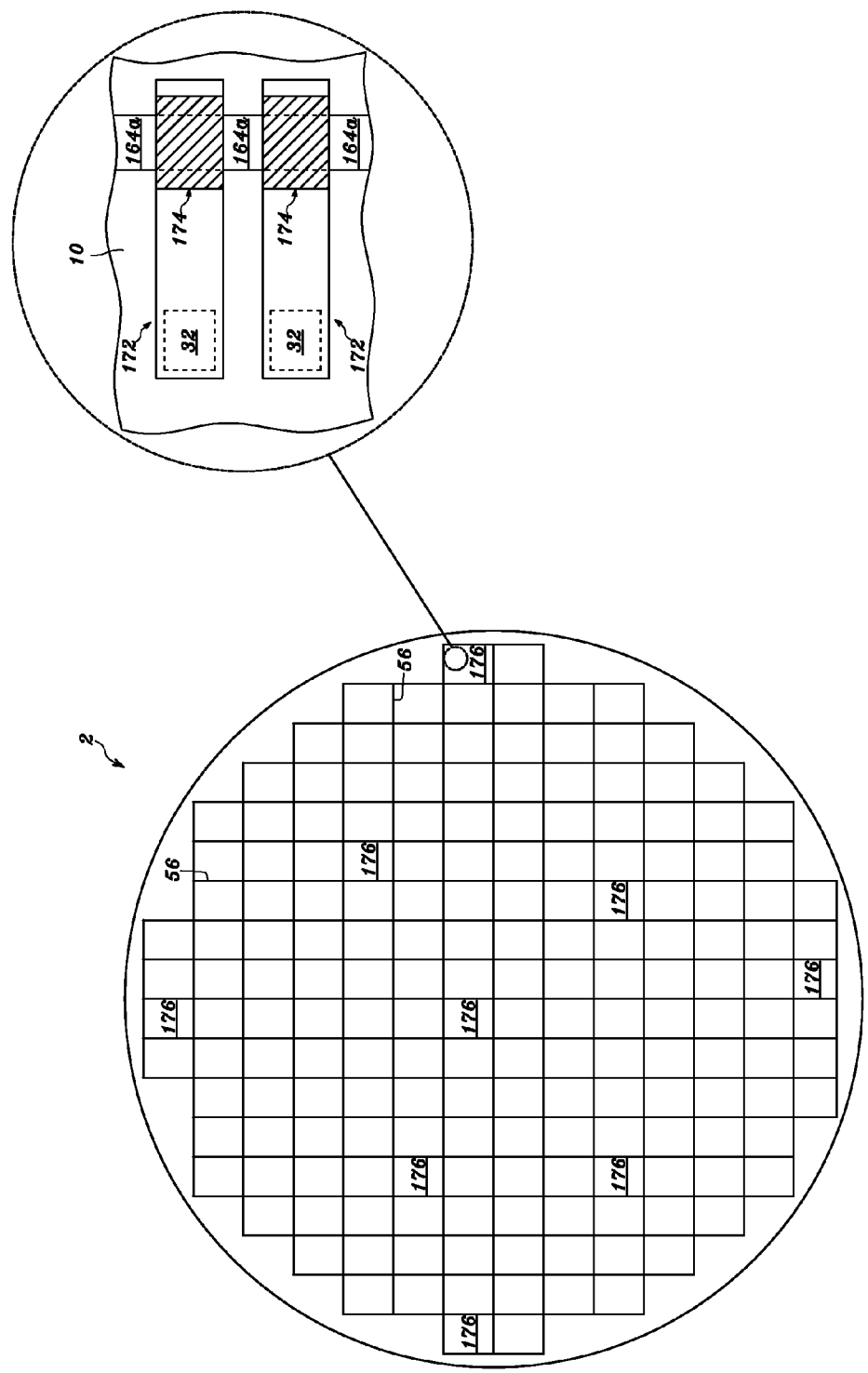
FIG. 16H is a top view showing a semiconductor wafer with one or more polymer bumps and multiple metal traces on one or more polymer bumps.
Figure 16I:
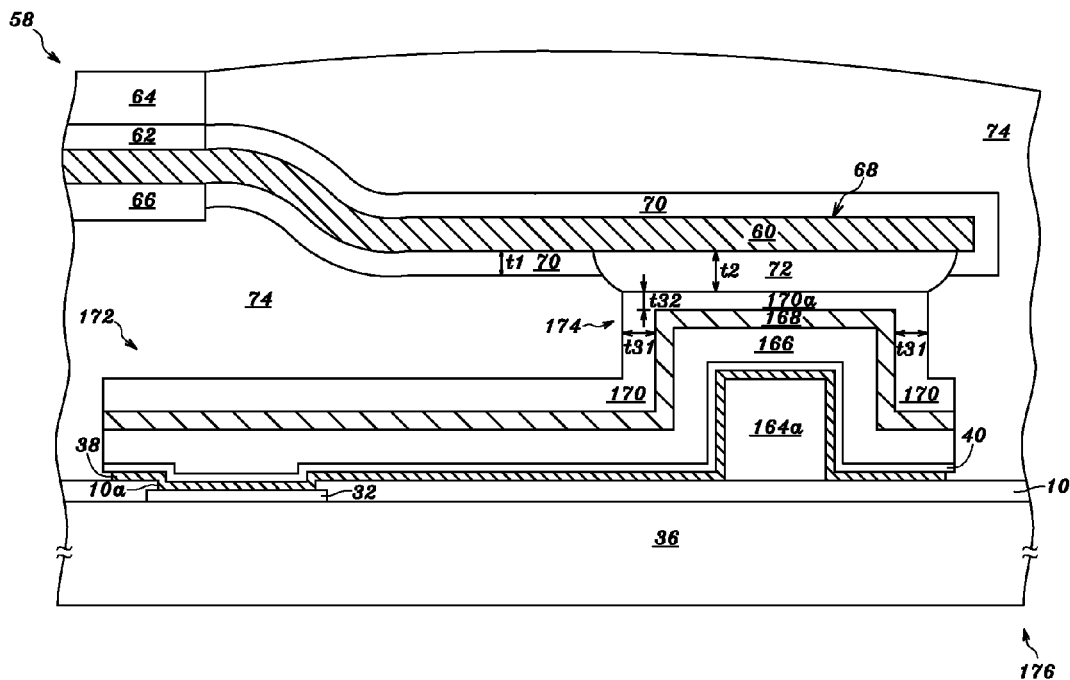
Figure 16J:
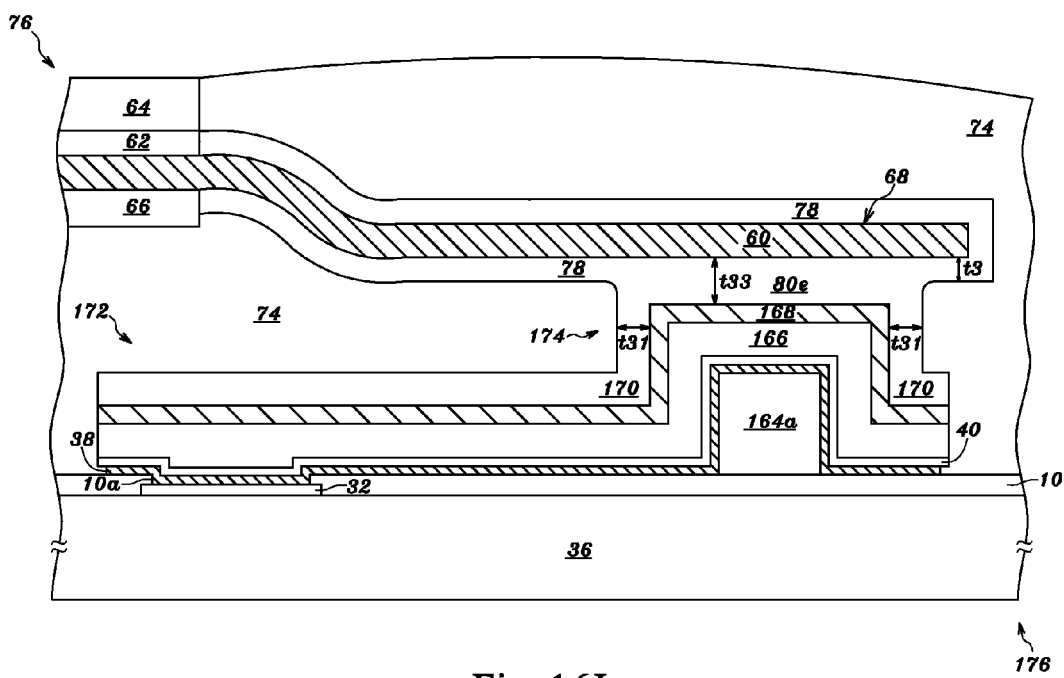
Figure 16K:
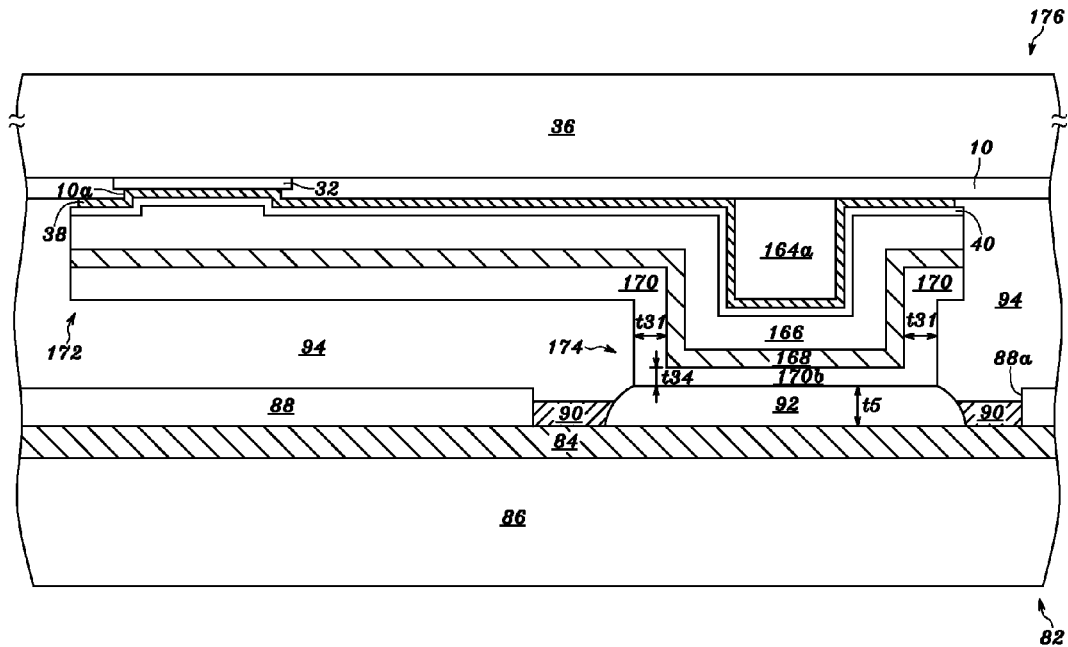
Figure 16L:
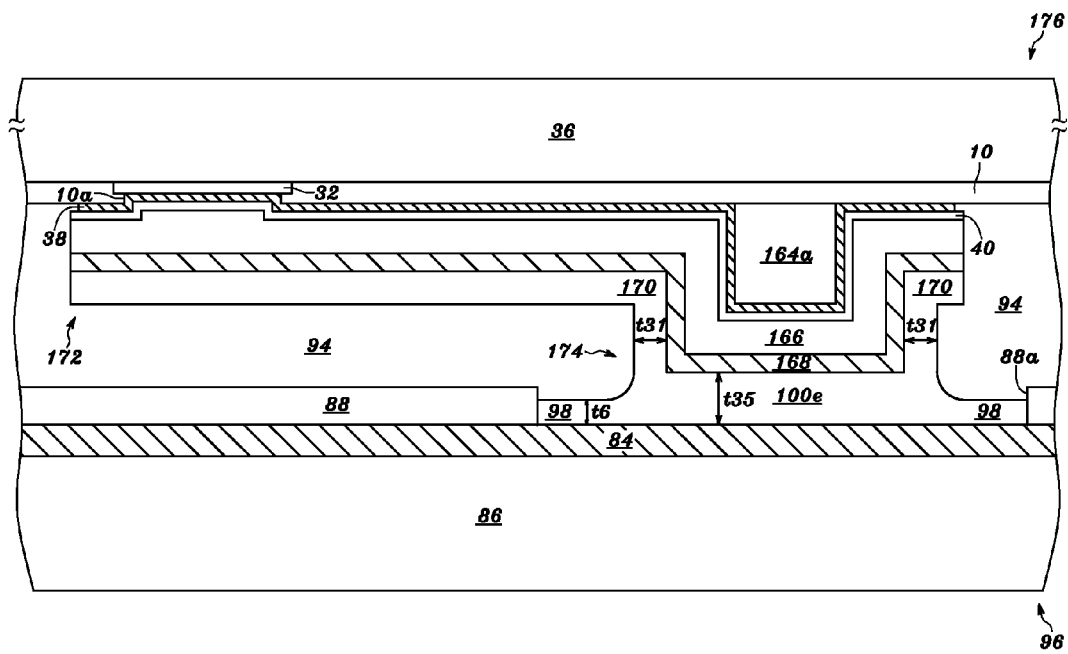
Figure 16M:
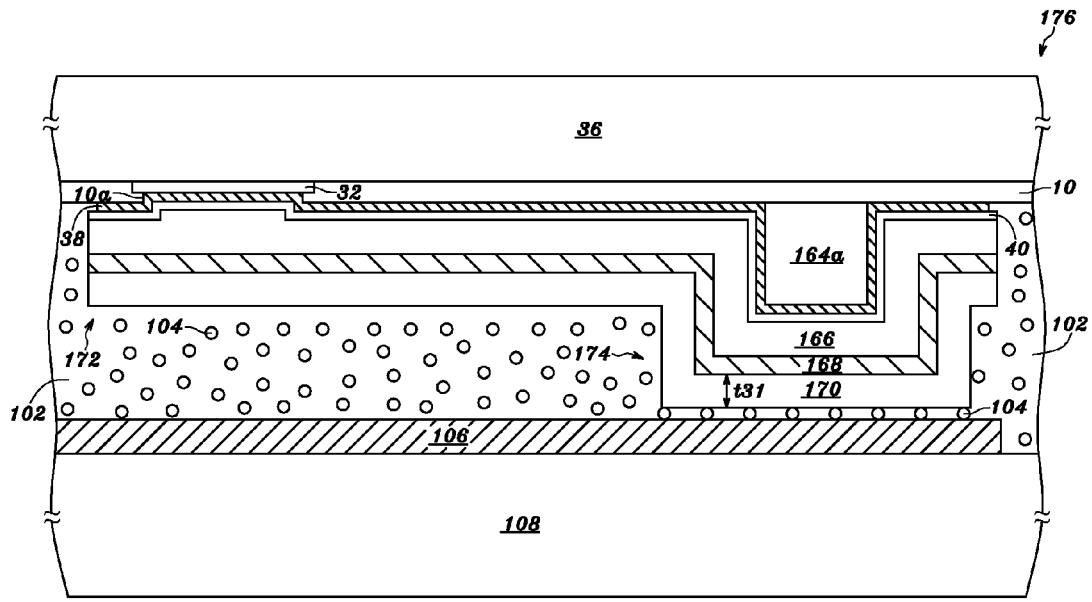
Figure 16N:
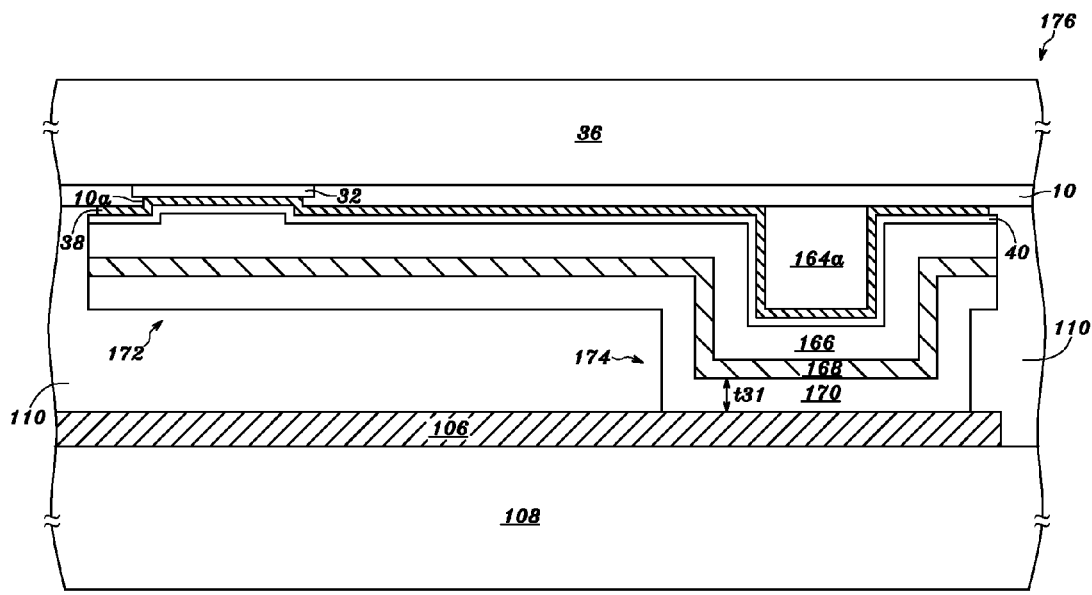
Figure 16O:
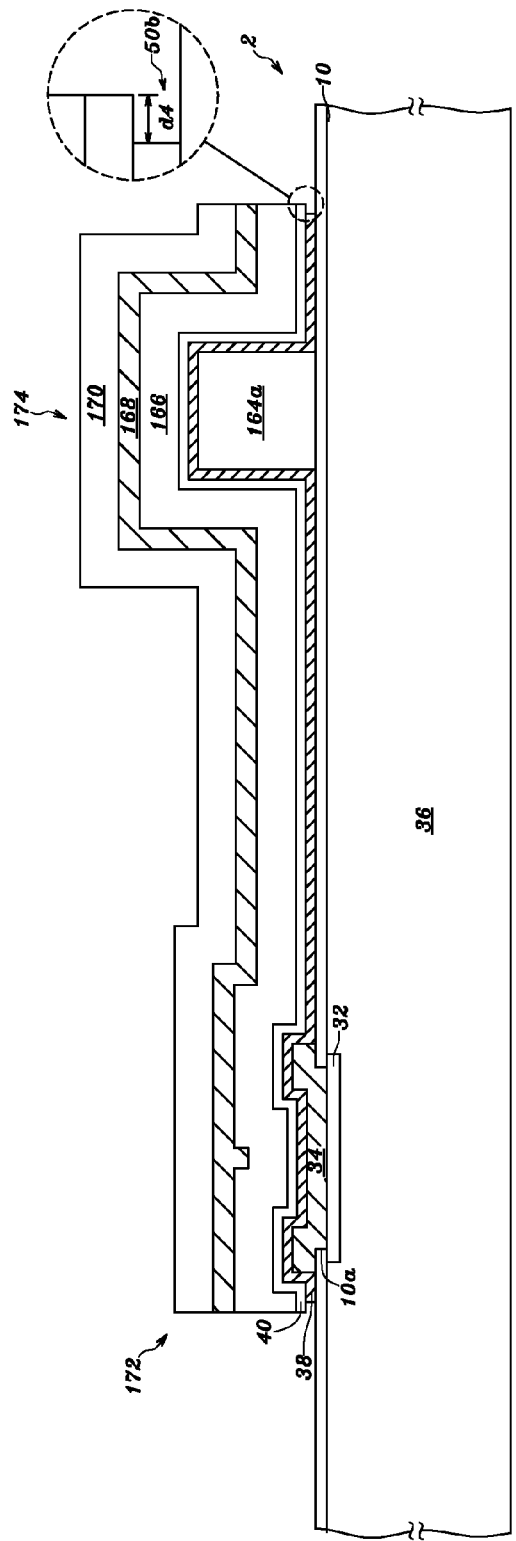

Alternatively, referring to FIG. 16O, when the metal caps 34, shown in FIG. 1B, are preformed on the pads 32, the adhesion/barrier layer 38 can be formed on the polymer bumps 164*a*, on the passivation layer 10 and on the metal caps 34.

Next, a seed layer 40, made of copper, having a thickness of between 0.03 and 1 µm, and preferably of between 0.05 and 0.2 µm, can be formed on the adhesion/barrier layer 38. The seed layer 40 can be formed by a physical vapor deposition (PVD) process, such as a sputtering process or an evaporation process, or a chemical vapor deposition (CVD) process. The specification of the adhesion/barrier layer 38 and the seed layer 40 shown in FIG. 16C can be referred to as the specification of the adhesion/barrier layer 38 and the seed layer 40 illustrated in FIG. 2A. The process of forming the adhesion/barrier layer 38 and the seed layer 40, as shown in FIG. 16C, can be referred to as the process of forming the adhesion/barrier layer 38 and the seed layer 40, as illustrated in FIG. 2A.

Referring to FIG. 16D, a photoresist layer 42, such as positive-type photoresist layer, having a thickness of between 10 and 60 micrometers, and preferably of between 15 and 25 micrometers, is spin-on coated on the seed layer 40. Next, the photoresist layer 42 is patterned with the processes of exposure and development to form openings 42a (only one of them is shown) in the photoresist layer 42 exposing the seed layer 40. A 1× stepper or 1× contact aligner can be used to expose the photoresist layer 42 during the process of exposure.

For example, the photoresist layer 42 can be formed by spin-on coating a positive-type photosensitive polymer layer having a thickness of between 10 and 60 μm, and preferably of between 15 and 25 μm, on the seed layer 40, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 40 with an $O_2$ plasma or a plasma containing fluorine of below 200 PPM and oxygen, such that the photoresist layer 42 can be patterned with the openings 42a in the photoresist layer 42 exposing the seed layer 40.

Referring to FIG. 16E, a copper layer 166 having a thickness t29 of between 0.5 and 25 micrometers, and preferably of between 5 and 10 micrometers, is electroplated on the seed layer 40 exposed by the openings 42a. Next, a nickel layer 168 having a thickness t30 of between 0.1 and 5 micrometers, and preferably of between 0.2 and 2 micrometers, can be electroplated on the electroplated copper layer 166 in the openings 42a. Next, a gold layer 170 having a thickness t31 of between 0.5 and 10 micrometers, and preferably of between 3 and 6 micrometers, can be electroplated on the nickel layer 168 in the openings 42a with a non-cyanide electroplating solution, such as a solution containing gold sodium sulfite ($Na_3Au(SO_3)_2$) or a solution containing gold ammonium sulfite (($NH_4)_3[Au(SO_3)_2]$), or with an electroplating solution containing cyanide. The nickel layer 168 can be replaced by a cobalt layer having a thickness of between 0.1 and 5 μm, and preferably of between 0.2 and 2 μm. The gold layer 170 can be replaced by a silver layer having a thickness of between 0.5 and 10 μm, and preferably of between 3 and 6 μm.

Referring to FIG. 16F, after the gold layer 170 is formed, most of the photoresist layer 42 can be removed using an organic solution with amide. However, some residuals from the photoresist layer 42 could remain on the gold layer 170 and on the seed layer 40. Thereafter, the residuals can be removed from the gold layer 170 and from the seed layer 40 with a plasma, such as $O_2$ plasma or plasma containing fluorine of below 200 PPM and oxygen.

Referring to FIG. 16G, the seed layer 40 and the adhesion/barrier layer 38 not under the electroplated copper layer 166 are subsequently removed with a wet etching method or a dry etching method, such as an Ar sputtering etching process. As to the wet etching method, the seed layer 40, made of copper, can be etched with a solution containing $NH_4OH$ or with a solution containing $H_2SO_4$. When the adhesion/barrier layer 38 is a titanium-tungsten-alloy layer, it can be etched with a solution containing hydrogen peroxide or with a solution containing $NH_4OH$ and hydrogen peroxide; when the adhesion/barrier layer 38 is a titanium layer, it can be etched with a solution containing hydrogen fluoride or with a solution containing $NH_4OH$ and hydrogen peroxide.

Multiple undercuts 50b (only one of them is shown) are formed under the seed layer 40 and under the electroplated copper layer 166 when the adhesion/barrier layer 38 not under the electroplated copper layer 166 is removed using a wet etching method. The adhesion/barrier layer 38 under the electroplated copper layer 166 has a first sidewall recessed from a second sidewall of the seed layer 40, wherein a distance d4 between the first sidewall and the second sidewall is between 0.3 and 2 micrometers.

Thereby, in the present invention, multiple metal traces 172 (only one of them is shown) can be formed on the passivation layer 10, on one or more polymer bumps 164a and on the pads 32, such as aluminum pads or copper pads, exposed by the openings 10a. Each of the metal traces 172 can be formed of the adhesion/barrier layer 38 on the passivation layer 10, on the pad 32 and on the polymer bump 164a, a copper layer (including the seed layer 40 and the electroplated copper layer 166), having a thickness of between 0.5 and 25 micrometers, and preferably of between 5 and 10 micrometers, on the adhesion/barrier layer 38, the nickel layer 168 on the copper layer and the gold layer 170 on the nickel layer 168. Alternatively, referring to FIG. 16O, when the metal caps 34, shown in FIG. 1B, are preformed on the pads 32, the metal traces 172 can be formed on the passivation layer 10, on one or more polymer bumps 164a and on the metal caps 34, that is, each of the metal traces 172 can be formed of the adhesion/barrier layer 38 on the passivation layer 10, on the metal cap 34 and on the polymer bump 164a, a copper layer (including the seed layer 40 and the electroplated copper layer 166), having a thickness of between 0.5 and 25 micrometers, and preferably of between 5 and 10 micrometers, on the adhesion/barrier layer 38, the nickel layer 168 on the copper layer and the gold layer 170 on the nickel layer 168.

Referring to FIGS. 16G-16H, each of the metal traces 172 comprises a protruding region 174 over the polymer bump 164a and over the passivation layer 10 near the polymer bump 164a. From a top perspective view, each of the polymer bumps 164a comprises a bar-shaped portion extending in a direction parallel with one of scribe lines 56 of the semiconductor wafer 2 or parallel with an edge of a chip after being cut from the semiconductor wafer 2, and the metal traces 172 have the protruding regions 174 extending across over one of the bar-shaped polymer bumps 164a and in a direction perpendicular to the direction in which said one of the bar-shaped polymer bumps 164a extends.

After the metal traces 172 are formed, the semiconductor wafer 2 can be cut into multiple chips 176. The detail can be referred as to FIG. 16H. Referring to FIG. 16H, the semiconductor wafer 2 includes multiple semiconductor chips 176 with the scribe lines 56 between neighboring two of the semiconductor chips 176. The metal traces 172 of each semiconductor chips 176 are on the passivation layer 10, on one or more polymer bumps 164a and on the pads 32 exposed by the openings 10a. Alternatively, referring to FIG. 16O, when the metal caps 34, shown in FIG. 1B, are preformed on the pads 32, the metal traces 172 of each semiconductor chips 176 are on the passivation layer 10, on one or more polymer bumps 164a and on the metal caps 34. In a wafer dicing process, the semiconductor wafer 2 can be cut along the scribe lines 56 to separate the semiconductor chips 176.

TCP (Tape Carrier Package)—Gold to Tin Connection

Referring to FIG. 16I, the flexible circuit film 58 as mentioned in FIG. 2G can be bonded with the protruding regions 174 of the metal traces 172 (only one of them is shown). The specification of the flexible circuit film 58 shown in FIG. 16I can be referred to as the specification of the flexible circuit film 58 illustrated in FIG. 2G When the flexible circuit film 58 is bonded with the protruding regions 174 of the metal traces 172, the tin-containing layer 70 on a bottom surface of the inner leads 68 (only one of them is shown) can be thermally pressed on a top surface of the gold layer 170 of the metal traces 172 at the protruding regions 174 at a temperature of between 490 and 540° C., and preferably of between 500 and 520° C., for a time of between 1 and 10 seconds, and preferably of between 3 and 6 seconds. Thereby, a tin-alloy layer 72 containing gold can be formed between the remaining gold layer 170a of the metal traces 172 at the protruding regions 174 and the copper traces 60 of the flexible circuit film 58, wherein the remaining gold layer 170a has a thickness t32 of between 0.2 and 6 micrometers, and preferably of between 1.5 and 4 micrometers. The tin-alloy layer 72 has a thickness t2 of between 0.5 and 10 micrometers, of between 1 and 5 micrometers or of between 1.5 and 3 micrometers. When the tin-containing layer 70 before bonded with the gold layer 170 is pure tin, the tin-alloy layer 72 is tin-gold alloy having a thickness t2 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 70 before bonded with the gold layer 170 is tin-silver alloy, the tin-alloy layer 72 is tin-silver-gold alloy having a thickness t2 of between 0.5 and 10 micrometers, of between 1 and 5 micrometers or of between 1.5 and 3 micrometers. When the tin-containing layer 70 before bonded with the gold layer 170 is tin-silver-copper alloy, the tin-alloy layer 72 is tin-silver-gold-copper alloy having a thickness t2 of between 0.5 and 10 micrometers, of between 1 and 5 micrometers or of between 1.5 and 3 micrometers.

After the protruding regions 174 of the metal traces 172 are connected to the tin-containing layer 70 on the bottom surface of the inner leads 68 using a thermal pressing process, a polymer material 74, such as epoxy or polyimide, can be formed between the semiconductor chip 176 and the tin-containing layer 70 on the bottom surface of the inner leads 68, and enclosing the metal traces 172. Next, the polymer material 74 is cured at a temperature of between 150 and 250° C.

In the FIG. 16I, the copper traces 60 can be replaced by multiple gold traces having a thickness of between 3 and 30 µm, and preferably of between 5 and 20 µm. Alternatively, the copper traces 60 can be replaced by multiple silver traces having a thickness of between 3 and 30 µm, and preferably of between 5 and 20 µm.

TCP (Tape Carrier Package)—Gold to Gold Connection

Referring to FIG. 16J, the flexible circuit film 76 as mentioned in FIG. 2I can be bonded with the protruding regions 174 of the metal traces 172 (only one of them is shown). The specification of the flexible circuit film 76 shown in FIG. 16J can be referred to as the specification of the flexible circuit film 76 illustrated in FIG. 2I. When the flexible circuit film 76 is bonded with the protruding regions 174 of the metal traces 172, the gold layer 78 on a bottom surface of the inner leads 68 (only one of them is shown) can be thermally pressed on a top surface of the gold layer 170 of the metal traces 172 at the protruding regions 174 at a temperature of between 490 and 540° C., and preferably of between 500 and 520° C., for a time of between 1 and 10 seconds, and preferably of between 3 and 6 seconds. Thereby, a gold layer 80e formed by the joint of the gold layer 78 and the gold layer 170 can be between the nickel layer 168 of the metal traces 172 at the protruding regions 174 and the copper traces 60 of the flexible circuit film 76, wherein the gold layer 80e has a thickness t33 of between 1 and 10 micrometers, and preferably of between 3 and 6 micrometers.

After the protruding regions 174 of the metal traces 172 are connected to the copper traces 60 using a thermal pressing process, a polymer material 74, such as epoxy or polyimide, can be formed between the semiconductor chip 176 and the gold layer 78 on the bottom surface of the inner leads 68, and enclosing the metal traces 172. Next, the polymer material 74 is cured at a temperature of between 150 and 250° C.

COF (Chip on Film) Package—Gold to Tin Connection

Referring to FIG. 16K, the flexible circuit film 82 as mentioned in FIG. 2K can be bonded with the protruding regions 174 of the metal traces 172 (only one of them is shown). The specification of the flexible circuit film 82 shown in FIG. 16K can be referred to as the specification of the flexible circuit film 82 illustrated in FIG. 2K. When the flexible circuit film 82 is bonded with the protruding regions 174 of the metal traces 172, a top surface of the gold layer 170 of the metal traces 172 at the protruding regions 174 can be thermally pressed on the tin-containing layer 90 of the flexible circuit film 82 at a temperature of between 490 and 540° C., and preferably of between 500 and 520° C., for a time of between 1 and 10 seconds, and preferably of between 3 and 6 seconds. Alternatively, when the flexible circuit film 82 is bonded with the protruding regions 174 of the metal traces 172, the tin-containing layer 90 of the flexible circuit film 82 can be thermally pressed on the top surface of the gold layer 170 of the metal traces 172 at the protruding regions 174 at a temperature of between 490 and 540° C., and preferably of between 500 and 520° C., for a time of between 1 and 10 seconds, and preferably of between 3 and 6 seconds. Thereby, a tin-alloy layer 92 containing gold can be formed between the remaining gold layer 170b of the metal traces 172 at the protruding regions 174 and the copper traces 84 of the flexible circuit film 82, wherein the remaining gold layer 170b has a thickness t34 of between 0.2 and 6 micrometers, and preferably of between 1.5 and 4 micrometers. The tin-alloy layer 92 has a thickness t5 of between 0.5 and 10 micrometers, of between 1 and 5 micrometers or of between 1.5 and 3 micrometers. When the tin-containing layer 90 before bonded with the gold layer 170 is pure tin, the tin-alloy layer 92 is tin-gold alloy having a thickness t5 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 90 before bonded with the gold layer 170 is tin-silver alloy, the tin-alloy layer 92 is tin-silver-gold alloy having a thickness t5 of between 0.5 and 10 micrometers, of between 1 and 5 micrometers or of between 1.5 and 3 micrometers. When the tin-containing layer 90 before bonded with the gold layer 170 is tin-silver-copper alloy, the tin-alloy layer 92 is tin-silver-gold-copper alloy having a thickness t5 of between 0.5 and 10 micrometers, of between 1 and 5 micrometers or of between 1.5 and 3 micrometers.

After the protruding regions 174 of the metal traces 172 are connected to the copper traces 84 using a thermal pressing process, a polymer material 94, such as epoxy or polyimide, can be formed between the passivation layer 10 of the semiconductor chip 176 and the polymer layer 88 of the flexible circuit film 82, and enclosing the metal traces 172. Next, the polymer material 94 is cured at a temperature of between 150 and 250° C.

In the FIG. 16K, the copper traces 84 can be replaced by multiple gold traces having a thickness of between 3 and 30 µm, and preferably of between 5 and 20 µm. Alternatively, the copper traces 84 can be replaced by multiple silver traces having a thickness of between 3 and 30 µm, and preferably of between 5 and 20 µm.

COF (Chip on Film) Package—Gold to Gold Connection

Referring to FIG. 16L, the flexible circuit film 96 as mentioned in FIG. 2M can be bonded with the protruding regions 174 of the metal traces 172 (only one of them is shown). The specification of the flexible circuit film 96 shown in FIG. 16L can be referred to as the specification of the flexible circuit film 96 illustrated in FIG. 2M. When the flexible circuit film 96 is bonded with the protruding regions 174 of the metal traces 172, a top surface of the gold layer 170 of the metal traces 172 at the protruding regions 174 can be thermally pressed on the gold layer 98 of the flexible circuit film 96 at a temperature of between 490 and 540° C., and preferably of between 500 and 520° C., for a time of between 1 and 10 seconds, and preferably of between 3 and 6 seconds. Alternatively, when the flexible circuit film 96 is bonded with the protruding regions 174 of the metal traces 172, the gold layer 98 of the flexible circuit film 96 can be thermally pressed on the top surface of the gold layer 170 of the metal traces 172 at the protruding regions 174 at a temperature of between 490 and 540° C., and preferably of between 500 and 520° C., for a time of between 1 and 10 seconds, and preferably of between 3 and 6 seconds. Thereby, a gold layer 100e formed by the joint of the gold layer 98 and the gold layer 170 can be between the nickel layer 168 of the metal traces 172 at the protruding regions 174 and the copper traces 84 of the flexible circuit film 96, wherein the gold layer 100e has a thickness t35 of between 1 and 10 micrometers, and preferably of between 3 and 6 micrometers.

After the protruding regions 174 of the metal traces 172 are connected to the copper traces 84 using a thermal pressing process, a polymer material 94, such as epoxy or polyimide, can be formed between the passivation layer 10 of the semiconductor chip 176 and the polymer layer 88 of the flexible circuit film 96, and enclosing the metal traces 172. Next, the polymer material 94 is cured at a temperature of between 150 and 250° C.

COG (Chip on Glass) Assembly—ACF/ACP

Referring to FIG. 16M, via a thermal pressing process, a top surface of the gold layer 170 of the metal traces 172 at the protruding regions 174 (only one of them is shown) is pressed into an anisotropic conductive film (ACF) or an anisotropic conductive paste (ACP) 102. Thus, metal particles 104 inside ACF or ACP 102 clusters between the top surface of the gold layer 170 of the metal traces 172 at the protruding regions 174 and multiple conductive traces 106 (only one of them is shown), such as indium tin oxide (ITO) or gold, on a glass substrate 108, leading the gold layer 170 of the metal traces 172 at the protruding regions 174 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the top surface of the gold layer 170 of the metal traces 172 at the protruding regions 174 may be pressed into ACF or ACP 102 preformed on a ceramic substrate or a printed circuit board to have metal particles 104 in the ACF or ACP 102 connecting the gold layer 170 of the metal traces 172 at the protruding regions 174 to multiple pads on the ceramic substrate or on the organic substrate.

COG (Chip on Glass) Assembly—NCF

Referring to FIG. 16N, via a thermal pressing process, a top surface of the gold layer 170 of the metal traces 172 at the protruding regions 174 (only one of them is shown) is pressed into a non-conductive film (NCF) 110, and the top surface of the gold layer 170 of the metal traces 172 at the protruding regions 174 contacts with multiple conductive traces 106 (only one of them is shown), such as indium tin oxide (ITO) or gold, on a glass substrate 108, leading the gold layer 170 of the metal traces 172 at the protruding regions 174 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the top surface of the gold layer 170 of the metal traces 172 at the protruding regions 174 may be pressed into NCF 110 preformed on a ceramic substrate or a printed circuit board to have the gold layer 170 of the metal traces 172 at the protruding regions 174 contacting with multiple pads on the ceramic substrate or on the organic substrate.

Embodiment 16

Figure 17A:
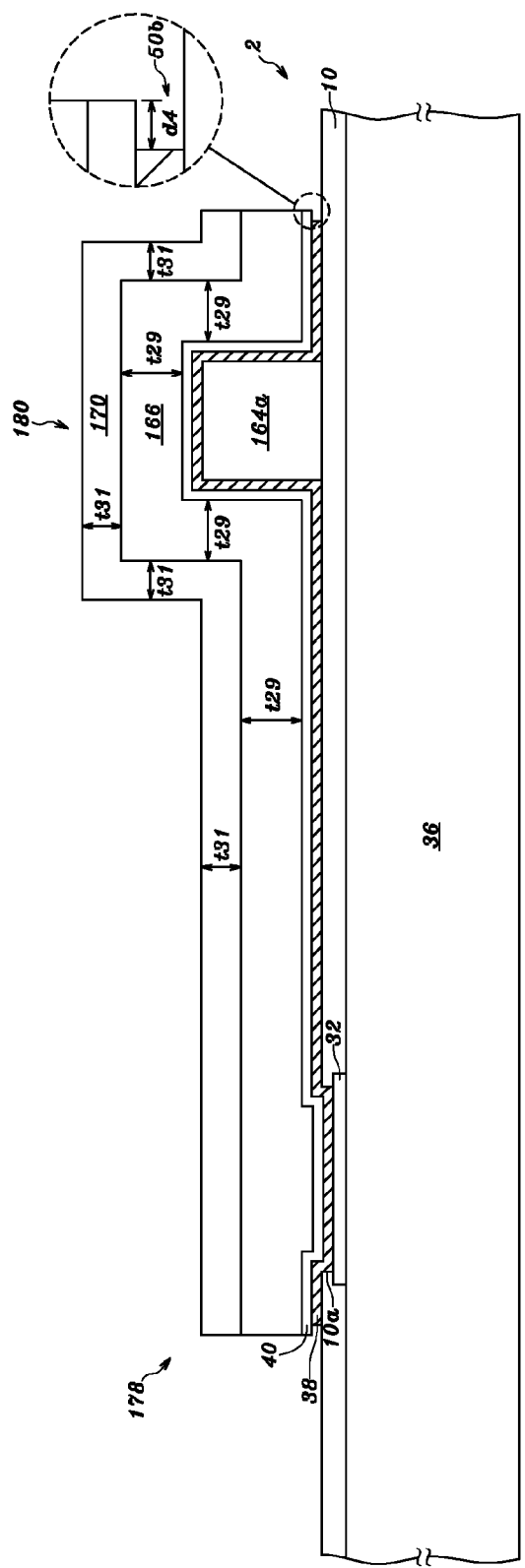
FIG. 17A and FIGS. 17C through 17I are cross-sectional views showing a process for fabricating one or more polymer bumps on a wafer, fabricating multiple metal traces on one or more polymer bumps and on the wafer, and packaging a chip singulated from the wafer according to one embodiment of the present invention.

Referring to FIG. 17A, multiple metal traces 178 (only one of them is shown) can be formed on the passivation layer 10, on one or more polymer bumps 164a and on the pads 32, such as aluminum pads or copper pads, exposed by the openings 10a. The process for forming the metal traces 178 can be performed by the above-mentioned steps as shown in FIGS. 16A-16D, followed by electroplating a copper layer 166 having a thickness of between 0.5 and 25 micrometers, and preferably of between 5 and 10 micrometers, on the seed layer 40 exposed by the openings 42a, and then electroplating a gold layer 170 having a thickness of between 0.5 and 10 micrometers, and preferably of between 3 and 6 micrometers, on the electroplated copper layer 166 in the openings 42a with a non-cyanide electroplating solution, such as a solution containing gold sodium sulfite ($Na_3Au(SO_3)_2$) or a solution containing gold ammonium sulfite (($NH_4)_3[Au(SO_3)_2]$), or with an electroplating solution containing cyanide, followed by the above-mentioned steps as shown in FIGS. 16F-16G.

Figure 17B:
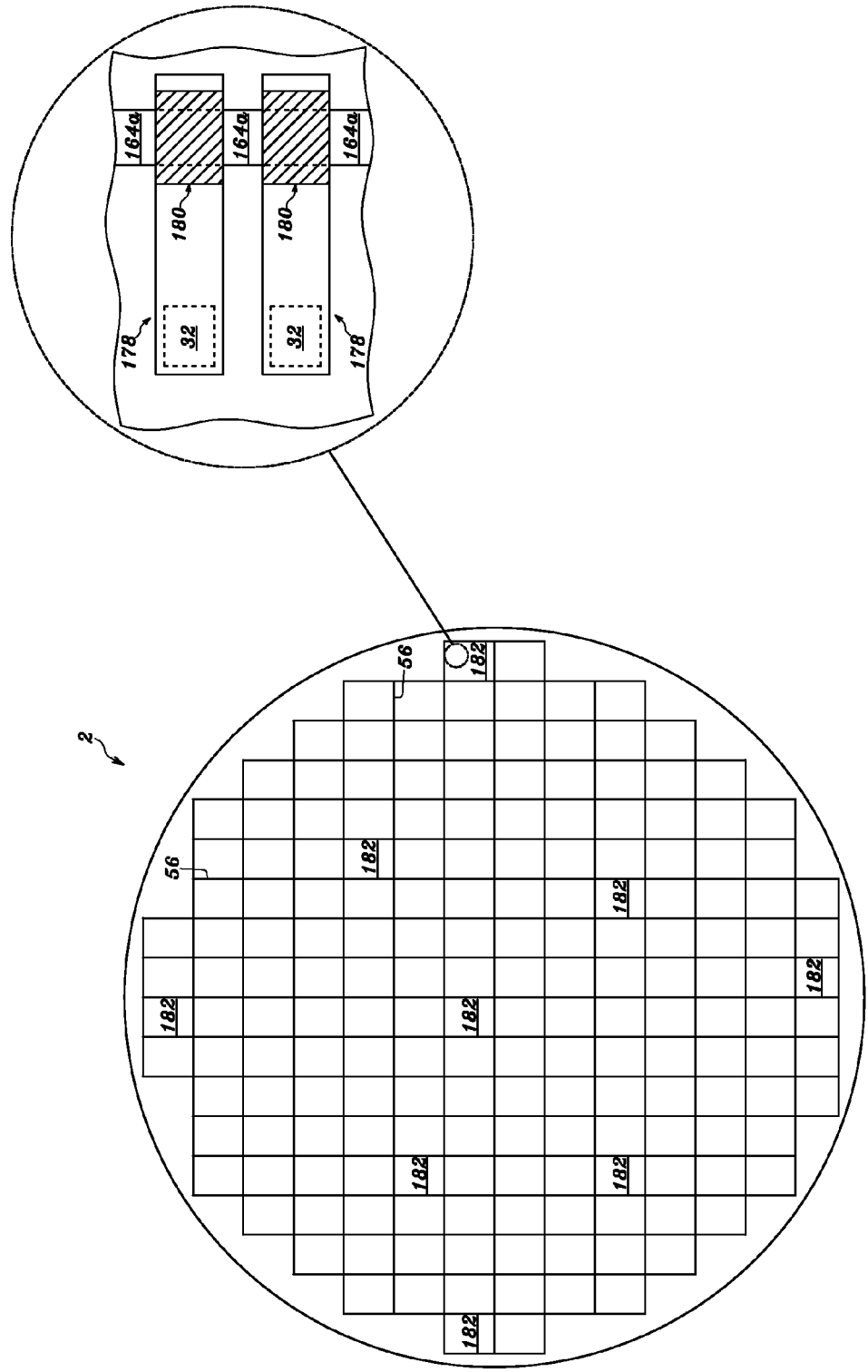
FIG. 17B is a top view showing a semiconductor wafer with one or more polymer bumps and multiple metal traces on one or more polymer bumps.
Figure 17C:
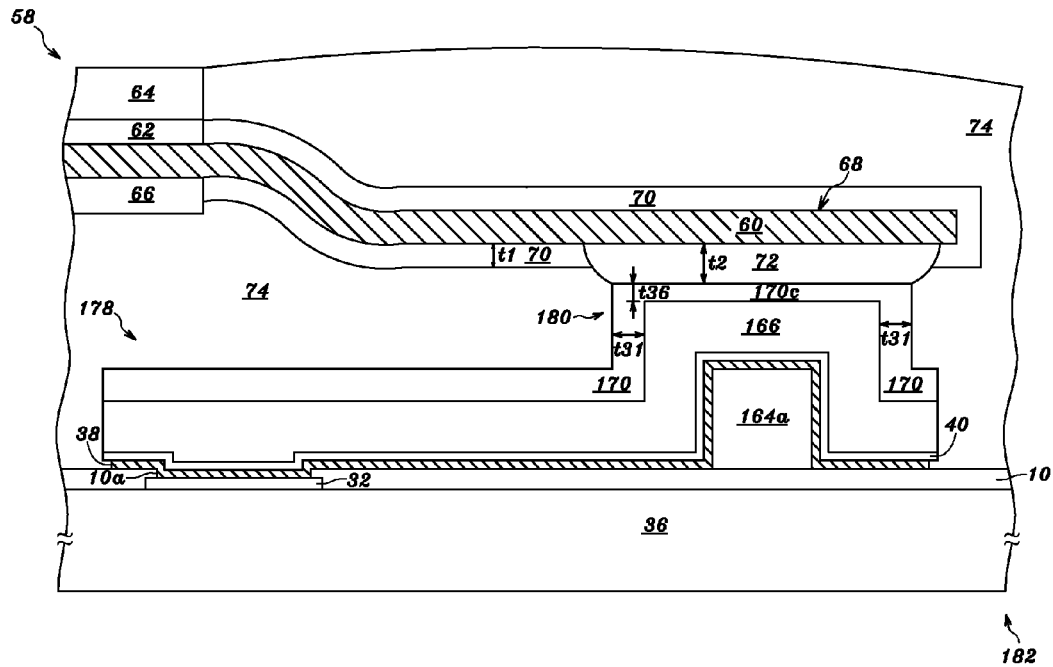
Figure 17D:
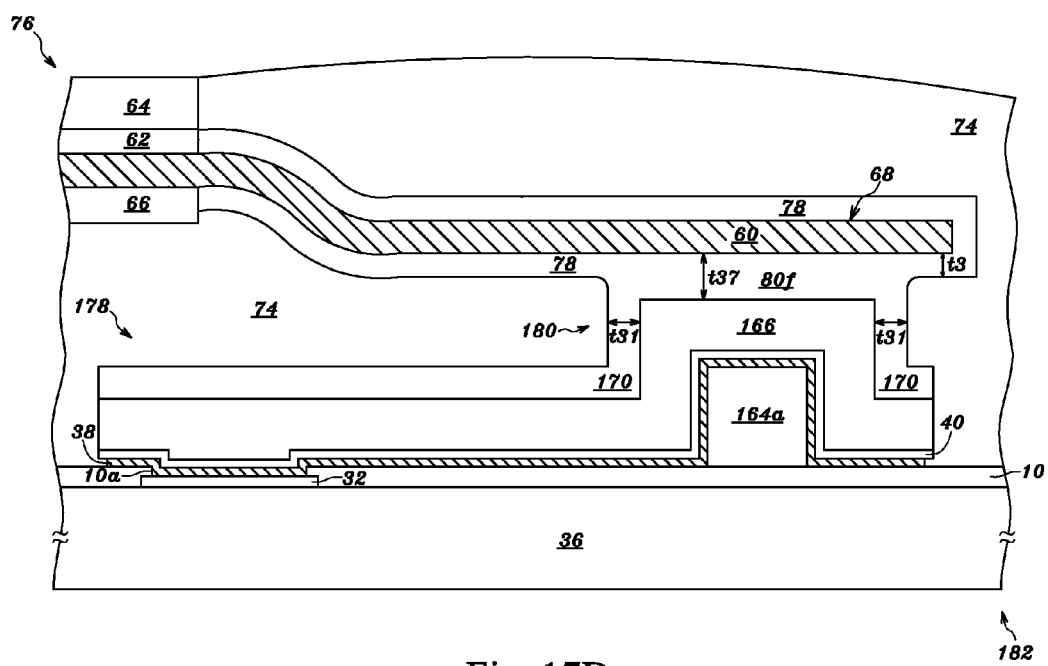
Figure 17E:
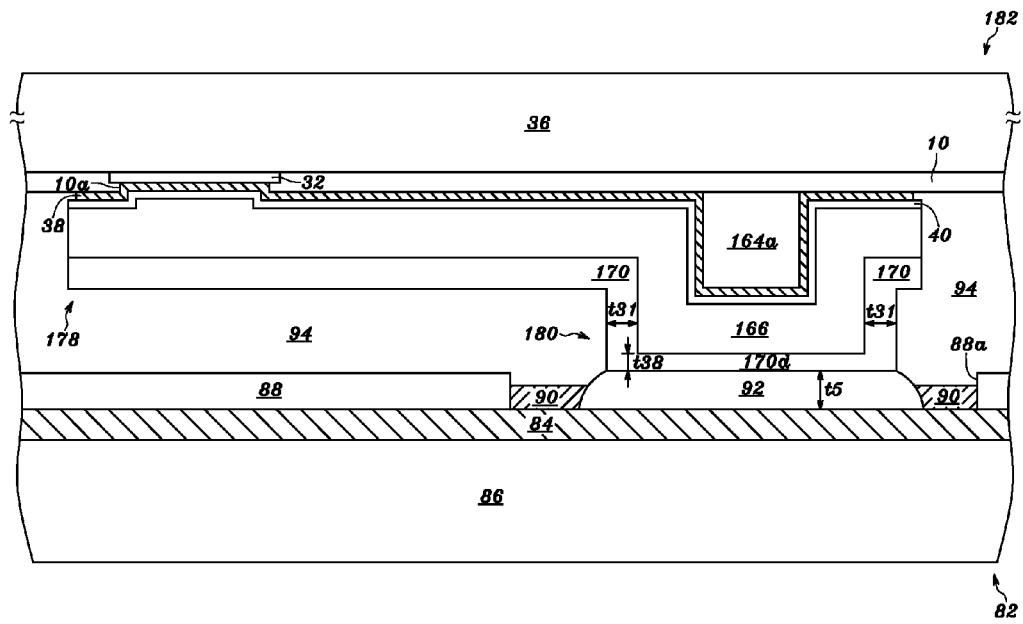
Figure 17F:
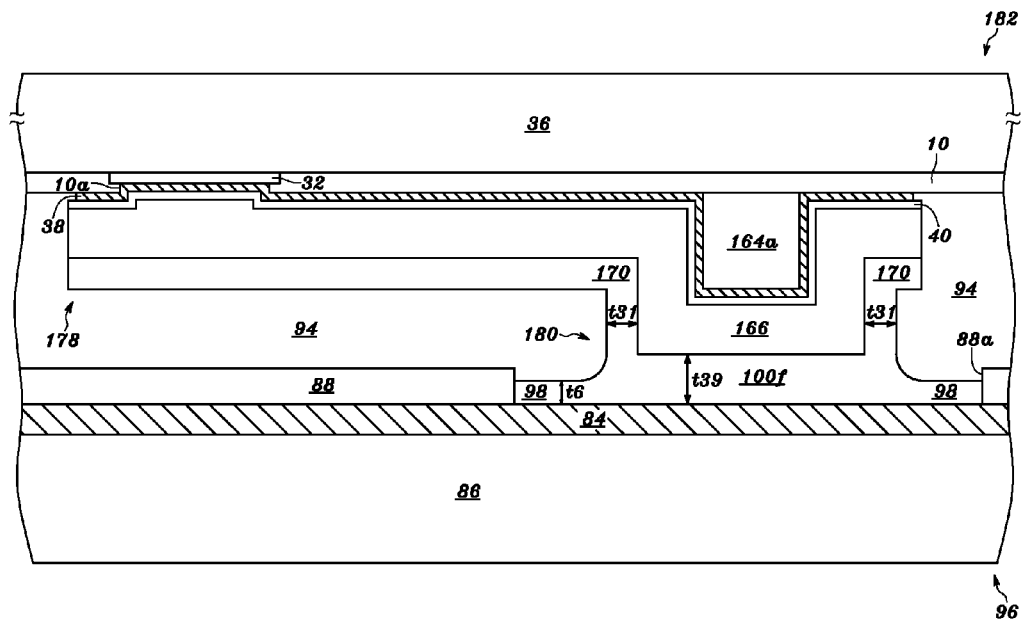
Figure 17G:
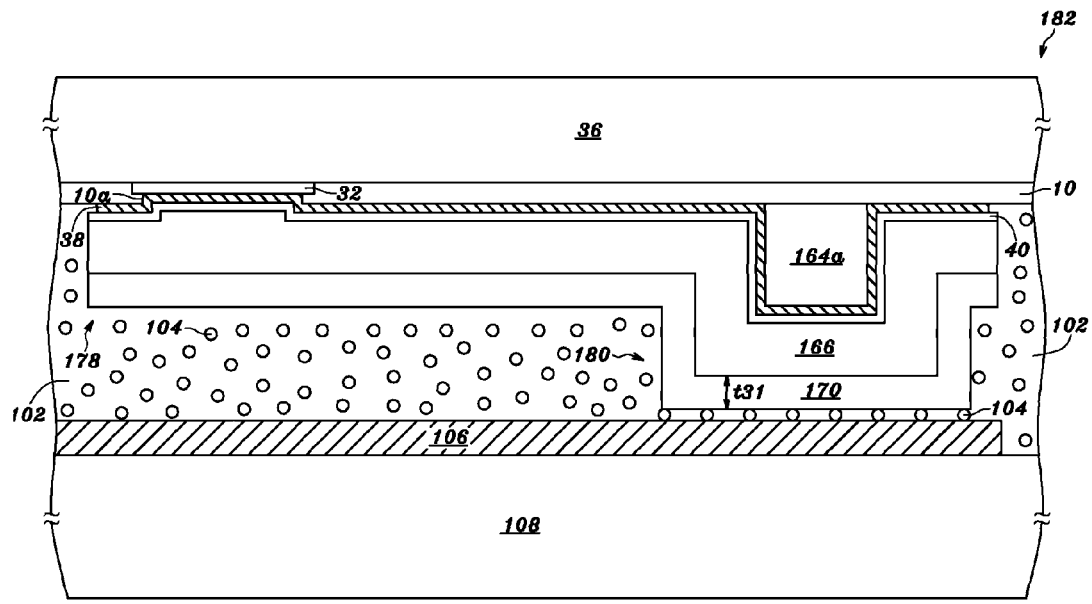
Figure 17H:
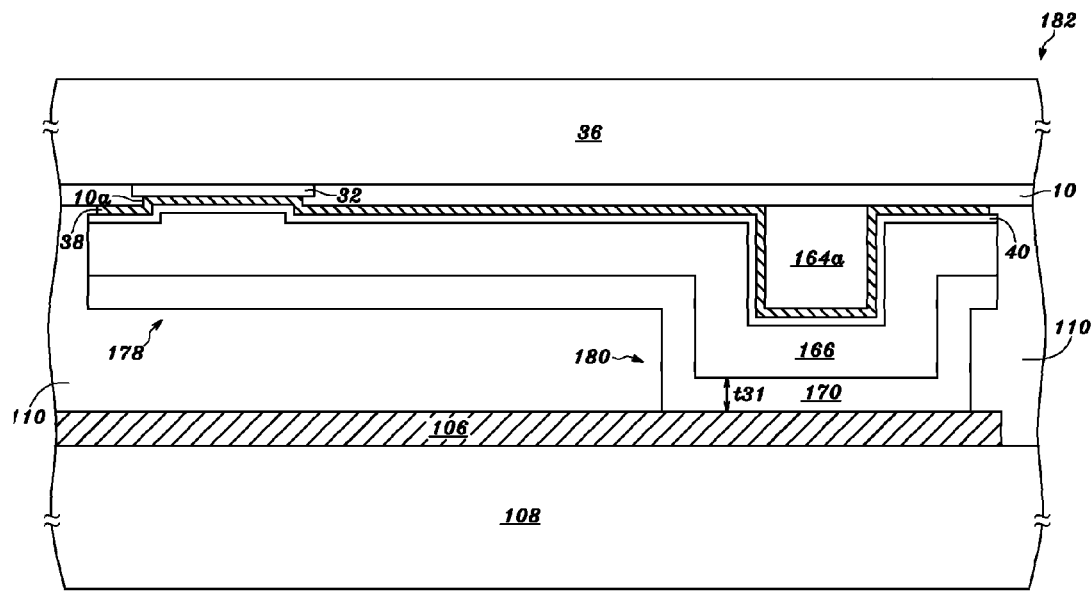
Figure 17I:
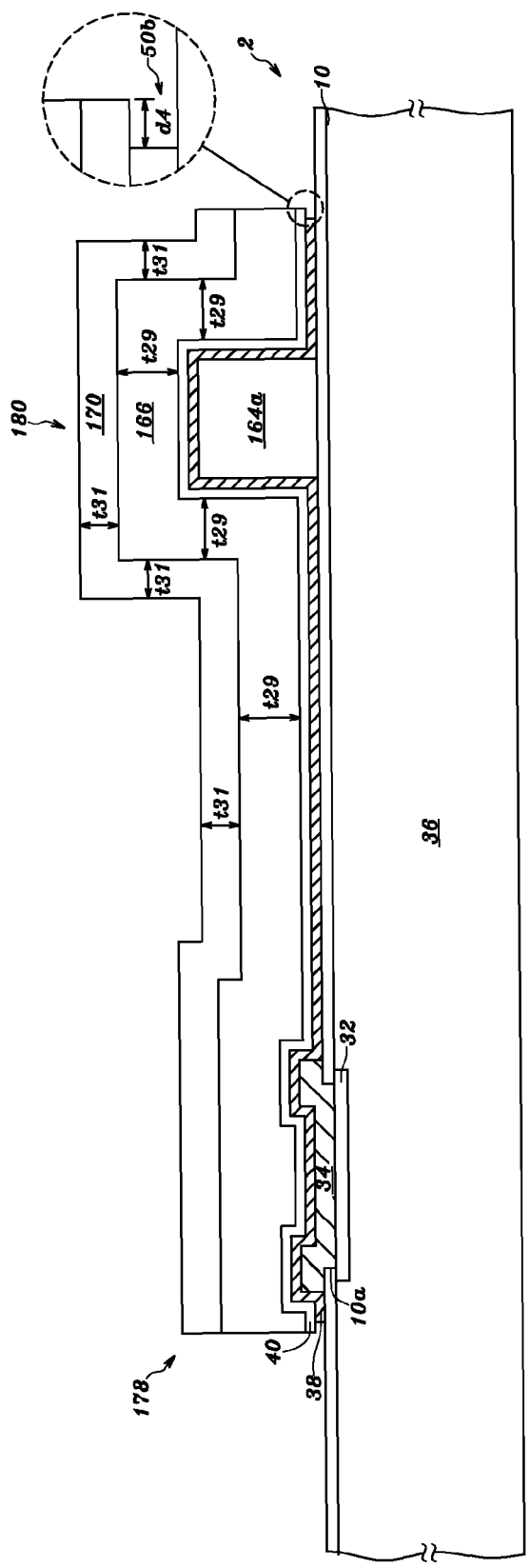

Alternatively, referring to FIG. 17I, when the metal caps 34, shown in FIG. 1B, are preformed on the pads 32, the metal traces 178 can be formed on the passivation layer 10, on one or more polymer bumps 164a and on the metal caps 34. The process for forming the metal traces 178 can be performed by forming an adhesion/barrier layer 38 having a thickness of between 0.02 and 0.5 µm, and preferably of between 0.25 and 0.35 µm, on the passivation layer 10, on the polymer bumps 164a and on the metal caps 34, followed by forming the seed layer 40, made of copper, having a thickness of between 0.03 and 1 µm, and preferably of between 0.05 and 0.2 µm, on the adhesion/barrier layer 38, followed by the above-mentioned step as shown in FIG. 16D, followed by electroplating a copper layer 166 having a thickness of between 0.5 and 25 micrometers, and preferably of between 5 and 10 micrometers, on the seed layer 40 exposed by the openings 42a, and then electroplating a gold layer 170 having a thickness of between 0.5 and 10 micrometers, and preferably of between 3 and 6 micrometers, on the electroplated copper layer 166 in the openings 42a with a non-cyanide electroplating solution, such as a solution containing gold sodium sulfite ($Na_3Au(SO_3)_2$) or a solution containing gold ammonium sulfite ((NH$_4$)$_3$[Au(SO$_3$)$_2$]), or with an electroplating solution containing cyanide, followed by the above-mentioned steps as shown in FIGS. 16F-16G.

Thereby, each of the metal traces 178 can be formed of the adhesion/barrier layer 38 on the passivation layer 10, on the pad 32 and on the polymer bump 164a, a copper layer (including the seed layer 40 and the electroplated copper layer 166), having a thickness of between 0.5 and 25 micrometers, and preferably of between 5 and 10 micrometers, on the adhesion/barrier layer 38 and the gold layer 170 on the copper layer. Alternatively, referring to FIG. 17I, when the metal caps 34, shown in FIG. 1B, are preformed on the pads 32, each of the metal traces 178 can be formed of the adhesion/barrier layer 38 on the passivation layer 10, on the metal cap 34 and on the polymer bump 164a, a copper layer (including the seed layer 40 and the electroplated copper layer 166), having a thickness of between 0.5 and 25 micrometers, and preferably of between 5 and 10 micrometers, on the adhesion/barrier layer 38 and the gold layer 170 on the copper layer.

Referring to FIGS. 17A-17B, each of the metal traces 178 comprises a protruding region 180 over the polymer bump 164a and over the passivation layer 10 near the polymer bump 164a. From a top perspective view, each of the polymer bumps 164a comprises a bar-shaped portion extending in a direction parallel with one of scribe lines 56 of the semiconductor wafer 2 or parallel with an edge of a chip after being cut from the semiconductor wafer 2, and the metal traces 178 have the protruding regions 180 extending across over one of the bar-shaped polymer bumps 164a and in a direction perpendicular to the direction in which said one of the bar-shaped polymer bumps 164a extends. Alternatively, the gold layer 170 of the metal traces 178 can be electroless plated with a thickness of between 500 and 5,000 angstroms for a COG structure or with a thickness of between 0.5 and 6 micrometers for a TCP or COF structure. Alternatively, the gold layer 170 can be replaced by a silver layer, having a thickness of between 1 and 10 μm, and preferably of between 3 and 6 μm, electroplated on the copper layer (including the seed layer 40 and the electroplated copper layer 166). Alternatively, the gold layer 170 can be replaced by a silver layer, having a thickness of between 500 and 5,000 angstroms or between 0.5 and 6 μm, electroless plated on the copper layer (including the seed layer 40 and the electroplated copper layer 166).

After the metal traces 178 are formed, the semiconductor wafer 2 can be cut into multiple chips 182. The detail can be referred as to FIG. 17B. Referring to FIG. 17B, the semiconductor wafer 2 includes multiple semiconductor chips 182 with scribe lines 56 between neighboring two of the semiconductor chips 182. The metal traces 178 of each semiconductor chips 182 are on the passivation layer 10, on one or more polymer bumps 164a and on the pads 32 exposed by the openings 10a. Alternatively, referring to FIG. 17I, when the metal caps 34, shown in FIG. 1B, are preformed on the pads 32, the metal traces 178 of each semiconductor chips 182 are on the passivation layer 10, on one or more polymer bumps 164a and on the metal caps 34. In a wafer dicing process, the semiconductor wafer 2 can be cut along the scribe lines 56 to separate the semiconductor chips 182.

TCP (Tape Carrier Package)—Gold to Tin Connection

Referring to FIG. 17C, the flexible circuit film 58 as mentioned in FIG. 2G can be bonded with the protruding regions 180 of the metal traces 178 (only one of them is shown). The specification of the flexible circuit film 58 shown in FIG. 17C can be referred to as the specification of the flexible circuit film 58 illustrated in FIG. 2G When the flexible circuit film 58 is bonded with the protruding regions 180 of the metal traces 178, the tin-containing layer 70 on a bottom surface of the inner leads 68 (only one of them is shown) can be thermally pressed on a top surface of the gold layer 170 of the metal traces 178 at the protruding regions 180 at a temperature of between 490 and 540° C., and preferably of between 500 and 520° C., for a time of between 1 and 10 seconds, and preferably of between 3 and 6 seconds. Thereby, a tin-alloy layer 72 containing gold can be formed between the remaining gold layer 170c of the metal traces 178 at the protruding regions 180 and the copper traces 60 of the flexible circuit film 58, wherein the remaining gold layer 170c has a thickness t36 of between 0.2 and 6 micrometers, and preferably of between 1.5 and 4 micrometers. The tin-alloy layer 72 has a thickness t2 of between 0.5 and 10 micrometers, of between 1 and 5 micrometers or of between 1.5 and 3 micrometers. When the tin-containing layer 70 before bonded with the gold layer 170 is pure tin, the tin-alloy layer 72 is tin-gold alloy having a thickness t2 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 70 before bonded with the gold layer 170 is tin-silver alloy, the tin-alloy layer 72 is tin-silver-gold alloy having a thickness t2 of between 0.5 and 10 micrometers, of between 1 and 5 micrometers or of between 1.5 and 3 micrometers. When the tin-containing layer 70 before bonded with the gold layer 170 is tin-silver-copper alloy, the tin-alloy layer 72 is tin-silver-gold-copper alloy having a thickness t2 of between 0.5 and 10 micrometers, of between 1 and 5 micrometers or of between 1.5 and 3 micrometers.

After the protruding regions 180 of the metal traces 178 are connected to the tin-containing layer 70 on the bottom surface of the inner leads 68 using a thermal pressing process, a polymer material 74, such as epoxy or polyimide, can be formed between the semiconductor chip 182 and the tin-containing layer 70 on the bottom surface of the inner leads 68, and enclosing the metal traces 178. Next, the polymer material 74 is cured at a temperature of between 150 and 250° C.

In the FIG. 17C, the copper traces 60 can be replaced by multiple gold traces having a thickness of between 3 and 30 μm, and preferably of between 5 and 20 μm. Alternatively, the copper traces 60 can be replaced by multiple silver traces having a thickness of between 3 and 30 μm, and preferably of between 5 and 20 μm.

TCP (Tape Carrier Package)—Gold to Gold Connection

Referring to FIG. 17D, the flexible circuit film 76 as mentioned in FIG. 2I can be bonded with the protruding regions 180 of the metal traces 178 (only one of them is shown). The specification of the flexible circuit film 76 shown in FIG. 17D can be referred to as the specification of the flexible circuit film 76 illustrated in FIG. 2I. When the flexible circuit film 76 is bonded with the protruding regions 180 of the metal traces 178, the gold layer 78 on a bottom surface of the inner leads 68 (only one of them is shown) can be thermally pressed on a top surface of the gold layer 170 of the metal traces 178 at the protruding regions 180 at a temperature of between 490 and 540° C., and preferably of between 500 and 520° C., for a time of between 1 and 10 seconds, and preferably of between 3 and 6 seconds. Thereby, a gold layer 80f formed by the joint of the gold layer 78 and the gold layer 170 can be between the copper layer 166 of the metal traces 178 at the protruding regions 180 and the copper traces 60 of the flexible circuit film 76, wherein the gold layer 80f has a thickness t37 of between 1 and 10 micrometers, and preferably of between 3 and 6 micrometers.

After the protruding regions 180 of the metal traces 178 are connected to the copper traces 60 using a thermal pressing process, a polymer material 74, such as epoxy or polyimide, can be formed between the semiconductor chip 182 and the gold layer 78 on the bottom surface of the inner leads 68, and enclosing the metal traces 178. Next, the polymer material 74 is cured at a temperature of between 150 and 250° C.

COF (Chip on Film) Package—Gold to Tin Connection

Referring to FIG. 17E, the flexible circuit film 82 as mentioned in FIG. 2K can be bonded with the protruding regions 180 of the metal traces 178 (only one of them is shown). The specification of the flexible circuit film 82 shown in FIG. 17E can be referred to as the specification of the flexible circuit film 82 illustrated in FIG. 2K. When the flexible circuit film 82 is bonded with the protruding regions 180 of the metal traces 178, a top surface of the gold layer 170 of the metal traces 178 at the protruding regions 180 can be thermally pressed on the tin-containing layer 90 of the flexible circuit film 82 at a temperature of between 490 and 540° C., and preferably of between 500 and 520° C., for a time of between 1 and 10 seconds, and preferably of between 3 and 6 seconds. Alternatively, when the flexible circuit film 82 is bonded with the protruding regions 180 of the metal traces 178, the tin-containing layer 90 of the flexible circuit film 82 can be thermally pressed on the top surface of the gold layer 170 of the metal traces 178 at the protruding regions 180 at a temperature of between 490 and 540° C., and preferably of between 500 and 520° C., for a time of between 1 and 10 seconds, and preferably of between 3 and 6 seconds. Thereby, a tin-alloy layer 92 containing gold can be formed between the remaining gold layer 170d of the metal traces 178 at the protruding regions 180 and the copper traces 84 of the flexible circuit film 82, wherein the remaining gold layer 170d has a thickness t38 of between 0.2 and 6 micrometers, and preferably of between 1.5 and 4 micrometers. The tin-alloy layer 92 has a thickness t5 of between 0.5 and 10 micrometers, of between 1 and 5 micrometers or of between 1.5 and 3 micrometers. When the tin-containing layer 90 before bonded with the gold layer 170 is pure tin, the tin-alloy layer 92 is tin-gold alloy having a thickness t5 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 90 before bonded with the gold layer 170 is tin-silver alloy, the tin-alloy layer 92 is tin-silver-gold alloy having a thickness t5 of between 0.5 and 10 micrometers, of between 1 and 5 micrometers or of between 1.5 and 3 micrometers. When the tin-containing layer 90 before bonded with the gold layer 170 is tin-silver-copper alloy, the tin-alloy layer 92 is tin-silver-gold-copper alloy having a thickness t5 of between 0.5 and 10 micrometers, of between 1 and 5 micrometers or of between 1.5 and 3 micrometers.

After the protruding regions 180 of the metal traces 178 are connected to the copper traces 84 using a thermal pressing process, a polymer material 94, such as epoxy or polyimide, can be formed between the passivation layer 10 of the semiconductor chip 182 and the polymer layer 88 of the flexible circuit film 82, and enclosing the metal traces 178. Next, the polymer material 94 is cured at a temperature of between 150 and 250° C.

In the FIG. 17E, the copper traces 84 can be replaced by multiple gold traces having a thickness of between 3 and 30 μm, and preferably of between 5 and 20 μm. Alternatively, the copper traces 84 can be replaced by multiple silver traces having a thickness of between 3 and 30 μm, and preferably of between 5 and 20 μm.

COF (Chip on Film) Package—Gold to Gold Connection

Referring to FIG. 17F, the flexible circuit film 96 as mentioned in FIG. 2M can be bonded with the protruding regions 180 of the metal traces 178 (only one of them is shown). The specification of the flexible circuit film 96 shown in FIG. 17F can be referred to as the specification of the flexible circuit film 96 illustrated in FIG. 2M. When the flexible circuit film 96 is bonded with the protruding regions 180 of the metal traces 178, a top surface of the gold layer 170 of the metal traces 178 at the protruding regions 180 can be thermally pressed on the gold layer 98 of the flexible circuit film 96 at a temperature of between 490 and 540° C., and preferably of between 500 and 520° C., for a time of between 1 and 10 seconds, and preferably of between 3 and 6 seconds. Alternatively, when the flexible circuit film 96 is bonded with the protruding regions 180 of the metal traces 178, the gold layer 98 of the flexible circuit film 96 can be thermally pressed on the top surface of the gold layer 170 of the metal traces 178 at the protruding regions 180 at a temperature of between 490 and 540° C., and preferably of between 500 and 520° C., for a time of between 1 and 10 seconds, and preferably of between 3 and 6 seconds. Thereby, a gold layer 100f formed by the joint of the gold layer 98 and the gold layer 170 can be between the copper layer 166 of the metal traces 178 at the protruding regions 180 and the copper traces 84 of the flexible circuit film 96, wherein the gold layer 100f has a thickness t39 of between 1 and 10 micrometers, and preferably of between 3 and 6 micrometers.

After the protruding regions 180 of the metal traces 178 are connected to the copper traces 84 using a thermal pressing process, a polymer material 94, such as epoxy or polyimide, can be formed between the passivation layer 10 of the semiconductor chip 182 and the polymer layer 88 of the flexible circuit film 96, and enclosing the metal traces 178. Next, the polymer material 94 is cured at a temperature of between 150 and 250° C.

COG (Chip on Glass) Assembly—ACF/ACP

Referring to FIG. 17G, via a thermal pressing process, a top surface of the gold layer 170 of the metal traces 178 at the protruding regions 180 (only one of them is shown) is pressed into an anisotropic conductive film (ACF) or an anisotropic conductive paste (ACP) 102. Thus, metal particles 104 inside ACF or ACP 102 clusters between the top surface of the gold layer 170 of the metal traces 178 at the protruding regions 180 and multiple conductive traces 106 (only one of them is shown), such as indium tin oxide (ITO) or gold, on a glass substrate 108, leading the gold layer 170 of the metal traces 178 at the protruding regions 180 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the top surface of the gold layer 170 of the metal traces 178 at the protruding regions 180 may be pressed into ACF or ACP 102 preformed on a ceramic substrate or a printed circuit board to have metal particles 104 in the ACF or ACP 102 connecting the gold layer 170 of the metal traces 178 at the protruding regions 180 to multiple pads on the ceramic substrate or on the organic substrate.

COG (Chip on Glass) Assembly—NCF

Referring to FIG. 17H, via a thermal pressing process, a top surface of the gold layer 170 of the metal traces 178 at the protruding regions 180 (only one of them is shown) is pressed into a non-conductive film (NCF) 110, and the top surface of the gold layer 170 of the metal traces 178 at the protruding regions 180 contacts with multiple conductive traces 106 (only one of them is shown), such as indium tin oxide (ITO) or gold, on a glass substrate 108, leading the gold layer 170 of the metal traces 178 at the protruding regions 180 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the top surface of the gold layer 170 of the metal traces 178 at the protruding regions 180 may be pressed into NCF 110 preformed on a ceramic substrate or a printed circuit board to have the gold layer 170 of the metal traces 178 at the protruding regions 180 contacting with multiple pads on the ceramic substrate or on the organic substrate.

Embodiment 17

Figure 18A:
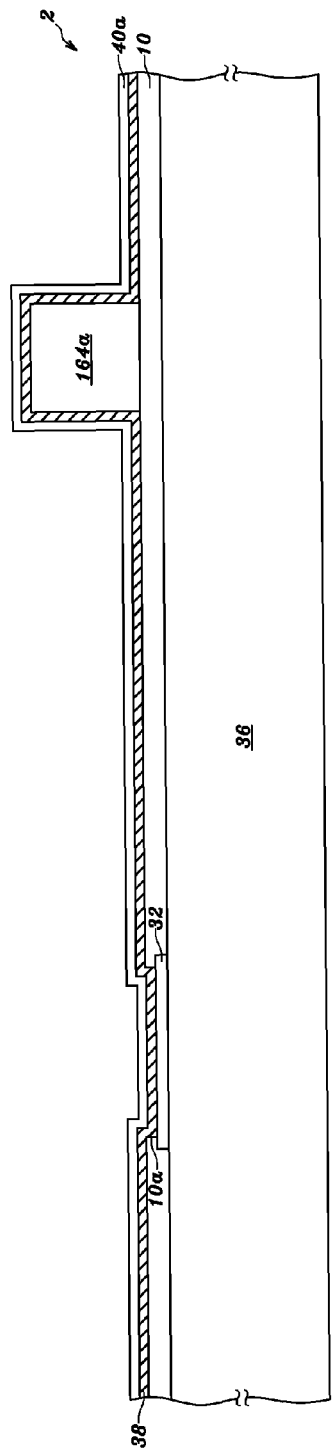

Referring to FIG. 18A, after the step shown in FIG. 16B, an adhesion/barrier layer 38 having a thickness of between 0.02 and 0.5 µm, and preferably of between 0.25 and 0.35 µm, can be formed on the polymer bumps 164a, on the passivation layer 10 and on the pads 32, such as aluminum pads or copper pads, exposed by the openings 10a. Alternatively, referring to FIG. 18M, when the metal caps 34, shown in FIG. 1B, are preformed on the pads 32, the adhesion/barrier layer 38 having a thickness of between 0.02 and 0.5 µm, and preferably of between 0.25 and 0.35 µm, can be formed on the polymer bumps 164a, on the passivation layer 10 and on the metal caps 34. The specification of the adhesion/barrier layer 38 shown in FIG. 18A can be referred to as the specification of the adhesion/barrier layer 38 illustrated in FIG. 16C. The process of forming the adhesion/barrier layer 38, as shown in FIG. 18A, can be referred to as the process of forming the adhesion/barrier layer 38, as illustrated in FIG. 16C.

Next, a seed layer 40a, made of gold, having a thickness of between 0.03 and 1 µm, and preferably of between 0.05 and 0.2 µm, can be formed on the adhesion/barrier layer 38. The seed layer 40a can be formed by a physical vapor deposition (PVD) process, such as a sputtering process or an evaporation process, or a chemical vapor deposition (CVD) process. For example, when the adhesion/barrier layer 38 is formed by sputtering a titanium layer with a thickness of between 0.02 and 0.5 µm, and preferably of between 0.25 and 0.35 µm, the seed layer 40a can be formed by sputtering a gold layer with a thickness of between 0.03 and 1 µm, and preferably of between 0.05 and 0.2 µm, on the titanium layer. When the adhesion/barrier layer 38 is formed by sputtering a titanium-tungsten-alloy layer with a thickness of between 0.02 and 0.5 µm, and preferably of between 0.25 and 0.35 µm, the seed layer 40a can be formed by sputtering a gold layer with a thickness of between 0.03 and 1 µm, and preferably of between 0.05 and 0.2 µm, on the titanium-tungsten-alloy layer. When the adhesion/barrier layer 38 is formed by sputtering a tantalum layer with a thickness of between 0.02 and 0.5 µm, and preferably of between 0.25 and 0.35 µm, the seed layer 40a can be formed by sputtering a gold layer with a thickness of between 0.03 and 1 µm, and preferably of between 0.05 and 0.2 µm, on the tantalum layer. When the adhesion/barrier layer 38 is formed by sputtering a tantalum-nitride layer with a thickness of between 0.02 and 0.5 µm, and preferably of between 0.25 and 0.35 µm, the seed layer 40a can be formed by sputtering a gold layer with a thickness of between 0.03 and 1 µm, and preferably of between 0.05 and 0.2 µm, on the tantalum-nitride layer. When the adhesion/barrier layer 38 is formed by sputtering a titanium layer and then sputtering a titanium-tungsten-alloy layer on the titanium layer, the seed layer 40a can be formed by sputtering a gold layer with a thickness of between 0.03 and 1 µm, and preferably of between 0.05 and 0.2 µm, on the titanium-tungsten-alloy layer.

Figure 18B:
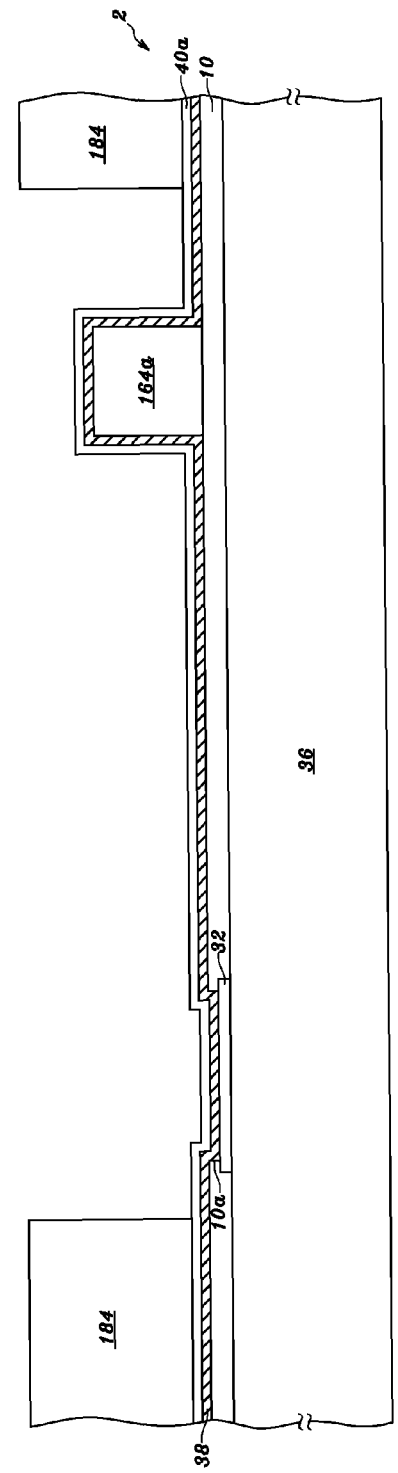

Referring to FIG. 18B, a photoresist layer 184, such as positive-type photoresist layer, having a thickness of between 1 and 25 micrometers, and preferably of between 5 and 10 micrometers, is spin-on coated on the seed layer 40a. Next, the photoresist layer 184 is patterned with the processes of exposure and development to form openings 184a (only one of them is shown) in the photoresist layer 184 exposing the seed layer 40a. A 1× stepper or 1× contact aligner can be used to expose the photoresist layer 184 during the process of exposure.

For example, the photoresist layer 184 can be formed by spin-on coating a positive-type photosensitive polymer layer having a thickness of between 1 and 25 µm, and preferably of between 5 and 10 µm, on the seed layer 40a, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the seed layer 40a with an $O_2$ plasma or a plasma containing fluorine of below 200 PPM and oxygen, such that the photoresist layer 184 can be patterned with the openings 184a in the photoresist layer 184 exposing the seed layer 40a.

Referring to FIG. 18C, a gold layer 186 having a thickness t40 of between 0.5 and 25 micrometers, and preferably of between 5 and 10 micrometers, can be electroplated on the seed layer 40a exposed by the openings 184a with a non-cyanide electroplating solution, such as a solution containing gold sodium sulfite ($Na_3Au(SO_3)_2$) or a solution containing gold ammonium sulfite (($NH_4)_3[Au(SO_3)_2]$), or with an electroplating solution containing cyanide. Alternatively, the gold layer 186 can be electroless plated with a thickness of between 500 and 5,000 angstroms for a COG structure or with a thickness of between 0.5 and 6 micrometers for a TCP or COF structure.

Referring to FIG. 18D, after the gold layer 186 is formed, most of the photoresist layer 184 can be removed using an organic solution with amide. However, some residuals from the photoresist layer 184 could remain on the gold layer 186 and on the seed layer 40a. Thereafter, the residuals can be removed from the gold layer 186 and from the seed layer 40a with a plasma, such as $O_2$ plasma or plasma containing fluorine of below 200 PPM and oxygen.

Figure 18E:
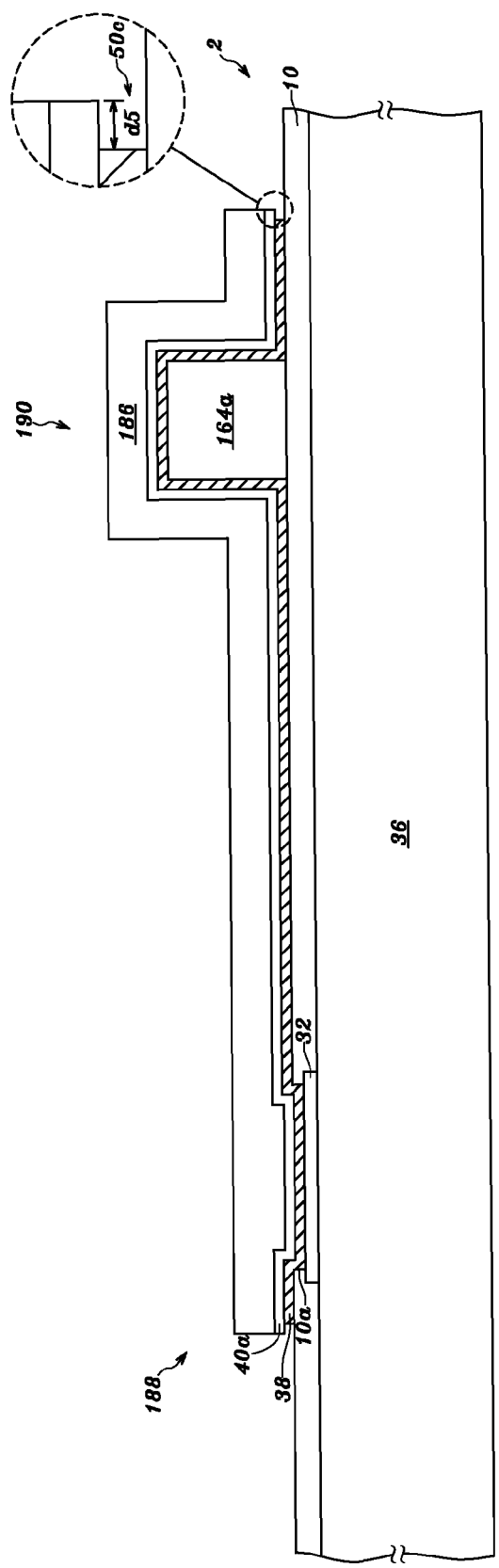

Referring to FIG. 18E, the seed layer 40a and the adhesion/barrier layer 38 not under the electroplated gold layer 186 are subsequently removed with a wet etching method or a dry etching method, such as an Ar sputtering etching process. As to the wet etching method, the seed layer 40a, made of gold, can be etched with an iodine-containing solution, such as solution containing potassium iodide. When the adhesion/barrier layer 38 is a titanium-tungsten-alloy layer, it can be etched with a solution containing hydrogen peroxide or with a solution containing $NH_4OH$ and hydrogen peroxide; when the adhesion/barrier layer 38 is a titanium layer, it can be etched with a solution containing hydrogen fluoride or with a solution containing $NH_4OH$ and hydrogen peroxide.

Multiple undercuts 50c (only one of them is shown) are formed under the seed layer 40a and under the electroplated gold layer 186 when the adhesion/barrier layer 38 not under the electroplated gold layer 186 is removed using a wet etching method. The adhesion/barrier layer 38 under the electroplated gold layer 186 has a first sidewall recessed from a second sidewall of the seed layer 40a, wherein a distance d5 between the first sidewall and the second sidewall is between 0.3 and 2 micrometers.

Thereby, in the present invention, multiple metal traces 188 (only one of them is shown) can be formed on the passivation layer 10, on one or more polymer bumps 164a and on the pads 32, such as aluminum pads or copper pads, exposed by the openings 10a. Each of the metal traces 188 can be formed of the adhesion/barrier layer 38 on the passivation layer 10, on the pad 32 and on the polymer bump 164a and a gold layer (including the seed layer 40a and the electroplated gold layer 186), having a thickness of between 0.5 and 25 micrometers, and preferably of between 5 and 10 micrometers, on the adhesion/barrier layer 38. Alternatively, referring to FIG. 18M, when the metal caps 34, shown in FIG. 1B, are preformed on the pads 32, the metal traces 188 can be formed on the passivation layer 10, on one or more polymer bumps 164a and on the metal caps 34, that is, each of the metal traces 188 can be formed of the adhesion/barrier layer 38 on the passivation layer 10, on the metal cap 34 and on the polymer bump 164a and a gold layer (including the seed layer 40a and the electroplated gold layer 186), having a thickness of between 0.5 and 25 micrometers, and preferably of between 5 and 10 micrometers, on the adhesion/barrier layer 38.

Figure 18F:
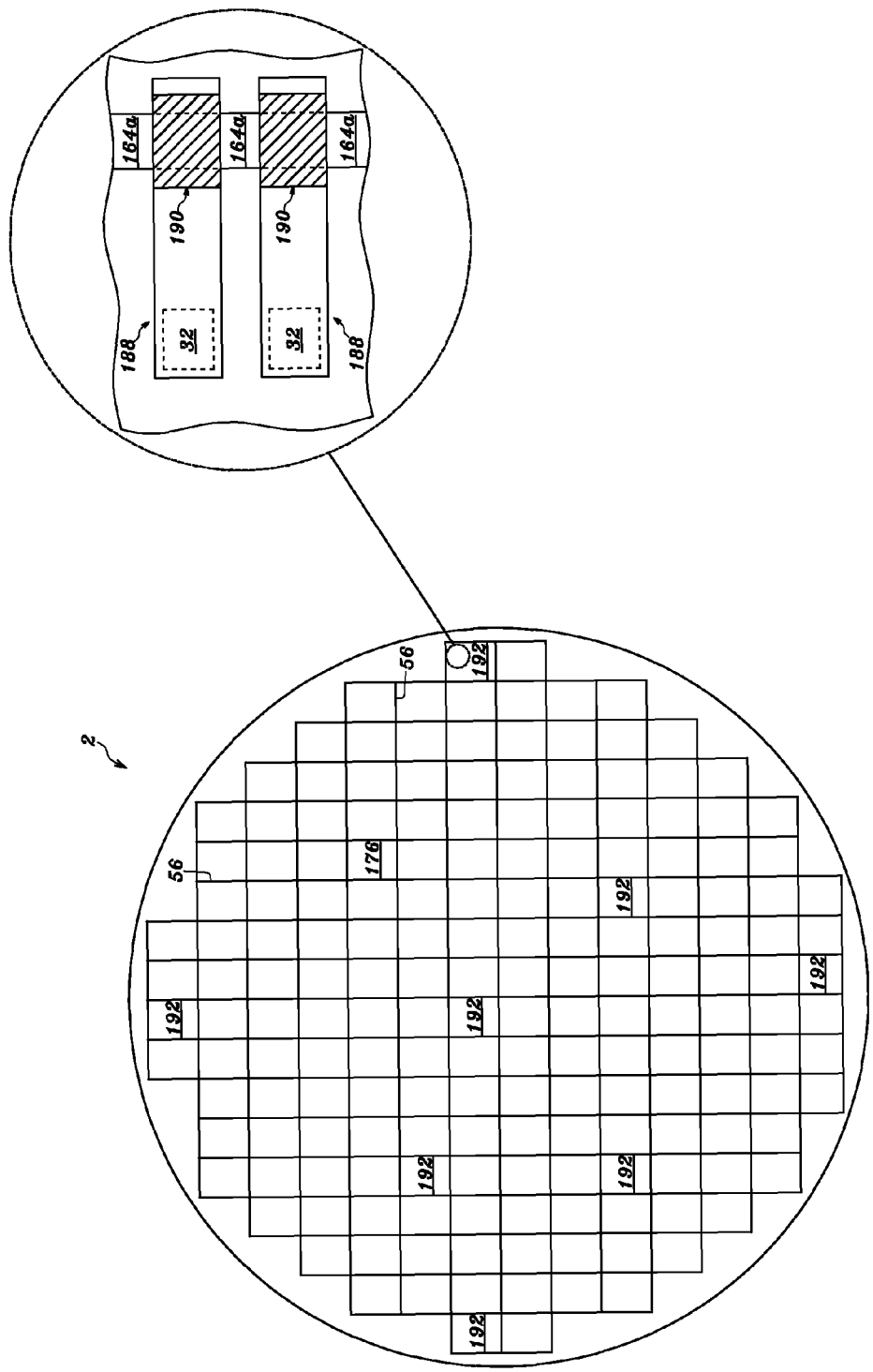
FIG. 18F is a top view showing a semiconductor wafer with one or more polymer bumps and multiple metal traces on one or more polymer bumps.

Referring to FIGS. 18E-18F, each of the metal traces 188 comprises a protruding region 190 over the polymer bump 164a and over the passivation layer 10 near the polymer bump 164a. From a top perspective view, each of the polymer bumps 164a comprises a bar-shaped portion extending in a direction parallel with one of scribe lines 56 of the semiconductor wafer 2 or parallel with an edge of a chip after being cut from the semiconductor wafer 2, and the metal traces 188 have the protruding regions 190 extending across over one of the bar-shaped polymer bumps 164a and in a direction perpendicular to the direction in which said one of the bar-shaped polymer bumps 164a extends.

After the metal traces 188 are formed, the semiconductor wafer 2 can be cut into multiple chips 192. The detail can be referred as to FIG. 18F. Referring to FIG. 18F, the semiconductor wafer 2 includes multiple semiconductor chips 192 with the scribe lines 56 between neighboring two of the semiconductor chips 192. The metal traces 188 of each semiconductor chips 192 are on the passivation layer 10, on one or more polymer bumps 164a and on the pads 32 exposed by the openings 10a. Alternatively, referring to FIG. 16O, when the metal caps 34, shown in FIG. 1B, are preformed on the pads 32, the metal traces 188 of each semiconductor chips 192 are on the passivation layer 10, on one or more polymer bumps 164a and on the metal caps 34. In a wafer dicing process, the semiconductor wafer 2 can be cut along the scribe lines 56 to separate the semiconductor chips 192.

TCP (Tape Carrier Package)—Gold to Tin Connection

Figure 18G:
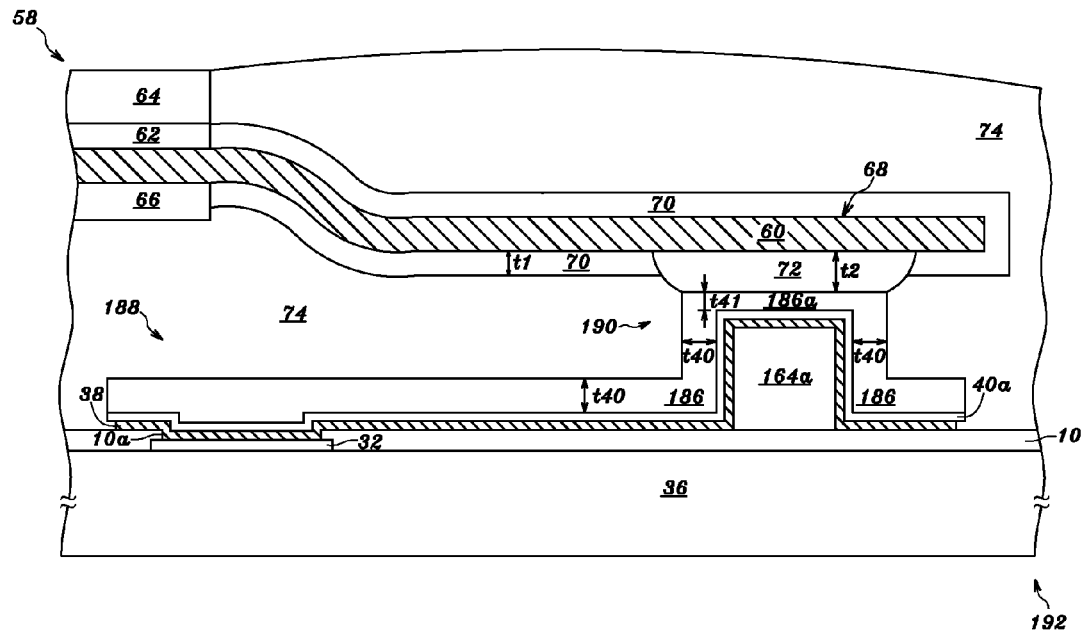

Referring to FIG. 18G, the flexible circuit film 58 as mentioned in FIG. 2G can be bonded with the protruding regions 190 of the metal traces 188 (only one of them is shown). The specification of the flexible circuit film 58 shown in FIG. 18G can be referred to as the specification of the flexible circuit film 58 illustrated in FIG. 2G When the flexible circuit film 58 is bonded with the protruding regions 190 of the metal traces 188, the tin-containing layer 70 on a bottom surface of the inner leads 68 (only one of them is shown) can be thermally pressed on a top surface of the gold layer 186 of the metal traces 188 at the protruding regions 190 at a temperature of between 490 and 540° C., and preferably of between 500 and 520° C., for a time of between 1 and 10 seconds, and preferably of between 3 and 6 seconds. Thereby, a tin-alloy layer 72 containing gold can be formed between the remaining gold layer 186a of the metal traces 188 at the protruding regions 190 and the copper traces 60 of the flexible circuit film 58, wherein the remaining gold layer 186a has a thickness t41 of between 0.1 and 20 micrometers, and preferably of between 1 and 10 micrometers. The tin-alloy layer 72 has a thickness t2 of between 0.5 and 10 micrometers, of between 1 and 5 micrometers or of between 1.5 and 3 micrometers. When the tin-containing layer 70 before bonded with the gold layer 186 is pure tin, the tin-alloy layer 72 is tin-gold alloy having a thickness t2 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 70 before bonded with the gold layer 186 is tin-silver alloy, the tin-alloy layer 72 is tin-silver-gold alloy having a thickness t2 of between 0.5 and 10 micrometers, of between 1 and 5 micrometers or of between 1.5 and 3 micrometers. When the tin-containing layer 70 before bonded with the gold layer 186 is tin-silver-copper alloy, the tin-alloy layer 72 is tin-silver-gold-copper alloy having a thickness t2 of between 0.5 and 10 micrometers, of between 1 and 5 micrometers or of between 1.5 and 3 micrometers.

After the protruding regions 190 of the metal traces 188 are connected to the tin-containing layer 70 on the bottom surface of the inner leads 68 using a thermal pressing process, a polymer material 74, such as epoxy or polyimide, can be formed between the semiconductor chip 192 and the tin-containing layer 70 on the bottom surface of the inner leads 68, and enclosing the metal traces 188. Next, the polymer material 74 is cured at a temperature of between 150 and 250° C.

In the FIG. 18G, the copper traces 60 can be replaced by multiple gold traces having a thickness of between 3 and 30 μm, and preferably of between 5 and 20 μm. Alternatively, the copper traces 60 can be replaced by multiple silver traces having a thickness of between 3 and 30 μm, and preferably of between 5 and 20 μm.

TCP (Tape Carrier Package)—Gold to Gold Connection

Figure 18H:
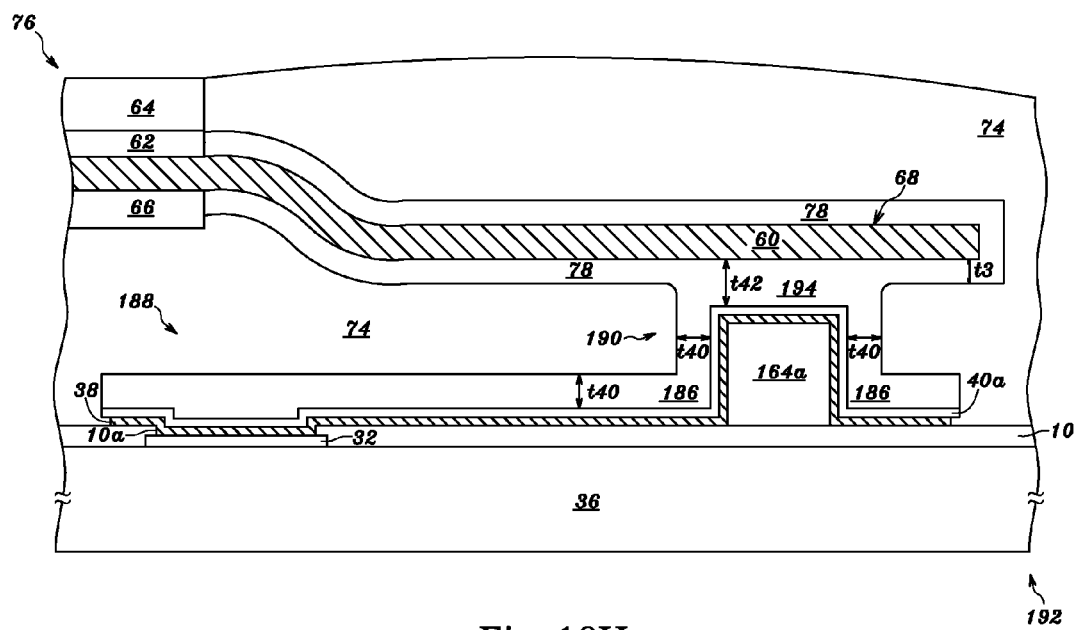

Referring to FIG. 18H, the flexible circuit film 76 as mentioned in FIG. 2I can be bonded with the protruding regions 190 of the metal traces 188 (only one of them is shown). The specification of the flexible circuit film 76 shown in FIG. 18H can be referred to as the specification of the flexible circuit film 76 illustrated in FIG. 2I. When the flexible circuit film 76 is bonded with the protruding regions 190 of the metal traces 188, the gold layer 78 on a bottom surface of the inner leads 68 (only one of them is shown) can be thermally pressed on a top surface of the gold layer 186 of the metal traces 188 at the protruding regions 190 at a temperature of between 490 and 540° C., and preferably of between 500 and 520° C., for a time of between 1 and 10 seconds, and preferably of between 3 and 6 seconds. Thereby, a gold layer 194 formed by the joint of the gold layer 78 and the gold layer 186 can be between the seed layer 40a of the metal traces 188 at the protruding regions 190 and the copper traces 60 of the flexible circuit film 76, wherein the gold layer 194 has a thickness t42 of between 0.5 and 20 micrometers, and preferably of between 2 and 10 micrometers.

After the protruding regions 190 of the metal traces 188 are connected to the copper traces 60 using a thermal pressing process, a polymer material 74, such as epoxy or polyimide, can be formed between the semiconductor chip 192 and the gold layer 78 on the bottom surface of the inner leads 68, and enclosing the metal traces 188. Next, the polymer material 74 is cured at a temperature of between 150 and 250° C.

COF (Chip on Film) Package—Gold to Tin Connection

Figure 18I:
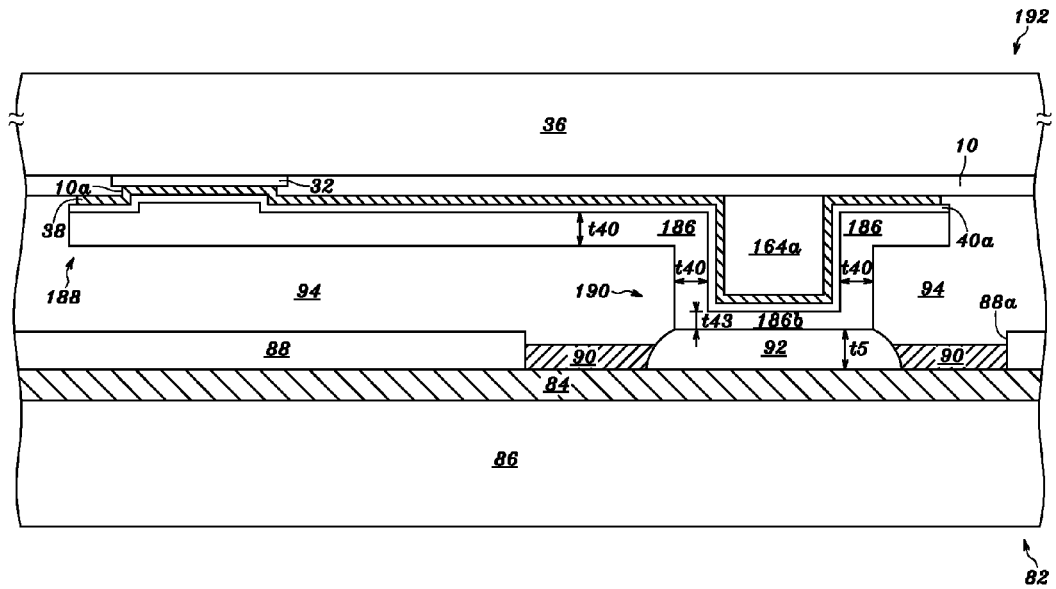

Referring to FIG. 18I, the flexible circuit film 82 as mentioned in FIG. 2K can be bonded with the protruding regions 190 of the metal traces 188 (only one of them is shown). The specification of the flexible circuit film 82 shown in FIG. 18I can be referred to as the specification of the flexible circuit film 82 illustrated in FIG. 2K. When the flexible circuit film 82 is bonded with the protruding regions 190 of the metal traces 188, a top surface of the gold layer 186 of the metal traces 188 at the protruding regions 190 can be thermally pressed on the tin-containing layer 90 of the flexible circuit film 82 at a temperature of between 490 and 540° C., and preferably of between 500 and 520° C., for a time of between 1 and 10 seconds, and preferably of between 3 and 6 seconds. Alternatively, when the flexible circuit film 82 is bonded with the protruding regions 190 of the metal traces 188, the tin-containing layer 90 of the flexible circuit film 82 can be thermally pressed on the top surface of the gold layer 186 of the metal traces 188 at the protruding regions 190 at a temperature of between 490 and 540° C., and preferably of between 500 and 520° C., for a time of between 1 and 10 seconds, and preferably of between 3 and 6 seconds. Thereby, a tin-alloy layer 92 containing gold can be formed between the remaining gold layer 186b of the metal traces 188 at the protruding regions 190 and the copper traces 84 of the flexible circuit film 82, wherein the remaining gold layer 186b has a thickness t43 of between 0.1 and 20 micrometers, and preferably of between 1 and 10 micrometers. The tin-alloy layer 92 has a thickness t5 of between 0.5 and 10 micrometers, of between 1 and 5 micrometers or of between 1.5 and 3 micrometers. When the tin-containing layer 90 before bonded with the gold layer 186 is pure tin, the tin-alloy layer 92 is tin-gold alloy having a thickness t5 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 90 before bonded with the gold layer 186 is tin-silver alloy, the tin-alloy layer 92 is tin-silver-gold alloy having a thickness t5 of between 0.5 and 10 micrometers, of between 1 and 5 micrometers or of between 1.5 and 3 micrometers. When the tin-containing layer 90 before bonded with the gold layer 186 is tin-silver-copper alloy, the tin-alloy layer 92 is tin-silver-gold-copper alloy having a thickness t5 of between 0.5 and 10 micrometers, of between 1 and 5 micrometers or of between 1.5 and 3 micrometers.

After the protruding regions 190 of the metal traces 188 are connected to the copper traces 84 using a thermal pressing process, a polymer material 94, such as epoxy or polyimide, can be formed between the passivation layer 10 of the semiconductor chip 192 and the polymer layer 88 of the flexible circuit film 82, and enclosing the metal traces 188. Next, the polymer material 94 is cured at a temperature of between 150 and 250° C.

In the FIG. 18I, the copper traces 84 can be replaced by multiple gold traces having a thickness of between 3 and 30 µm, and preferably of between 5 and 20 µm. Alternatively, the copper traces 84 can be replaced by multiple silver traces having a thickness of between 3 and 30 µm, and preferably of between 5 and 20 µm.

COF (Chip on Film) Package—Gold to Gold Connection

Figure 18J:
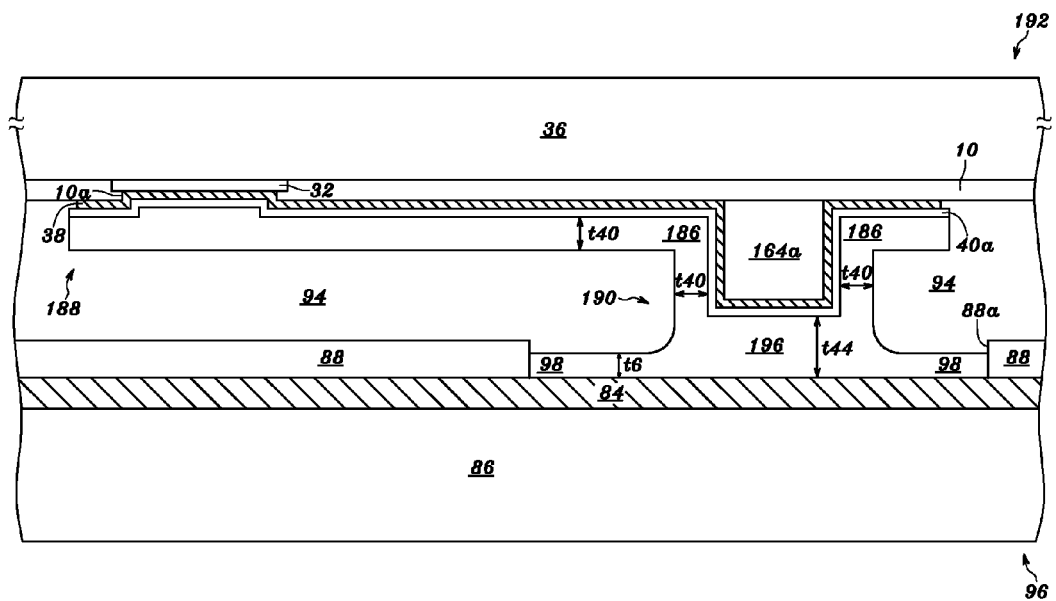

Referring to FIG. 18J, the flexible circuit film 96 as mentioned in FIG. 2M can be bonded with the protruding regions 190 of the metal traces 188 (only one of them is shown). The specification of the flexible circuit film 96 shown in FIG. 18J can be referred to as the specification of the flexible circuit film 96 illustrated in FIG. 2M. When the flexible circuit film 96 is bonded with the protruding regions 190 of the metal traces 188, a top surface of the gold layer 186 of the metal traces 188 at the protruding regions 190 can be thermally pressed on the gold layer 98 of the flexible circuit film 96 at a temperature of between 490 and 540° C., and preferably of between 500 and 520° C., for a time of between 1 and 10 seconds, and preferably of between 3 and 6 seconds. Alternatively, when the flexible circuit film 96 is bonded with the protruding regions 190 of the metal traces 188, the gold layer 98 of the flexible circuit film 96 can be thermally pressed on the top surface of the gold layer 186 of the metal traces 188 at the protruding regions 190 at a temperature of between 490 and 540° C., and preferably of between 500 and 520° C., for a time of between 1 and 10 seconds, and preferably of between 3 and 6 seconds. Thereby, a gold layer 196 formed by the joint of the gold layer 98 and the gold layer 186 can be between the seed layer 40a of the metal traces 188 at the protruding regions 190 and the copper traces 84 of the flexible circuit film 96, wherein the gold layer 196 has a thickness t44 of between 0.5 and 20 micrometers, and preferably of between 2 and 10 micrometers.

After the protruding regions 190 of the metal traces 188 are connected to the copper traces 84 using a thermal pressing process, a polymer material 94, such as epoxy or polyimide, can be formed between the passivation layer 10 of the semiconductor chip 192 and the polymer layer 88 of the flexible circuit film 96, and enclosing the metal traces 188. Next, the polymer material 94 is cured at a temperature of between 150 and 250° C.

COG (Chip on Glass) Assembly—ACF/ACP

Figure 18K:
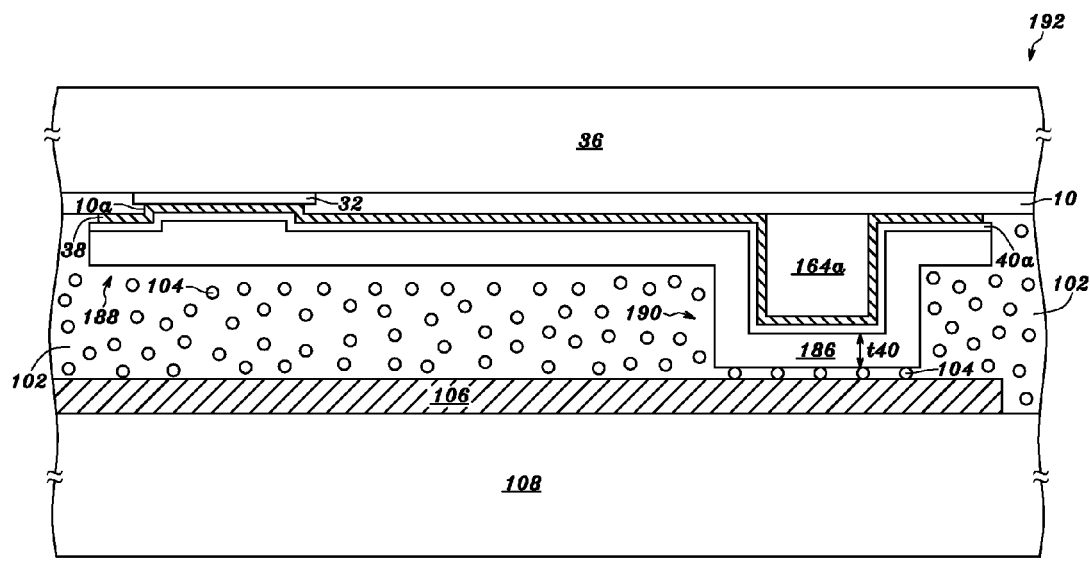

Referring to FIG. 18K, via a thermal pressing process, a top surface of the gold layer 186 of the metal traces 188 at the protruding regions 190 (only one of them is shown) is pressed into an anisotropic conductive film (ACF) or an anisotropic conductive paste (ACP) 102. Thus, metal particles 104 inside ACF or ACP 102 clusters between the top surface of the gold layer 186 of the metal traces 188 at the protruding regions 190 and multiple conductive traces 106 (only one of them is shown), such as indium tin oxide (ITO) or gold, on a glass substrate 108, leading the gold layer 186 of the metal traces 188 at the protruding regions 190 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the top surface of the gold layer 186 of the metal traces 188 at the protruding regions 190 may be pressed into ACF or ACP 102 preformed on a ceramic substrate or a printed circuit board to have metal particles 104 in the ACF or ACP 102 connecting the gold layer 186 of the metal traces 188 at the protruding regions 190 to multiple pads on the ceramic substrate or on the organic substrate.

COG (Chip on Glass) Assembly—NCF

Figure 18L:
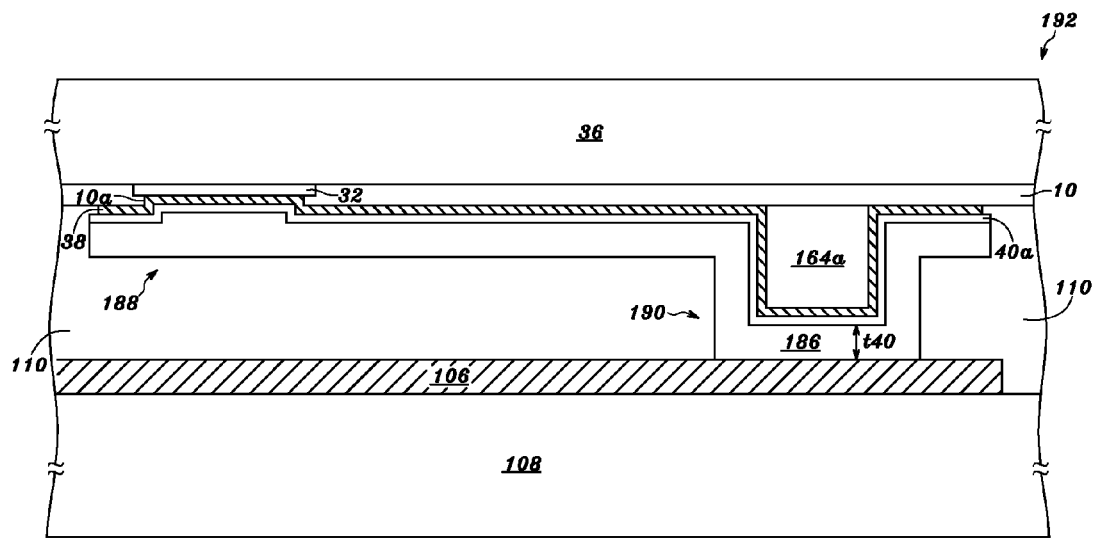
Figure 18M:
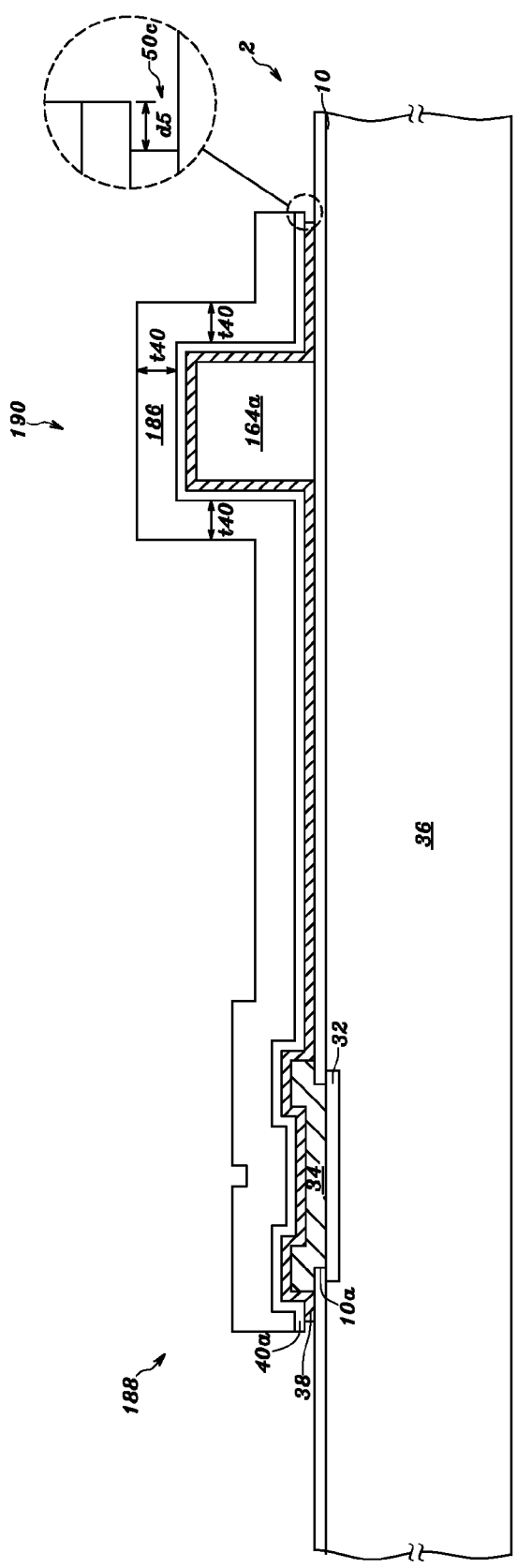

Referring to FIG. 18L, via a thermal pressing process, a top surface of the gold layer 186 of the metal traces 188 at the protruding regions 190 (only one of them is shown) is pressed into a non-conductive film (NCF) 110, and the top surface of the gold layer 186 of the metal traces 188 at the protruding regions 190 contacts with multiple conductive traces 106 (only one of them is shown), such as indium tin oxide (ITO) or gold, on a glass substrate 108, leading the gold layer 186 of the metal traces 188 at the protruding regions 190 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the top surface of the gold layer 186 of the metal traces 188 at the protruding regions 190 may be pressed into NCF 110 preformed on a ceramic substrate or a printed circuit board to have the gold layer 186 of the metal traces 188 at the protruding regions 190 contacting with multiple pads on the ceramic substrate or on the organic substrate.

Embodiment 18

Figure 19A:
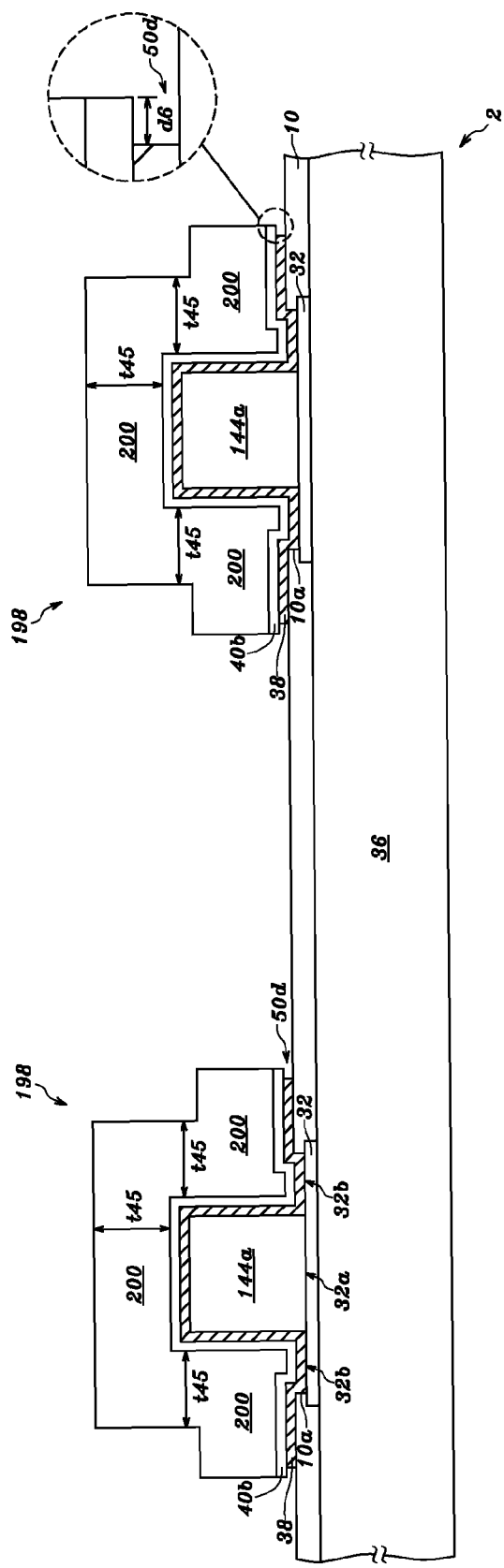
FIG. 19A and FIGS. 19C through 19H are cross-sectional views showing a process for fabricating multiple bumps on a wafer and packaging a chip singulated from the wafer according to one embodiment of the present invention.

Referring to FIG. 19A, multiple bumps 198 can be formed on the pads 32, such as copper pads or aluminum pads, exposed by the openings 10a. The process for forming the bumps 198 on the pads 32 can be performed by the above-mentioned steps as shown in FIGS. 12A-12B, followed by forming an adhesion/barrier layer 38 having a thickness of between 0.02 and 0.5 μm, and preferably of between 0.25 and 0.35 μm, on the polymer bumps 144a, on the passivation layer 10 and on the pads 32 exposed by the openings 10a, followed by forming a seed layer 40b, made of gold, having a thickness of between 0.03 and 1 μm, and preferably of between 0.05 and 0.2 μm, on the adhesion/barrier layer 38 with a physical vapor deposition (PVD) process, such as a sputtering process or an evaporation process, or a chemical vapor deposition (CVD) process, followed by forming a photoresist layer 42 having a thickness of between 1 and 25 micrometers, and preferably of between 5 and 10 micrometers, is spin-on coated on the seed layer 40b, multiple openings 42a in the photoresist layer 42 exposing the seed layer 40b, followed by electroplating a gold layer 200 having a thickness t45 of between 0.5 and 25 micrometers, and preferably of between 5 and 10 micrometers, on the seed layer 40b exposed by the openings 42a with a non-cyanide electroplating solution, such as a solution containing gold sodium sulfite ($Na_3Au(SO_3)_2$) or a solution containing gold ammonium sulfite (($NH_4)_3[Au(SO_3)_2]$), or with an electroplating solution containing cyanide, followed by the above-mentioned steps as shown in FIGS. 12F-12G The specification of the adhesion/barrier layer 38 shown in FIG. 19A can be referred to as the specification of the adhesion/barrier layer 38 illustrated in FIG. 12C. The process of forming the adhesion/barrier layer 38, as shown in FIG. 19A, can be referred to as the process of forming the adhesion/barrier layer 38, as illustrated in FIG. 12C. The specification of the photoresist layer 42 and the openings 42a shown in FIG. 19A can be referred to as the specification of the photoresist layer 42 and the openings 42a illustrated in FIG. 12D. The process of forming the photoresist layer 42 and the openings 42a, as shown in FIG. 19A, can be referred to as the process of forming the photoresist layer 42 and the openings 42a, as illustrated in FIG. 12D.

For example, when the adhesion/barrier layer 38 is formed by sputtering a titanium layer with a thickness of between 0.02 and 0.5 μm, and preferably of between 0.25 and 0.35 μm, the seed layer 40b can be formed by sputtering a gold layer with a thickness of between 0.03 and 1 μm, and preferably of between 0.05 and 0.2 μm, on the titanium layer. When the adhesion/barrier layer 38 is formed by sputtering a titanium-tungsten-alloy layer with a thickness of between 0.02 and 0.5 μm, and preferably of between 0.25 and 0.35 μm, the seed layer 40b can be formed by sputtering a gold layer with a thickness of between 0.03 and 1 μm, and preferably of between 0.05 and 0.2 μm, on the titanium-tungsten-alloy layer. When the adhesion/barrier layer 38 is formed by sputtering a tantalum layer with a thickness of between 0.02 and 0.5 μm, and preferably of between 0.25 and 0.35 μm, the seed layer 40b can be formed by sputtering a gold layer with a thickness of between 0.03 and 1 μm, and preferably of between 0.05 and 0.2 μm, on the tantalum layer. When the adhesion/barrier layer 38 is formed by sputtering a tantalum-nitride layer with a thickness of between 0.02 and 0.5 μm, and preferably of between 0.25 and 0.35 μm, the seed layer 40b can be formed by sputtering a gold layer with a thickness of between 0.03 and 1 μm, and preferably of between 0.05 and 0.2 μm, on the tantalum-nitride layer. When the adhesion/barrier layer 38 is formed by sputtering a titanium layer and then sputtering a titanium-tungsten-alloy layer on the titanium layer, the seed layer 40b can be formed by sputtering a gold layer with a thickness of between 0.03 and 1 μm, and preferably of between 0.05 and 0.2 μm, on the titanium-tungsten-alloy layer.

Thereby, each of the bumps 198 can be formed of one of the polymer bumps 144a on the center region 32a of one of the pads 32, the adhesion/barrier layer 38 on the peripheral regions 32b of said one of the pads 32 and on said one of the polymer bumps 144a, and a gold layer (including the seed layer 40b and the electroplated gold layer 200), having a thickness of between 0.5 and 25 micrometers, and preferably of between 5 and 10 micrometers, on the adhesion/barrier layer 38. Alternatively, the gold layer 200 of the bumps 198 can be electroless plated with a thickness of between 500 and 5,000 angstroms for a COG structure or with a thickness of between 0.5 and 6 micrometers for a TCP or COF structure.

Multiple undercuts 50d are formed under the seed layer 40b and under the electroplated gold layer 200 when the adhesion/barrier layer 38 not under the electroplated gold layer 200 is removed using a wet etching method. The adhesion/barrier layer 38 under the electroplated gold layer 200 has a first sidewall recessed from a second sidewall of the seed layer 40b, wherein a distance d6 between the first sidewall and the second sidewall is between 0.3 and 2 micrometers.

Figure 19B:
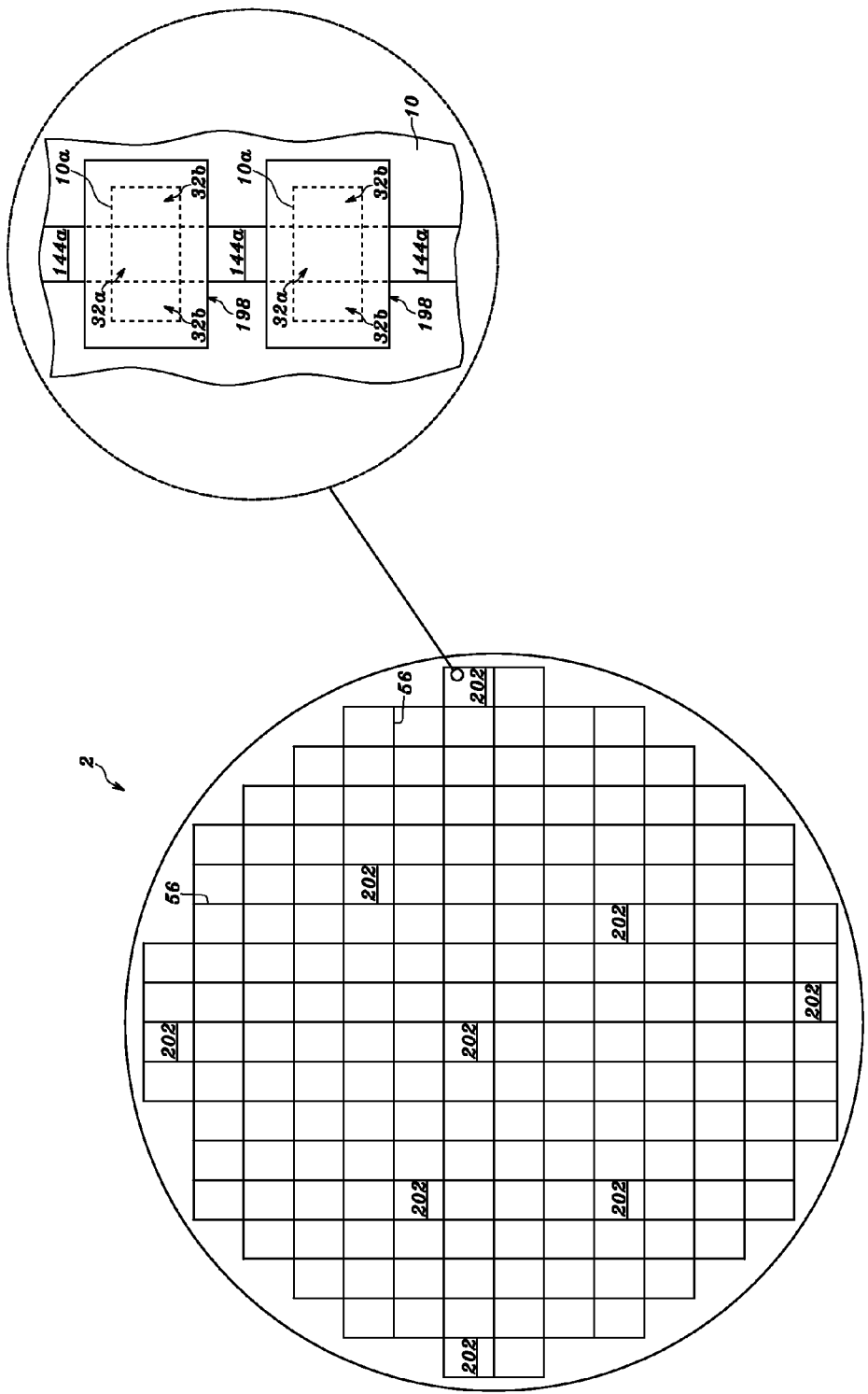
FIG. 19B is a top view showing a semiconductor wafer with multiple bumps.

After the bumps 198 are formed, the semiconductor wafer 2 can be cut into multiple chips 202. The detail can be referred as to FIG. 19B. Referring to FIG. 19B, the semiconductor wafer 2 includes multiple semiconductor chips 202 with scribe lines 56 between neighboring two of the semiconductor chips 202. The bumps 198 are on the pads 32, of each semiconductor chips 202, exposed by the openings 10a. In a wafer dicing process, the semiconductor wafer 2 can be cut along the scribe lines 56 to separate the semiconductor chips 202.

TCP (Tape Carrier Package)—Gold to Tin Connection

Figure 19C:
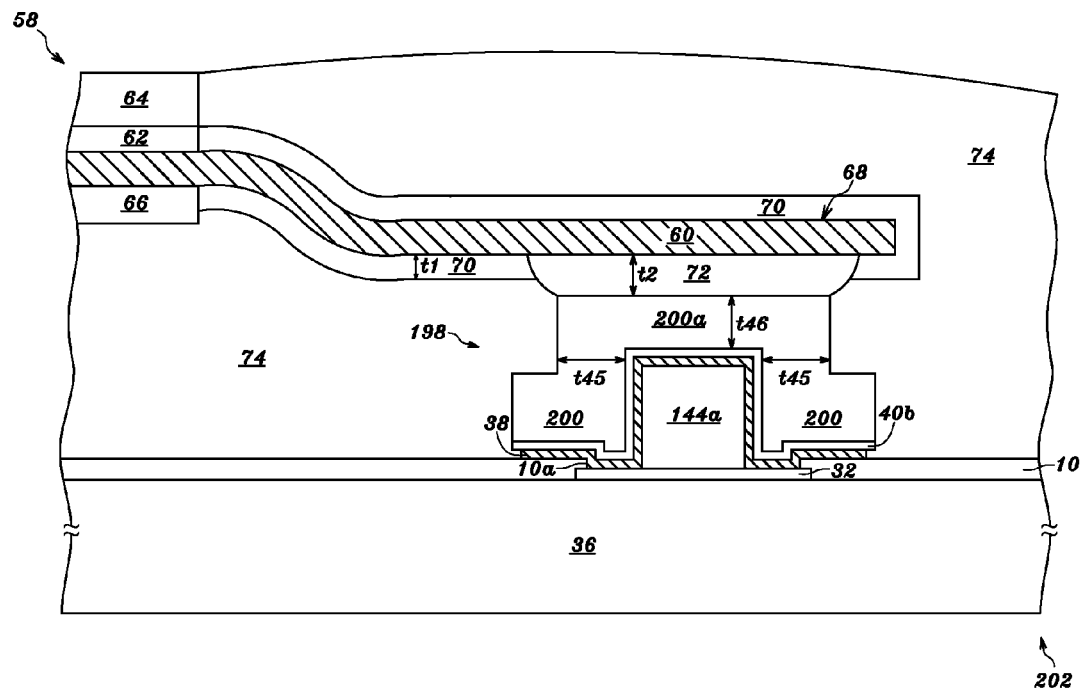

Referring to FIG. 19C, the flexible circuit film 58 as mentioned in FIG. 2G can be bonded with the bumps 198 (only one of them is shown). The specification of the flexible circuit film 58 shown in FIG. 19C can be referred to as the specification of the flexible circuit film 58 illustrated in FIG. 2G When the flexible circuit film 58 is bonded with the bumps 198, the tin-containing layer 70 on a bottom surface of the inner leads 68 (only one of them is shown) can be thermally pressed on a top surface of the gold layer 200 of the bumps 198 at a temperature of between 490 and 540° C., and preferably of between 500 and 520° C., for a time of between 1 and 10 seconds, and preferably of between 3 and 6 seconds. Thereby, a tin-alloy layer 72 containing gold can be formed between the remaining gold layer 200a of the bumps 198 and the copper traces 60 of the flexible circuit film 58, wherein the remaining gold layer 200a has a thickness t46 of between 0.1 and 20 micrometers, and preferably of between 1 and 10 micrometers. The tin-alloy layer 72 has a thickness t2 of between 0.5 and 10 micrometers, of between 1 and 5 micrometers or of between 1.5 and 3 micrometers. When the tin-containing layer 70 before bonded with the gold layer 200 is pure tin, the tin-alloy layer 72 is tin-gold alloy having a thickness t2 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 70 before bonded with the gold layer 200 is tin-silver alloy, the tin-alloy layer 72 is tin-silver-gold alloy having a thickness t2 of between 0.5 and 10 micrometers, of between 1 and 5 micrometers or of between 1.5 and 3 micrometers. When the tin-containing layer 70 before bonded with the gold layer 200 is tin-silver-copper alloy, the tin-alloy layer 72 is tin-silver-gold-copper alloy having a thickness t2 of between 0.5 and 10 micrometers, of between 1 and 5 micrometers or of between 1.5 and 3 micrometers.

After the bumps 198 are connected to the tin-containing layer 70 on the bottom surface of the inner leads 68 using a thermal pressing process, a polymer material 74, such as epoxy or polyimide, can be formed between the semiconductor chip 202 and the tin-containing layer 70 on the bottom surface of the inner leads 68, and enclosing the bumps 198. Next, the polymer material 74 is cured at a temperature of between 150 and 250° C.

In the FIG. 19C, the copper traces 60 can be replaced by multiple gold traces having a thickness of between 3 and 30 μm, and preferably of between 5 and 20 μm. Alternatively, the copper traces 60 can be replaced by multiple silver traces having a thickness of between 3 and 30 μm, and preferably of between 5 and 20 μm.

TCP (Tape Carrier Package)—Gold to Gold Connection

Figure 19D:
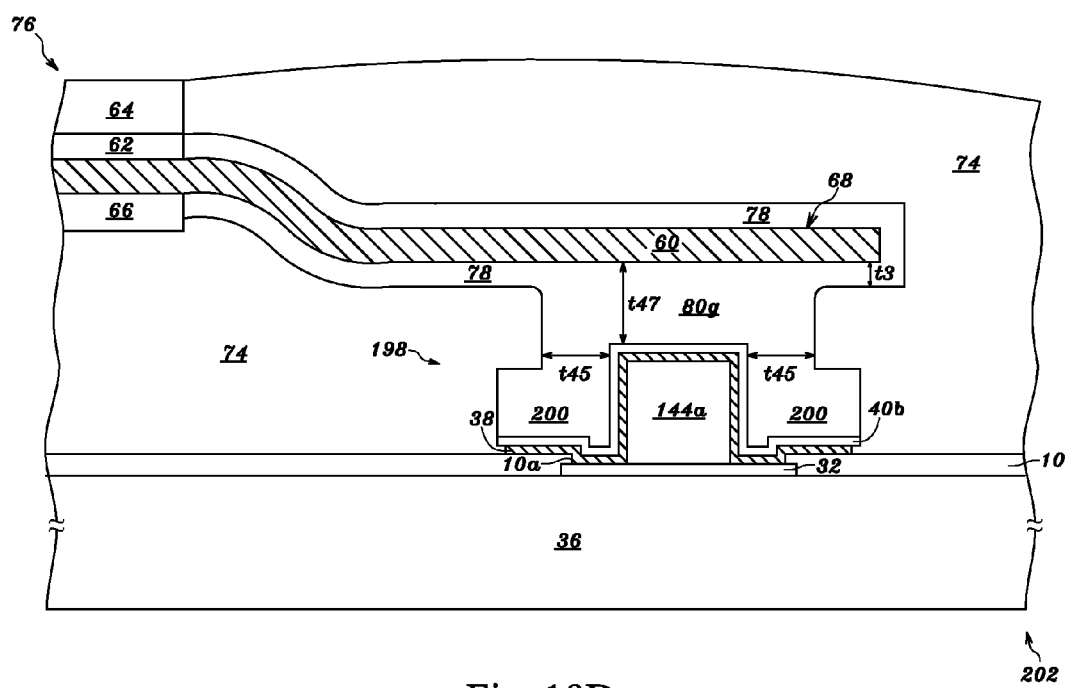

Referring to FIG. 19D, the flexible circuit film 76 as mentioned in FIG. 2I can be bonded with the bumps 198 (only one of them is shown). The specification of the flexible circuit film 76 shown in FIG. 19D can be referred to as the specification of the flexible circuit film 76 illustrated in FIG. 2I. When the flexible circuit film 76 is bonded with the bumps 198, the gold layer 78 on a bottom surface of the inner leads 68 (only one of them is shown) can be thermally pressed on a top surface of the gold layer 200 of the bumps 198 at a temperature of between 490 and 540° C., and preferably of between 500 and 520° C., for a time of between 1 and 10 seconds, and preferably of between 3 and 6 seconds. Thereby, a gold layer 80g formed by the joint of the gold layer 78 and the gold layer 200 can be between the seed layer 40b of the bumps 198 and the copper traces 60 of the flexible circuit film 76, wherein the gold layer 80g has a thickness t47 of between 0.5 and 20 micrometers, and preferably of between 2 and 10 micrometers.

After the bumps 198 are connected to the copper traces 60 using a thermal pressing process, a polymer material 74, such as epoxy or polyimide, can be formed between the semiconductor chip 202 and the gold layer 78 on the bottom surface of the inner leads 68, and enclosing the bumps 198. Next, the polymer material 74 is cured at a temperature of between 150 and 250° C.

COF (Chip on Film) Package—Gold to Tin Connection

Figure 19E:
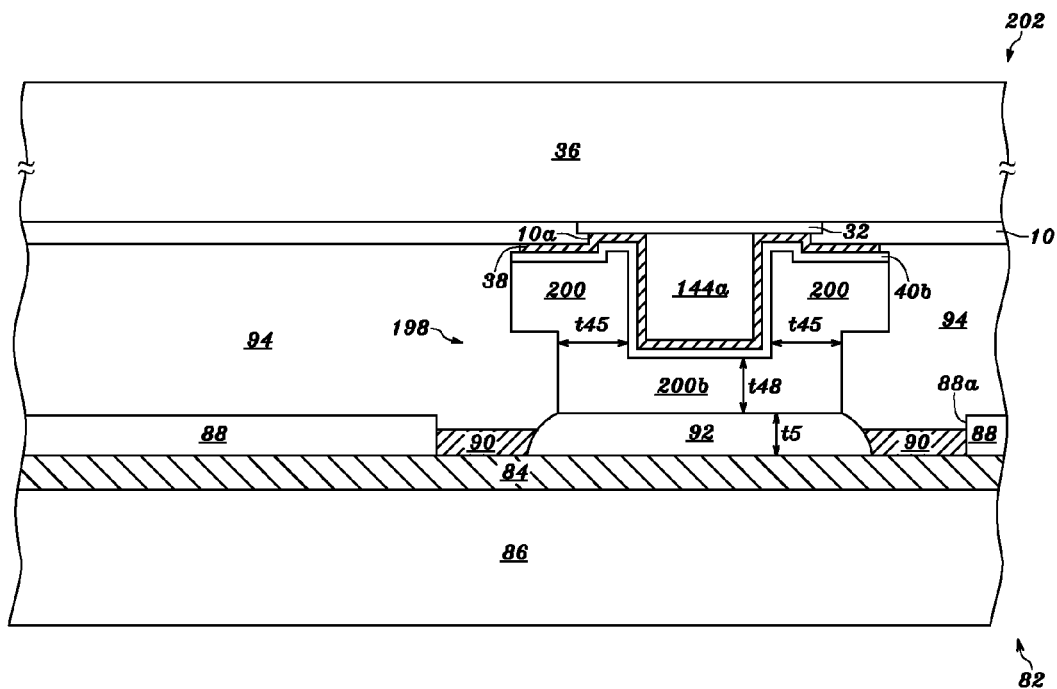

Referring to FIG. 19E, the flexible circuit film 82 as mentioned in FIG. 2K can be bonded with the bumps 198 (only one of them is shown). The specification of the flexible circuit film 82 shown in FIG. 19E can be referred to as the specification of the flexible circuit film 82 illustrated in FIG. 2K. When the flexible circuit film 82 is bonded with the bumps 198, a top surface of the gold layer 200 of the bumps 198 can be thermally pressed on the tin-containing layer 90 of the flexible circuit film 82 at a temperature of between 490 and 540° C., and preferably of between 500 and 520° C., for a time of between 1 and 10 seconds, and preferably of between 3 and 6 seconds. Alternatively, when the flexible circuit film 82 is bonded with the bumps 198, the tin-containing layer 90 of the flexible circuit film 82 can be thermally pressed on the top surface of the gold layer 200 of the bumps 198 at a temperature of between 490 and 540° C., and preferably of between 500 and 520° C., for a time of between 1 and 10 seconds, and preferably of between 3 and 6 seconds. Thereby, a tin-alloy layer 92 containing gold can be formed between the remaining gold layer 200d of the bumps 198 and the copper traces 84 of the flexible circuit film 82, wherein the remaining gold layer 200d has a thickness t48 of between 0.1 and 20 micrometers, and preferably of between 1 and 10 micrometers. The tin-alloy layer 92 has a thickness t5 of between 0.5 and 10 micrometers, of between 1 and 5 micrometers or of between 1.5 and 3 micrometers. When the tin-containing layer 90 before bonded with the gold layer 200 is pure tin, the tin-alloy layer 92 is tin-gold alloy having a thickness t5 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 90 before bonded with the gold layer 200 is tin-silver alloy, the tin-alloy layer 92 is tin-silver-gold alloy having a thickness t5 of between 0.5 and 10 micrometers, of between 1 and 5 micrometers or of between 1.5 and 3 micrometers. When the tin-containing layer 90 before bonded with the gold layer 200 is tin-silver-copper alloy, the tin-alloy layer 92 is tin-silver-gold-copper alloy having a thickness t5 of between 0.5 and 10 micrometers, of between 1 and 5 micrometers or of between 1.5 and 3 micrometers.

After the bumps 198 are connected to the copper traces 84 using a thermal pressing process, a polymer material 94, such as epoxy or polyimide, can be formed between the passivation layer 10 of the semiconductor chip 202 and the polymer layer 88 of the flexible circuit film 82, and enclosing the bumps 198. Next, the polymer material 94 is cured at a temperature of between 150 and 250° C.

In the FIG. 19E, the copper traces 84 can be replaced by multiple gold traces having a thickness of between 3 and 30 μm, and preferably of between 5 and 20 μm. Alternatively, the copper traces 84 can be replaced by multiple silver traces having a thickness of between 3 and 30 μm, and preferably of between 5 and 20 μm.

COF (Chip on Film) Package—Gold to Gold Connection

Figure 19F:
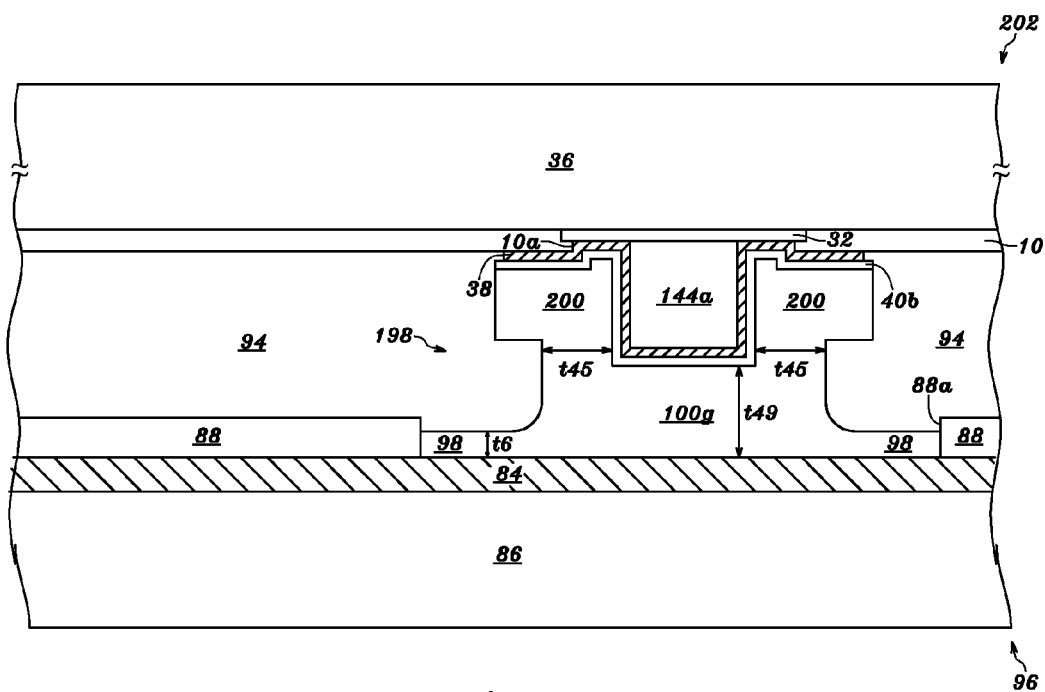

Referring to FIG. 19F, the flexible circuit film 96 as mentioned in FIG. 2M can be bonded with the bumps 198 (only one of them is shown). The specification of the flexible circuit film 96 shown in FIG. 19F can be referred to as the specification of the flexible circuit film 96 illustrated in FIG. 2M. When the flexible circuit film 96 is bonded with the bumps 198, a top surface of the gold layer 200 of the bumps 198 can be thermally pressed on the gold layer 98 of the flexible circuit film 96 at a temperature of between 490 and 540° C., and preferably of between 500 and 520° C., for a time of between 1 and 10 seconds, and preferably of between 3 and 6 seconds. Alternatively, when the flexible circuit film 96 is bonded with the bumps 198, the gold layer 98 of the flexible circuit film 96 can be thermally pressed on the top surface of the gold layer 200 of the bumps 198 at a temperature of between 490 and 540° C., and preferably of between 500 and 520° C., for a time of between 1 and 10 seconds, and preferably of between 3 and 6 seconds. Thereby, a gold layer 100g formed by the joint of the gold layer 98 and the gold layer 200 can be between the seed layer 40b of the bumps 198 and the copper traces 84 of the flexible circuit film 96, wherein the gold layer 100g has a thickness t49 of between 0.5 and 20 micrometers, and preferably of between 2 and 10 micrometers.

After the bumps 198 are connected to the copper traces 84 using a thermal pressing process, a polymer material 94, such as epoxy or polyimide, can be formed between the passivation layer 10 of the semiconductor chip 202 and the polymer layer 88 of the flexible circuit film 96, and enclosing the bumps 198. Next, the polymer material 94 is cured at a temperature of between 150 and 250° C.

COG (Chip on Glass) Assembly—ACF/ACP

Figure 19G:
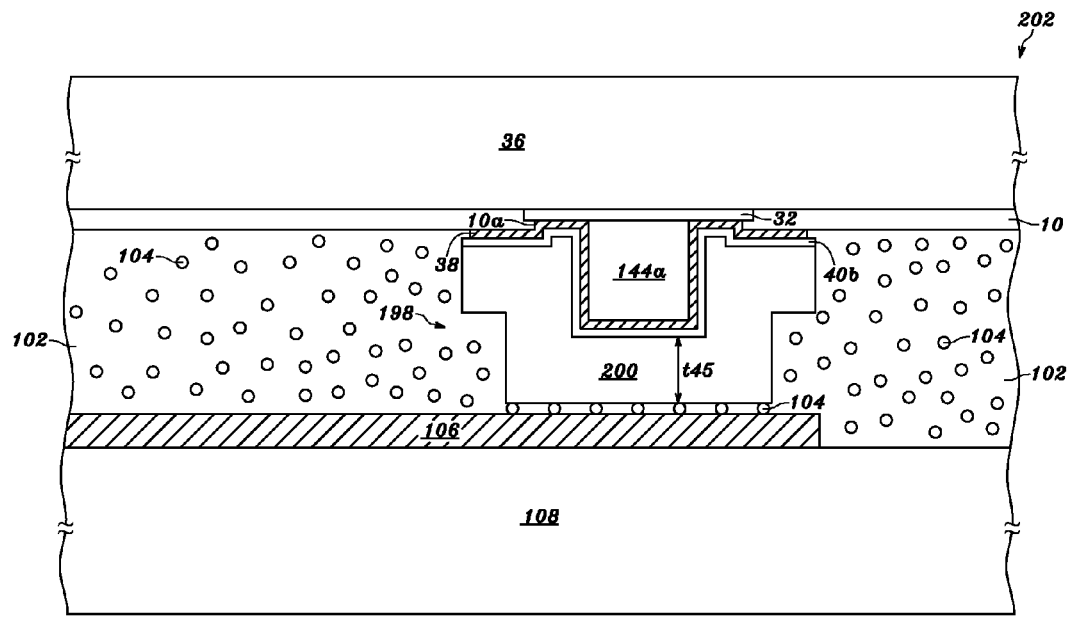

Referring to FIG. 19G, via a thermal pressing process, the gold layer 200 of the bumps 198 (only one of them is shown) is pressed into an anisotropic conductive film (ACF) or an anisotropic conductive paste (ACP) 102. Thus, metal particles 104 inside ACF or ACP 102 clusters between the gold layer 200 of the bumps 198 and multiple conductive traces 106 (only one of them is shown), such as indium tin oxide (ITO) or gold, on a glass substrate 108, leading the gold layer 200 of the bumps 198 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 200 of the bumps 198 may be pressed into ACF or ACP 102 preformed on a ceramic substrate or a printed circuit board to have metal particles 104 in the ACF or ACP 102 connecting the gold layer 200 of the bumps 198 to multiple pads on the ceramic substrate or on the organic substrate.

COG (Chip on Glass) Assembly—NCF

Figure 19H:
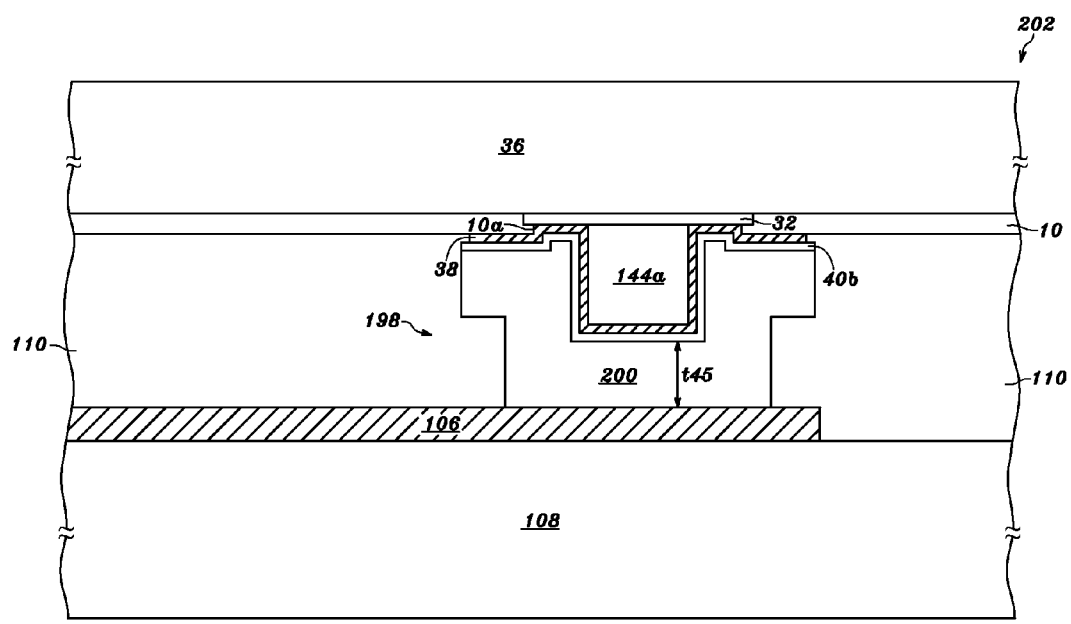

Referring to FIG. 19H, via a thermal pressing process, the gold layer 200 of the bumps 198 (only one of them is shown) is pressed into a non-conductive film (NCF) 110, and the gold layer 200 of the bumps 198 contacts with multiple conductive traces 106 (only one of them is shown), such as indium tin oxide (ITO) or gold, on a glass substrate 108, leading the gold layer 200 of the bumps 198 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 200 of the bumps 198 may be pressed into NCF 110 preformed on a ceramic substrate or a printed circuit board to have the gold layer 200 of the bumps 198 contacting with multiple pads on the ceramic substrate or on the organic substrate.

Embodiment 19

Figure 20A:
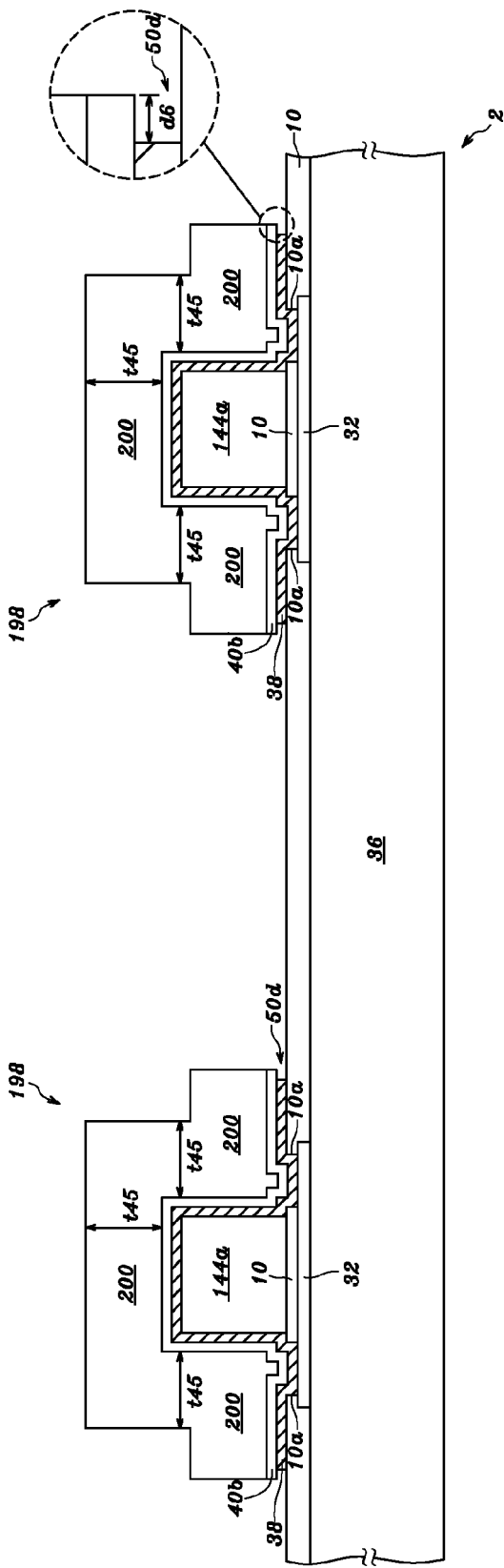
FIG. 20A and FIGS. 20C through 20H are cross-sectional views showing a process for fabricating multiple bumps on a wafer and packaging a chip singulated from the wafer according to one embodiment of the present invention.

Referring to FIG. 20A, multiple bumps 198 can be formed by multiple polymer bumps 144a and multiple metal layers 38, 40b and 200. The polymer bumps 144a can be formed with a bar shape extending on the passivation layer 10 in a direction parallel with a scribeline. In this embodiment, two of the openings 10a at different sides of one of the polymer bumps 144a expose one of the pads 32, such as copper pads or aluminum pads, exposed by the openings 10a. Alternatively, two of the openings 10a at different sides of one of the polymer bumps 144a expose separate pads 32 that can be connected to each other using an interconnecting trace under the passivation layer 10 or can be disconnected from each other under the passivation layer 10. The metal layer 38 can be formed on the polymer bumps 144 and on the pads 32 each exposed by two of the openings 10a. The process for forming the bumps 198 on the pads 32 can be performed by forming the polymer bumps 144a with a bar shape extending on the passivation layer 10 in a direction parallel with a scribeline and between the openings 10a aligned in two lines parallel with the scribe line, followed by forming the adhesion/barrier layer 38 having a thickness of between 0.02 and 0.5 µm, and preferably of between 0.25 and 0.35 µm, on the polymer bumps 144a, on the passivation layer 10 and on the pads 32 exposed by the openings 10a, followed by forming the seed layer 40b, made of gold, having a thickness of between 0.03 and 1 µm, and preferably of between 0.05 and 0.2 µm, on the adhesion/barrier layer 38, followed by forming a photoresist layer 42 having a thickness of between 1 and 25 micrometers, and preferably of between 5 and 10 micrometers, is spin-on coated on the seed layer 40b, multiple openings 42a in the photoresist layer 42 exposing the seed layer 40b, followed by electroplating the gold layer 200 having a thickness t45 of between 0.5 and 25 micrometers, and preferably of between 5 and 10 micrometers, on the seed layer 40b exposed by the openings 42a with a non-cyanide electroplating solution, such as a solution containing gold sodium sulfite ($Na_3Au(SO_3)_2$) or a solution containing gold ammonium sulfite ($(NH_4)_3[Au(SO_3)_2]$), or with an electroplating solution containing cyanide, followed by the above-mentioned steps as shown in FIGS. 12F-12G The process of forming the polymer bumps 144a, as shown in FIG. 20A, can be referred to as the process of forming the polymer bumps 144a, as illustrated in FIGS. 12A-12B. The specification of the adhesion/barrier layer 38 and the seed layer 40b shown in FIG. 20A can be referred to as the specification of the adhesion/barrier layer 38 and the seed layer 40b illustrated in FIG. 19A. The process of forming the adhesion/barrier layer 38 and the seed layer 40b, as shown in FIG. 20A, can be referred to as the process of forming the adhesion/barrier layer 38 and the seed layer 40b, as illustrated in FIG. 19A. The specification of the photoresist layer 42 and the openings 42a shown in FIG. 20A can be referred to as the specification of the photoresist layer 42 and the openings 42a illustrated in FIG. 12D. The process of forming the photoresist layer 42 and the openings 42a, as shown in FIG. 20A, can be referred to as the process of forming the photoresist layer 42 and the openings 42a, as illustrated in FIG. 12D.

Thereby, each of the bumps 198 can be formed of one of the polymer bumps 144a on the passivation layer 10 and between the openings 10a formed in two lines, the adhesion/barrier layer 38 on the polymer bump 144a and on a single large pad 32 or multiple separate pads 32 exposed by the openings 10a, and a gold layer (including the seed layer 40b and the electroplated gold layer 200), having a thickness of between 0.5 and 25 micrometers, and preferably of between 5 and 10 micrometers, on the adhesion/barrier layer 38. Alternatively, the gold layer 200 of the bumps 198 can be electroless plated with a thickness of between 500 and 5,000 angstroms for a COG structure or with a thickness of between 0.5 and 6 micrometers for a TCP or COF structure.

Figure 20B:
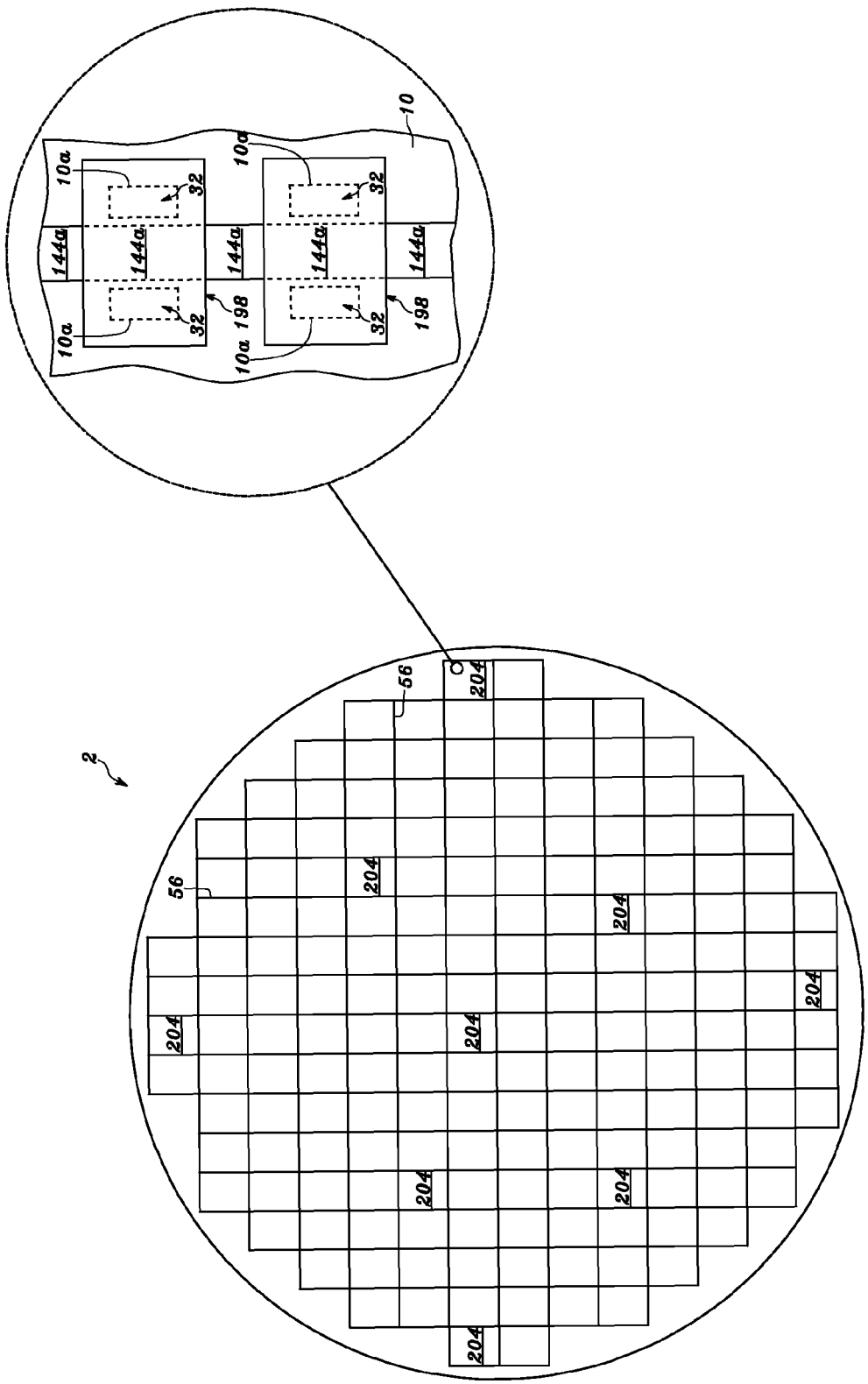
FIG. 20B is a top view showing a semiconductor wafer with multiple bumps.

After the bumps 198 are formed, the semiconductor wafer 2 can be cut into multiple chips 204. The detail can be referred as to FIG. 20B. Referring to FIG. 20B, the semiconductor wafer 2 includes multiple semiconductor chips 204 with scribe lines 56 between neighboring two of the semiconductor chips 204. The bumps 198 are on the pads 32, of each semiconductor chips 204, exposed by the openings 10a. In a wafer dicing process, the semiconductor wafer 2 can be cut along the scribe lines 56 to separate the semiconductor chips 204.

TCP (Tape Carrier Package)—Gold to Tin Connection

Figure 20C:
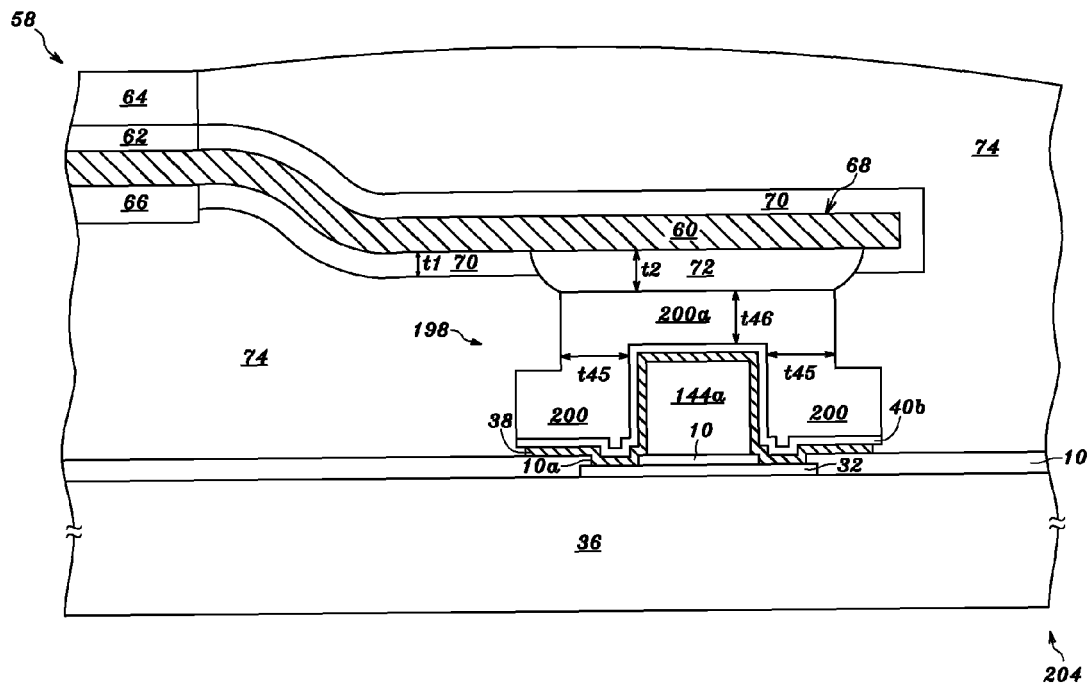

Referring to FIG. 20C, the flexible circuit film 58 as mentioned in FIG. 2G can be bonded with the bumps 198 (only one of them is shown). The specification of the flexible circuit film 58 shown in FIG. 20C can be referred to as the specification of the flexible circuit film 58 illustrated in FIG. 2G When the flexible circuit film 58 is bonded with the bumps 198, the tin-containing layer 70 on a bottom surface of the inner leads 68 (only one of them is shown) can be thermally pressed on a top surface of the gold layer 200 of the bumps 198 at a temperature of between 490 and 540° C., and preferably of between 500 and 520° C., for a time of between 1 and 10 seconds, and preferably of between 3 and 6 seconds. Thereby, a tin-alloy layer 72 containing gold can be formed between the remaining gold layer 200a of the bumps 198 and the copper traces 60 of the flexible circuit film 58, wherein the remaining gold layer 200a has a thickness t46 of between 0.1 and 20 micrometers, and preferably of between 1 and 10 micrometers. The tin-alloy layer 72 has a thickness t2 of between 0.5 and 10 micrometers, of between 1 and 5 micrometers or of between 1.5 and 3 micrometers. When the tin-containing layer 70 before bonded with the gold layer 200 is pure tin, the tin-alloy layer 72 is tin-gold alloy having a thickness t2 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 70 before bonded with the gold layer 200 is tin-silver alloy, the tin-alloy layer 72 is tin-silver-gold alloy having a thickness t2 of between 0.5 and 10 micrometers, of between 1 and 5 micrometers or of between 1.5 and 3 micrometers. When the tin-containing layer 70 before bonded with the gold layer 200 is tin-silver-copper alloy, the tin-alloy layer 72 is tin-silver-gold-copper alloy having a thickness t2 of between 0.5 and 10 micrometers, of between 1 and 5 micrometers or of between 1.5 and 3 micrometers.

After the bumps 198 are connected to the tin-containing layer 70 on the bottom surface of the inner leads 68 using a thermal pressing process, a polymer material 74, such as epoxy or polyimide, can be formed between the semiconductor chip 204 and the tin-containing layer 70 on the bottom surface of the inner leads 68, and enclosing the bumps 198. Next, the polymer material 74 is cured at a temperature of between 150 and 250° C.

In the FIG. 20C, the copper traces 60 can be replaced by multiple gold traces having a thickness of between 3 and 30 μm, and preferably of between 5 and 20 μm. Alternatively, the copper traces 60 can be replaced by multiple silver traces having a thickness of between 3 and 30 μm, and preferably of between 5 and 20 μm.

TCP (Tape Carrier Package)—Gold to Gold Connection

Figure 20D:
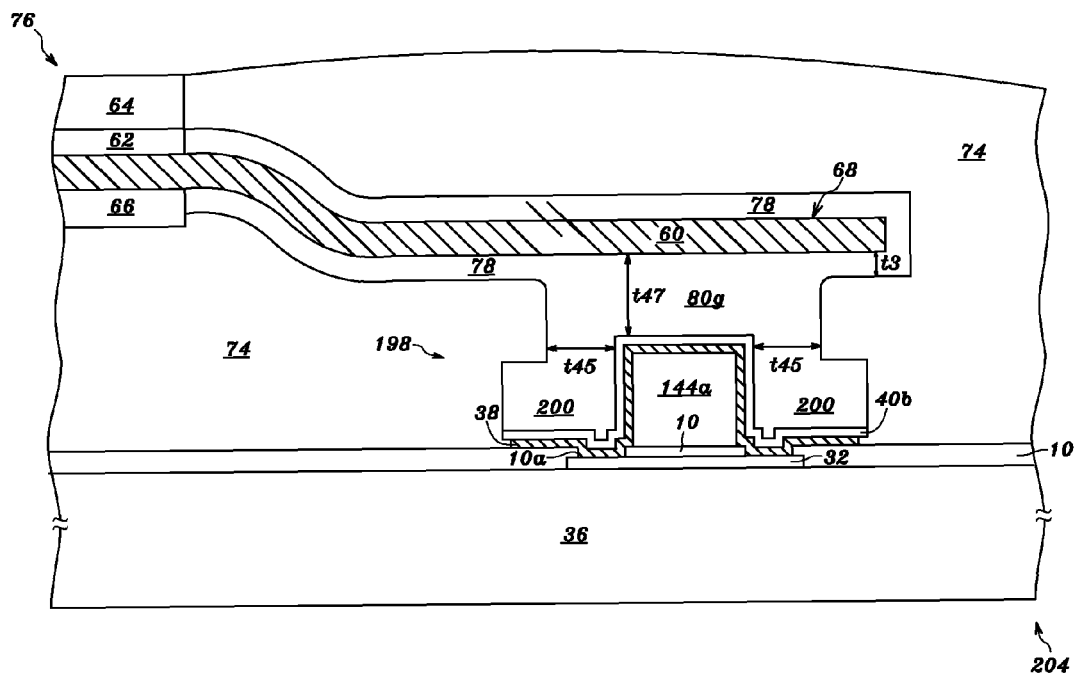

Referring to FIG. 20D, the flexible circuit film 76 as mentioned in FIG. 2I can be bonded with the bumps 198 (only one of them is shown). The specification of the flexible circuit film 76 shown in FIG. 20D can be referred to as the specification of the flexible circuit film 76 illustrated in FIG. 2I. When the flexible circuit film 76 is bonded with the bumps 198, the gold layer 78 on a bottom surface of the inner leads 68 (only one of them is shown) can be thermally pressed on a top surface of the gold layer 200 of the bumps 198 at a temperature of between 490 and 540° C., and preferably of between 500 and 520° C., for a time of between 1 and 10 seconds, and preferably of between 3 and 6 seconds. Thereby, a gold layer 80g formed by the joint of the gold layer 78 and the gold layer 200 can be between the seed layer 40b of the bumps 198 and the copper traces 60 of the flexible circuit film 76, wherein the gold layer 80g has a thickness t47 of between 0.5 and 20 micrometers, and preferably of between 2 and 10 micrometers.

After the bumps 198 are connected to the copper traces 60 using a thermal pressing process, a polymer material 74, such as epoxy or polyimide, can be formed between the semiconductor chip 204 and the gold layer 78 on the bottom surface of the inner leads 68, and enclosing the bumps 198. Next, the polymer material 74 is cured at a temperature of between 150 and 250° C.

COF (Chip on Film) Package—Gold to Tin Connection

Figure 20E:
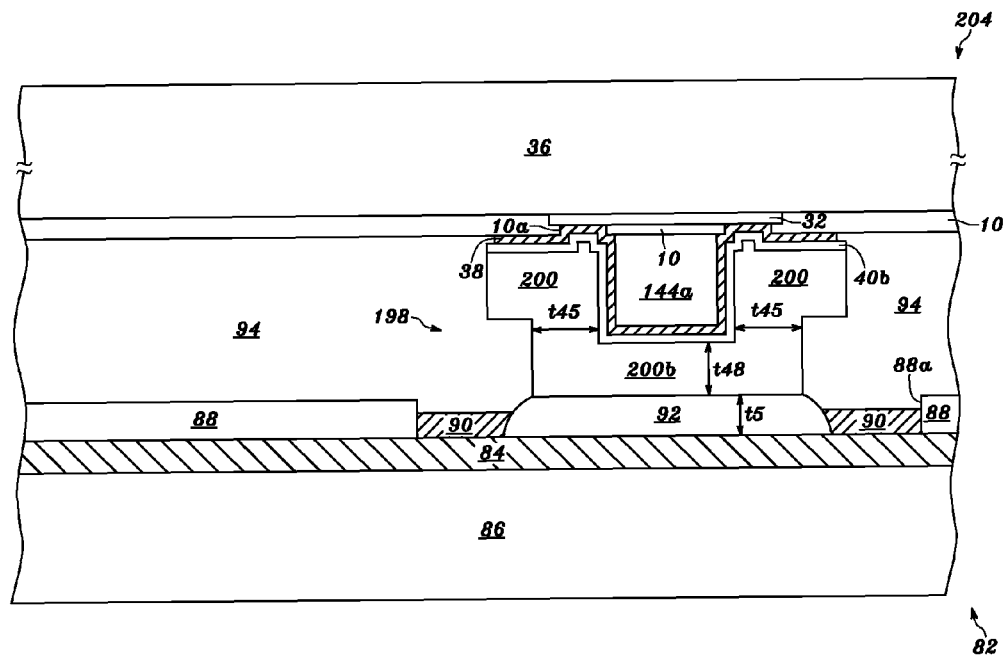

Referring to FIG. 20E, the flexible circuit film 82 as mentioned in FIG. 2K can be bonded with the bumps 198 (only one of them is shown). The specification of the flexible circuit film 82 shown in FIG. 20E can be referred to as the specification of the flexible circuit film 82 illustrated in FIG. 2K. When the flexible circuit film 82 is bonded with the bumps 198, a top surface of the gold layer 200 of the bumps 198 can be thermally pressed on the tin-containing layer 90 of the flexible circuit film 82 at a temperature of between 490 and 540° C., and preferably of between 500 and 520° C., for a time of between 1 and 10 seconds, and preferably of between 3 and 6 seconds. Alternatively, when the flexible circuit film 82 is bonded with the bumps 198, the tin-containing layer 90 of the flexible circuit film 82 can be thermally pressed on a top surface of the gold layer 200 of the bumps 198 at a temperature of between 490 and 540° C., and preferably of between 500 and 520° C., for a time of between 1 and 10 seconds, and preferably of between 3 and 6 seconds. Thereby, a tin-alloy layer 92 containing gold can be formed between the remaining gold layer 200b of the bumps 198 and the copper traces 84 of the flexible circuit film 82, wherein the remaining gold layer 200b has a thickness t48 of between 0.1 and 20 micrometers, and preferably of between 1 and 10 micrometers. The tin-alloy layer 92 has a thickness t5 of between 0.5 and 10 micrometers, of between 1 and 5 micrometers or of between 1.5 and 3 micrometers. When the tin-containing layer 90 before bonded with the gold layer 200 is pure tin, the tin-alloy layer 92 is tin-gold alloy having a thickness t5 of between 0.5 and 10 micrometers, of between 1 and 5 micrometers or of between 1.5 and 3 micrometers, wherein an atomic ratio of tin to gold in the tin-gold alloy is between 0.2 and 0.3. When the tin-containing layer 90 before bonded with the gold layer 200 is tin-silver alloy, the tin-alloy layer 92 is tin-silver-gold alloy having a thickness t5 of between 0.5 and 10 micrometers, of between 1 and 5 micrometers or of between 1.5 and 3 micrometers. When the tin-containing layer 90 before bonded with the gold layer 200 is tin-silver-copper alloy, the tin-alloy layer 92 is tin-silver-gold-copper alloy having a thickness t5 of between 0.5 and 10 micrometers, of between 1 and 5 micrometers or of between 1.5 and 3 micrometers.

After the bumps 198 are connected to the copper traces 84 using a thermal pressing process, a polymer material 94, such as epoxy or polyimide, can be formed between the passivation layer 10 of the semiconductor chip 204 and the polymer layer 88 of the flexible circuit film 82, and enclosing the bumps 198. Next, the polymer material 94 is cured at a temperature of between 150 and 250° C.

In the FIG. 20E, the copper traces 84 can be replaced by multiple gold traces having a thickness of between 3 and 30 μm, and preferably of between 5 and 20 μm. Alternatively, the copper traces 84 can be replaced by multiple silver traces having a thickness of between 3 and 30 μm, and preferably of between 5 and 20 μm.

COF (Chip on Film) Package—Gold to Gold Connection

Figure 20F:
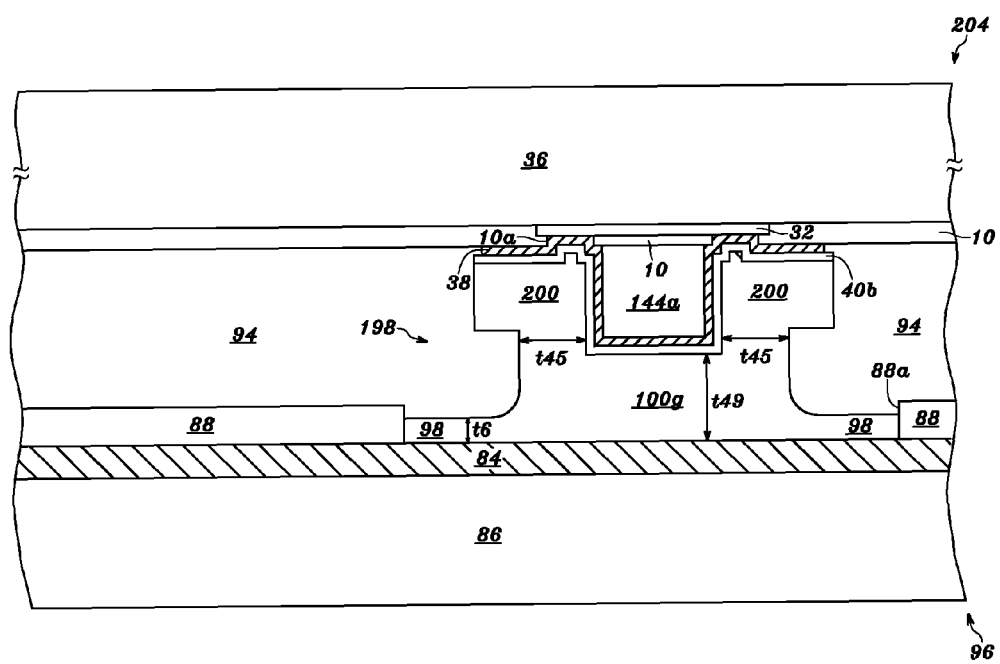

Referring to FIG. 20F, the flexible circuit film 96 as mentioned in FIG. 2M can be bonded with the bumps 198 (only one of them is shown). The specification of the flexible circuit film 96 shown in FIG. 20F can be referred to as the specification of the flexible circuit film 96 illustrated in FIG. 2M. When the flexible circuit film 96 is bonded with the bumps 198, a top surface of the gold layer 200 of the bumps 198 can be thermally pressed on the gold layer 98 of the flexible circuit film 96 at a temperature of between 490 and 540° C., and preferably of between 500 and 520° C., for a time of between 1 and 10 seconds, and preferably of between 3 and 6 seconds. Alternatively, when the flexible circuit film 96 is bonded with the bumps 198, the gold layer 98 of the flexible circuit film 96 can be thermally pressed on a top surface of the gold layer 200 of the bumps 198 at a temperature of between 490 and 540° C., and preferably of between 500 and 520° C., for a time of between 1 and 10 seconds, and preferably of between 3 and 6 seconds. Thereby, a gold layer 100g formed by the joint of the gold layer 98 and the gold layer 200 can be between the seed layer 40b of the bumps 198 and the copper traces 84 of the flexible circuit film 96, wherein the gold layer 100g has a thickness t49 of between 0.5 and 20 micrometers, and preferably of between 2 and 10 micrometers.

After the bumps 198 are connected to the copper traces 84 using a thermal pressing process, a polymer material 94, such as epoxy or polyimide, can be formed between the passivation layer 10 of the semiconductor chip 204 and the polymer layer 88 of the flexible circuit film 96, and enclosing the bumps 198. Next, the polymer material 94 is cured at a temperature of between 150 and 250° C.

COG (Chip on Glass) Assembly—ACF/ACP

Figure 20G:
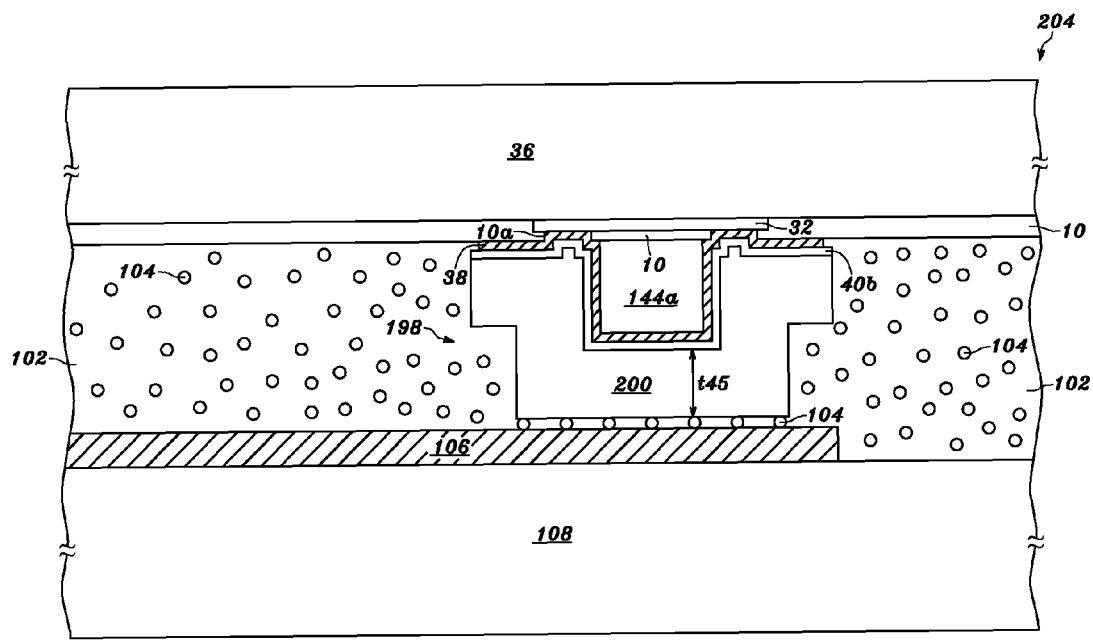

Referring to FIG. 20G, via a thermal pressing process, the gold layer 200 of the bumps 198 (only one of them is shown) is pressed into an anisotropic conductive film (ACF) or an anisotropic conductive paste (ACP) 102. Thus, metal particles 104 inside ACF or ACP 102 clusters between the gold layer 200 of the bumps 198 and multiple conductive traces 106 (only one of them is shown), such as indium tin oxide (ITO) or gold, on a glass substrate 108, leading the gold layer 200 of the bumps 198 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 200 of the bumps 198 may be pressed into ACF or ACP 102 preformed on a ceramic substrate or a printed circuit board to have metal particles 104 in the ACF or ACP 102 connecting the gold layer 200 of the bumps 198 to multiple pads on the ceramic substrate or on the organic substrate.

COG (Chip on Glass) Assembly—NCF

Figure 20H:
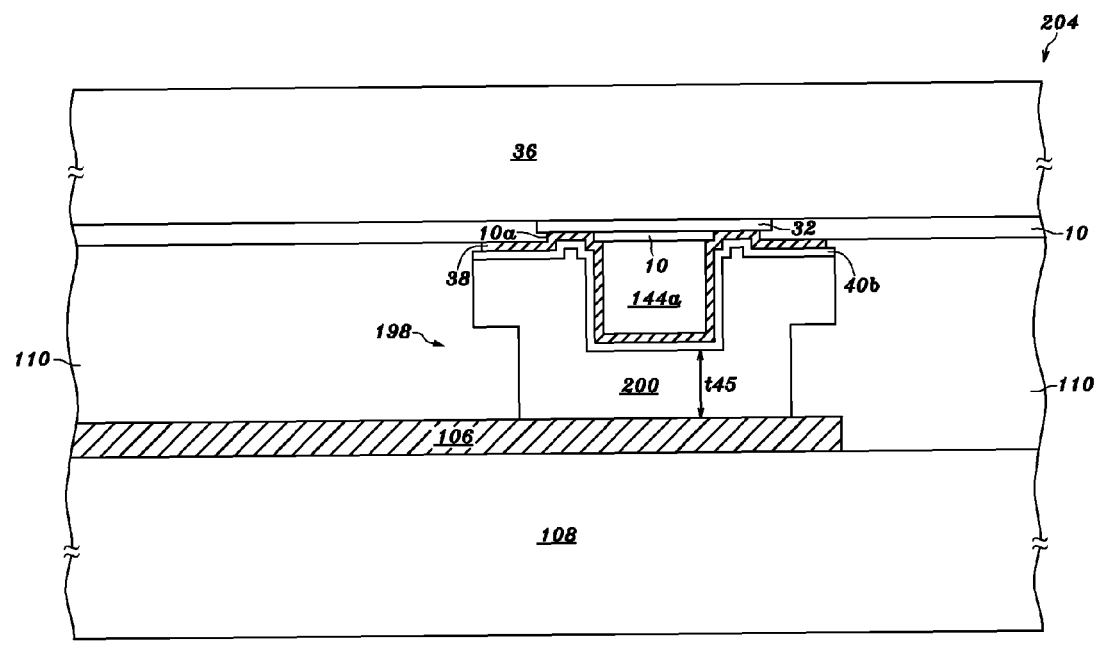

Referring to FIG. 20H, via a thermal pressing process, the gold layer 200 of the bumps 198 (only one of them is shown) is pressed into a non-conductive film (NCF) 110, and the gold layer 200 of the bumps 198 contacts with multiple conductive traces 106 (only one of them is shown), such as indium tin oxide (ITO) or gold, on a glass substrate 108, leading the gold layer 200 of the bumps 198 to be electrically coupled to the conductive traces 106 on the glass substrate 108. The glass substrate 108 has a thickness of between 400 and 10,000 micrometers, and preferably of between 400 and 1,100 micrometers. The conductive traces 106 have a thickness of between 2 and 25 micrometers. Alternatively, the gold layer 200 of the bumps 198 may be pressed into NCF 110 preformed on a ceramic substrate or a printed circuit board to have the gold layer 200 of the bumps 198 contacting with multiple pads on the ceramic substrate or on the organic substrate.

Those described above are the embodiments to exemplify the present invention to enable the person skilled in the art to understand, make and use the present invention. However, it is not intended to limit the scope of the present invention. Any equivalent modification and variation according to the spirit of the present invention is to be also included within the scope of the claims stated below.

What is claimed is:

1. A chip package comprising:
a semiconductor chip comprising a silicon substrate, a transistor in or over said silicon substrate, a first dielectric layer over said silicon substrate, a metallization structure over said first dielectric layer, wherein said metallization structure comprises a first metal layer and a second metal layer over said first metal layer, a second dielectric layer between said first and second metal layers, a passivation layer over said metallization structure, over said first and second dielectric layers and over said transistor, wherein an opening in said passivation layer is over a contact point of a metal pad of said metallization structure, and said contact point is at a bottom of said opening, wherein said metal pad comprises a first copper layer having a thickness between 0.5 and 3 micrometers and a barrier metal layer at a bottom and a sidewall of said first copper layer, wherein said passivation layer comprises a nitride layer;

a metal bump on said contact point, wherein said metal bump is connected to said contact point through said opening, wherein said metal bump comprises an aluminum-free adhesion layer on said contact point, a copper-containing seed layer on said aluminum-free adhesion layer, and a second copper layer with a thickness between 5 and 30 micrometers on said copper-containing seed layer, wherein said aluminum-free adhesion layer is at a bottom of said second copper layer, but not at a sidewall of said second copper layer;

a flexible circuit film comprising a first polymer layer, a second polymer layer and a copper trace comprising a portion between said first and second polymer layers;

a tin-alloy layer between said second copper layer and said copper trace, wherein said tin-alloy layer comprises gold, wherein said tin-alloy layer is vertically over said sidewall of said second copper layer; and a polymer between said semiconductor chip and said flexible circuit film, wherein said polymer contacts said semiconductor chip and said flexible circuit film and encloses said metal bump.

2. The chip package of claim 1, wherein said tin-alloy layer further comprises silver.

3. The chip package of claim 1, wherein said metal bump further comprises a nickel layer having a thickness between 0.1 and 5 micrometers between said second copper layer and said tin-alloy layer.

4. The chip package of claim 1, wherein said barrier metal comprises a tantalum-containing layer.

5. The chip package of claim 1, wherein said nitride layer has a thickness between 0.2 and 1.2 micrometers.

6. The chip package of claim 1, wherein said aluminum-free adhesion layer comprises a titanium-containing layer having a thickness between 0.02 and 0.5 micrometers.

7. The chip package of claim 1, wherein said aluminum-free adhesion layer comprises a tantalum-containing layer having a thickness between 0.02 and 0.5 micrometers.

8. The chip package of claim 1, wherein said metal bump further comprises a gold layer having a thickness between 0.2 and 6 micrometers between said second copper layer and said tin-alloy layer.

9. The chip package of claim 1, wherein said metal bump further comprises a nickel layer having a thickness between 0.1 and 5 micrometers between said second copper layer and said tin-alloy layer, and a gold layer having a thickness between 0.2 and 6 micrometers between said nickel layer and said tin-alloy layer.

10. A chip package comprising:
a semiconductor chip comprising a silicon substrate, a transistor in or over said silicon substrate, a first dielectric layer over said silicon substrate, a metallization structure over said first dielectric layer, wherein said metallization structure comprises a first metal layer and a second metal layer over said first metal layer, a second dielectric layer between said first and second metal layers, a separating layer over said metallization structure, over said first and second dielectric layers and over said transistor, wherein an opening in said separating layer is over a contact point of a third metal layer said metallization structure, and said contact point is at a bottom of said opening, wherein said third metal layer comprises a first copper layer;

a metal bump on said contact point, wherein said metal bump is connected to said contact point through said opening, wherein said metal bump comprises an aluminum-free adhesion layer on said contact point, a copper-containing seed layer on said aluminum-free adhesion layer, and a second copper layer with a thickness between 5 and 30 micrometers on said copper-containing seed layer;

a circuit component comprising a first polymer layer, a second polymer layer and a copper trace comprising a portion between said first and second polymer layers;

a tin-alloy layer between said second copper layer and said copper trace, wherein said tin-alloy layer comprises silver and gold, wherein said second copper layer has a sidewall with a region not covered by said tin-alloy layer, wherein said tin-alloy layer is vertically over said sidewall of said second copper layer; and a polymer between said semiconductor chip and said circuit component, wherein said polymer contacts said semiconductor chip and said circuit component and encloses said metal bump.

11. The chip package of claim 10, wherein said metal bump further comprises a nickel layer having a thickness between 0.1 and 5 micrometers between said second copper layer and said tin-alloy layer.

12. The chip package of claim 10, wherein said third metal layer further comprises a tantalum-containing layer at a bottom and a sidewall of said first copper layer.

13. The chip package of claim 10, wherein said separating layer comprises a nitride layer having a thickness between 0.2 and 1.2 micrometers.

14. The chip package of claim 10, wherein said aluminum-free adhesion layer comprises a titanium-containing layer having a thickness between 0.02 and 0.5 micrometers.

15. The chip package of claim 10, wherein said aluminum-free adhesion layer comprises a tantalum-containing layer having a thickness between 0.02 and 0.5 micrometers.

16. The chip package of claim 10, wherein said metal bump further comprises a gold layer having a thickness between 0.2 and 6 micrometers between said second copper layer and said tin-alloy layer.

17. The chip package of claim 10, wherein said metal bump further comprises a nickel layer having a thickness between 0.1 and 5 micrometers between said second copper layer and said tin-alloy layer, and a gold layer having a thickness between 0.2 and 6 micrometers between said nickel layer and said tin-alloy layer.

* * * * *